United States Patent [19]
Akaogi et al.

[11] Patent Number: 5,590,074
[45] Date of Patent: Dec. 31, 1996

[54] NONVOLATILE SEMICONDUCTOR MEMORY

[75] Inventors: Takao Akaogi; Masanobu Yoshida, both of Kawasaki; Yasushige Ogawa, Kasugai; Yasushi Kasa; Shouichi Kawamura, both of Kawasaki, all of Japan

[73] Assignee: Fujitsu Limited, Kanagawa, Japan

[21] Appl. No.: 466,732

[22] Filed: Jun. 6, 1995

Related U.S. Application Data

[62] Division of Ser. No. 996,942, Dec. 28, 1992, Pat. No. 5,490,107.

[30] Foreign Application Priority Data

| Dec. 27, 1991 | [JP] | Japan | 3-346663 |
| May 28, 1992 | [JP] | Japan | 4-137080 |
| Jul. 20, 1992 | [JP] | Japan | 4-191793 |
| Sep. 17, 1992 | [JP] | Japan | 4-248023 |
| Oct. 9, 1992 | [JP] | Japan | 4-271869 |
| Oct. 13, 1992 | [JP] | Japan | 4-274355 |
| Dec. 3, 1992 | [JP] | Japan | 4-324302 |
| Dec. 4, 1992 | [JP] | Japan | 4-325544 |

[51] Int. Cl.$^6$ ........................ G11C 11/34
[52] U.S. Cl. ............... 365/185.22; 365/185.29; 365/185.2
[58] Field of Search ............... 365/185.22, 185.29, 365/185.2, 185.18, 201, 185.24

[56] References Cited

U.S. PATENT DOCUMENTS

| 4,527,251 | 7/1985 | Nibby, Jr. et al. | 364/900 |
| 4,585,955 | 4/1986 | Uchida | 365/226 X |
| 4,691,304 | 9/1987 | Hori et al. | 365/226 |
| 4,794,564 | 12/1988 | Watanabe | 365/185.22 |
| 4,875,188 | 10/1989 | Jungroth | 365/185.22 |
| 4,890,262 | 12/1989 | Hashimoto et al. | 365/200 |
| 4,964,079 | 10/1990 | Devin | 365/185.22 |
| 5,012,445 | 4/1991 | Kazuaki et al. | 365/189.06 |
| 5,046,052 | 9/1991 | Miyaji et al. | 365/226 |
| 5,072,134 | 12/1991 | Min | 327/536 |
| 5,075,890 | 12/1991 | Itoh et al. | 365/189.09 |
| 5,077,691 | 12/1991 | Haddad et al. | 365/218 |
| 5,153,452 | 10/1992 | Iwamura et al. | 365/226 X |
| 5,247,480 | 9/1993 | Itoh et al. | 365/189.09 |
| 5,341,329 | 8/1994 | Takebuchi | 365/185.3 |

FOREIGN PATENT DOCUMENTS

| 3-73497 | 3/1991 | Japan. |
| 91-1774 | 1/1991 | Rep. of Korea. |

*Primary Examiner*—Joseph A. Popek
*Attorney, Agent, or Firm*—Nikaido Marmelstein Murray & Oram LLP

[57] ABSTRACT

A nonvolatile semiconductor memory employs sense amplifiers, circuits for providing stabilized source voltages, and circuits for realizing high-speed and reliable read and write operations. The semiconductor memory has a matrix of nonvolatile erasable memory cell transistors. The semiconductor memory employs an arrangement for effectively using a plurality of source voltages and applying a verify voltage to sense amplifiers and word lines, a write verify arrangement for detecting an output of the sense amplifiers, an arrangement for comparing an output of the sense amplifiers with a reference value to determine whether or not a written state of the memory cell transistors is acceptable, an arrangement for adjusting an output of the sense amplifiers with use of inverters and transistors in response to a current flowing to the memory cell transistors, to improve a drive speed of the sense amplifiers, an internal source voltage generating arrangement using an n-channel depletion transistor connected to an external source voltage (Vcc), the gate of the transistor being connected to a low source voltage (Vss) to provide an internal source voltage (Vci), a combination of an arrangement for dropping the external source voltage (Vcc) for read to a predetermined value to drive a read circuit in the memory and an arrangement for dropping an external voltage (Vpp) for write, to generate a word line potential for a verify-after-write operation, an arrangement for setting a reference voltage (Vref) as a lower threshold (Vth) allowed for cell transistors ($11_{00}$ to $11_{22}$), and comparing the voltage of a data bus (13) with the reference voltage (Vref), to simultaneously carry out an erase-verify operation on all memory cell transistors, and a pre-read arrangement for accessing the next address during a read time of the sense amplifiers, to improve a read speed.

7 Claims, 78 Drawing Sheets

① ···SENSING CHARACTERISTIC CURVE ($V_{cc}$ IS VARIED)
② ···SENSING CHARACTERISTIC CURVE ($V_{VER}$ IS VARIED)
③ ···CELL CURRENT CHARACTERISTIC CURVE (AFTER WRITING DATA)
④ ···CELL CURRENT CHARACTERISTIC CURVE (AFTER ERASING DATA)

⑤ ⋯ SENSING CHARACTERISTIC CURVE
⑥ ⋯ CELL CURRENT CHARACTERISTIC CURVE (AFTER WRITING DATA)
⑦ ⋯ CELL CURRENT CHARACTERISTIC CURVE (AFTER ERASING DATA)

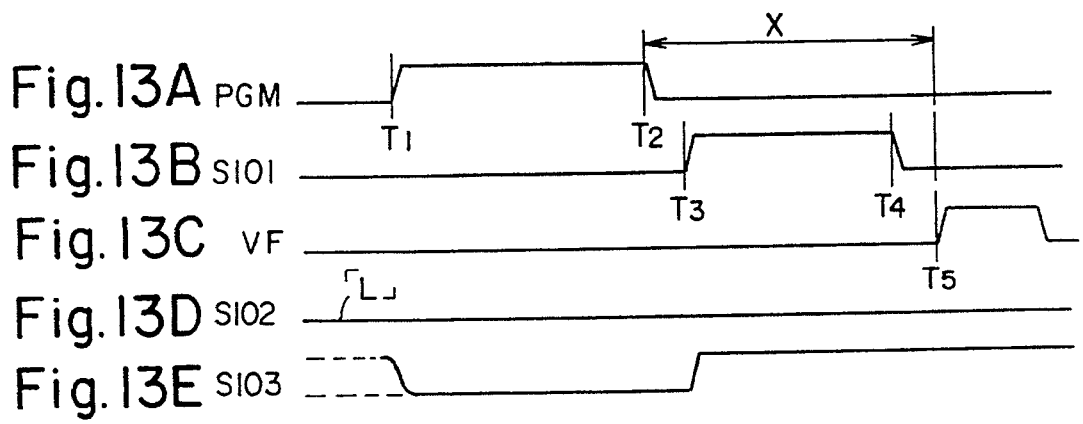
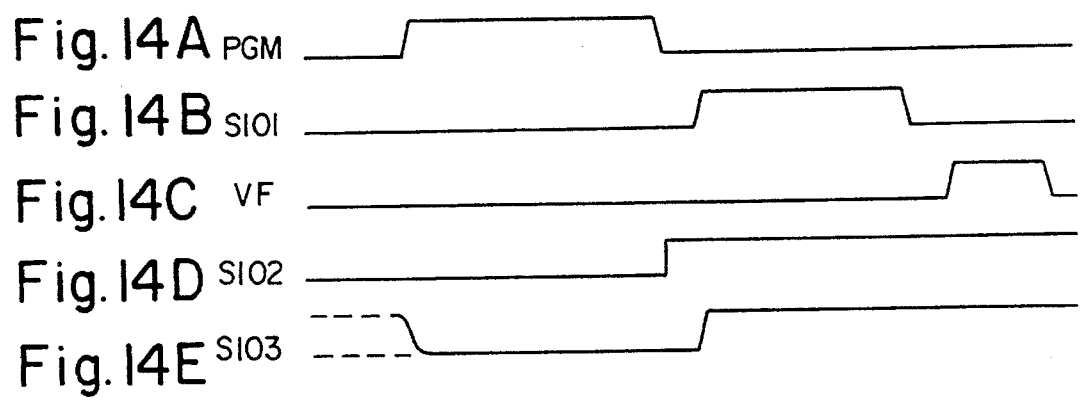
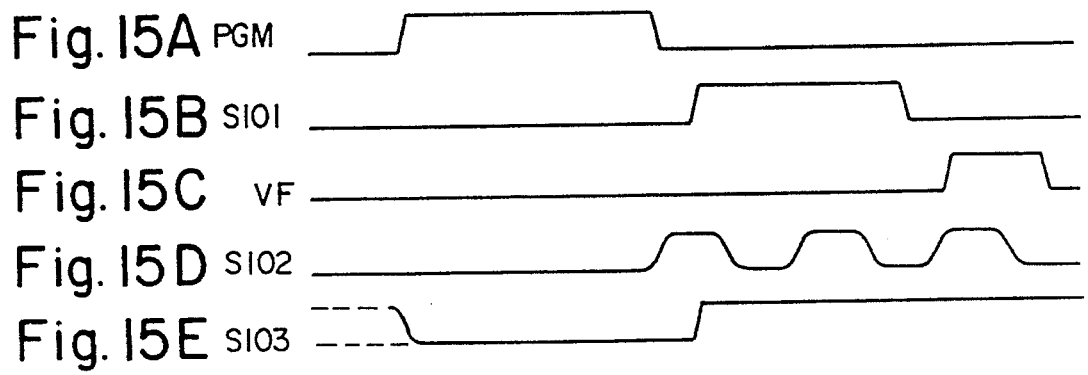

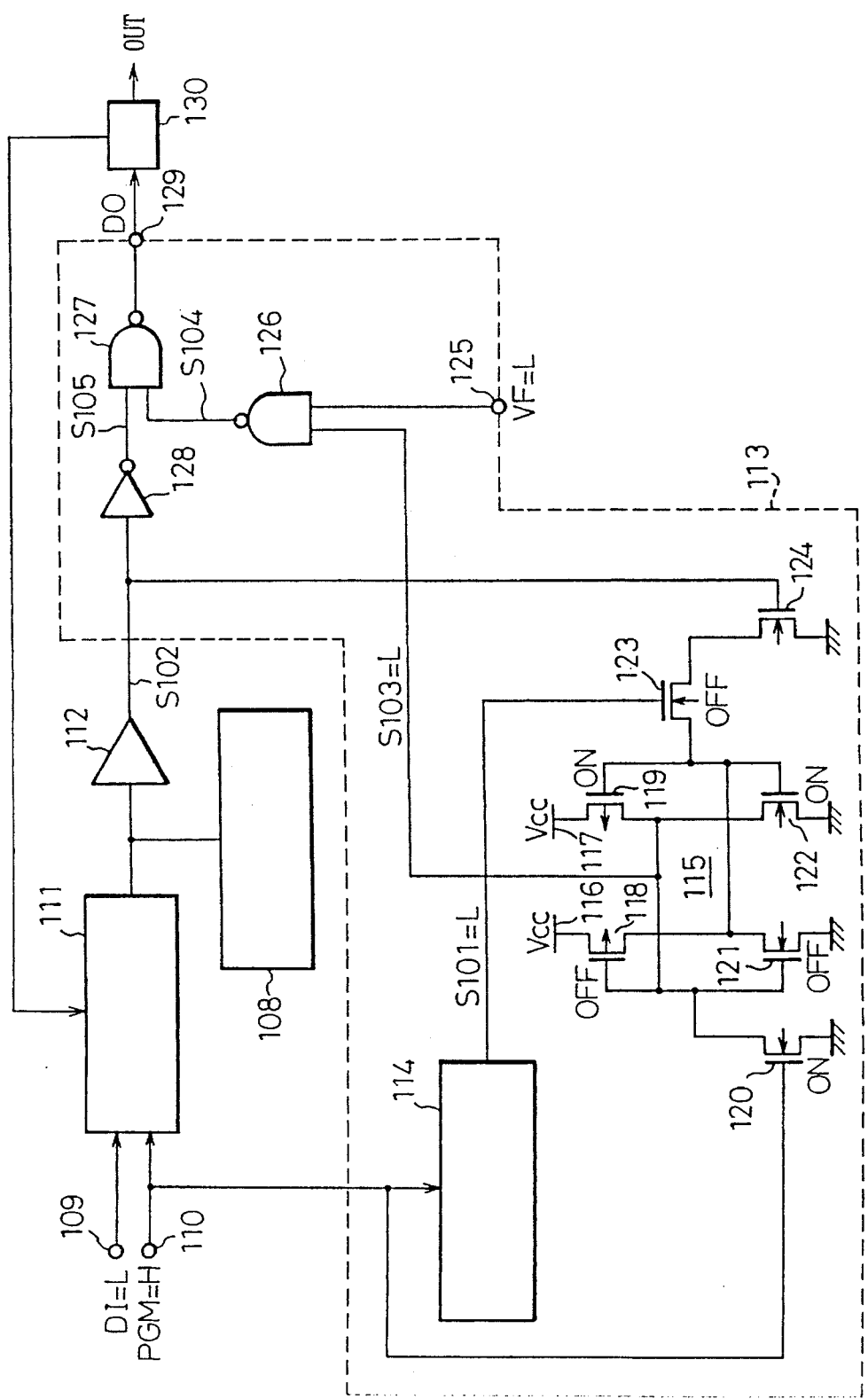

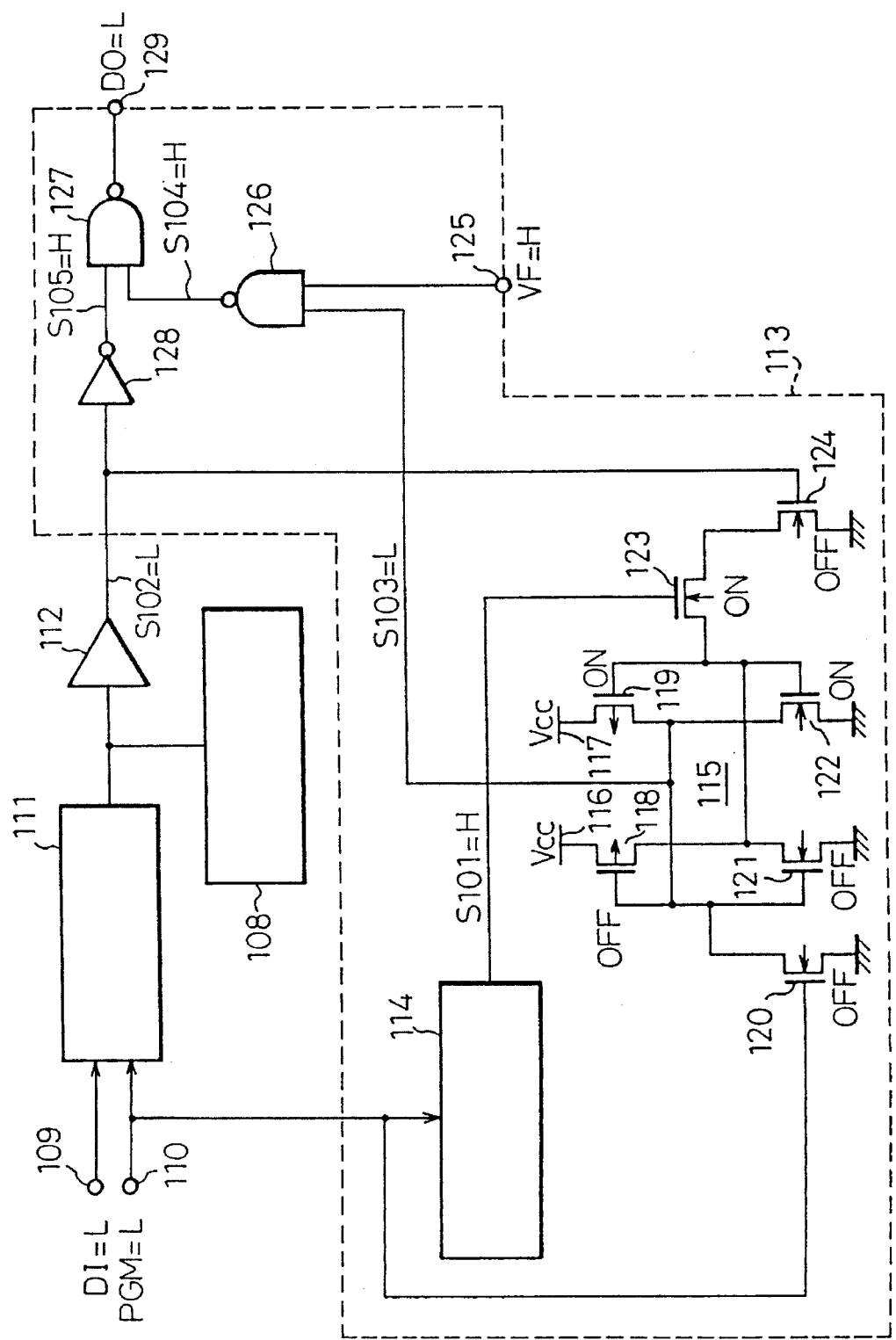

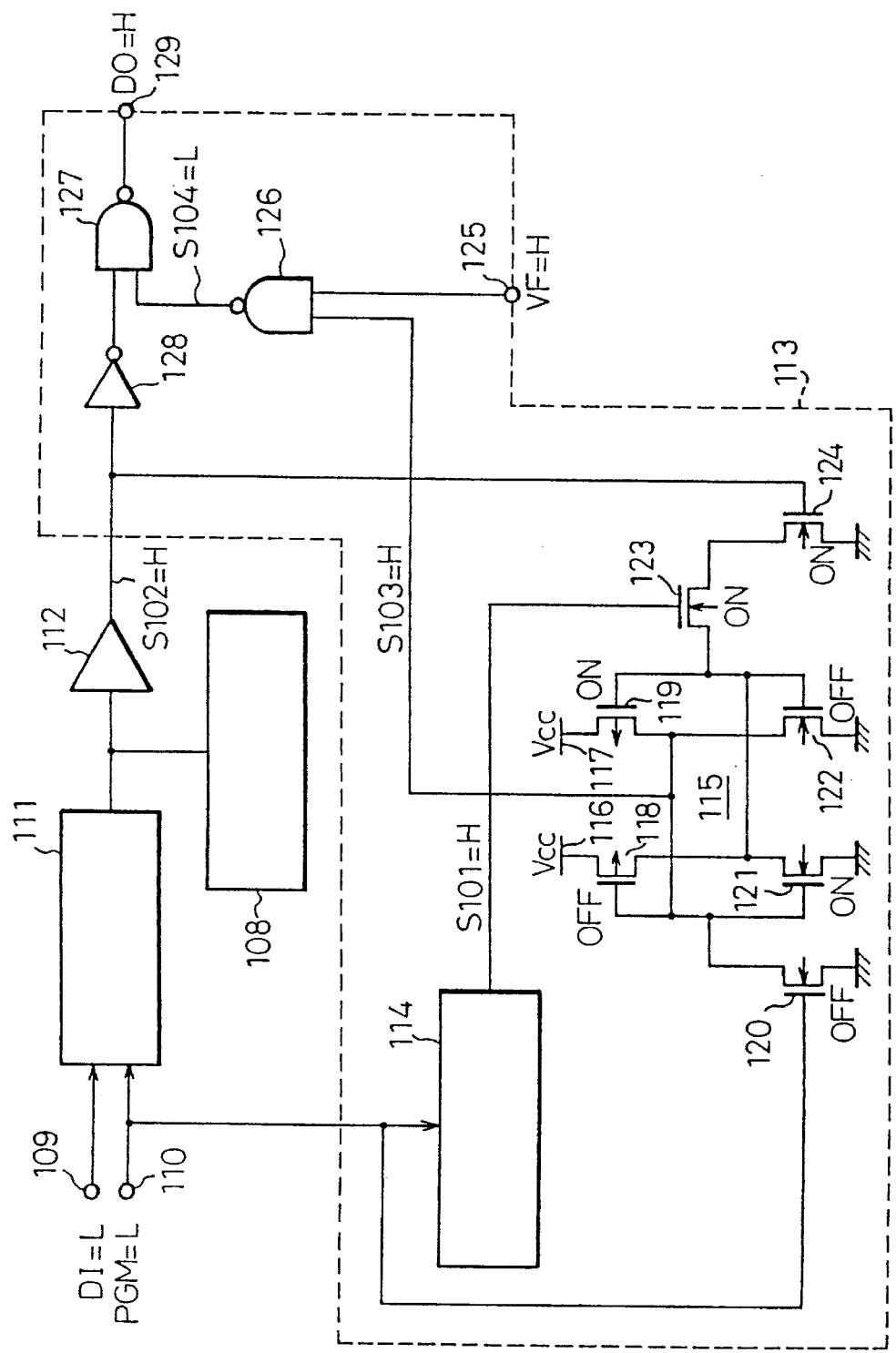

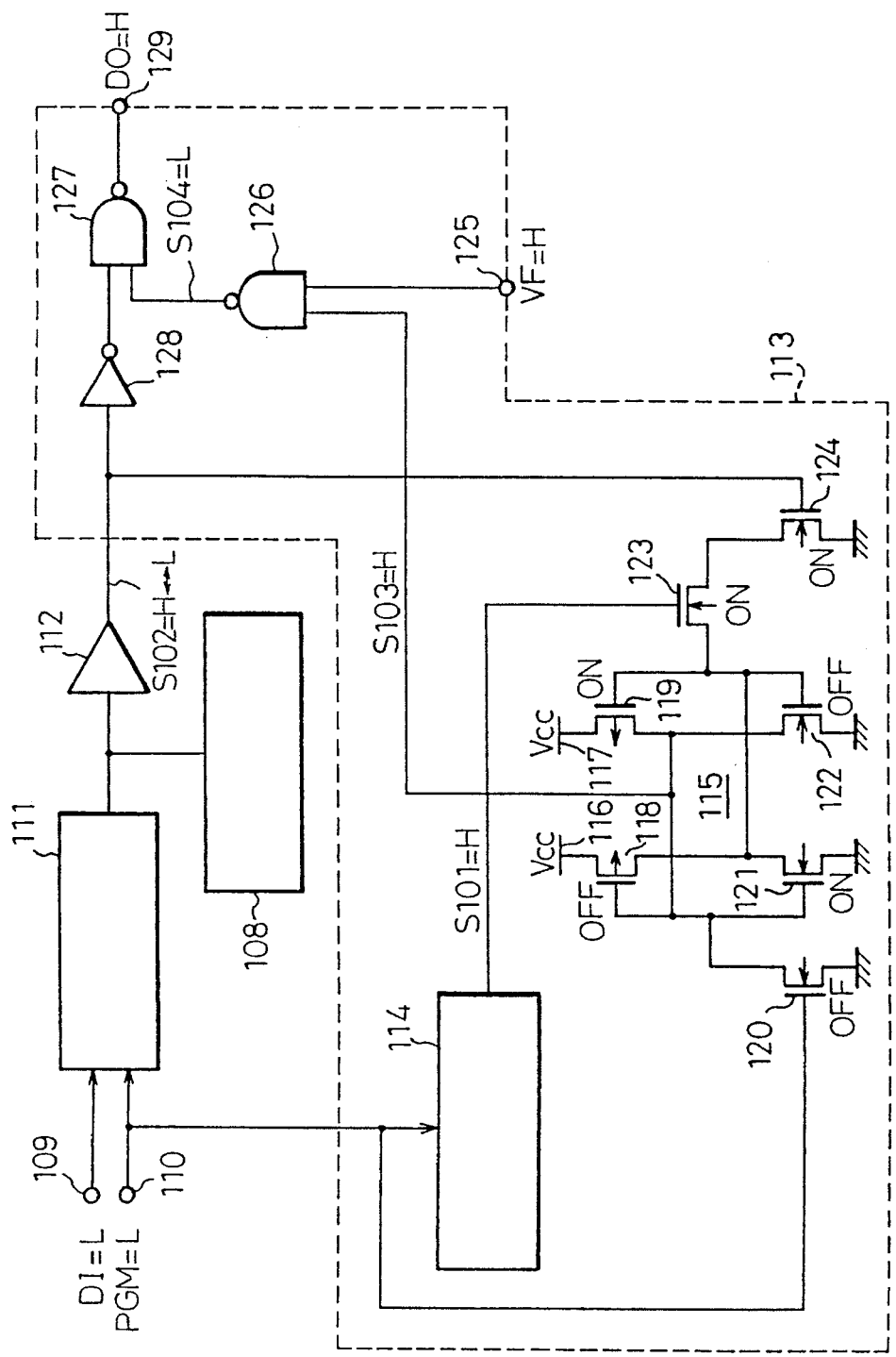

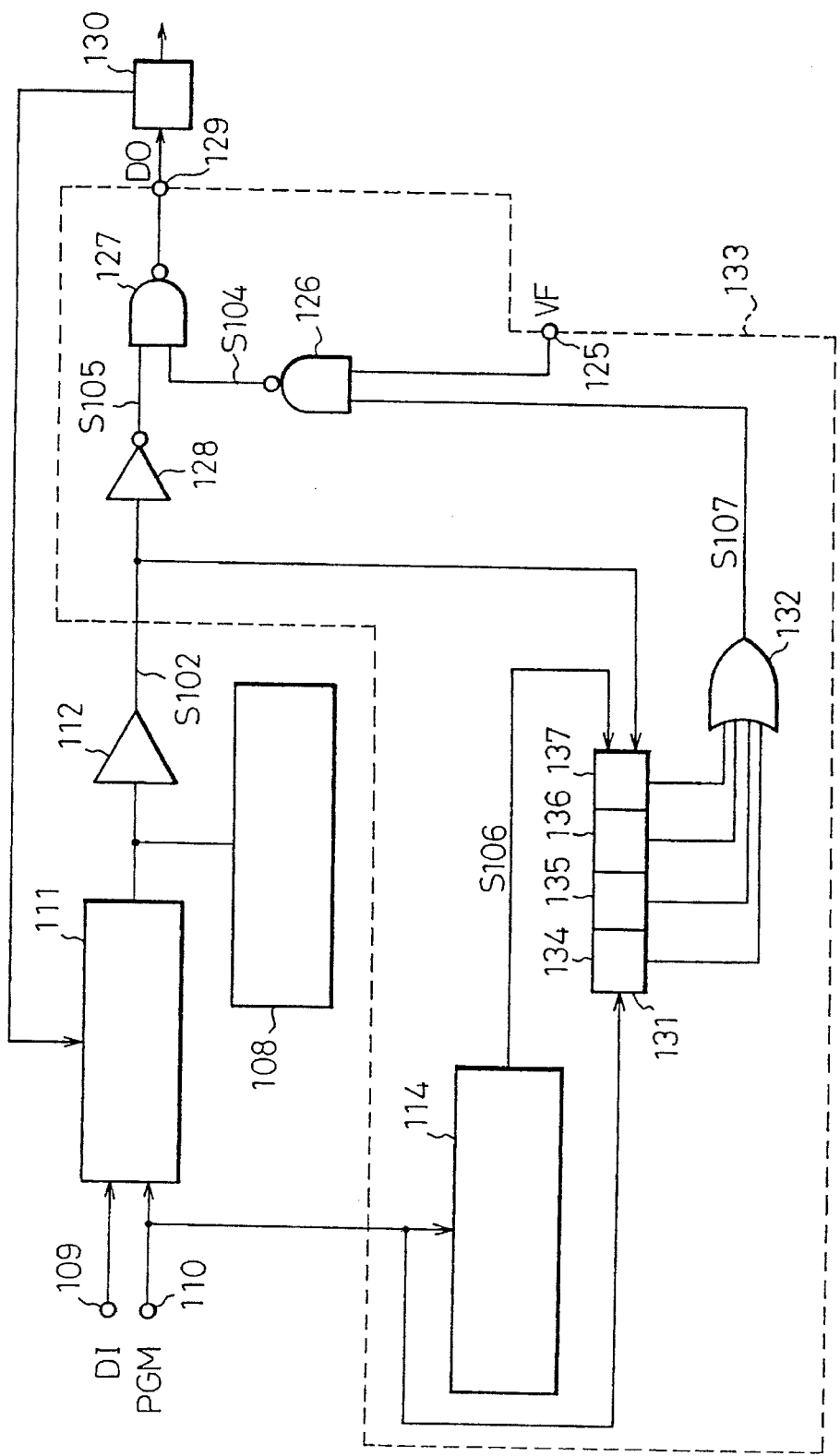

Fig. 21A PGM
Fig. 21B S106
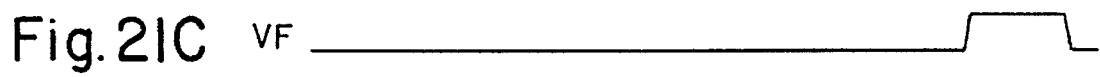
Fig. 21C VF
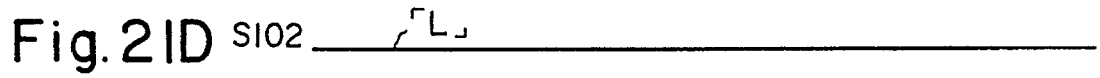
Fig. 21D S102
Fig. 21E S107
Fig. 22A PGM
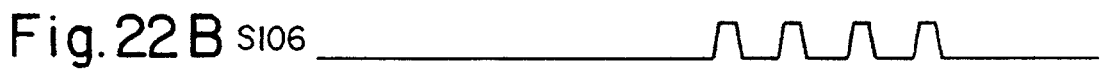
Fig. 22B S106
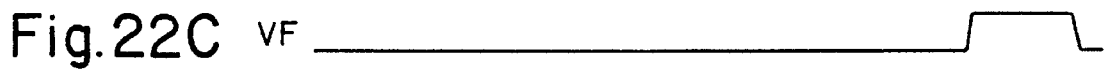
Fig. 22C VF
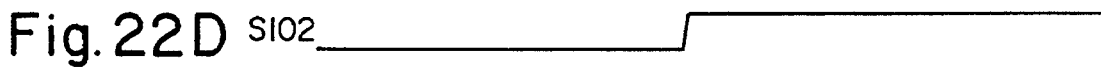
Fig. 22D S102
Fig. 22E S107
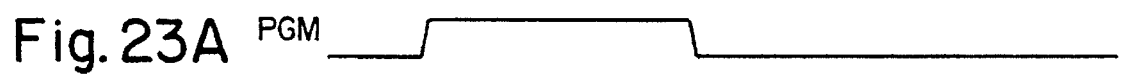
Fig. 23A PGM
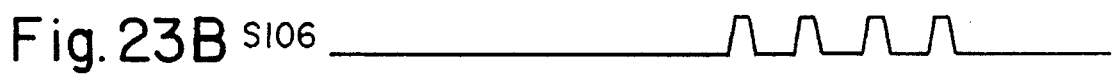
Fig. 23B S106
Fig. 23C VF
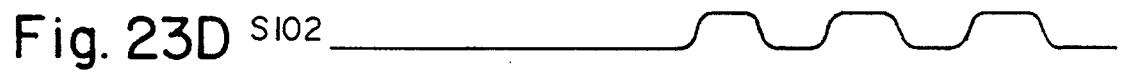
Fig. 23D S102
Fig. 23E S107

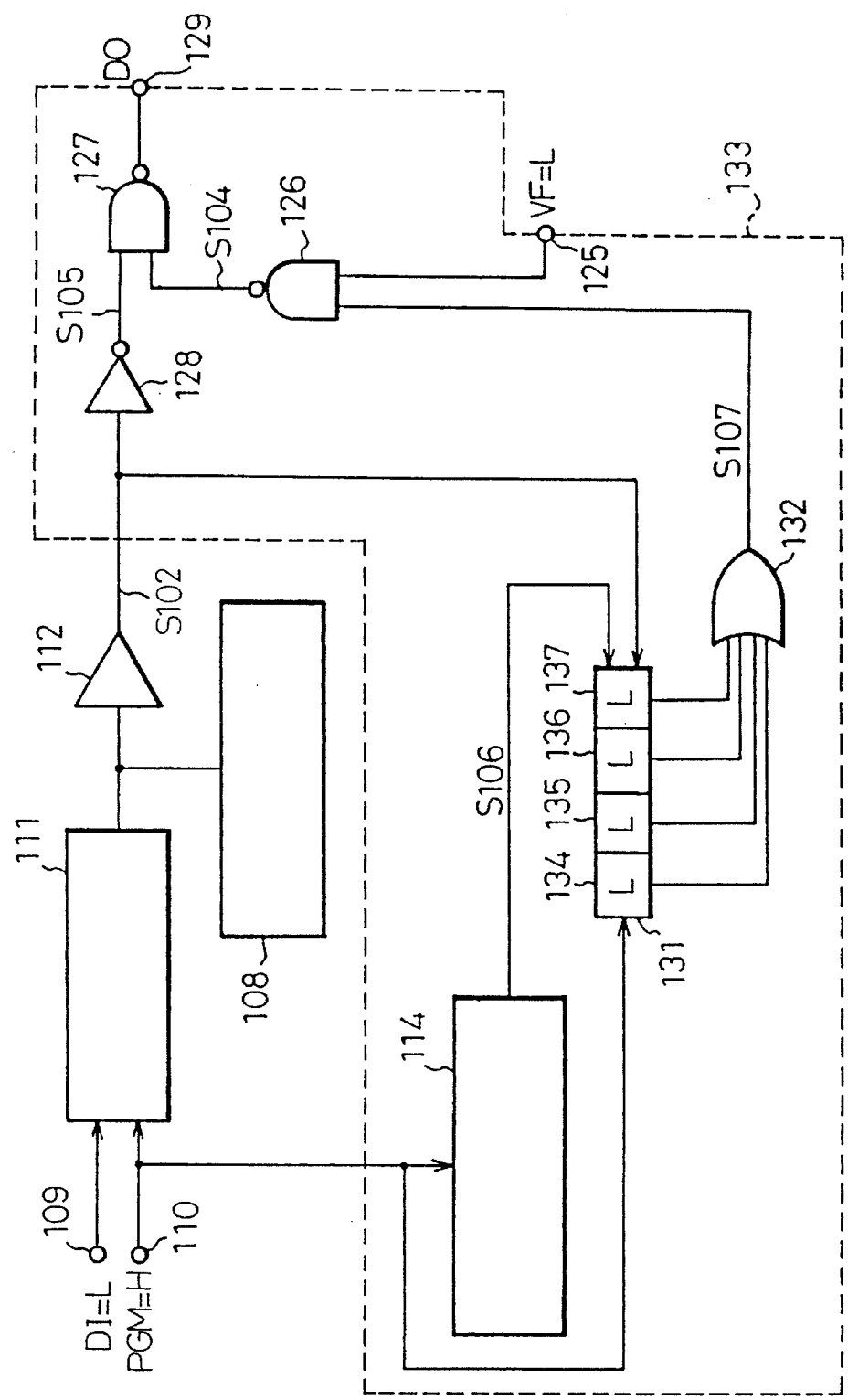

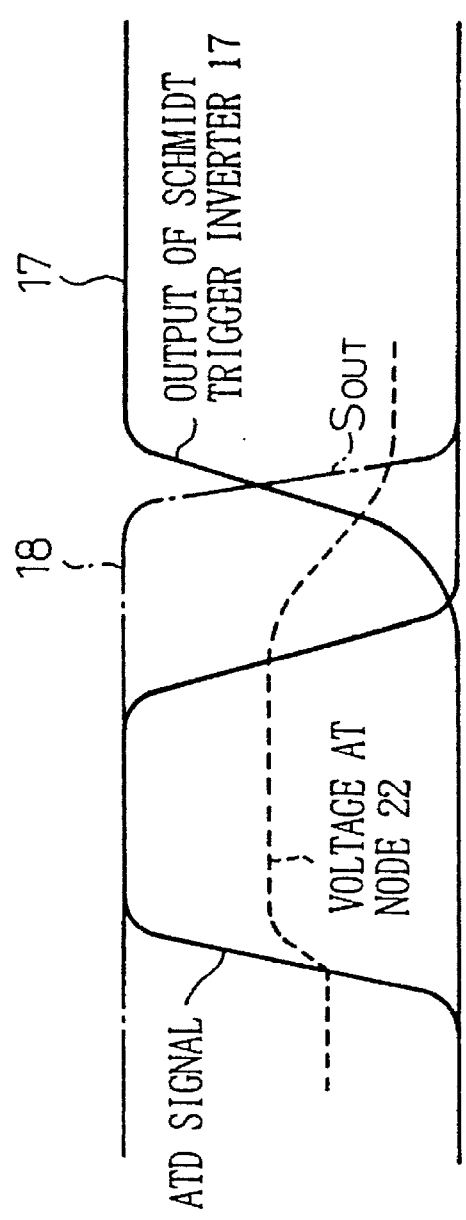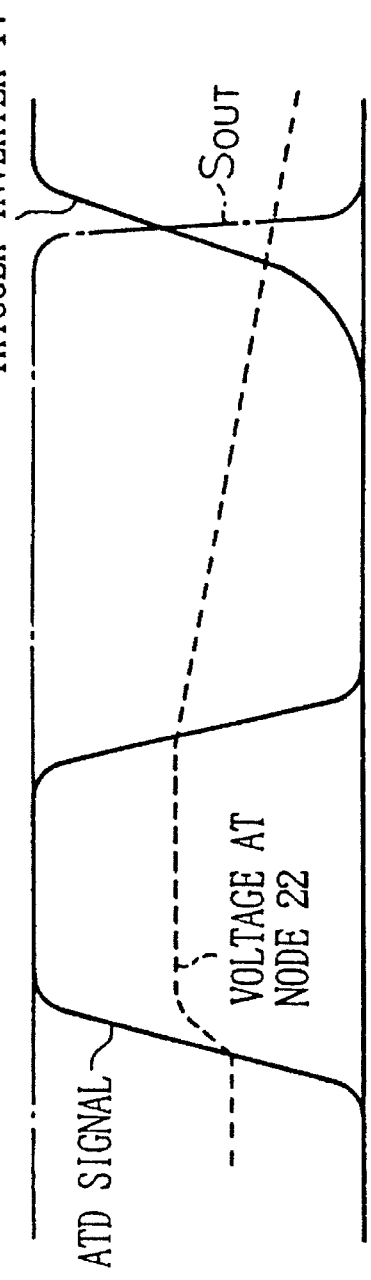

Fig.40
PRIOR ART
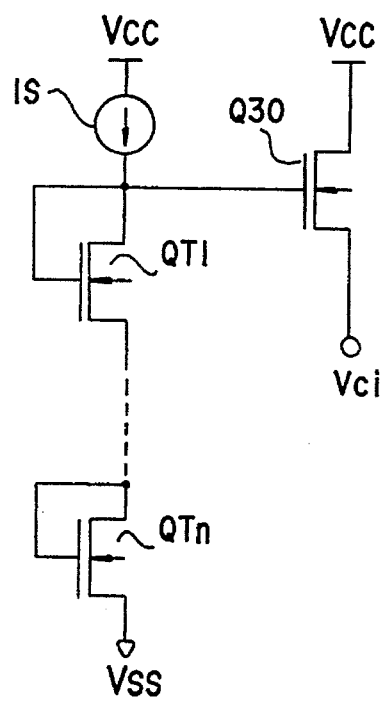
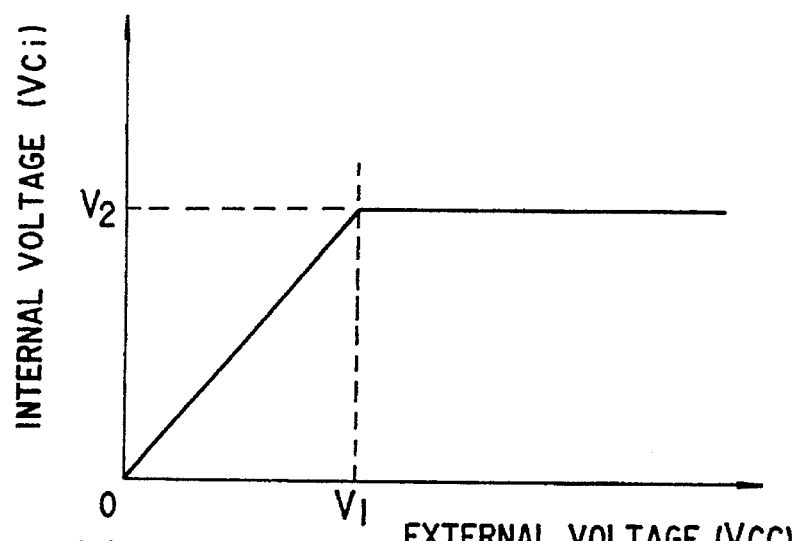
Fig.41
PRIOR ART

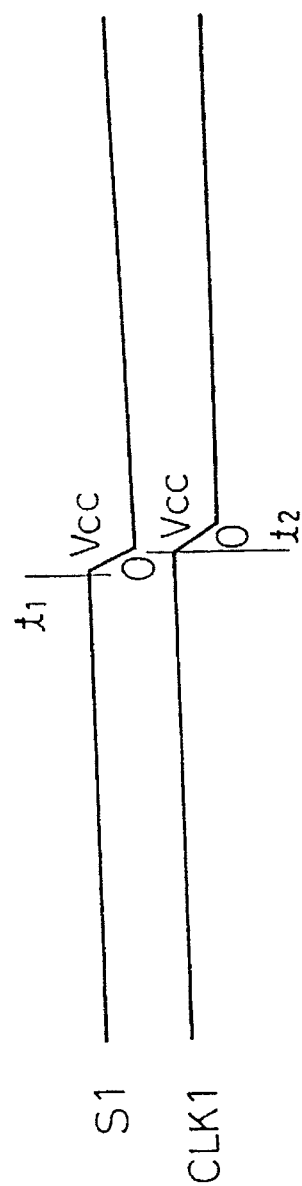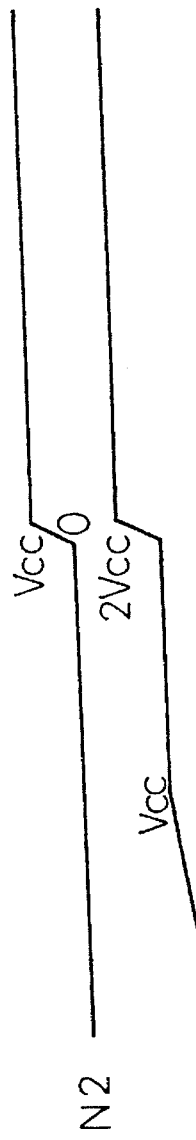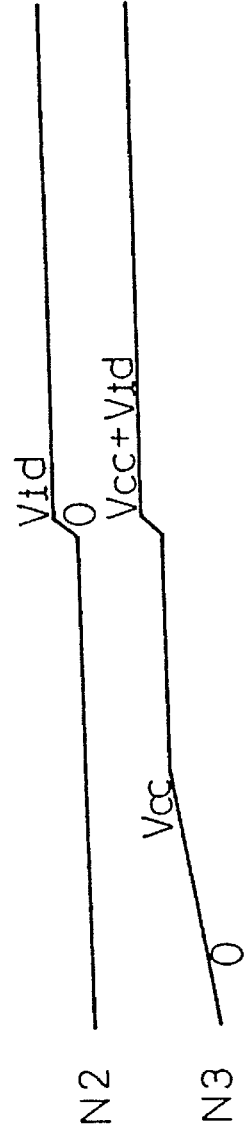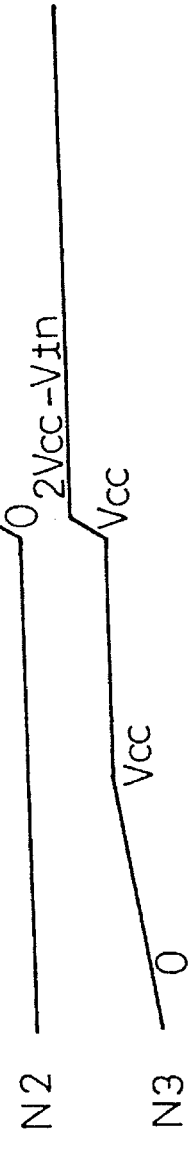
Fig.67(A) {S1, CLK1}
Fig.67(B)
Fig.67(C)
Fig.67(D)
Fig.67(E)

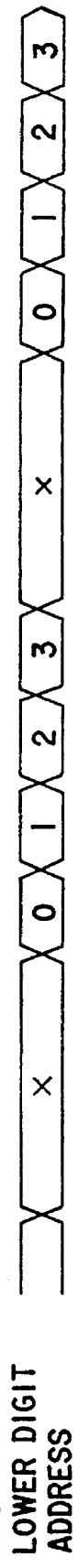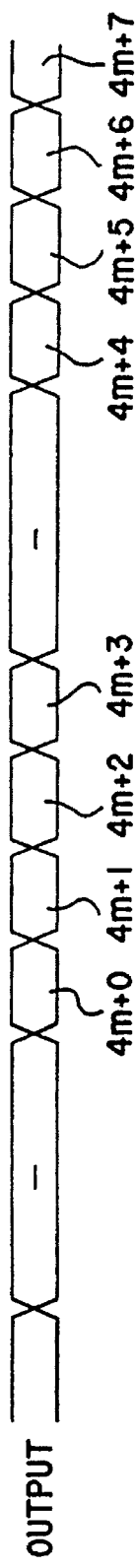
Fig. 83A PRIOR ART
Fig. 83B PRIOR ART
Fig. 83C PRIOR ART

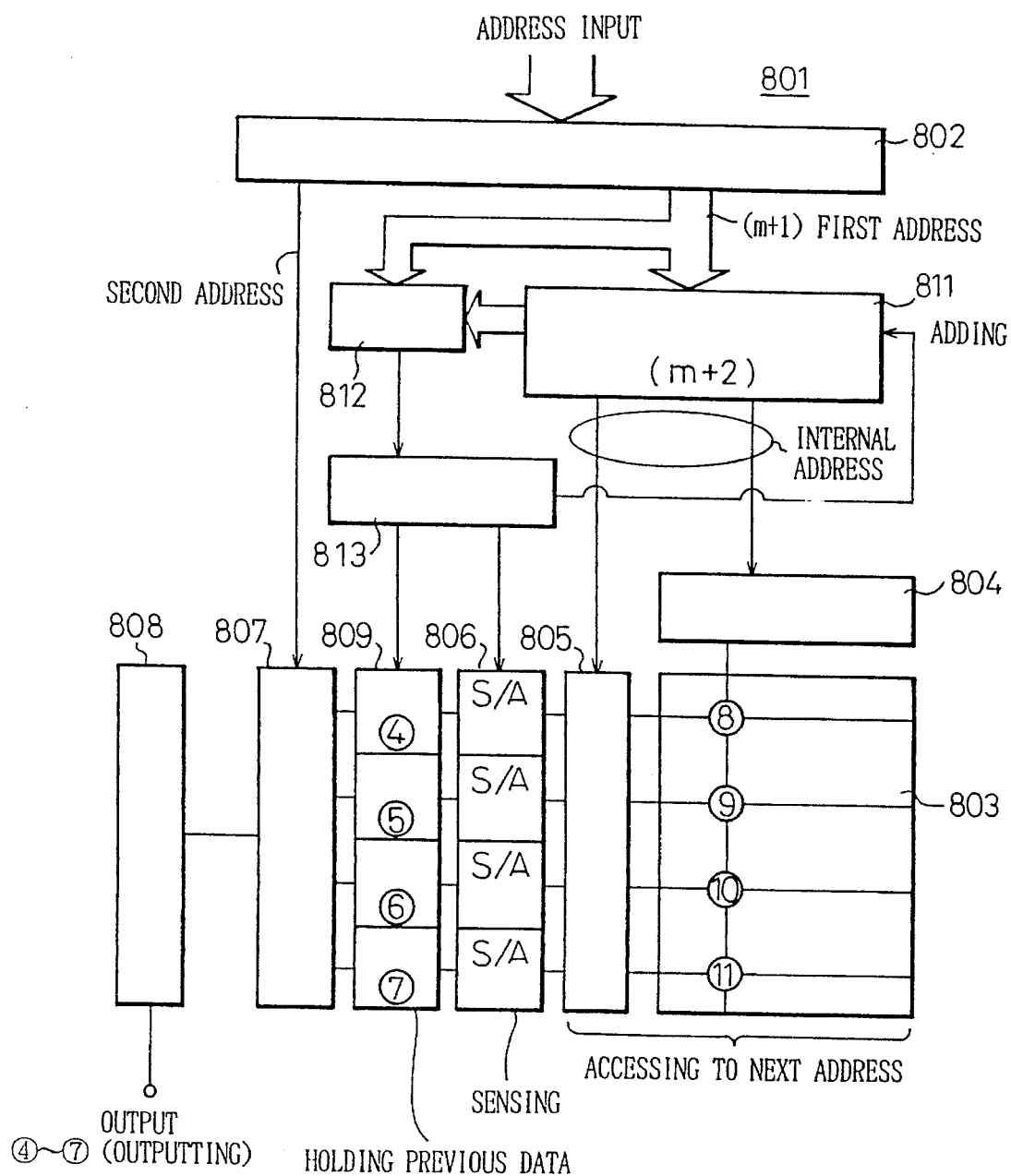

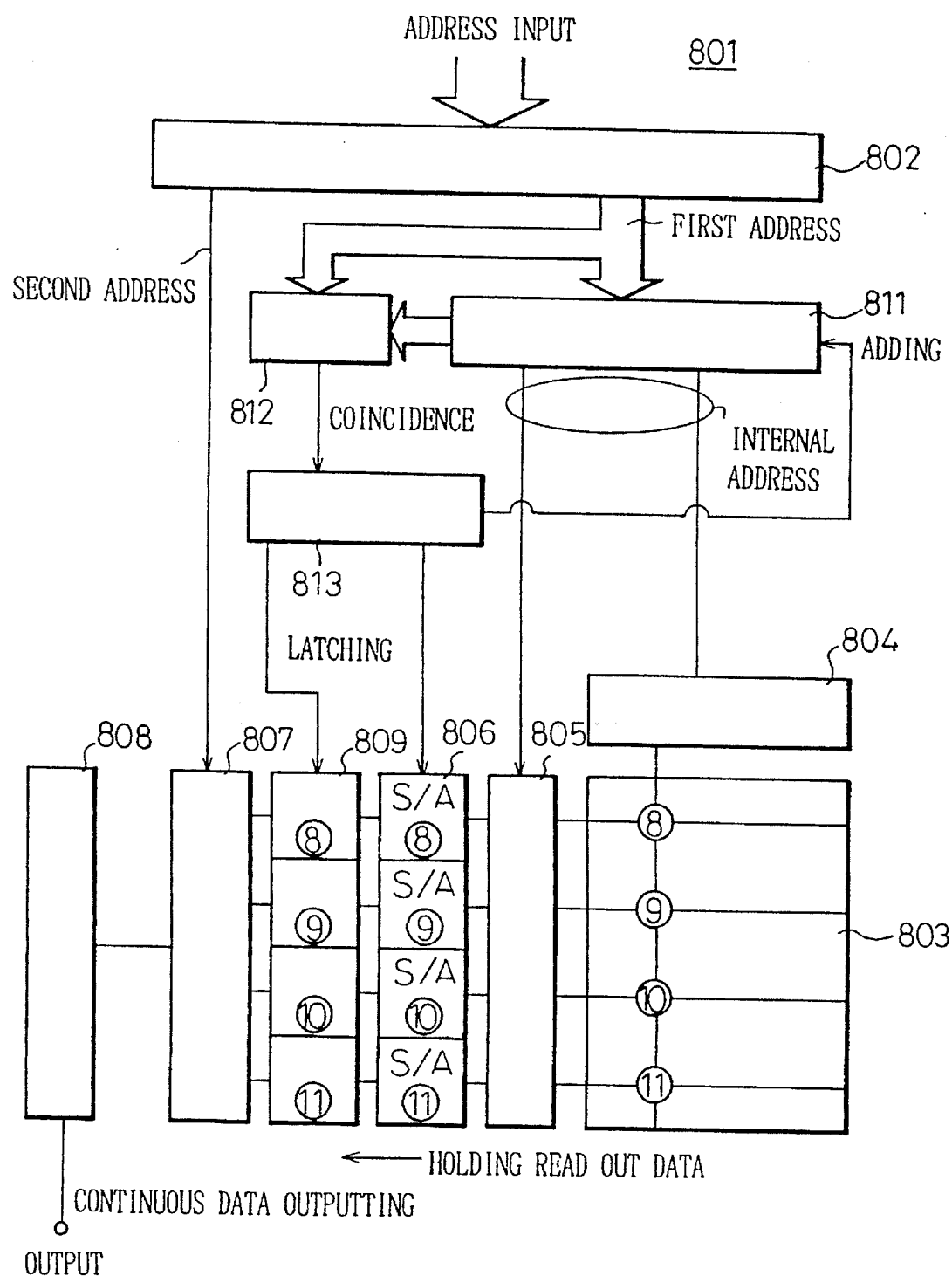

NONVOLATILE SEMICONDUCTOR MEMORY

This is a divisional, of application Ser. No. 07/996,942 filed Dec. 28, 1992, now U.S. Pat. No. 5,490,107.

BACKGROUND OF THE INVENTION

1. Field of Industrial Utilization

This invention relates to a nonvolatile semiconductor memory, particularly to an EPROM and an EEPROM including a nonvolatile memory circuit and, more particularly to a circuit construction of a nonvolatile semiconductor memory of the batch erasure type (hereinafter referred to as a flash memory).

The invention further relates particularly to a circuit construction concerning a sense amplifying (S/A) circuit, supply of a supply voltage, improvement in the reliability of a writing operation, and a high speed reading operation in a nonvolatile semiconductor memory.

2. Description of the Prior Art

FIG. 8 shows diagrammatically a structure of a cell used in a flash memory.

In this figure, indicated at $V_G$ is a gate terminal, at $V_D$ a drain terminal, at $V_S$ a source terminal, at 27 a control gate CG connected to the gate terminal $V_G$, and at 25 a floating gate FG which is controlled by the potential of the control gate CG.

Further, indicated at 22 is a semiconductor substrate, e.g., a semiconductor substrate having P-type conductivity. On the semiconductor substrate 22 are mounted well portions 23, 24 made of semiconductor having N-type conductivity. The well portion 23 forms a drain while the well portion 24 forms a source. Indicated at 26, 28 are insulating films.

When data is read from the cell, 0 V is applied to the source terminal $V_S$, a read voltage (normal supply voltage $V_{CC}$) of 5 V is applied to the gate terminal $V_G$, and a voltage of about 1 V is applied to the drain terminal $V_D$. Then, it is discriminated whether the read data is "1" or "0" depending upon whether a current flows through the cell. On the other hand, when data is written in the cell, 0 V is applied to the source terminal $V_S$, a write/erase voltage $V_{PP}$ of about 12 V is applied to the gate terminal $V_G$, and a write drain voltage $V_W$ (lower than $V_{PP}$) is applied to the drain terminal $V_D$. Thereby, electrons are injected into the floating gate FG from a drain region (writing operation). Further, when the data is erased, the drain terminal $V_D$ is brought into an open state, and 0 V and the write/erase voltage $V_{PP}$ are applied to the gate terminal $V_G$ and the source terminal $V_S$ respectively. Thereby, the electrons are taken from the floating gate FG to a source region (erasing operation).

When the data is written, it is required to check whether the data is written sufficiently in the memory cell (write verification). Likewise, when the data is written, it is required to check whether the data is erased sufficiently from the memory cell (erase verification).

The write verification and erase verification are carried out so as to confirm whether the degree of writing and the degree of erasing have a sufficient margin for the read voltage, i.e., a variation range of the normal supply voltage $V_{CC}$ (5 V±0.5 V). Generally, these verifications are carried out to confirm that an operation margin of about 0.5 V to 1.0 V is available for a voltage range of $V_{CC}$. In this case, the verify voltage including the operation margin is 6 V to 6.5 V in the write verification, and 3.5 V to 4 V in the erase verification.

It is expected that the write verification and the erase verification can be accomplished easily if the verify voltage including the operation margin to be secured is applied to word lines (for example, word lines $WL_1$ to $WL_m$ of the flash memory shown in FIG. 1), so that the sensitivity of the S/A circuit is same regardless of whether the voltage $V_{CC}$ or the verify voltage is applied as the supply voltage of the S/A circuit.

FIG. 9 shows a construction of a general S/A circuit used in the nonvolatile semiconductor memory such as an EPROM.

In this figure, indicated at $V_{CC}$ is a line of a supply voltage 5 V, and at $V_{SS}$ a line of a supply voltage 0 V. Between the power supply lines $V_{CC}$ and $V_{SS}$ are connected a p-channel transistor 11 and an n-channel transistor 12 in series. A gate of the transistor 11 is connected to power supply line $V_{SS}$, while a gate of the transistor 12 is connected to a data line (i.e., a bit line). Between the power supply line $V_{CC}$ and the data line is connected an n-channel transistor 13 whose gate is connected to drains of the respective transistors 11, 12. Likewise, between the power supply line $V_{CC}$ and the data line are connected a p-channel transistor 14 and an n-channel transistor 15 in series. A gate of the transistor 14 is connected to the power supply line $V_{SS}$, while a gate of the transistor 15 is connected to the drains of the respective transistors 11, 12. An output (data output) of the S/A circuit is taken from drains of the respective transistors 14, 15.

In this construction, when the data read from the memory cell is "1", i.e., when the level of the data line is "H", the transistor 12 is turned on and thereby a drain potential thereof is reduced to "L" level. Accordingly, the transistor 15 is cut off. Thus, the voltage of "H" level is output from the power supply line $V_{CC}$ through the transistor 14 (data output). In other words, the data having the same level as the read data is sensed. Conversely, when the data read from the memory cell is "0", the transistor 12 is cut off and the voltage of "H" level is fed from the power supply line $V_{CC}$ through the transistor 11 to the gate of the transistor 15 to turn the transistor 15 on. Thereupon, the level of a data output line is reduced to "L" (the data of "L" level is the same as the read data).

In this way, the transistor 15 is provided with a function of transmitting the level of the bit line to the data output line (bit line level adjustment), and the transistor 14 is provided with a function of discriminating the data of the memory cell according to the state (on/off) of the transistor 15.

In the construction of the conventional S/A circuit as described above, the sensitivity of the S/A circuit becomes dependent on the voltage $V_{CC}$ since the voltage $V_{CC}$ is used as a supply voltage, thus presenting the problem that an original object of the verification cannot be accomplished.

On the other hand, the desired object can be accomplished if the voltage $V_{CC}$ is replaced by the verify voltage. However, since all the power to be consumed by the S/A circuit must be supplied by the verify voltage, the size, i.e., the current supplying performance of a power supply circuit for supplying the verify voltage is disadvantageously required to be increased.

Further, in the case where the writing operation is carried out in such a manner that a current within a dead band of the sense amplifier is caused to flow through the cell transistor in the conventional nonvolatile semiconductor memory, the sense amplifier oscillates during the reading operation and the data cannot be read accurately. However, the inaccurate reading operation cannot be verified in the write verification, thus the conventional nonvolatile semiconductor memory has lacked the reliability of the written data.

Moreover, in recent years, a high speed operation has been aimed at. However, there is a limit in carrying out the data writing, data reading, and erasing operations at a high speed in the conventional nonvolatile semiconductor memory in terms of its circuit construction and software, thus realization of higher operations are earnestly demanded.

SUMMARY OF THE INVENTION

The present invention pertains to a nonvolatile semiconductor memory capable of solving the aforementioned various problems collectively and having high utility value. A first aspect according to the invention is developed in view of the problems residing in the prior art, and an object thereof is to provide a nonvolatile semiconductor memory in which an S/A circuit is permitted to have the sensitivity compatible with any of a write verification and an erase verification even if a normal supply voltage is used, that is, a verification can be conducted sufficiently.

An object of a second aspect according to the invention is to provide a nonvolatile semiconductor memory capable of, when data is written in a cell transistor, verifying whether a writing operation to the cell transistor is sufficient to the degree that a sense amplifier does not oscillate during a reading operation, and of carrying out the sufficient writing operation to the degree that the sense amplifier does not oscillate during the reading operation.

Also, a third aspect according to the invention pertains to a nonvolatile semiconductor memory including a sense amplifier for detecting a current, and an object thereof is to provide a nonvolatile semiconductor memory capable of shortening a reading time during a reading operation when a current flows through a memory cell transistor, to thereby carry out the reading operation at high speed.

Further, an object of a fourth aspect according to the invention is to solve conventional problems residing in an internal supply voltage generating circuit used mainly in the nonvolatile semiconductor memory and to provide the internal supply voltage generating circuit capable of reducing a current consumption and supplying an external supply voltage after reducing the same stably.

Moreover, an object of a fifth aspect according to the invention is to provide a nonvolatile semiconductor memory in which a read voltage is reduced to a low voltage so as to consume less power. This nonvolatile semiconductor memory is capable of carrying out verification satisfactorily and assuring a stable device operation even when it is operated at a voltage obtained by reducing a supply voltage internally.

Further, in the nonvolatile semiconductor memory of the prior art, since there is variation in an erasing characteristic of the memory cell transistors, it takes time to erase the information written in the memory reliably, which creates a risk of erasing even necessary information. In view of these problems, an object of a sixth aspect according to the invention is to provide a nonvolatile semiconductor memory capable of shortening an erase verifying time and a time required to erase information, and of carrying out an erasing operation such that there is no memory cell transistor having necessary information erased therefrom.

The prior art has also the problem that, when a read mode is executed in the nonvolatile semiconductor memory such as a flash type memory, the write data and the erase data in the read mode are erroneously determined, and thereby write and erase errors are liable to occur. An object of a seventh aspect according to the invention is to overcome the defects residing in the prior art and to provide a power supply circuit used in a nonvolatile semiconductor memory such as a flash type memory, the power supply circuit being provided with a supply voltage generating function with which a plurality of different supply voltages can be generated easily.

Moreover, in the nonvolatile semiconductor memory of the prior art, in the case where continuous addresses greater than the number of built-in sense amplifiers per bit are accessed, there exists halfway a waiting time for an operation of the sense amplifier. Thus, it is impossible to read an output of a corresponding data at regular time intervals and at a high speed. An object of an eighth aspect according to the invention is to overcome the defects residing in the prior art and to provide a nonvolatile semiconductor memory capable of reading a plurality of data stored in memory cell means at high speed and, particularly a nonvolatile semiconductor memory capable of reading continuous addresses at high speed and at regular time intervals.

In order to accomplish each of the objects mentioned above, the invention adopts a basic technological construction as described below.

According to the first aspect of the invention, there is provided a nonvolatile semiconductor memory comprising a cell matrix circuit (1) having erasable nonvolatile memory cell transistors ($M_{ij}$) arranged at intersections of a plurality of word lines ($WL_1$ to $WL_m$) and a plurality of bit lines ($BL_{ll}$ to $BL_{lk}$, . . . , $BL_{nl}$ to $BL_{nk}$); a row decoding circuit (3); a column decoding circuit (5); sense amplifying circuits ($7_1$ to $7_n$) connected to the respective bit lines ($BL_{ll}$ to $BL_{lk}$, . . . , $BL_{nl}$ to $BL_{nk}$) of the cell matrix circuit (1); and an internal source voltage generating circuit which is connected to at least one external power source and is adapted to generate a plurality of kinds of internal source voltages from an external supply voltage, the respective circuits being operative in response to the plurality of voltages output from the internal source voltage generating circuit, wherein the plurality of kinds of voltages generated by the internal source voltage generating circuit include at least either one of a normal source voltage and a specific verify source voltage.

And further there is provided nonvolatile semiconductor memory having the same construction as mentioned above except the internal source voltage and instead, the external power source has a normal source voltage generating means and a specific verify source voltage generating means, independently so that the circuits mentioned above carry out predetermined operations according to any one of the normal source voltage and the specific verify source voltage in response to a predetermined selection signal.

According to the second aspect of the invention, there is provided a nonvolatile semiconductor memory comprising a cell matrix circuit (1) having erasable nonvolatile memory cell transistors ($M_{ij}$) arranged at intersections of a plurality of word lines ($WL_1$ to $WL_m$) and a plurality of bit lines ($BL_{ll}$ to $BL_{lk}$, . . . , $BL_{nl}$ to $BL_{nk}$); a row decoding circuit (3); a column decoding circuit (5); sense amplifying circuits ($7_1$ to $7_n$) connected to the respective bit lines ($BL_{ll}$ to $BL_{lk}$, . . . , $BL_{nl}$ to $BL_{nk}$) of the cell matrix circuit (1); specified writing means; verifying means for determining whether specified information has been stored or erased properly in the memory cell transistor, the verifying means including means for detecting an output voltage of the sense amplifier, comparing means for comparing the output voltage with a predetermined reference voltage value, and memory means for storing the comparison result; and means for, in the case where information output from the memory means indicates that the specified information is written in the memory cell transistor insufficiently based on an output from the comparison result as a result of a verifying operation carried out after a specified writing operation, repeating the specified writing operation.

According to the third aspect of the invention, each sense amplifying circuit in the aforementioned nonvolatile semiconductor memory includes load means and a first transistor for detecting a current arranged in series between a high voltage supply and one terminal of the bit line connected to the memory cell transistor; an output portion provided at a node of the load means and the first transistor; an inverter arranged between a gate of the first transistor and a terminal of the bit line; and a second transistor for amplifying the current arranged between the terminal of the bit line and a low voltage supply, a gate of the second transistor being connected to an output portion of the inverter.

According to the fourth aspect of the invention, there is provided an internal supply voltage generating circuit for use in the aforementioned nonvolatile semiconductor memories, comprising voltage reducing means for reducing an external supply voltage ($V_{CC}$) to a specified internal voltage ($V_{ci}$), the voltage reducing means including a transistor (Q) connected between a line of the external supply voltage and a node (N) where the internal voltage is generated, wherein a reference voltage of a predetermined level is applied to a gate of the transistor thereby to take out the reduced internal voltage from the internal voltage generating node.

According to the fifth aspect of the invention, there is provided a nonvolatile semiconductor memory comprising external voltage reducing means constructed similar to the one in the fourth aspect but to receive a read external supply voltage ($V_{CC}$) and a write external supply voltage ($V_{PP}$), means for reducing the read external supply voltage ($V_{CC}$) to a given value so as to operate a circuit for carrying out a reading operation in the nonvolatile semiconductor memory, and means for generating a word line potential at which verification is carried out after a writing operation by reducing the write external supply voltage ($V_{PP}$).

According to the sixth aspect of the invention, all the memory cell transistors constituting the cell matrix circuit in the aforementioned nonvolatile semiconductor memories are connected in parallel with one another while being in on-states, and the cell matrix circuit has voltage discriminating means connected thereto, the voltage discriminating means including voltage detecting means for detecting a generated voltage in response to a current flowing through all the memory cell transistors, reference voltage generating means, and comparing means for comparing an output voltage from the voltage detecting means and a reference voltage output from the reference voltage generating means.

According to the seventh aspect of the invention, the aforementioned nonvolatile semiconductor memories which includes a plurality of read modes and requires different supply voltages in the respective read modes, further comprising a supply voltage input portion, reference voltage generating means, boosting means including a capacity element, and charging means for charging the capacity element, the charging means including charge amount changing means for changing a charge amount of the capacity element to a plurality of values in response to the mutually different voltages required in the respective read modes.

According to the eighth aspect of the invention, there is provided a semiconductor memory comprising first address generating means which is connected at least to address buffer means, memory cell means, word line selecting means, bit line selecting means, and an output buffer, and is adapted to designate one address to a group including a plurality of information; second address generating means for designating one address to each individual piece of information; first reading means selectively reading the plurality of information included in the group through either one of the word line selecting means and the bit line selecting means using one address value in the first address generating means; second reading means for selectively reading the individual information included in the group selectively read by the one address value in the first address generating means to the output buffer through either one of the bit line selecting means and the word line selecting means using address values in the second address generating means; and anticipatory reading means, i.e., pre-read means, for reading a plurality of information included in another group corresponding to another address in a first address group using another address value in the first address generating means until the plurality of information read by the one address from the first address generating means is selectively read to the output buffer by the respective addresses in the second address generating means after the plurality of information is read by the one address in the first address generating means.

BRIEF DESCRIPTION OF THE DRAWINGS

FIGS. 13–15 are waveform charts for explaining an operation of the specific example shown in FIG. 12;

FIGS. 16 to 19 are block diagrams for explaining the operation of the specific example shown in FIG. 12;

FIG. 20 is a circuit diagram showing an essential portion of a second specific example of a second aspect according to the invention;

FIGS. 21 to 23 are waveform charts for explaining an operation of the specific example shown in FIG. 20;

FIGS. 24 to 27 are block diagrams for explaining the operation of the specific example shown in FIG. 20;

FIGS. 38(A) and 38(B) are a waveform charts comparatively showing an operation of the sense amplifier used in FIG. 37 and an operation of the sense amplifier shown in FIG. 30;

FIG. 40 is a circuit diagram showing an exemplary voltage reducing circuit in the semiconductor device of the prior art;

FIG. 41 is a diagram showing an operation characteristic of the circuit shown in FIG. 40;

FIGS. 52(A), 52(B), and 52(C) are circuit diagrams of a supply voltage switching unit of a nonvolatile semiconductor memory in a second specific example of the fifth mode according to the invention, wherein FIG. 52(A) is a circuit diagram, FIG. 52(B) is a circuit diagram of a verify voltage generating circuit, and FIG. 52(C) is a voltage waveform chart of signals $\phi 1$, $\phi 2$;

FIGS. 67(A), 67(B), 67(C), 67(D) and 67(E) are timing charts in the supply voltage generating circuit shown in FIG. 66;

FIG. 83 is a timing chart in the case where the semiconductor memory of the prior art is used;

FIGS. 87 to 92 are block diagrams showing the operation procedure of the semiconductor memory according to the eight mode of the invention.

DETAILED DESCRIPTION OF THE PREFERRED EMBODIMENTS

Figure 1:
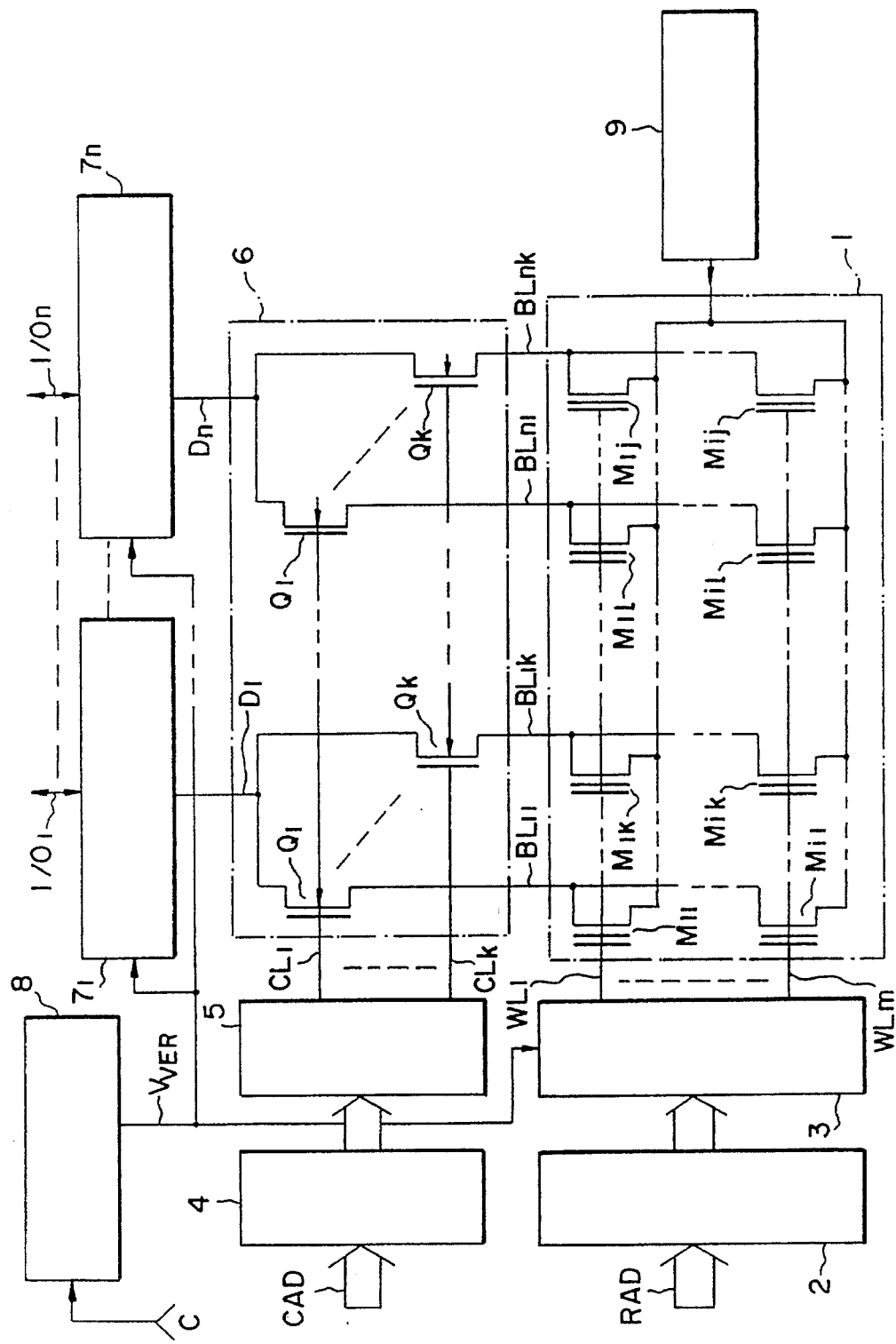
FIG. 1 is an overall construction diagram showing a flash memory as an embodiment of the invention.

In order to solve the aforementioned problems, according to a first aspect of the invention, there is provided a nonvolatile semiconductor memory comprising a cell matrix circuit (1) having erasable nonvolatile memory cell transistors ($M_{ij}$) arranged at intersections of a plurality of word lines ($WL_1$ to $WL_m$) and a plurality of bit lines ($BL_{ll}$ to $BL_{lk}$, ..., $BL_{nl}$ to $BL_{nk}$); a row decoding circuit (3); a column decoding circuit (5); sense amplifying circuits ($7_1$ to $7_n$) connected to the respective bit lines ($BL_{ll}$ to $BL_{lk}$, ..., $BL_{nl}$ to $BL_{nk}$) of the cell matrix circuit (1); and an internal source voltage generating circuit which is connected to at least one external power supply and is adapted to generate a plurality of kinds of internal source voltages from an external source voltage, the respective circuits being operative in response to the plurality of voltages output from the internal source voltage generating circuit, wherein the plurality of kinds of voltages generated by the internal source voltage generating circuit include at least either one of a normal source voltage and a specific verify source voltage.

Specifically, the nonvolatile semiconductor memory comprises a cell matrix including erasable nonvolatile memory cells arranged at the intersections of the plurality of word lines and the plurality of bit lines, sense amplifying (S/A) circuits having two different kinds of source voltages supplied thereto and adapted to apply sense amplification to data of the selected line in the cell matrix, and a verify source voltage supply circuit for generating the two different kinds of source voltages in accordance with a control signal for instructing a write verification or erase verification, wherein a normal source voltage and a specific verify source voltage different from the normal source voltage are generated as the two different kinds of source voltages during the verification and the verify source voltage is applied to the selected word line.

With the above construction, the specific verify source voltage different from the normal source voltage $V_{CC}$ is applied to the S/A circuit during the write verification or erase verification, and also to the selected word line. Accordingly, the sensitivity of the S/A circuit to the normal source voltage during a reading operation can be made equal to that of the S/A circuit to the verify source voltage during the verification. Further, margins during a data writing operation and an erasing operation can be checked sufficiently.

The voltage supply circuit for supplying the verify source voltage $V_{VER}$ is used to reduce or boost the external source voltage of, e.g., 5 V, to a specified level. However, the size of the voltage supply circuit is determined by to which place the verify source voltage needs to be supplied. Accordingly, a feature of the first mode of the invention is to limit a place where the verify source voltage is supplied.

In this way, the reading operation can be executed in the same state as in the prior art by supplying the verify source voltage to limited places. This makes a capacity of the verify source voltage supply circuit small, thereby permitting an area of the semiconductor memory itself to be reduced.

In the present invention, the verify source voltage supplying circuit of the nonvolatile semiconductor memory is not restricted only to the internal source voltage genarating circuit as mentioned above, the nonvolatile semiconductor memory can be provided with a optional external source voltage supplying means in which a normal source voltage generating circuit and a specific verify source voltage generating circuit capable of generating a source voltage different from the normal source voltage in the write verify operation and the erase verify operation, respectively.

And in that, any one of the normal source voltage and the specific verify source voltage can be selected by a predetermined controlling singal.

Regarding the embodiment as mentioned above, there is provided a nonvolatile semiconductor memory.

Features and actions of the aforementioned first aspect according to the invention will be described in detail with reference to the accompanying drawings hereafter.

FIG. 1, partially a block diagram, shows an overall construction of a flash type memory as a specific example of the first mode of the invention.

In this figure, indicated at 1 is a cell array formed by arranging erasable nonvolatile memory cells $M_{ij}$ at intersections of a plurality of word lines $WL_1$ to $WL_m$ and a plurality of bit lines $BL_{ll}$ to $BL_{lk}$, ..., $BL_{nl}$ to $BL_{nk}$. In this embodiment, the cell array is divided into n blocks, in each of which (k×m) memory cells are arranged. Indicated at 2 is a row address buffer for buffering a row address RAD of an address signal fed externally thereto, at 3 a row decoder for decoding the row address and selecting any one of the word lines $WL_1$ to $WL_m$, at 4 a column address buffer for buffering a column address CAD of the address signal, and at 5 a column decoder for decoding the column address and selecting any one of column lines $CL_1$ to $CL_k$ corresponding to the bit lines $BLi_1$ to $BLi_k$ for each of the aforementioned blocks. Indicated at 6 is a column gate circuit including transfer gate transistors $Q_1$ to $Q_k$ corresponding to the bit lines $BL_{il}$ to $BL_{ik}$ for each of the aforementioned blocks. The respective transistors $Q_1$ to $Q_k$ are turned on when the corresponding column lines $CL_1$ to $CL_k$ are selected, to thereby connect the selected bit line $BL_{ij}$ to a data line $D_i$.

Indicated at $7_1$ to $7_n$ are respectively writing circuits and S/A circuits for applying amplification to a write data and sense amplification to a read data between corresponding internal data lines $D_1$ to $D_n$ and external input/output data lines $I/O_1$ to $I/O_n$. Indicated at 8 is a verify source voltage generating circuit for generating a verify voltage $V_{VER}$ in accordance with a control signal fed externally thereto. The generated verify source voltage $V_{VER}$ is supplied to the selected work lines $WL_1$ to $WL_m$ through the row decoder 3 as described later, and to the S/A circuit corresponding to the selected word line. Indicated at 9 is a source voltage supply circuit for supplying a source voltage in common to the respective sources of the nonvolatile memory cells $M_{ij}$.

Figure 2:
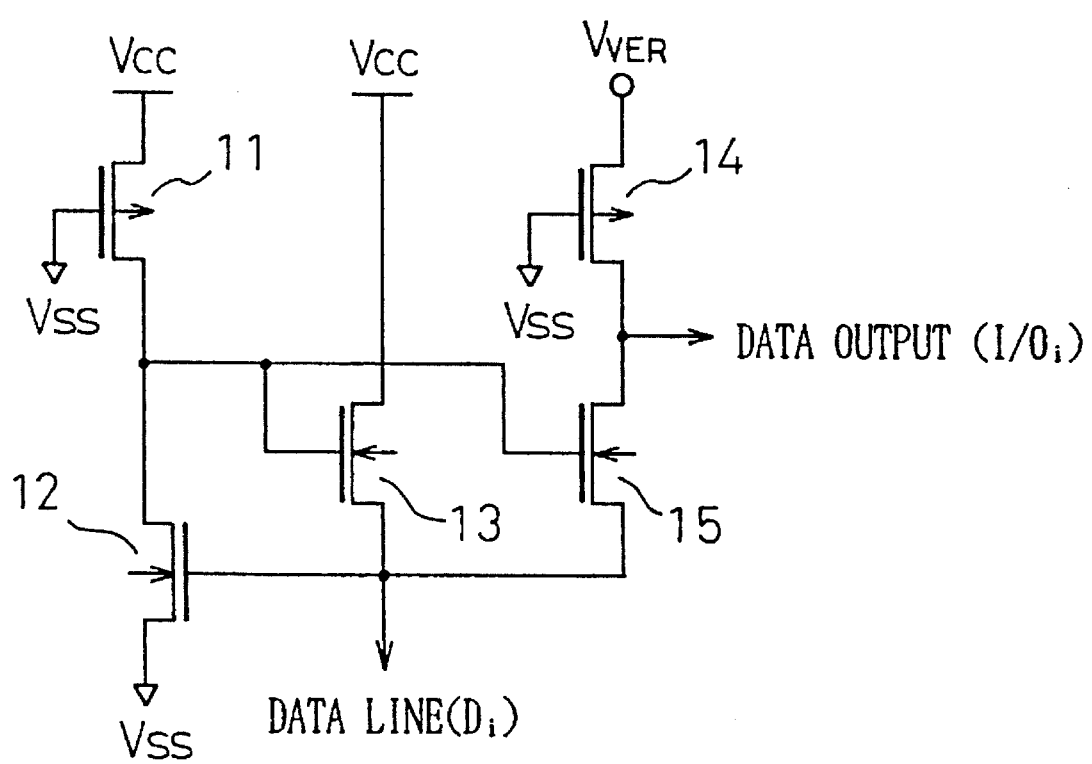
FIG. 2 is a circuit diagram showing an exemplary construction of an S/A circuit in FIG. 1.

FIG. 2 shows an exemplary construction of the S/A circuit used in a specific example of the first aspect according to the invention.

Figure 9:
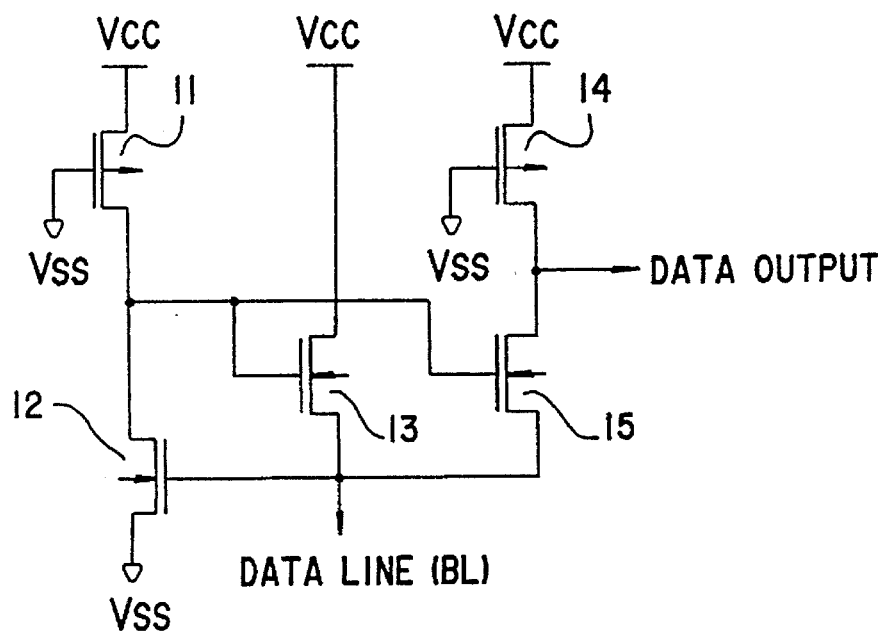
FIG. 9 is a circuit diagram showing a construction of the S/A circuit as an example of the prior art.

An illustrated circuit corresponds to a part of the writing circuits and S/A circuits $7_1$ to $7_n$ and a construction thereof is same as the one of the conventional S/A circuit shown in FIG. 9, and accordingly no description is given of the construction. This construction differs from the one shown in FIG. 9 in that the verify voltage $V_{VER}$ is supplied to a source of a transistor 14 illustrated as a load resistance element 14 for discriminating the data stored in the memory cell. As will be described later, this verify voltage $V_{VER}$ is a variable voltage set such that it is at the same level as a supply voltage $V_{CC}$ during a normal reading operation while being at the same level as the potential of the word line during a verifying operation.

Figure 3:
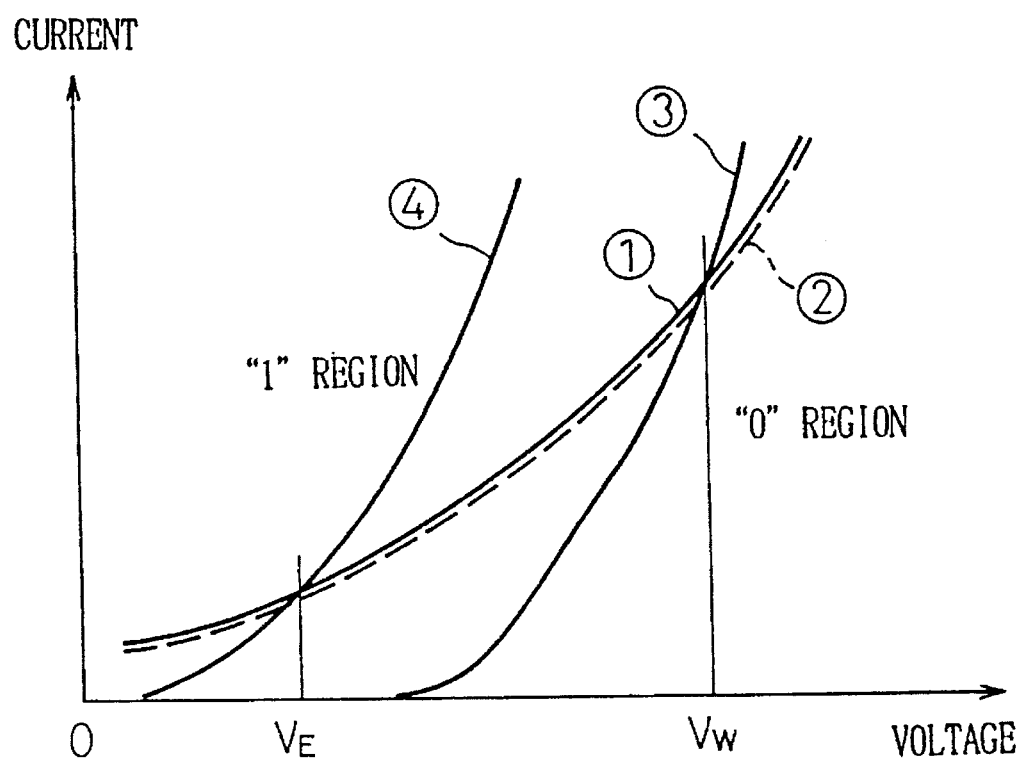
FIG. 3 is a graph showing a characteristic of the S/A circuit in FIG. 2.

When obtained mathematically, a sense voltage curve of the S/A circuit in this embodiment is as shown in FIG. 3.

In this figure, a curve (1) indicated by solid line represents a sense characteristic curve when $V_{CC}$ is changed in a state where the verify source voltage is set equal to the normal source voltage ($V_{VER}=V_{CC}$); and a curve (2) indicated by broken line represents a sense characteristic curve when the verify source voltage $V_{VER}$ is changed in a state when $V_{CC}$ is held at 5 V. Further, a curve (3) represents a cell current characteristic curve after the data is written; and a curve (4) represents the cell current characteristic curve after the data is erased. Indicated at $V_W$ is a write verify source voltage, and at $V_E$ is an erase verify source voltage. The data is discriminated to be "1" when a larger amount of current flows through the cell while being discriminated to be "0" when a smaller amount of current flows through the cell, compared to the current indicated by the sense characteristic curves (1), (2).

It can be seen from the characteristic curves shown in FIG. 3 that the sensitivity of the S/A circuit is practically the same in both cases where only the verify voltage $V_{VER}$ is changed and where $V_{CC}$ is changed in the state where $V_{VER}=V_{CC}$. In other words, as a conventional method for checking the verification, there is typical method in that the verification checking operation is carried out by applying the verify source voltage to the selected word line, while the verify source voltage is equally applied to over all components provided in the circuitry and to which the normal source voltage $V_{CC}$ is supplied. On the other hand, there is provided another method for checking the verification in that the verification checking operation is carried out by applying the verify source voltage to the selected word line and it is also applied only to a transister used for comparing with a voltage level of the sense amplifier used in the reading operation, while the normal source voltage $V_{CC}$ is applied to any other components provided in the circuitry as in the normal reading operation. As apparent from the FIG. 3, both methods are not different from each other in the discriminating level of the sensitivity of the sense amplifier. Accordingly, the verification can be carried out at a specified operating power supply margin.

Since the verify voltage circuit 8 supply the voltage only to the transistor 14, this embodiment is advantageous in terms of a supply ability of the verify voltage circuit. In other words, the size of a transistor contributing to supply the current, provided in the circuit can be prevented from being increased by avoiding waste.

Figure 4:
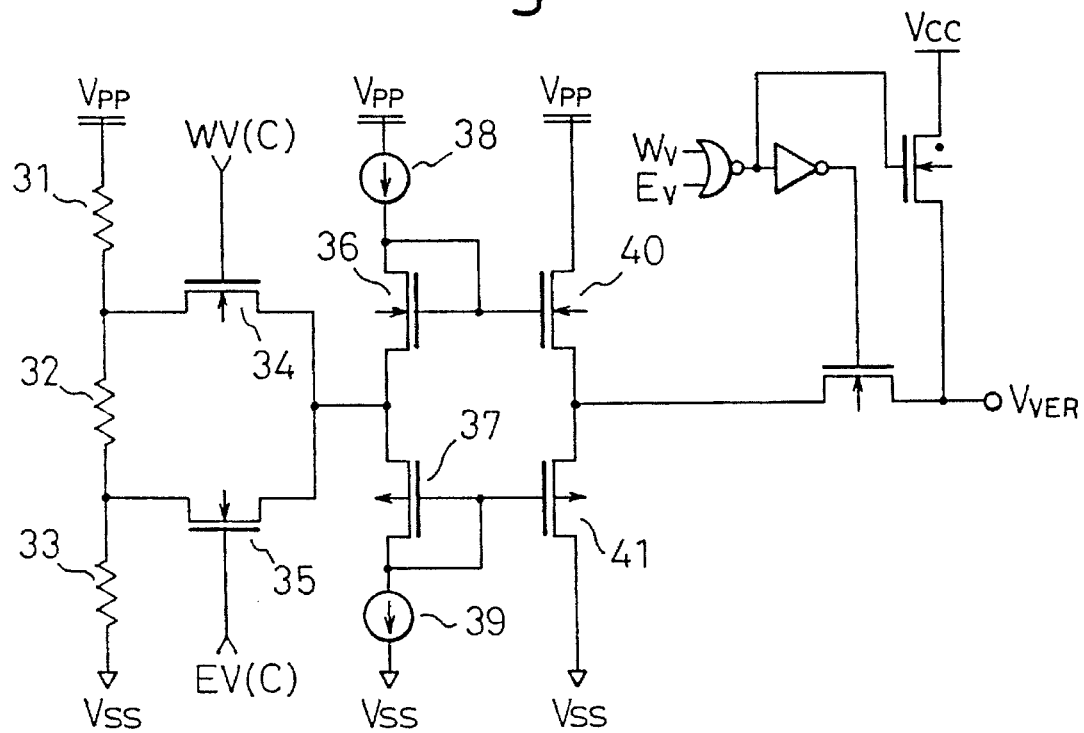
FIG. 4 is a construction diagram of a verify voltage supply circuit in FIG. 1.

FIG. 4 shows an exemplary construction of the verify voltage circuit 8.

An illustrated circuit includes resistors 31 to 33 connected in series between a line of a write/erase voltage $V_{PP}$ and a power supply line $V_{SS}$, an n-channel transistor 34 having a source thereof connected to a node of the resistors 31, 32 and responsive to a write verify signal WV, an n-channel transistor 35 having a source thereof connected to a node of the resistors 32, 33 and responsive to an erase verify signal EV, an n-channel transistor 36 whose source is connected to drains of the respective transistors 34, 35 and whose gate is connected to a drain of its own, a p-channel transistor 37 whose source is connected to the drains of the respective transistors 34, 35 and whose gate is connected to a drain of its own, a current supply 38 connected between a line of the voltage $V_{PP}$ and the drain of the transistor 36, a current supply 39 connected between the drain of the transistor 37 and the power supply line $V_{SS}$, an n-channel transistor 40 and a p-channel transistor 41 connected in series between the line of the voltage $V_{PP}$ and the power supply line $V_{SS}$ and having gates connected to the corresponding gates of the transistors 36, 37. The verify voltage $V_{VER}$ is taken from the sources of the respective transistors 40, 41.

In this construction, the resistors 31 to 33 divide the write/erase voltage $V_{PP}$ (12 V). In this embodiment, resistance values of the respective resistors are set so that the potential at the node of the resistors 31, 32 is 6.5 V (maximum voltage for the write verification) and the potential at the node of the resistors 32, 33 is 3.5 V (minimum voltage for the erase verification). Further, the transistors 36, 37, 40, 41 and the current supplies 38, 39 constitute a sort of current mirror circuit, which functions so that the potential at a node of the transistors 36, 37 becomes equal to an output voltage (verify voltage $V_{VER}$).

It is desirable to set the erase verify source voltage $V_E$ lower than the normal source voltage ($V_{CC}$) and to set the write verify source voltage $V_W$ higher than the normal source voltage ($V_{CC}$). Preferably, the normal supply voltage ($V_{CC}$) is an intermediate value between a first verify voltage which is the erase verify voltage and a second verify voltage which is the write verify voltage.

In this case, the desirable range of the write verify source voltage $V_W$ and the erase verify source voltage $V_E$ can be determined with reference to the graphs as shown in FIG. 3.

Note, that when the erase verify source voltage $V_E$ is selectively set at the voltage level close to or exactly at the crossing point formed by the characteristic curve of the sense amplifier ((1) or (2)) and cell current characteristic curve (after data is erased) (4) and the write verify source voltage $V_W$ is selectively set at the voltage level close to or exactly at the crossing point formed by the characteristic curve of the sense amplifier ((1) or (2)) and cell current characteristic curve (after data is writted) (3), the accurate discrimination for the verification can be obtained.

Accordingly, if the write verify signal WV is set at "H" level during the write verification, the transistor 34 is turned on. Thus, the potential at the node of the resistors 31, 32, i.e., the voltage of 6.5 V, is applied to the node of the transistors 36, 37, and the verify voltage $V_{VER}$ of 6.5 V can be obtained by a current mirror action. On the other hand, if the erase verify signal EV is set at "H" level during the erase verification, the transistor 35 is turned on. Thus, the potential at the node of the resistors 32, 33, i.e., the voltage of 3.5 V, is applied to the node of the transistors 36, 37, and the verify voltage $V_{VER}$ of 3.5 V can be obtained by the current mirror action. If the write verify signal WV and the erase verify signal EV are both set at "H" level during the normal reading operation, the transistors 34, 35 are cut off. As a result, only the current mirror circuit operates and an intermediate level (5 V) between 6.5 V and 3.5 V is output as the output voltage $V_{VER}$. This output voltage is at the same level as the normal supply voltage $V_{CC}$.

Since an output signal of the S/A circuit is normally a weak signal in terms of the amplitude and drive ability, it is preferable to provide a buffer circuit for the purpose of stabilizing the output signal.

In the case of the flash type memory, the voltage is changed from the bit line potential (about 1 V) to the verify voltage $V_{VER}$ during the verification, it is preferable to supply the verify voltage $V_{VER}$ as a source voltage of the buffer circuit.

Figure 5:
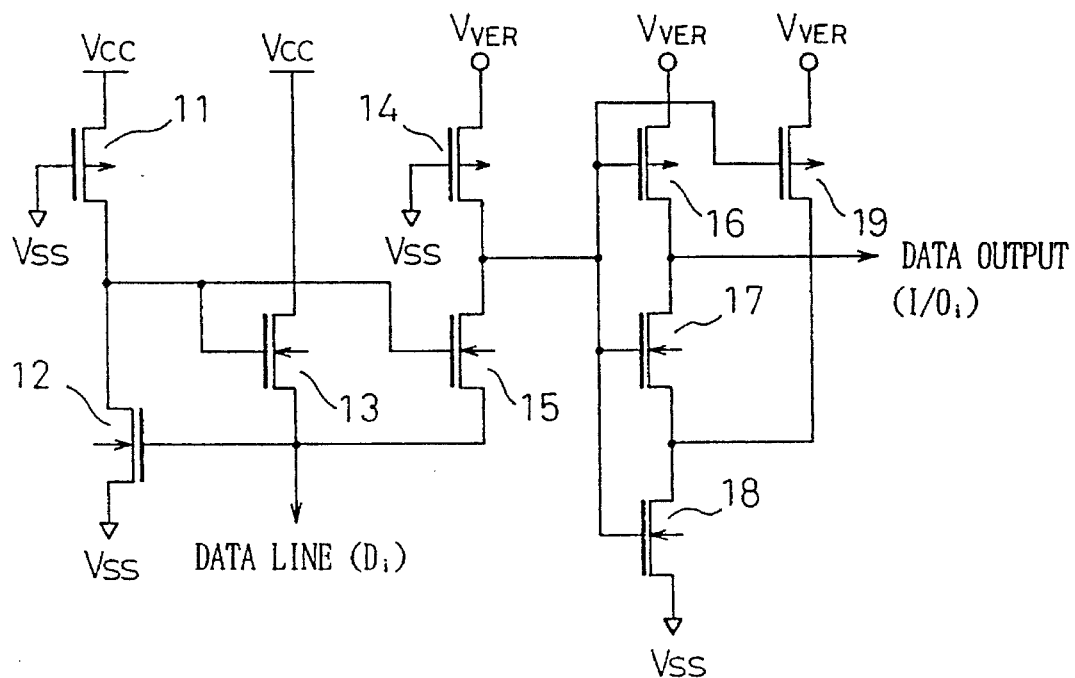
FIG. 5 is a circuit diagram showing another exemplary construction of the S/A circuit in FIG. 1.

FIG. 5 shows an exemplary construction of the S/A circuit including the buffer circuit.

The illustrated circuit is obtainable by adding the buffer circuit to the construction of FIG. 2. This buffer circuit includes a p-channel transistor 16 and n-channel transistors 17, 18 which are connected in series between the line of the verify source voltage $V_{VER}$ and the power supply line $V_{SS}$ and are responsive to the drain potentials of the respective transistors 14, 15, and a p-channel transistor 19 which is connected between the line of the voltage $V_{VER}$ and a node of the transistors 17, 18 and is responsive to the drain potentials of the respective transistors 14, 15. In this case, the output of the S/A circuit (data output) is taken from the drains of the respective transistors 16, 17.

In consideration of the operation of the flash type memory, the sense characteristic curves shown in FIG. 3 are ideally required to be devised. For example, the inclination of the sense characteristic curve is preferably large in the neighborhood of the write verify source voltage $V_W$ so that a large power supply margin is taken for a change of a threshold voltage of the cell transistor. Conversely, the inclination of the sense characteristic curve is preferably small in the neighborhood of the erase verify source voltage $V_E$ because of the ease of adjusting the voltage $V_E$ finely and in order to improve the stability of the characteristic in terms of differences among cell transistors.

Figure 6:
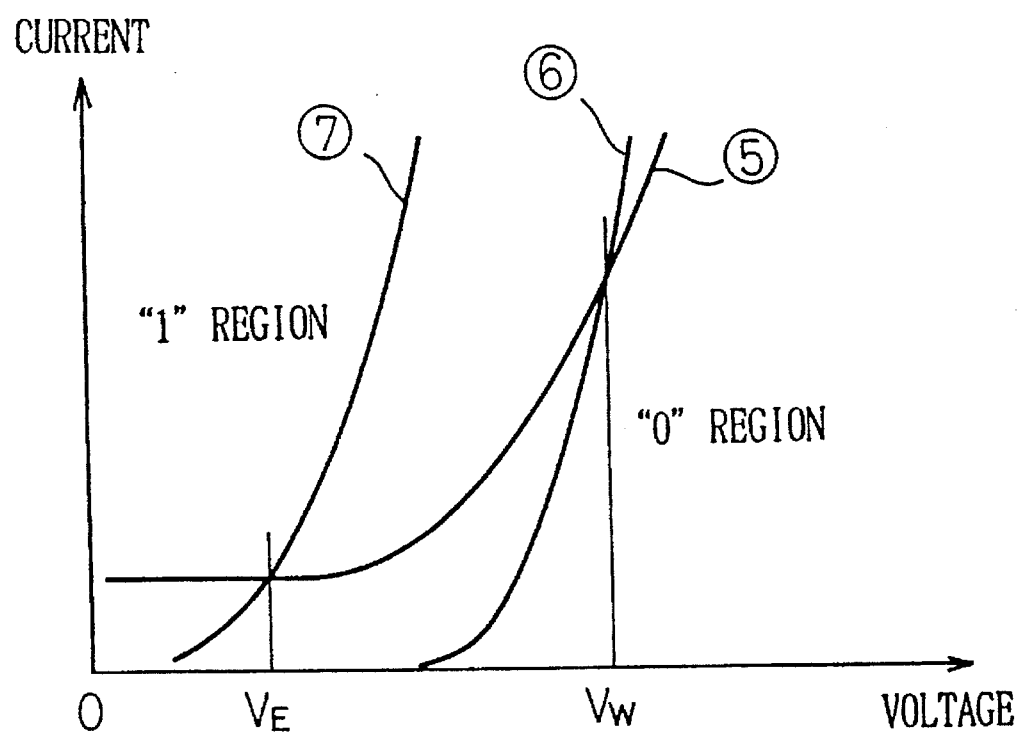
FIG. 6 is a graph showing an ideal sensing characteristic.
Figure 7:
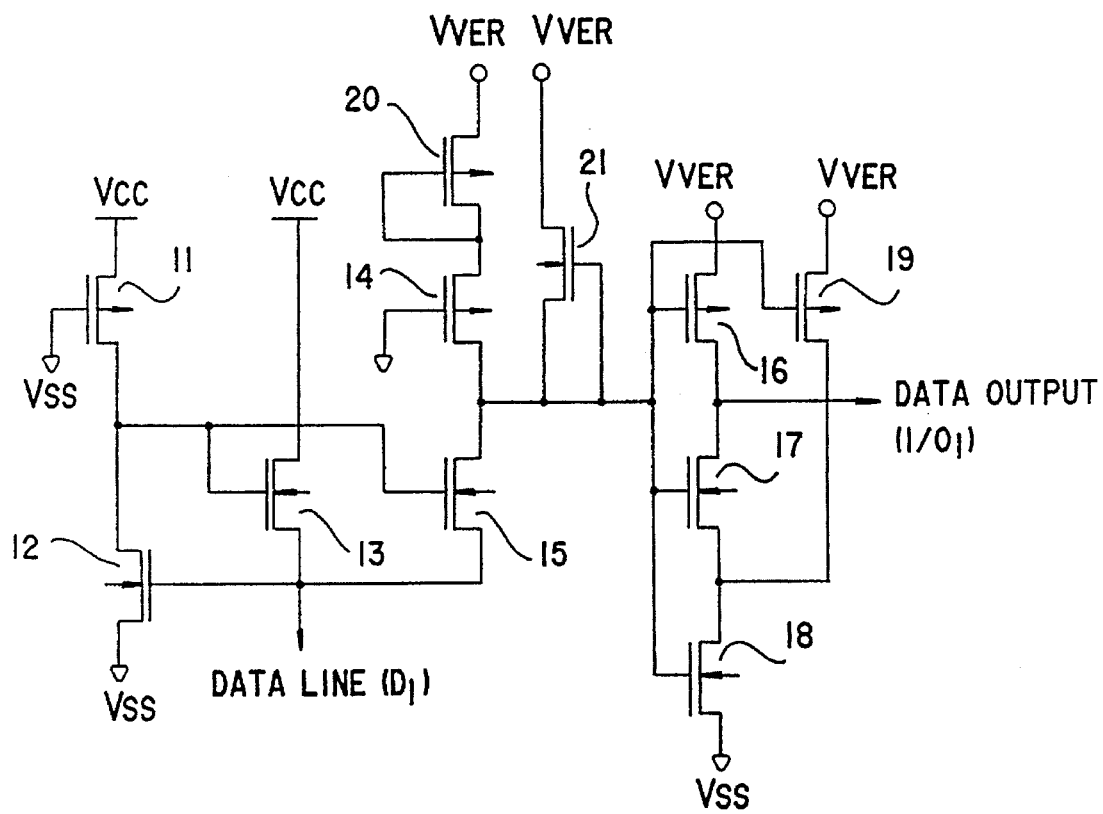
FIG. 7 is a circuit diagram showing an exemplary construction of the S/A circuit in order to realize the characteristic shown in FIG. 6.

FIG. 6 shows ideal sense characteristic curves, and FIG. 7 shows an exemplary construction of a preferable S/A circuit for realizing this characteristic.

The illustrated circuit is obtainable by adding two transistors 20 and 21 to the construction of the S/A circuit including the buffer circuit shown in FIG. 5. The transistor 20 is a p-channel transistor, and is connected between the line of the verify source voltage $V_{VER}$ and the source of the transistor 14. A gate of the transistor 20 is connected to a drain thereof. Accordingly, this transistor 20 functions as a voltage reducing element. On the other hand, the transistor 21 is an n-channel transistor of the depression type, and is connected to the voltage $V_{VER}$ and between the drain ends of the respective transistors 14,15. A gate of the transistor 21 is connected to a source thereof. Accordingly, this transistor 21 functions as a constant current supplying element.

In this construction, when the verify source voltage $v_{VER}$ is at low level, the drain potential of the voltage reducing transistor 20 is reduced accordingly. Thus, the transistor 14 is cut off and only the transistor 21 for the constant current load is turned on. In other words, there is realized a steeply inclined portion of the sense characteristic in the neighborhood of the erase verify source voltage $V_E$ shown in FIG. 6. On the contrary, when the verify source voltage $V_{VER}$ is at a relatively high level, the drain potential of the transistor 20 increases accordingly, and the transistor 14 is turned on. In other words, the transistors 21, 14 are both turned on, thereby realizing a gently inclined portion of the sense characteristic curve in the neighborhood of the write verify voltage $V_W$ shown in FIG. 6.

As described above, according to the first aspect of the invention, in over-all memory circuit, the portion to which the verify source voltage should be applied, may only be at least only the selected word line and the transister used for comparing with a voltage level provided in the sense amplifier. Note, that in accordance with the present invention, the number of the portions to which the verify source voltage should be applied in the verify operation can be remarkably reduced comparing with the conventional method in which the source voltage $V_{CC}$ applied to each of the components provided in the memory circuit is simply and uniformly converted to the verify source voltage. Accordingly, in the present invention, the number of the portions to which the source voltage should be applied is remarkably small and to thereby reduce the performance for supplying the source voltage of the verify source voltage generating circuit remarkably small comparing with the conventional method and thus the area to be occupied by the verify source voltage generating circuit can be remarkably reduced with keeping the sensitivity in the verifying operation.

Next will be described a specific example of a second aspect according to the invention next.

Figure 8:
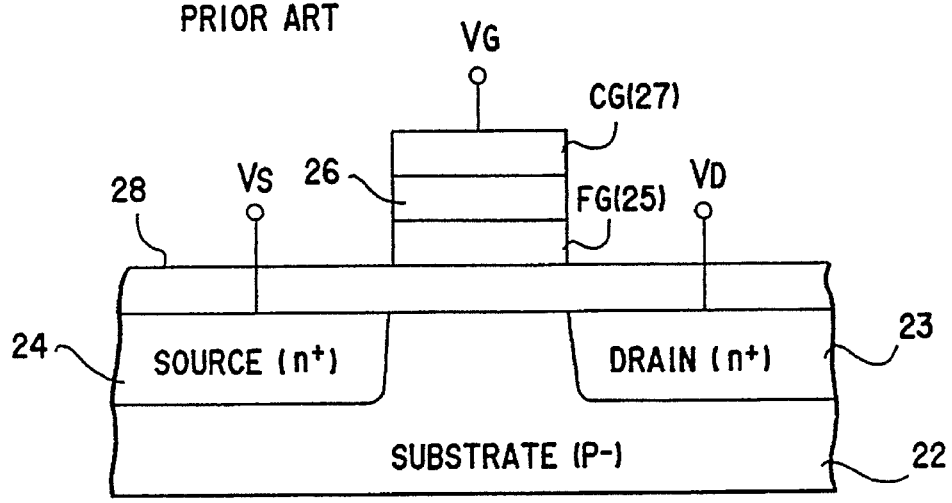
FIG. 8 is a diagram showing a cell structure for explaining an operation of the flash memory.

A memory cell transistor used in a nonvolatile semiconductor memory according to the second aspect of the invention may, for example, have a conventional construction as shown in FIG. 8.

When a high voltage of, e.g., 12.5 V, is applied to a control gate 27 and a voltage of about 7 V is applied to a drain 23, an avalanche breakdown phenomenon occurs near the drain 23. Thereby, a great number of high energy electrons are generated, and a part thereof are injected into a floating gate 25 to charge the gate 25 negative. This operation is referred to as a "writing operation" or "programming".

Figure 10:
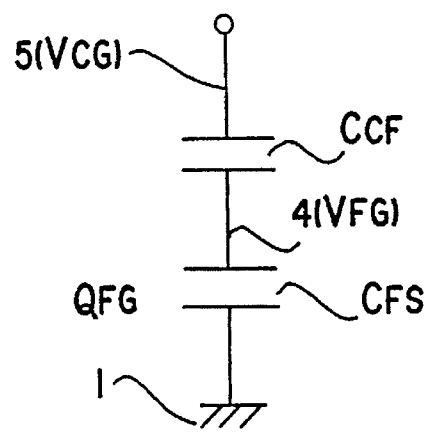
FIG. 10 is a diagram showing a relationship between a capacity between a control gate and a floating gate and a capacity between the floating gate and a substrate in a cell transistor.

Incidentally, when it is assumed that a capacity between the control gate 27 and the floating gate 25 is $C_{CF}$ and a capacity between the floating gate 25 and a p-type silicon substrate 22 is $C_{FS}$, a relationship between these capacities $C_{CF}$, $C_{FS}$ can be shown as in FIG. 10.

Further, when it is assumed that an amount of charge of the electrons injected into the floating gate 25 during the writing operation is $Q_{FG}$, a voltage of the control gate 27 is $V_{CG}$, and a voltage of the floating gate 25 is $V_{FG}$, the voltage $V_{FG}$ of the floating gate 254 can be obtained using the following equation (1).

$$V_{FG} = \frac{C_{CF} \times V_{CG}}{C_{FS} + C_{CF}} + \frac{Q_{FG}}{C_{FS} + C_{CF}} \quad (1)$$

writing operation, the charge amount $Q_{FG}$ becomes a negative value and $Q_{FG}/(C_{FS}+C_{CF})$ is about $-5$ V. On the other hand, $C_{CF}/(C_{FS}+C_{CF})$ is designed to have a value of about 0.6 V.

As a result, even if the voltage of 5 V is applied to the control gate 27, the floating gate 25 maintains the negative potential and the cell transistor is not brought into an on-state, thereby allowing no current to flow therethrough. This state is assumed as a state where an information "0" is stored.

When ultraviolet rays are projected on this cell transistor, the electrons injected in the floating gate 25 are released to a substrate 1, and the charge amount $Q_{FG}$ of the injected electrons becomes zero. This operation is referred to as an "erasing operation". In this case, with $Q_{FG}=0$, the voltage $V_{FG}$ of the floating gate 25 can be obtained using the following equation (2).

$$V_{FG} = \frac{C_{CF} \times V_{CG}}{C_{CF} + C_{CF}} \quad (2)$$

equation (2), since $C_{CF}/(C_{FS}+C_{CF})$ is designed to have a value of about 0.6 V as described above, the voltage $V_{FG}$ of the floating gate 25 becomes about 3 V if the voltage of 5 V is, for example, applied to the control gate 27 after the erasing operation.

Accordingly, the cell transistor is brought to the on-state in this case, thereby allowing a current of, e.g., 100 μA to flow therethrough. This state is assumed as a state where an information "1" is stored.

Incidentally, in the EPROM, the data is output after the sense amplifier detects the current flowing through the cell transistor during the write verification or reading operation. Specifically, the sense amplifier is provided with a discriminating level of, e.g., 50 μA, and is so designed as to output "H" (high level) on the assumption that the writing operation is not carried out if the current of not lower than 50 μA is flowing through the cell transistor, while to output "L" (low level) on the assumption that the writing operation is carried out if the current of not lower than 50 μA is not flowing through the cell transistor.

Further, in the EPROM, the following method has been adopted so as to shorten a writing time. A pulse duration of a write signal (program signal) for instructing the writing operation is shortened in accordance with the cell transistor having a good writing characteristic. As for the cell transistor having a poor writing characteristic, the write signal is applied several times, i.e., the writing operation is repeated several times, and the charge amount $Q_{FG}$ of the floating gate 4 is increased little by little during each writing operation.

More specifically, the writing operation is carried out in the following procedure. (1) An address of a writing end is given to an address terminal. (2) Write data is given to a data terminal. (3) A write signal is given to a control terminal. (4) The data is read and compared with the write data so as to verify the writing operation. (5) As a result, a next address follows if the write data coincides with the read data as a result of the verification, whereas the operations (1) to (4) are repeated again if these data are at variance with each other.

Figure 11:
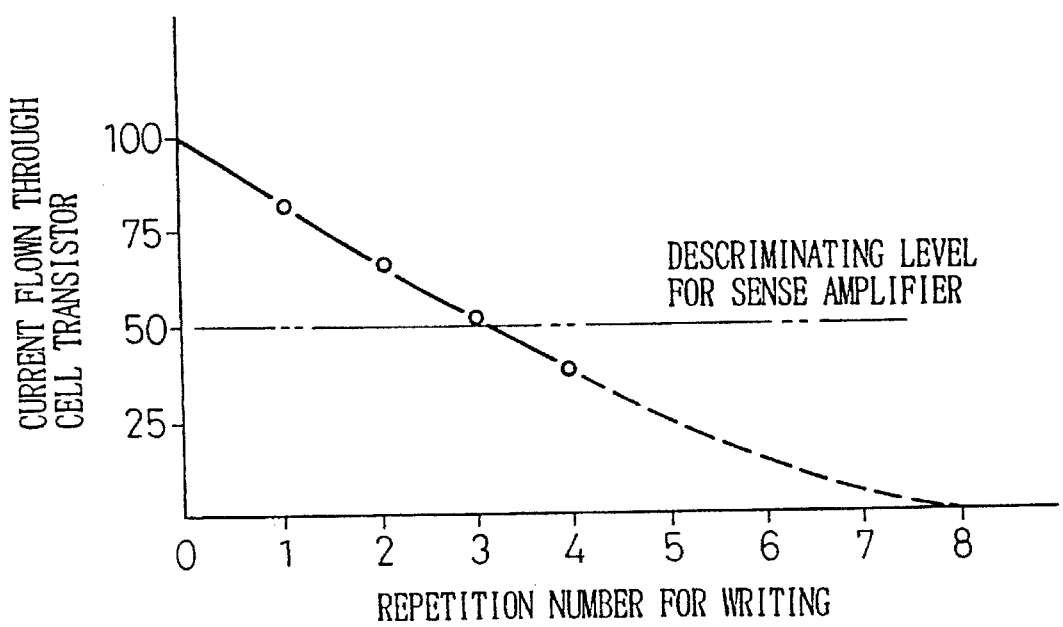
FIG. 11 is a diagram showing an exemplary relationship between the number of writing operation executed to a cell transistor having a bad writing characteristic and a current flowing through this cell transistor.

FIG. 11 shows an exemplary relationship between the number of writing operation executed to the cell transistor having the poor writing characteristic and the current flowing through the cell transistor. In this example, the current flowing through the cell transistor which was initially 100 μA, is changed to 80 μA after the first writing operation, to 63 μA after the second writing operation, to 51 μA after the third writing operation, and to 38 μA after the fourth writing operation.

In this case, the write data and the read data coincide with each other in the fourth writing operation, and the next address follows after the fourth writing operation. Therefore, the fifth writing operation is not executed to this cell transistor. In this case, no problem arises since the write voltage level is substantially below the discrimination level of the sense amplifier.

However, in this example, the current flowing through this cell transistor becomes 51 μA after the third writing operation. This current value is very close to 50 μA which is a discrimination level at which the sense amplifier discriminates whether the writing operation is carried out.

In actuality, the sense amplifier oscillates in such a case, thereby being incapable of outputting a normal output. In other words, the discrimination level has a range called a dead band. Accordingly, even if 50 μA is conceived as the discrimination level, the sense amplifier cannot discriminate, for example, a range of 45 μA to 55 μA as a dead band, and oscillates.

The cause of the above is generally said to be power supply noise. More specifically, supposing that the cell transistor allows the current of 51 μA to flow and the sense amplifier outputs "H", the supply voltage is reduced at this time and thereby the current flowing through the cell transistor is reduced to, for example, 49 μA.

Then, the sense amplifier outputs "L", and the supply voltage is returned to an original voltage value. Thereby, the current flowing through the cell transistor is returned to 51 μA, and the sense amplifier outputs "H". In this way, the sense amplifier outputs "H" and "L" alternately repeatedly, i.e., is brought into an oscillating state.

In this case, a write verifying circuit in an EPROM writing apparatus for executing the writing operation to the EPROM, namely an EPROM writer, may detect "L" output of the sense amplifier despite the fact that the writing operation is not executed to the cell transistor sufficiently to the degree that the sense amplifier does oscillate, and may determine that an accurate writing operation has been executed to the cell transistor on the assumption that the write data and the read data coincide with each other.

As described above, in the conventional EPROM, when such a writing operation as to cause the current in the dead band of the sense amplifier to flow is executed to the cell transistor, the sense amplifier oscillates during the reading operation. Thus, the conventional EPROM has suffered the problem that it cannot verify an inaccurate data reading operation during the write verification despite the fact that the data cannot be read accurately. This sort of problem has generally resided in not only the EPROM, but also other nonvolatile semiconductor memories including the EEPROM and the flash type memory.

In view of the above problem, the second aspect of the invention provides a nonvolatile semiconductor memory capable of, when the writing operation is executed to the cell transistor, verifying whether the writing operation to the cell transistor is executed sufficiently to the degree that the sense amplifier does not oscillate during the reading operation, and of executing the writing operation sufficiently to the degree that the sense amplifier does not oscillate during the reading operation.

According to another embodiment of the first aspect of the present invention, there is provided a nonvolatile semiconductor memory having a matrix (1) of nonvolatile erasable memory cells (Mij) formed at intersections of word lines (WL1 to WLm) and bit lines (BL11 to BL1k, . . . , BLn1 to BLnk), a row decoder (3), a column decoder (5), and sense amplifiers (71 to 7n) connected to the bit lines (BL11 to BL1k, . . . , BLn1 to BLnk), respectively, the nonvolatile semiconductor memory comprising:

at least one external power source connected to the circuits mentioned above so that they can carry out predetermined operations according to the a plurality of voltage sources different from each other supplied from said external power source and said external power source providing the normal source voltage and a specific verify source voltage different from said normal source voltage to said circuits mentioned above.

According to the second aspect of the invention, after necessary information is written in the memory cell transistor, it is verified with the use of the sense amplifier whether the information is written accurately during the reading operation. If the information is still at an insufficient level, or if the output of the sense amplifier oscillates, the programming, or the writing operation, is repeated until it is determined that the information is written accurately during the reading operation.

More specifically, the second aspect of the invention pertains to a nonvolatile semiconductor memory having a matrix (1) of nonvolatile erasable memory cell transistors (Mij) formed at intersections of word lines (WL1 to WLm) and bit lines (BL11 to BL1k, . . . , BLn1 to BLnk), a row decoder (3), a column decoder (5), and sense amplifiers (71 to 7n) connected to the bit lines (BL11 to BL1k, . . . , BLn1 to BLnk), respectively, the nonvolatile semiconductor memory comprising:

write means;

verify means having at least one function selected from a write verify function in which it is determined whether or not data are written in a memory so deeply as to accurately read out them even when variation in the power source voltage is occured in the reading operation, and an erase verify function in which it is determined whether or not data are erased in a memory so deeply as to accurately read out them as being correctly erased even when variation in the power source voltage is occured in the reading operation, the verify means involving means for detecting an output voltage of the sense amplifiers, comparison means for comparing the output voltage with a reference voltage, and storage means for storing a result of the comparison; and means for repeating a write operation to memory cell transistors, if a result of comparison provided by the storage means after a verify operation for the write operation tells that the write operation is insufficient.

In this specific example, it is preferable to provide timing signal generating means for setting a specified period during which the comparing means compares the output voltage of the sense amplifier with the predetermined reference voltage value while the verifying means is executing the verifying operation after the specified writing operation is completed.

More specifically, it is desirable for the verifying means to include memory means for storing the level of the output of the sense amplifier when the sense amplifier determines that the writing operation is insufficient such as when the sense amplifier oscillates in a state where the memory cell transistor is in a reading state after the writing operation to the memory cell transistor. Based on the content of the memory circuit, it is verified whether the writing operation to the memory cell transistor is sufficient to the degree that the sense amplifier does not oscillate during the reading operation, and the verification result is output externally.

Another specific example of this aspect is provided with a timing signal generating circuit for generating a timing signal of a specified cycle after a writing operation to a cell transistor, a memory circuit which is controlled in accordance with the timing signal generated by the timing signal generating circuit so as to read and store a level of an output of a sense amplifier in the specified cycle, and a write verifying circuit. In the case where the output level of the sense amplifier stored in the memory circuit includes a level which is output when the sense amplifier determines that the writing operation is insufficient, the write verifying circuit outputs a verification result indicative of the insufficient writing operation externally. On the other hand, in the case where the output level of the sense amplifier stored in the memory circuit does not include the level which is output when the sense amplifier determines that the writing operation is insufficient, the write verifying circuit outputs a verification result indicative of the sufficient writing operation externally.

Hereafter, first and second specific examples of the second aspect according to the invention will be described with reference to FIGS. 12 to 29, taking a case where the invention is applied to the EPROM as an example.

Figure 12:
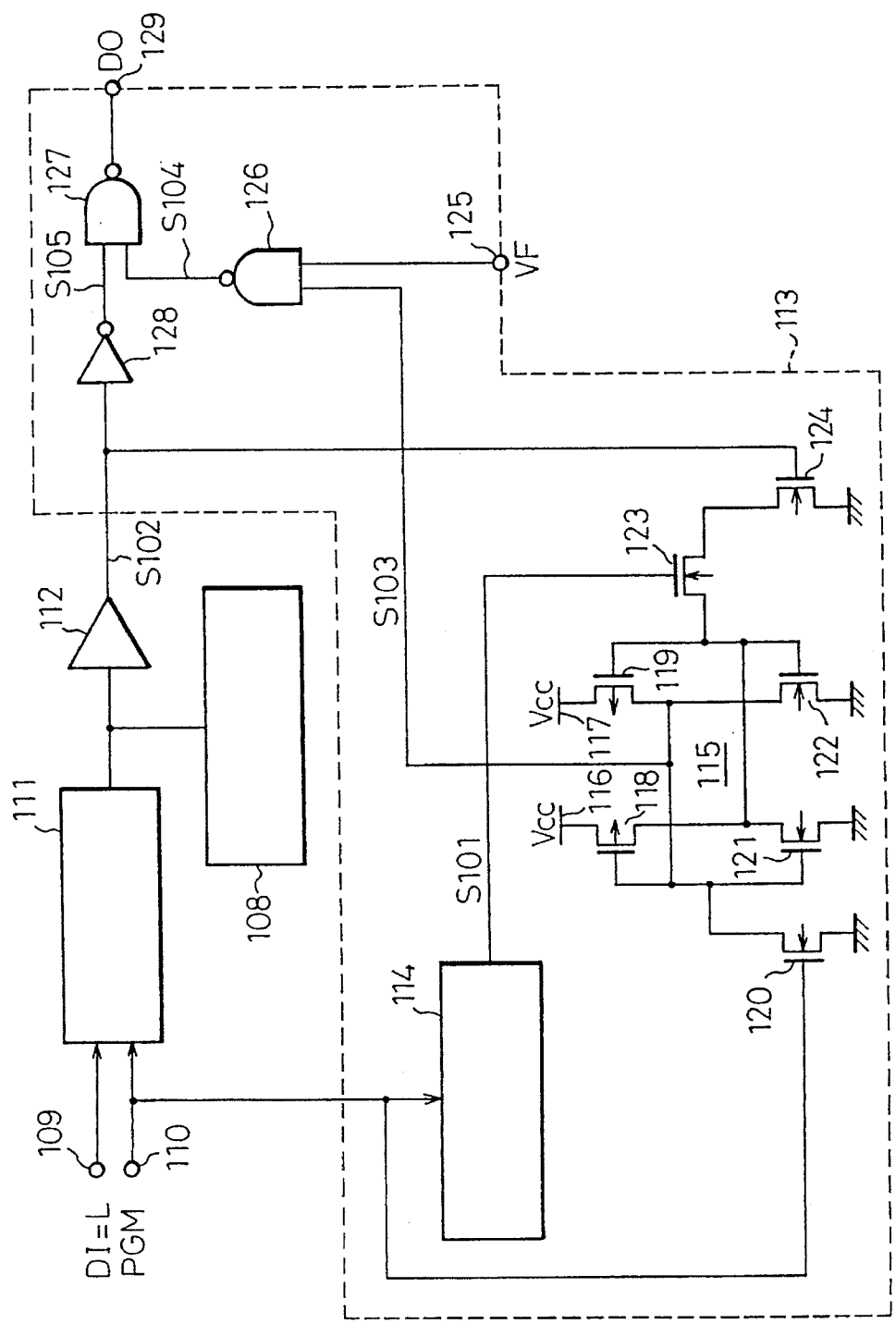
FIG. 12 is a circuit diagram showing an essential portion of a first specific example of a second aspect according to the invention.

FIG. 12 is a circuit diagram showing an essential portion of the first specific example of the second mode.

In this figure, indicated at 108 is a memory cell array unit including arranged cell transistors, at 109 a write data input terminal to which a write data DI is input, and at 110 a write signal input terminal to which a write signal PGM is input.

Indicated at 111 is a writing circuit for writing the write data DI in the cell transistor in accordance with the write signal PGM, and at 112 a sense amplifier for reading the data stored in the cell transistor.

Indicated at 113 is a write verifying circuit for verifying whether information is written in the cell transistor sufficiently to the degree that the sense amplifier 112 does not oscillate or to the degree that the information can be read accurately during a reading operation, namely verifying means. In this write verifying circuit, indicated at 114 is a timing signal generating circuit for generating such a timing signal S101 as to become "H" during a specified period following a predetermined delay period after the writing operation, i.e., after the write signal PGM is inverted from "H" to Indicated at 115 is a flip-flop. In the flip-flop 115, indicated at 116, 117 are VCC power supply lines for supplying a supply voltage VCC, at 118, 119 p-MOS transistors (hereinafter referred to as p-MOS), and at 120 to 124 n-MOS transistors (hereinafter referred to as n-MOS).

Indicated at 125 is a verify signal input terminal to which a write verify signal, so-called a verify signal VF, is input, at 126, 127 NAND circuits, at 128 an inverter, and at 129 a data output terminal from which an output data DO is output.

FIGS. 13 to 15 are waveform charts for explaining an operation of this first specific example, FIGS. 16 to 19 are circuit diagrams for explaining the operation of the first specific example, and FIG. 28 is a flow chart showing this operation. The operation of this embodiment will be explained sequentially step by step as shown in FIG. 28, hereunder.

In the first specific example, a cell address X is selected in Step (1) when the verify signal V becomes "L" as shown in FIGS. 13 and 16, and in Step (2), when the write data becomes "L" (corresponding to the information "0") and the write signal PGM becomes "H", the information is written in the selected cell transistor; the n-MOS 120 is turned on; the p-MOS 118 is turned on; and the n-MOS 121 is turned off.

Further in this case, the timing signal generating circuit 114 outputs "L" as the timing signal S101 to thereby turn the n-MOS 123 off. However, since the p-MOS 118 is on and the n-MOS 121 is off, the p-MOS 119 is turned off and the n-MOS 122 is turned on, with the result that an output S103 of the flip-flop becomes "L".

Thereafter, upon lapse of the specified period in Step (3), the write PGM becomes "L" and the first writing operation is completed as shown in FIGS. 13 and 17. Thereupon, the n-MOS 120 is turned off, and the timing signal S101 becomes "H" and the n-MOS 123 is turned on.

Here, the n-MOS 124 is turned off in the case where the output S102 of the sense amplifier 112 becomes "L" stably after the writing operation to the cell transistor, i.e., the writing operation to the cell transistor is executed sufficiently to the degree that the sense amplifier 112 does not oscillate.

As a result, since the p-MOS 118, p-MOS 119, n-MOS 121, n-MOS 122 are held in on-, off-, off-, and on-states respectively, the output S103 of the flip-flop 115 is held at "L".

When the verify signal VF becomes "H" in this state in Step (4), an output S104 of the NAND circuit 126 becomes "H". In this case, since an output of the inverter 128 is "H", an output of the NAND circuit 127, namely the output data DO, becomes "L" which is fed to an EPROM writer (Step (5)).

In this case, the write data DI is "L" and the output data DO is "L", and the write data DI coincides with the output data DO. Accordingly, the EPROM writer stops writing the information in the cell transistor assuming that the writing operation to the cell transistor is sufficient, and this routine proceeds to Step (6) in which a next address X+1 is selected and the writing operation is executed to the next address X+1.

After repeating the above operation, it is discriminated whether the address X is a last address in Step (7). This routine ends if the discrimination result is in the affirmative while returning to Step (1) to repeat the above operation if the discrimination result is in the negative.

Contrary to this, the n-MOS 124 is turned on in the case where the output S102 of the sense amplifier 112 becomes "H" stably after the writing operation to the cell transistor as shown in FIGS. 14 and 18, i.e., the writing operation to the cell transistor is not sufficient to the degree that the sense amplifier 112 does not oscillate.

In this case, since the n-MOS 120 is off and the n-MOS is on, the p-MOS 119 is turned on; the n-MOS 122 is turned off; the p-MOS 118 is turned off; and the n-MOS 121 is turned on. As a result, the output S103 of the flip-flop 115 becomes "H".

When the verify signal VF becomes "H" in this state, the output S104 of the NAND circuit 126 becomes "L" and the output of the NAND circuit 127, namely the output data DO, becomes "H" which is fed to the EPROM writer (Step (5)).

In this case, the write data DI is "L" and the output data DO is "H", and the write data DI is at variance with the output data DO. Accordingly, the EPROM writer returns to Step (5) assuming that the writing operation to the cell transistor is insufficient, and causes a specified command signal to return from a desired writing operation designating circuit 130 to the writing circuit 111 to carry out the writing operation to this cell transistor.

Further, in the case where the sense amplifier 112 oscillates thereby oscillating the output S102 thereof after the writing operation to the cell transistor as shown in FIGS. 15 and 19, the n-MOS 124 is turned on when the output S102 of the sense amplifier 112 first becomes "H".

In this case, since the n-MOSs 120 and 123 are already off and on respectively, the p-MOS 119 is turned on and the n-MOS 122 is turned off, and the p-MOS 118 is turned off and the n-MOS 121 is turned on. As a result, the output S103 of the flip-flop 115 becomes "H".

When the verify signal VF becomes "H" in this state, the output S104 of the NAND circuit 126 becomes "L" and the output of the NAND circuit 127, namely the output data DO, becomes "H" which is fed to the EPROM writer.

In this case as well, the write data DI is "L" and the output data DO is "H", and the write data DI is at variance with the output data DO. Accordingly, the EPROM writer returns to Step (2) assuming that the writing operation to the cell transistor is insufficient in Step (5), and carries out the writing operation to this cell transistor.

In this way, in the first specific example of the second mode according to the invention, the write verifying circuit 113 outputs "L" having the same level as the write data as the output data DO only in the case where the sense amplifier 112 outputs "L" stably after the writing operation to the cell transistor, i.e., the writing operation to the cell transistor is sufficient to the degree that the sense amplifier 112 does not oscillate.

On the other hand, the write verifying circuit 113 outputs "H" having a level different from the write data DI as the output data DO in the case where the sense amplifier 112 outputs "H" stably or oscillates after the writing operation to the cell transistor, i.e., the writing operation to the cell transistor is not sufficient to the degree that the sense amplifier 112 does not oscillate.

In this way, according to the first specific example, it can be verified through the built-in write verifying circuit 113 whether the writing operation to the cell transistor is sufficient to the degree that the sense amplifier 112 does not oscillate during the reading operation. Thus, when the information is written in the cell transistor, the writing operation can be executed sufficiently to the degree that the sense amplifier 112 does not oscillate during the reading operation.

Referring to general cases, as is clear from FIG. 11, the information is not written sufficiently even after the second writing operation, i.e., after the second programming operation, in many cases. In the third programming operation, an output level is close to the discrimination standard of the sense amplifier, thus the output of the sense amplifier may oscillate in many cases considering the influence of the noise.

In this specific example, the programming operation is repeated upon determination that the writing operation is insufficient in any of the above cases, thereby contributing to accuracy of the writing operation and improvement in the reliability of the read information.

Next will be described timings of the respective operations in this specific example with reference to FIG. 13. The write command PGM for writing the specified information in one of the specified memory cell transistors is given at time T1, and is stopped at time T2. The writing operation is carried out during a period defined between T1 and T2. The timing signal S101 is output from the timing signal generating circuit 114 at time T3 following time T2, and is stopped at time T4. During a period defined between T3 and T4, the flip-flop 115 is actuated to compare the output voltage of the sense amplifier and the reference voltage.

Subsequently, at time T5, the verify signal $V_{VER}$ is output, and thereupon the output state of the sense amplifier is discriminated according to the aforementioned method.

FIG. 20 is a circuit diagram showing an essential portion of the second example of the second mode according to the invention. This second example is provided with a write verify circuit 133 including a timing signal generating circuit 114, a four bit shift register 131, an OR circuit 132, NAND circuits 126, 127, and an inverter 128. Other construction of the second example is similar to the first specific example.

Figure 28A:
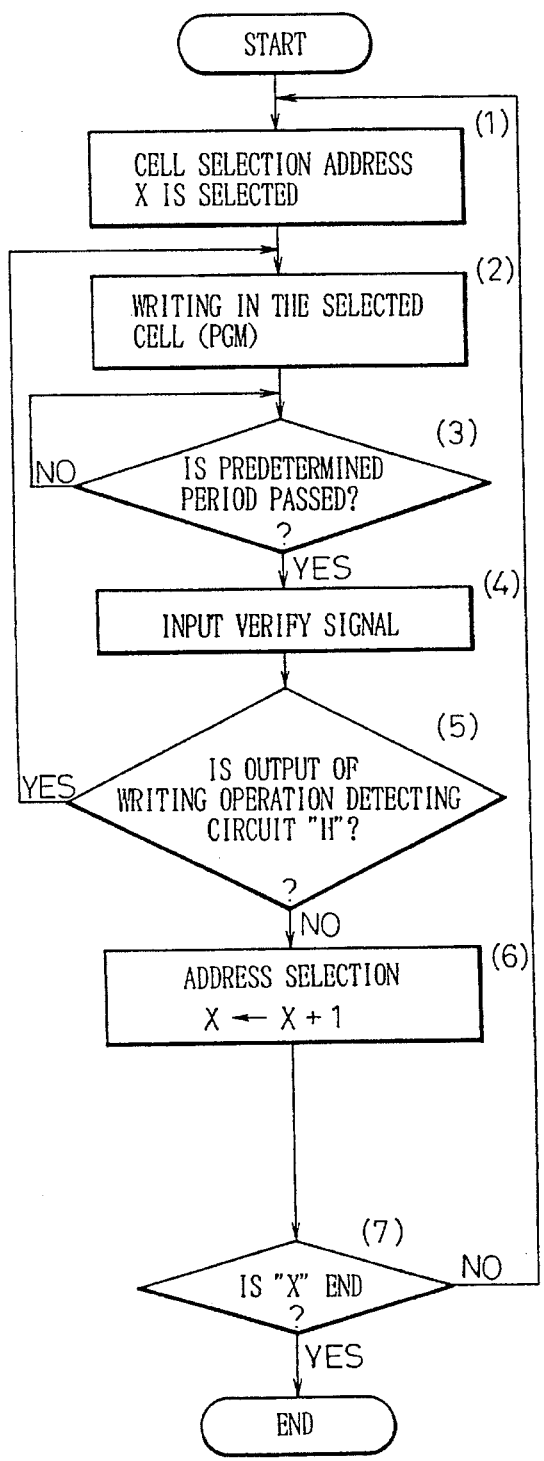
FIGS. 28(A) and 28(B) are flow charts showing an operation procedure in the second mode according to the invention.
Figure 28B:
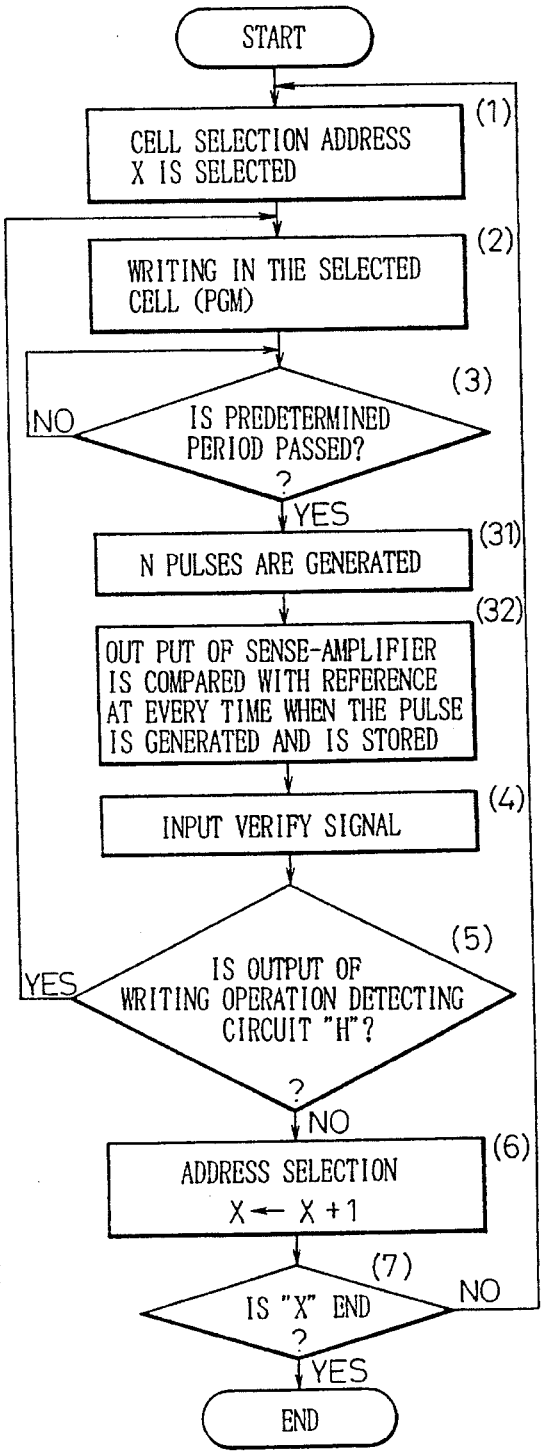

A flow chart shown in FIG. 28(B) is substantially similar to the one shown in FIG. 28(A).

The timing signal generating circuit 114 as shown in FIG. 20, generates such a timing signal S106 as to become "H" four times in a specified cycle until the verify signal becomes "H" after the writing operation to the cell transistor.

The shift register 131 is so reset that stored contents of the respective bits 134 to 137 become "L" when a write signal PGM is "H". The shift register 131 also reads an output S102 of a sense amplifier 112 and stores the level of the output when the timing signal S106 is "H".

The OR circuit 132 takes an OR logic of the contents stored in the respective bits 134 to 137 of the shift register 131, and feeds the result to the NAND circuit 126.

FIGS. 21 to 23 are waveform charts for explaining an operation of this second specific example, FIGS. 24 to 27 are circuit diagrams for explaining the operation of the second specific example. In the second specific example, as shown in FIGS. 21 and 24, when a write data DI is "L" and the write signal PGM becomes "H" in the state where the verify signal VF is "L", the writing operation to the cell transistor is carried out and the shift register 131 is reset.

Figure 25:
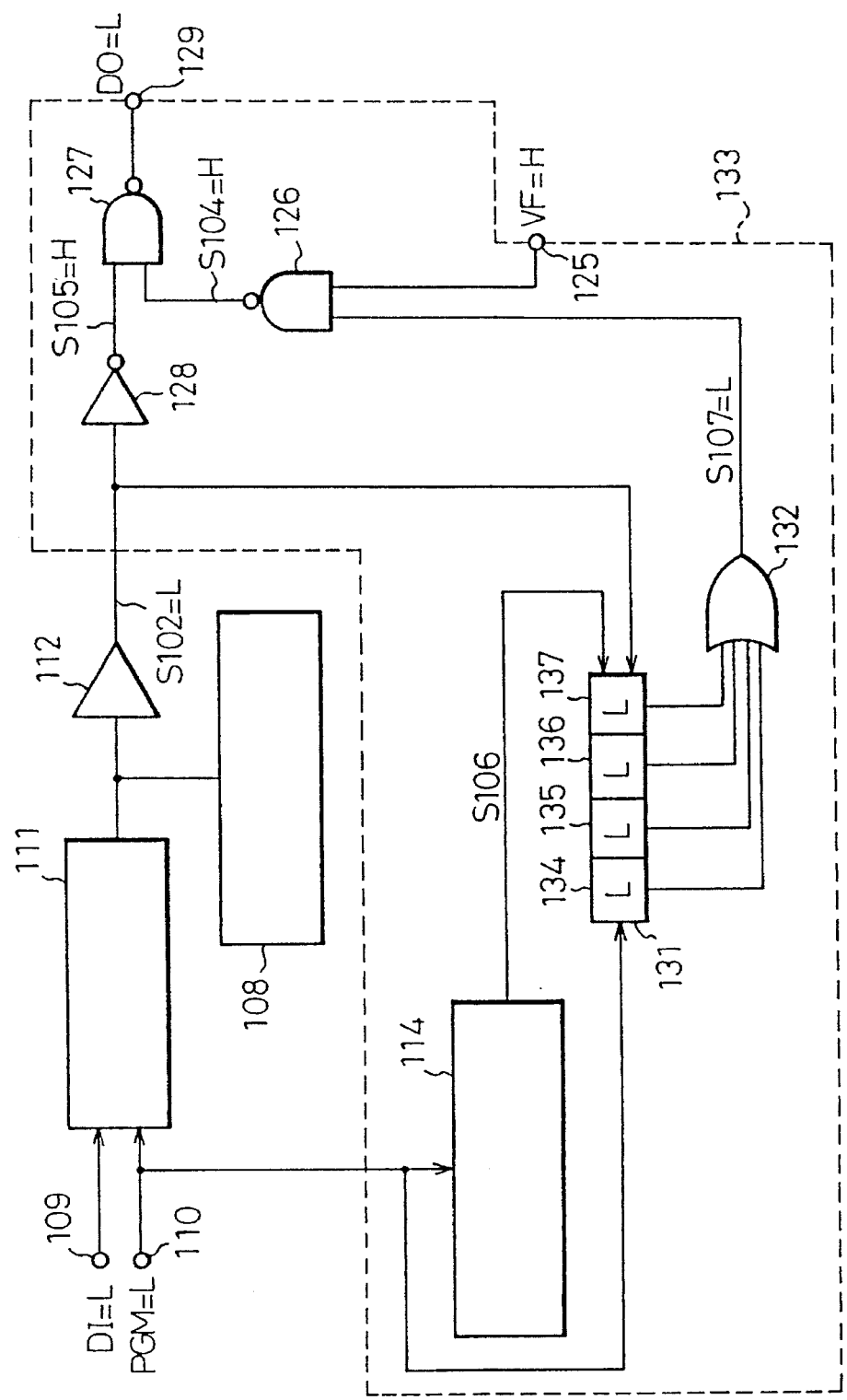

Thereafter, as shown in FIGS. 21 and 25, when the write signal PGM becomes "L" and the first writing operation is completed, the timing signal S106 becomes "H" in the specified cycle, and the output S102 of the sense amplifier 112 is read by the shift register 131 in synchronism with the timing signal S106 (Steps (1) to (3)).

After the writing operation to the cell transistor, for example, four pulses are generated in Step (31) as shown in FIG. 28(B). In Step (32), the output of the sense amplifier 112 is compared with a reference voltage, and the comparison result is stored, for example, in memory means such as a shift register.

In the case where the output S102 of the sense amplifier 112 is "L" stably, i.e., the writing operation to the cell transistor is sufficient to the degree that the sense amplifier 112 does not oscillate, the level read by the shift register 131 is only "L". Thereupon, the stored contents of the respective bits 134, 135, 136, 137 of the shift register 131 becomes "L", "L", "L", "L", and an output S107 of the OR circuit 132 becomes "L".

When the verify signal VF becomes "H" in this state in Step (4), an output S104 of the NAND circuit 126 becomes "H". In this case, since an output of the inverter 128 is "H", an output of the NAND circuit 127, namely the output data DO, becomes "L" (Step (5)) which is fed to an EPROM writer.

In this case, the write data DI is "L" and the output data DO is "L", and the write data DI coincides with the output data DO. Accordingly, the EPROM writer stops writing the information in the cell transistor assuming that the writing operation to the cell transistor is sufficient, and proceeds to the writing operation to a next address (Steps (6) to (7)).

Figure 26:
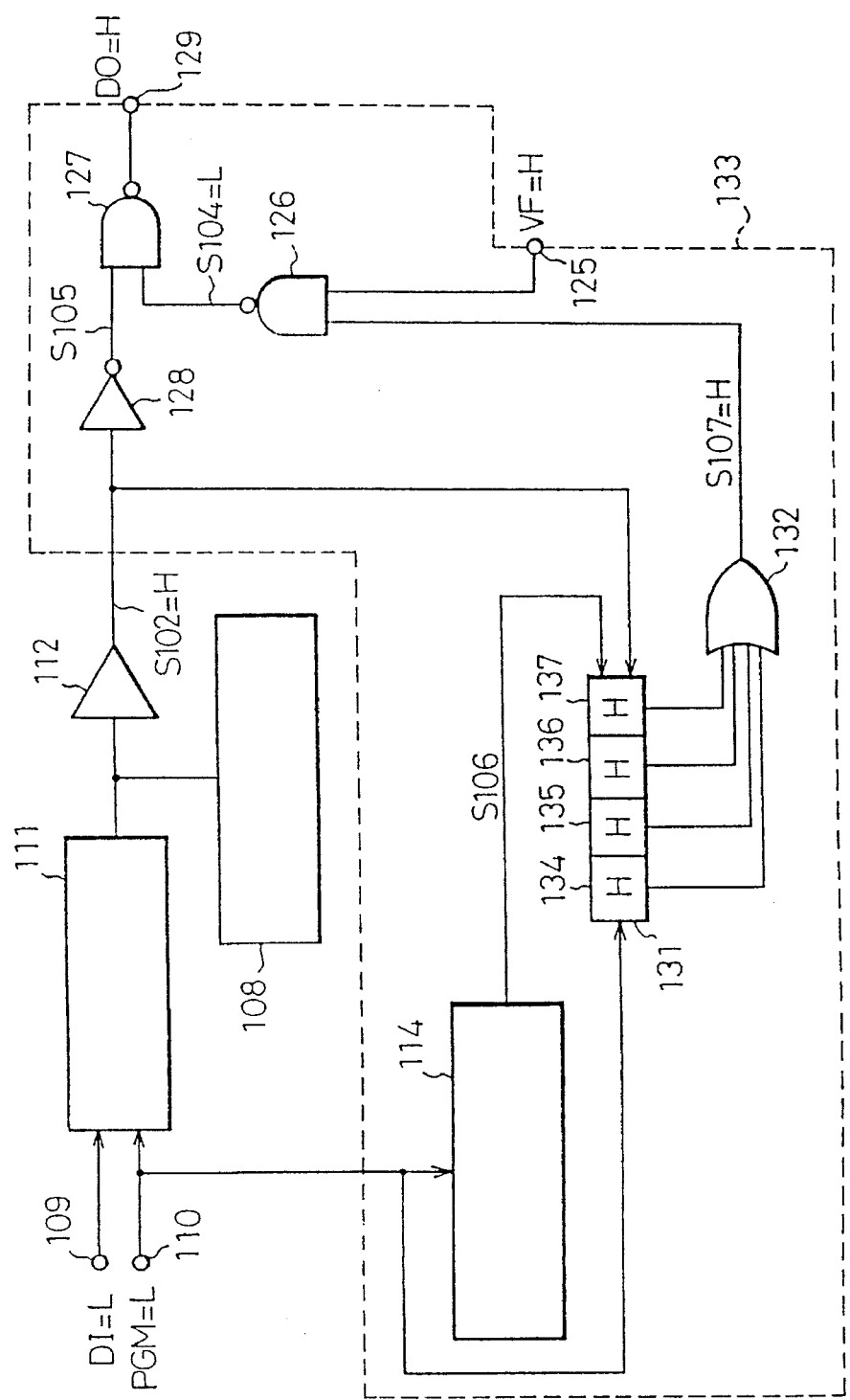

Contrary to this, in the case where the output S102 of the sense amplifier is "H" stably after the writing operation to the cell transistor, i.e., the writing operation to the cell transistor is not sufficient to the degree that the sense amplifier 112 does not oscillate, as shown in FIGS. 22 and 26, the level read by the shift register 131 is only "H". Thereupon, the stored contents of the respective bits 134, 135, 136, 137 of the shift register 131 becomes "H", "H", "H", "H", and an output S107 of the OR circuit 132 becomes "H".

When the verify signal VF becomes "H" in this state, the output S104 of the NAND circuit 126 becomes "L" and the output of the NAND circuit 127, namely the output data DO, becomes "H" which is fed to the EPROM writer.

In this case, the write data DI is "L" and the output data DO is "H", and the write data DI is at variance with the output data DO. Accordingly, the EPROM writer returns to Step (2) assuming that the writing operation to the cell transistor is insufficient, and carries out the writing operation to this cell transistor again.

Figure 27:
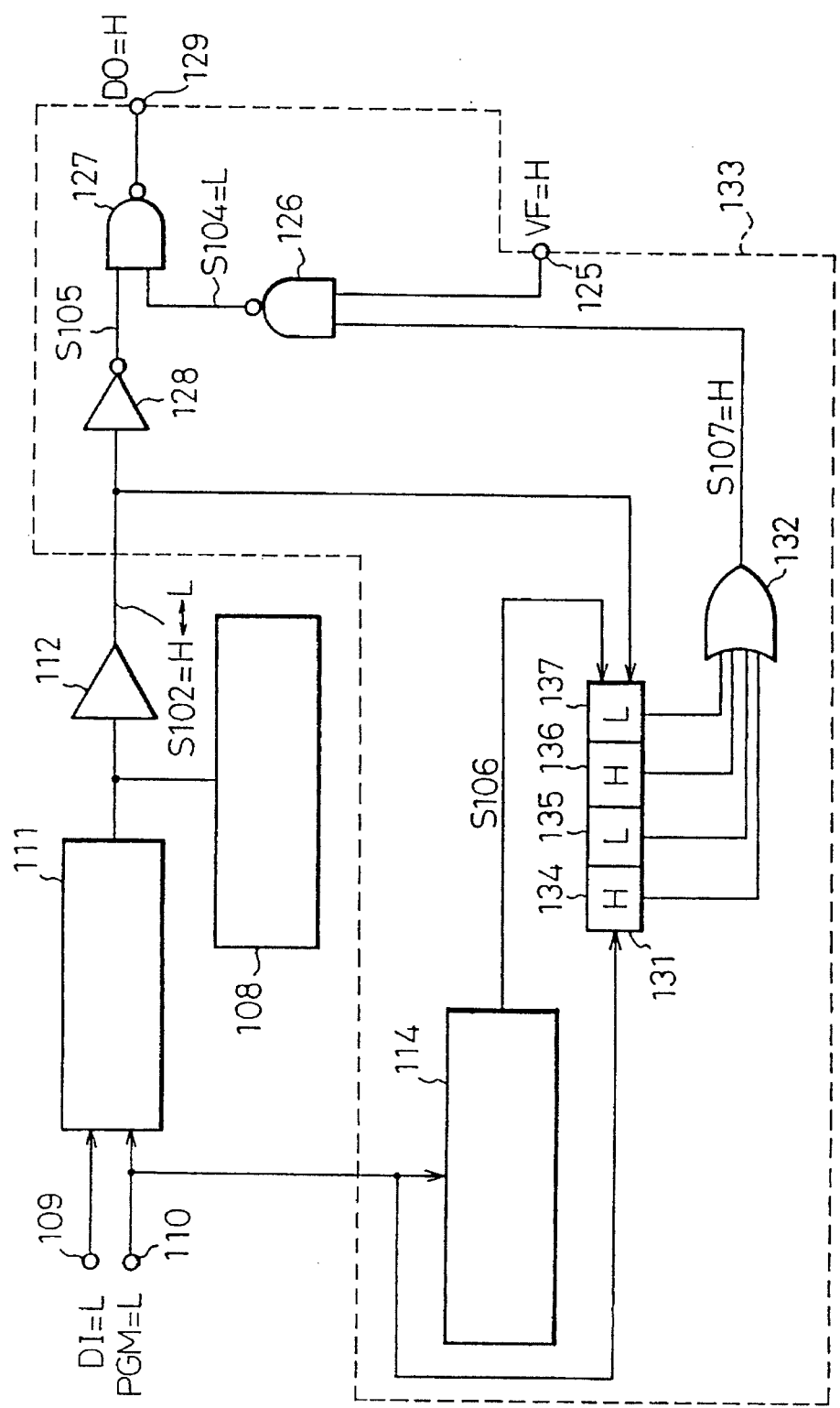

Further, in the case where the sense amplifier 112 oscillates thereby oscillating the output S102 thereof after the writing operation to the cell transistor as shown in FIGS. 23 and 27, the levels read by the shift register 131 become, for example, "H", "L", "H", "L". Thereupon, the stored contents of the respective bits 134, 135, 136, 137 of the shift register 131 becomes "H", "L", "H", "L", and an output S107 of the OR circuit 132 becomes "H".

When the verify signal VF becomes "H" in this state, the output S104 of the NAND circuit 126 becomes "L" and the output of the NAND circuit 127, namely the output data DO, becomes "H" which is fed to the EPROM writer.

In this case as well, the write data DI is "L" and the output data DO is "H", and the write data DI is at variance with the output data DO. Accordingly, the EPROM writer carries out the writing operation to this cell transistor again assuming that the writing operation to the cell transistor is insufficient.

In this way, in the second specific example as well, the write verifying circuit 133 outputs "L" having the same level as the write data as the output data DO only in the case where the sense amplifier 112 outputs "L" stably after the writing operation to the cell transistor, i.e., the writing operation to the cell transistor is sufficient to the degree that the sense amplifier 112 does not oscillate.

On the contrary, the write verifying circuit 133 outputs "H" having a level different from the write data DI as the output data DO in the case where the sense amplifier 112 outputs "H" stably or oscillates after the writing operation to the cell transistor, i.e., the writing operation to the cell transistor is not sufficient to the degree that the sense amplifier 112 does not oscillate.

In this way, in the first specific example as well, it can be verified through the built-in write verifying circuit 133 whether the writing operation to the cell transistor is sufficient to the degree that the sense amplifier 112 does not oscillate during the reading operation. Thus, when the information is written in the cell transistor, the writing operation can be executed sufficiently to the degree that the sense amplifier 112 does not oscillate during the reading operation.

Next will be described an exemplary construction of the timing signal generating circuit 114 used in the nonvolatile semiconductor memory according to the invention with reference to FIGS. 29(A) and 29(B).

Figure 29A:
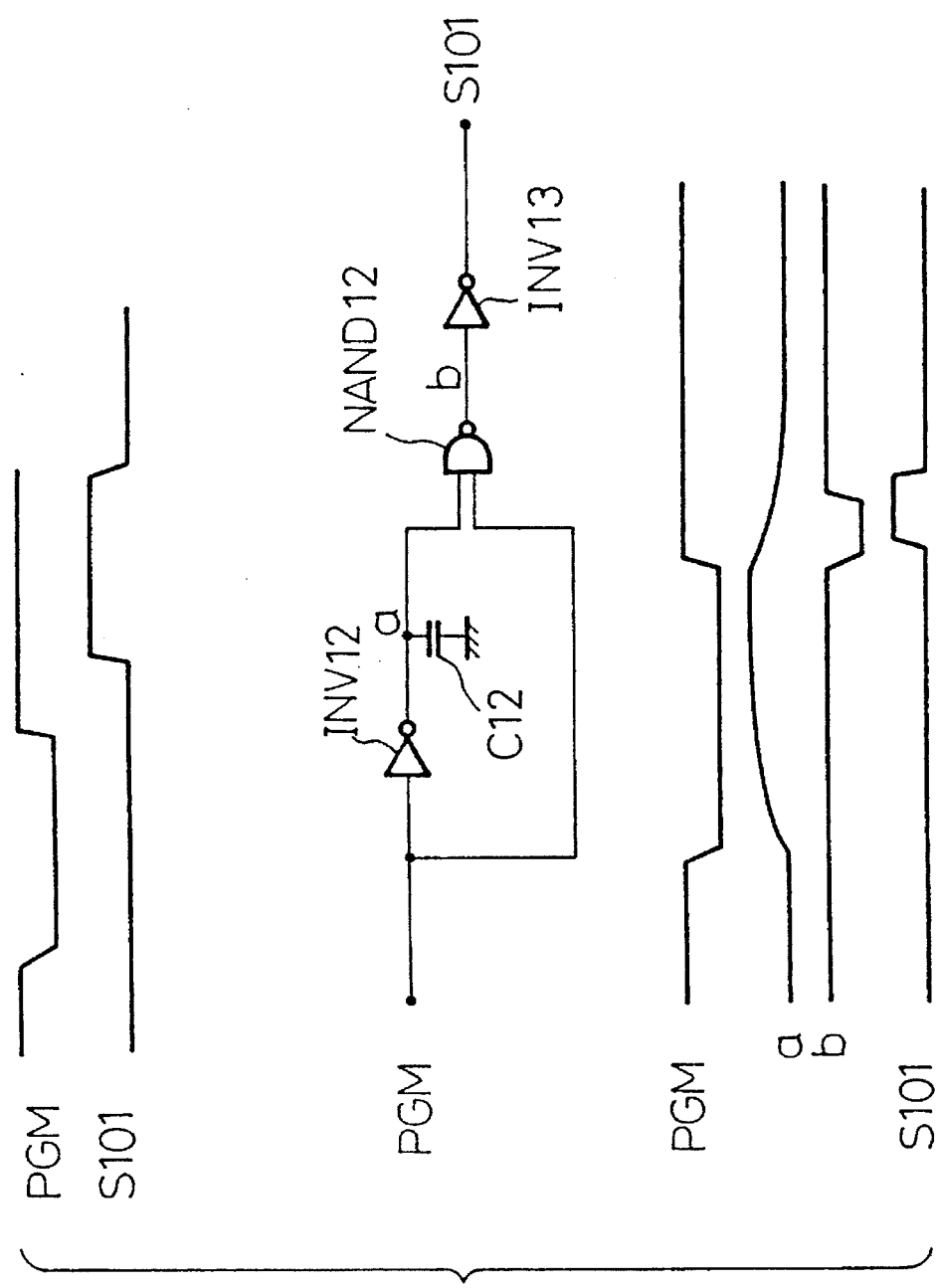
FIGS. 29(A) and 29(B) are diagram showing an exemplary timing signal generating circuit used in the second aspect according to the invention.

FIG. 29(A) shows the exemplary construction of the timing signal generating circuit 114 used in the first specific example of the second aspect according to the invention. This circuit 114 is constructed as follows. An inverter INV12 has an input terminal to which the program signal PGM is input and an output terminal connected to one end of a capacity C12. The other end of the capacity C12 is grounded. The output terminal of the inverter INV12 is connected to one input terminal of a NAND circuit NAND12. To the other input terminal of the NAND circuit NAND12 is input the program signal PGM.

Further, an output terminal of the NAND circuit NAND12 is connected to an input terminal of another inverter INV13, an output of which is an output of the timing signal generating circuit 114.

In the timing signal generating circuit 114 thus constructed, when the program signal PGM of "L" level is input to the input terminal of the inverter INV12, the potential at a point a increases gradually due to the presence of the capacity. When this potential becomes in excess of a specified voltage level, a signal of "H" level is input from the NAND circuit NAND12. Thereafter, when the level of the program signal PGM changes to "H", the potential at a point b which is the output of the NAND circuit NAND12 becomes "L" level and the output of the inverter INV13, namely the output S101, becomes "H" level after lapse of a specified delay period.

Thereafter, when the capacity is discharged, thereby reducing the potential at the point a lower than the specified level, the output of the NAND circuit NAND12 is inverted to H" level. Thus, the output of the inverter INV13, namely the output S101, is also inverted to level.

Figure 29B:
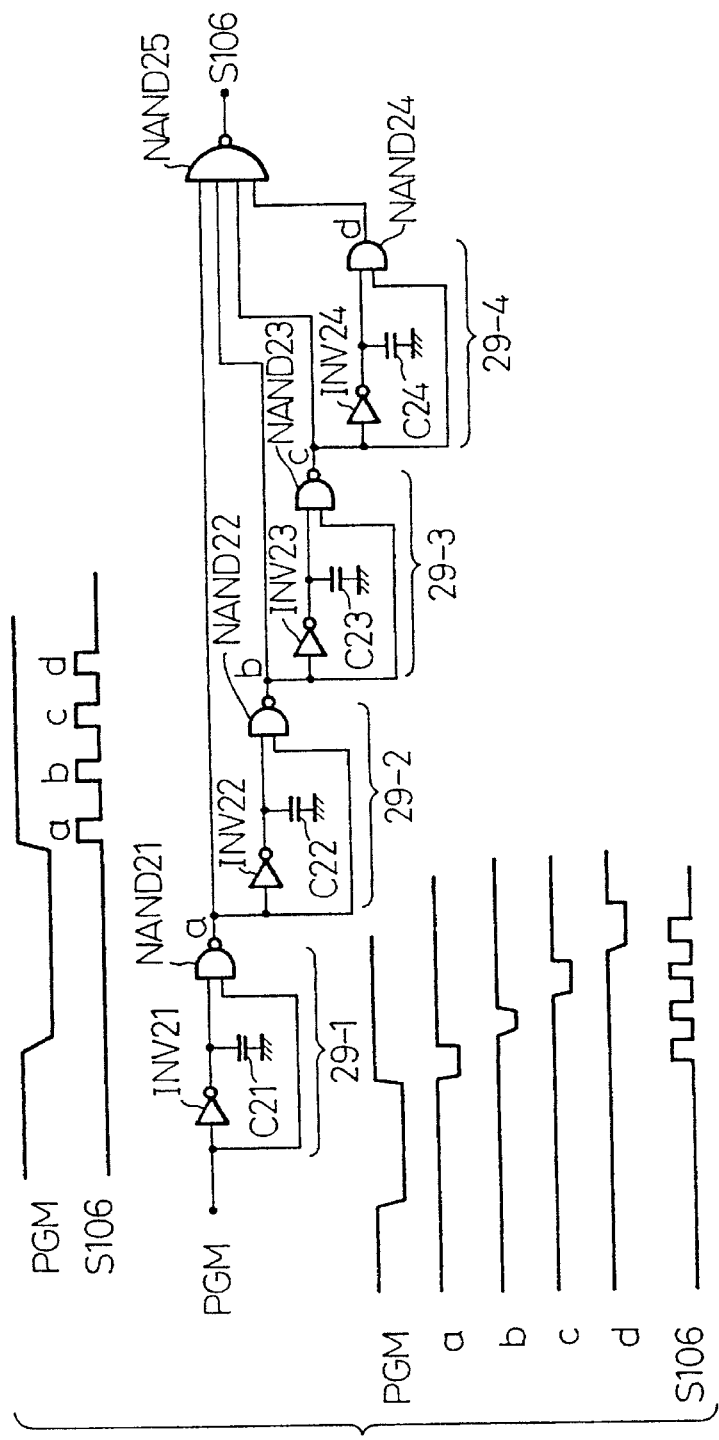

FIG. 29(B) shows the exemplary construction of the timing signal generating circuit 114 used in the second specific example of the second aspect according to the invention. This circuit 114 is provided with a first circuit 29-1, a second circuit 29-2, a third circuit 29-3, and a fourth circuit 29-4. The first circuit 29-1 is constructed as follows. An inverter INV21 has an input terminal to which the program signal PGM is input and an output terminal connected to one end of a capacity C21. The other end of the capacity C21 is grounded. The output terminal of the inverter INV21 is connected to one input terminal of a NAND circuit NAND21. To the other input terminal of the NAND circuit NAND21 is input the program signal PGM. The second circuit 29-2 is constructed as follows. An inverter INV22 has an input terminal to which an output of the first circuit 29-1 is input and an output terminal connected to one end of a capacity C22. The other end of the capacity C22 is grounded. The output terminal of the inverter INV22 is connected to one input terminal of a NAND circuit NAND22. To the other input terminal of the NAND circuit NAND22 is input the output of the first circuit 29-1.

Further, the third circuit 29-3 is constructed as follows. An inverter INV23 has an input terminal to which an output of the second circuit 29-2 is input and an output terminal connected to one end of a capacity C23. The other end of the capacity C23 is grounded. The output terminal of the inverter INV23 is connected to one input terminal of a NAND circuit NAND23. To the other input terminal of the NAND circuit NAND23 is input the output of the second circuit 29-2. The fourth circuit 29-4 is constructed as follows. An inverter INV24 has an input terminal to which an output of the third circuit 29-3 is input and an output terminal connected to one end of a capacity C24. The other end of the capacity C24 is grounded. The output terminal of the inverter INV24 is connected to one input terminal of a NAND circuit NAND24. To the other input terminal of the NAND circuit NAND24 is input the output of the third circuit 29-3.

The outputs of the respective circuits 29-1 to 29-4 are connected to input terminals of a NAND circuit NAND25, an output of which is the output S106 of the timing signal generating circuit 114.

In this construction, a change in the potential at a point a which is the output of the first circuit 29-1 when the program signal PGM is input to the input terminal of the timing signal generating circuit 114 is same as a change in the potential at the point b in FIG. 29(A). Further, since the second to fourth circuits 29-2 to 29-4 receive the outputs of the circuits provided therebefore, changes in the potential at points b, c, d which are outputs of the circuits provided therebefore are same as the change in the potential at the point b in FIG. 29(A).

Since the outputs of the signal at the respective points b, c, d change after a specific delay period, four pulse signals can be obtained at the specified intervals as shown in FIG. 29(B).

A third aspect according to the invention will be described next.

In the aforementioned nonvolatile semiconductor memories, the greatest concern is: how to read various information written in the memory cell transistors at a high speed and with accuracy. In view of this, attention has always been directed to a structure of the sense amplifier itself.

Figure 30:
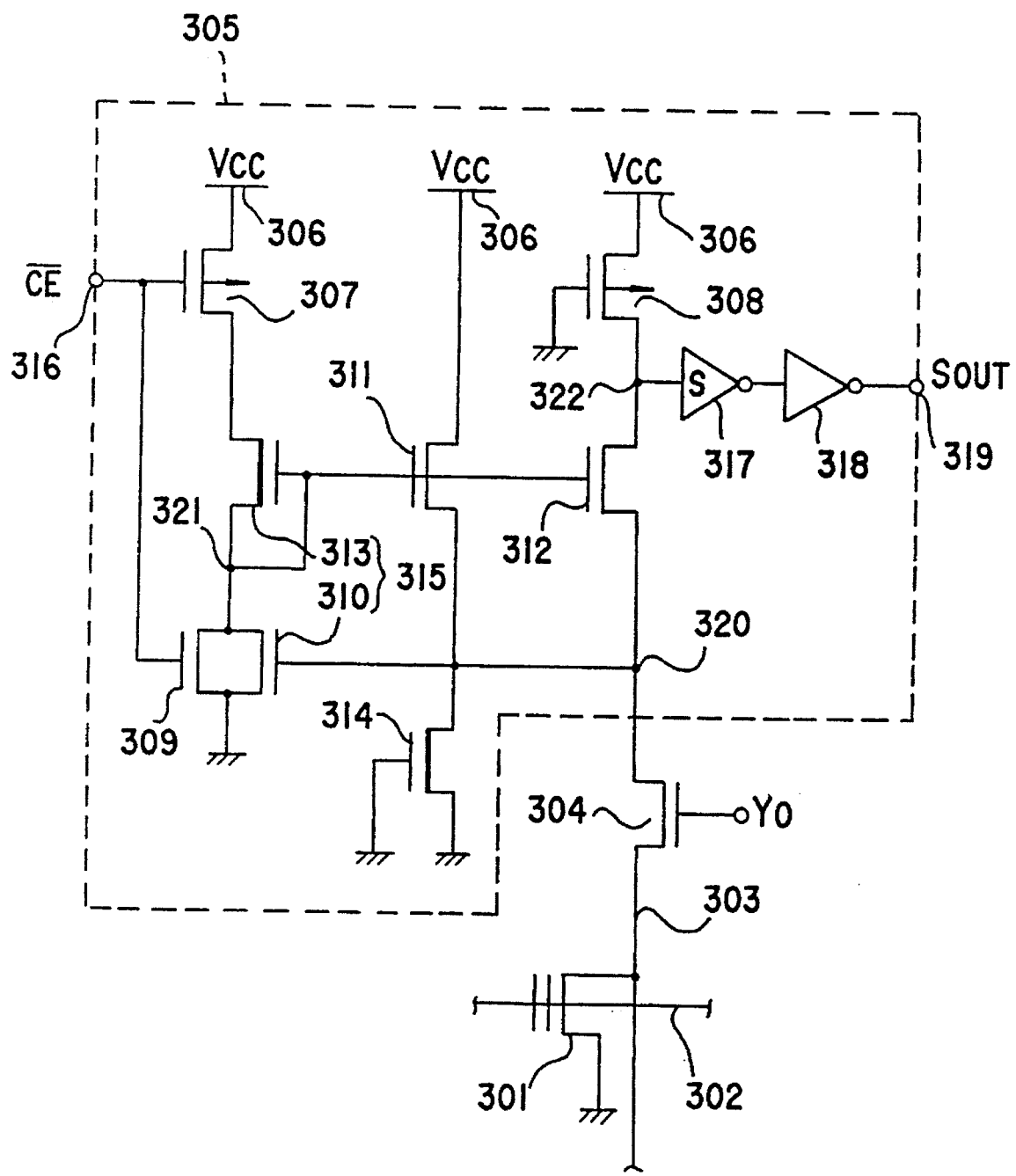
FIG. 30 is a circuit diagram showing an essential portion of an exemplary construction of a sense amplifier in an EPROM of the prior art.

FIG. 30 shows an essential portion of the structure of an exemplary sense amplifier used conventionally when the EPROM is, for example, used as a cell memory transistor in the nonvolatile semiconductor memory including a built-in sense amplifier of the current detecting type.

In this figure, indicated at 301 is a memory cell transistor, at 302 a word line, at 303 a bit line, at 304 an n-MOS transistor of the enhancement type for selecting the bit line 303 in accordance with a bit line selection signal $Y_0$, and at 305 a sense amplifier of the current detecting type.

In the sense amplifier 305, indicated at 306 is a power supply line for supplying a supply voltage $V_{CC}$, at 307, 308 p-MOS transistors of the enhancement type, at 309 to 312 n-MOS transistors of the enhancement type, and at 313, 314 n-MOS transistors of the depletion type.

The n-MOS transistors 310 and 313 constitute an inverter 315 of the so-called E/D (enhancement/depletion) type in which the n-MOS transistors 310, 313 are used as a drive transistor and a load transistor respectively.

Indicated at 316 is a chip enable signal input terminal to which a chip enable signal/CE is input, at 317 a Schmidt trigger inverter, at 318 a normal inverter, at 319 a sense amplifier output terminal from which a sense amplifier output Sour is output.

Particularly, the p-MOS transistor 307 and the n-MOS transistor 309 are such transistors as to make the sense amplifier 305 inactive to be described later in the case where this EPROM is not selected so that power is not consumed in the sense amplifier 305.

The p-MOS transistor 308 is a load transistor for detecting whether a current flows through the selected memory cell transistor during the reading operation, and a gate thereof is grounded.

The n-MOS transistor 314 is a transistor for supplementing the current flowing through the p-MOS transistor 308 so as to facilitate the current detection in the p-MOS transistor

308 since only a small amount of current flows through the selected memory cell transistor even when the selected memory cell transistor is turned on during the reading operation.

The n-MOS transistors 311, 312 and the inverter 315 are adapted to reduce the voltage at a node 320 when it increases, and to stabilize the same at, for example, 1 V.

More specifically, a circuit constant is set such that when the voltage at the node 320 is higher than 1 V, the potential at an output terminal of the inverter 315, namely a node 321, decreases to thereby reduce the amount of current flowing through the n-MOS transistors 311, 312, the voltage at the node 320 is stabilized at 1 V.

In this example, the circuit constant is also set such that the voltage at the node 322 becomes "H" relative to the Schmidt trigger inverter 317 when the voltage at the node 320 is 1 V.

The n-MOS transistor 311 also has function to speed up the charging operation to charge the bit-lines.

In the EPROM thus constructed, the chip enable signal/CE becomes "H"; the p-MOS transistor 307 is turned off; and the n-MOS transistor 309 is turned on when the EPROM is not selected.

As a result, the supply of the supply voltage $V_{CC}$ to the inverter 315 is interrupted, and the n-MOS transistors 311 and 312 are turned off so that no power is consumed in the sense amplifier 305.

Contrary to this, when the EPROM is selected, the chip enable signal/CE becomes "L"; the p-MOS transistor 307 is turned on; and the n-MOS transistor 309 is turned off.

As a result, the supply voltage $V_{CC}$ is supplied to the inverter 315 through the p-MOS transistor 307, and the n-MOS transistors 311 and 312 are turned on, thereby bringing the sense amplifier 305 into an active state.

In the case where the n-MOS transistor 304 is turned on and the memory cell transistor 301 is selected when the word line is "H" and the bit line selection signal $Y_0$ is "H", the voltage at the node 320 increases due to the current supplied through the p-MOS transistor 308 and the n-MOS transistor 312 and the current supplied through the n-MOS transistor 311.

In this case, as described above, the voltage at the node 321 decreases to thereby reduce the amount of current flowing through the n-MOS transistors 311, 312, and the voltage at the node 320 is stabilized at 1 V. As a result, the level of the node 322 becomes "H", and is output to the sense amplifier output terminal 319 as the sense amplifier output Sout.

Contrary to this, in the case where the current flows through the memory cell transistor 301, the voltage at the node 320 decreases, with the result that the level of the node 322 becomes "L" and "L" is output to the sense amplifier output terminal 319 as the sense amplifier output Sout.

In this EPROM, the n-MOS transistor 314 is provided to facilitate the current detection in the p-MOS transistor 308, and to supplement the current flowing through the p-MOS transistor 308 during the reading operation so as to carry out the reading operation at high speed. It is required in the commercial market to shorten a reading time further so as to carry out the reading operation at high speed in the case where the current flows through the selected memory cell transistor.

In view of the problems residing in the prior art, the third aspect according to the invention provides a nonvolatile semiconductor memory including a sense amplifier for detecting a current which is capable of shortening a reading time to carry out a reading operation at high speed in the case where the current flows through a memory cell transistor during the reading operation.

More specifically, the sense amplifier used in the nonvolatile semiconductor memory according to the invention is provided with a function of carrying out computational processing at a higher speed if a larger amount of current is caused to flow. However, since only a small amount of current flows through the memory cell transistor, the ability to drive the sense amplifier is suppressed.

This creates the problem that the sense amplifier cannot clearly determine whether the current flowing through the memory cell transistor is higher or lower than a reference value.

As a counter measure to this problem, it is considered that a change in the current may be easily detected by conducting the comparison while causing a relatively large amount of current to flow without changing the ratio, rather than by comparing the small amount of currents.

In view of this, the basic concept of the third aspect according to the invention is to detect the level of the current flowing through the memory cell transistor by causing another current to flow simultaneously with the current flowing through the memory cell transistor.

More specifically, the third mode according to the invention is directed to a nonvolatile semiconductor memory comprising a cell matrix circuit (1) having erasable nonvolatile memory cell transistors ($M_{ij}$) arranged at intersections of a plurality of word lines ($WL_1$ to $WL_m$) and a plurality of bit lines ($BL_{11}$ to $BL_{1k}$, $BL_{nl}$ to $BL_{nk}$); and sense amplifying circuits ($7_1$ to $7_n$) connected to the respective bit lines ($BL_{11}$ to $BL_{1k}$, $BL_{nl}$ to $BL_{nk}$), wherein each sense amplifying circuit includes load means and a first transistor for detecting a current arranged in series between a high voltage supply and one terminal of the bit line connected to the memory cell transistor; an output portion provided at a node of the load means and the first transistor; an inverter arranged between a gate of the first transistor and a terminal of the bit line; and a second transistor for amplifying the current arranged between the terminal of the bit line and a low voltage supply, a gate of the second transistor being connected to an output portion of the inverter.

Figure 31:
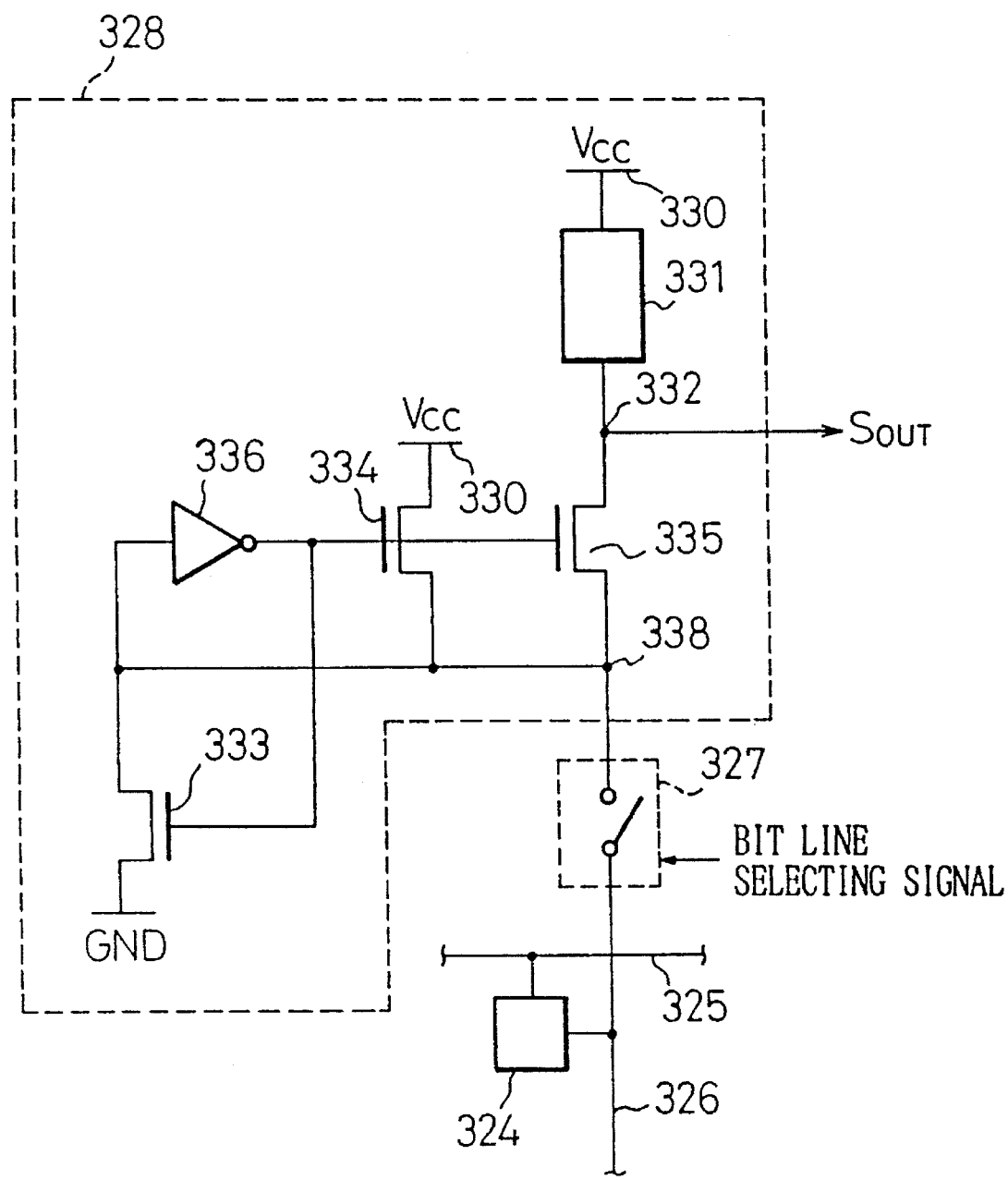
FIG. 31 is a diagram showing the principle of a sense amplifier according to a third mode of the invention.
Figure 32:
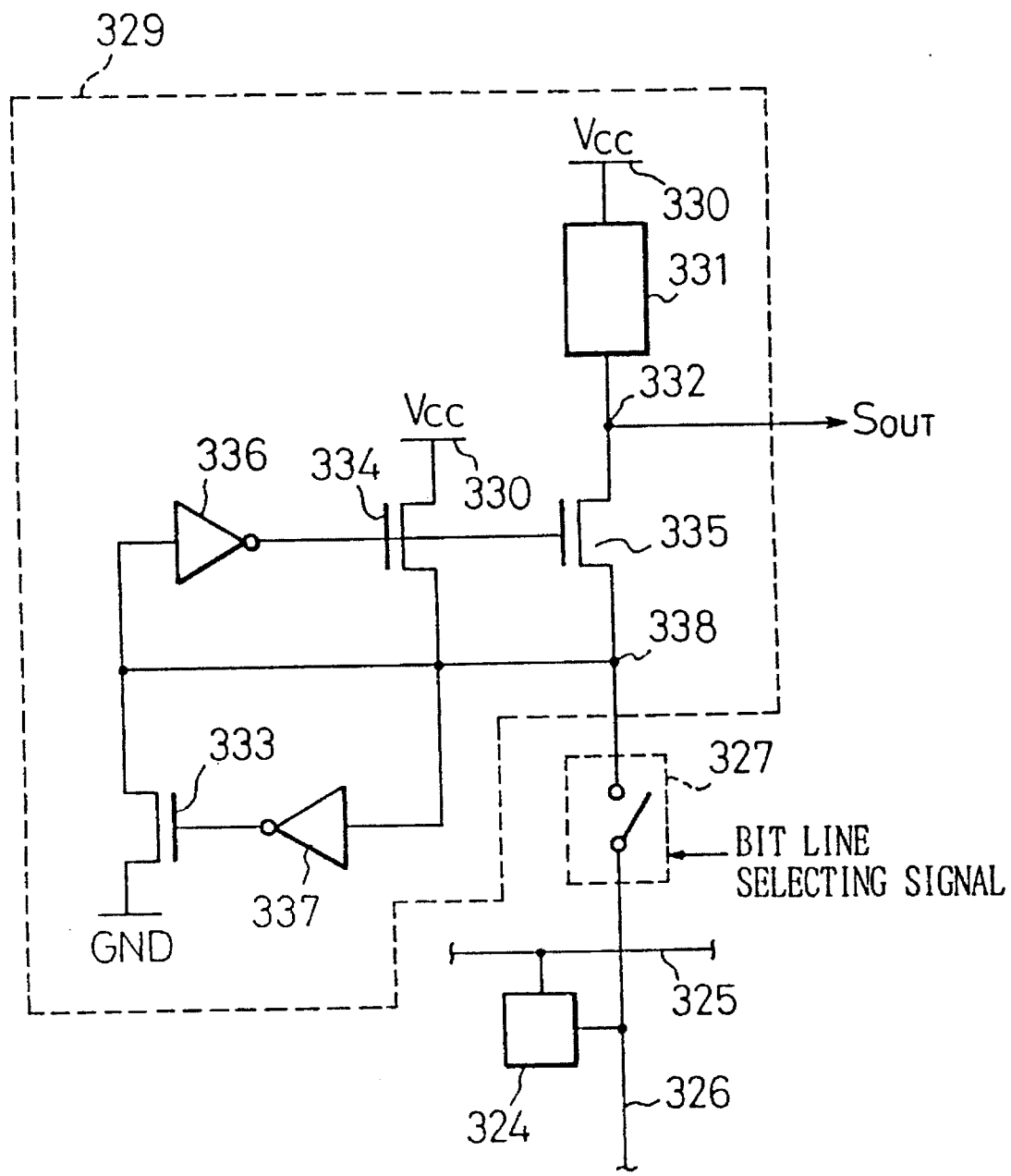
FIG. 32 is a diagram showing the principle of a sense amplifier having another construction according to the third mode of the invention.

FIGS. 31 and 32 show the principle of the sense amplifier in the third mode of the present invention. In Figures, the reference numeral 324 denotes a memory cell transistor, 325 a word line, 326 a bit line, 327 a bit-line selecting switching device of which the on-off operation is controlled with a bit line select signal, 328 and 329 sense amplifiers, respectively.

In the illustrations of the sense amplifiers 328 and 329, the reference numeral 330 denotes a power line over which a power-supply voltage Vcc is supplied, 331 a load intended for detection of whether or not a current flows through a selected memory cell transistor at the time of data reading, 332 a node where a sense amplifier output Sout develops, 333 to 335 an n-channel MOS transistor, 336 and 337 an inverter.

The n-channel MOS transistor 333 is provided to make up the current flowing to the load 331 in order to facilitate the detection of a current at the load 331 since the current flowing through the selected memory cell transistor is turned on at the time of data reading.

The n-channel MOS transistors 334 and 335 and the inverter 336 are provided to stabilize at a predetermined level the voltage at the junction of the n-channel MOS transistor 335 and switching device 327, that is, the voltage at the node 338.

It should be noted here that the n-channel MOS transistor 334 also serves to make up the current flowing through the n-channel MOS transistor 33 when the selected memory cell transistor is turned off and thus no current flows through the memory cell transistor.

According to the present invention, the circuit is so designed that the voltage at the gate of the n-channel MOS transistor 333 is so controlled as to fall when the voltage at the node 338 rises at the time of data reading and to rise when the voltage at the node 338 falls at the time of data reading.

FIGS. 31 and 32 show example circuit configurations, respectively, in the third aspect of the present invention. FIG. 31 shows an example circuit configuration in which the inverter 336 is connected at the output terminal thereof to the gate of the n-channel MOS transistor 333, and FIG. 32 shows another example circuit configuration in which the inverter 337, different from the inverter 336 the input terminal of which is connected to the node 338, is connected at the output terminal thereof to the gate of the n-channel MOS transistor 333.

An example circuit configuration of the sense amplifier used in the third aspect of the present invention will be discussed in detail below. The flash-type memory according to the present invention comprises the sense amplifiers 328 and 329 having the first n-channel MOS transistor 335 connected at the drain thereof to the power line by means of the load 331 and at the source thereof to a terminal to which the bit line 326 of the bit-line selecting switching device 327 is not connected; the first inverter 336 connected at the input terminal thereof to the node 338, that is, the junction of the first n-channel MOS transistor 335 and the switching device 327 and at the output terminal to the gate of the first n-channel MOS transistor 335; the second n-channel MOS transistor 334 connected at the drain thereof to the power line 330, at the source thereof to the node 338, that is, the junction of the first n-channel MOS transistor 335 and the switching device 327 and at the gate thereof to the output terminal of the first n-channel MOS transistor 335; the third n-channel MOS transistor 333 connected at the drain thereof to the node 338, that is, the junction of the first n-channel MOS transistor 335 and the switching device 327 and at the source thereof to the ground potential and so controlled that its gate voltage falls when the voltage at the node 338, that is, the junction of the first n-channel MOS transistor 335 and the switching device 327 rises at the time of data reading while it rises when the voltage at the node 338 falls, whereby a sense amplifier output Sout develops at the node 328, that is, the junction of the load 331 and the first n-channel MOS transistor 335.

In this embodiment, the n-channel MOS transistor 333 is so controlled that when the voltage at the node 338 falls, namely, when a current flows through a selected memory cell transistor at the time of data reading, the voltage at the gate of the n-channel MOS transistor 333 rises. Therefore, the current flowing through the load 331 can be increased to shorten the time taken for the signal "L" to develop at the sense amplifier output Sout, namely, the time taken for data reading when the current flows through the selected memory cell transistor, thereby permitting a higher data reading speed.

Embodiments in the third aspect of the present invention will be described with reference to FIGS. 33 to 39.

Figure 33:
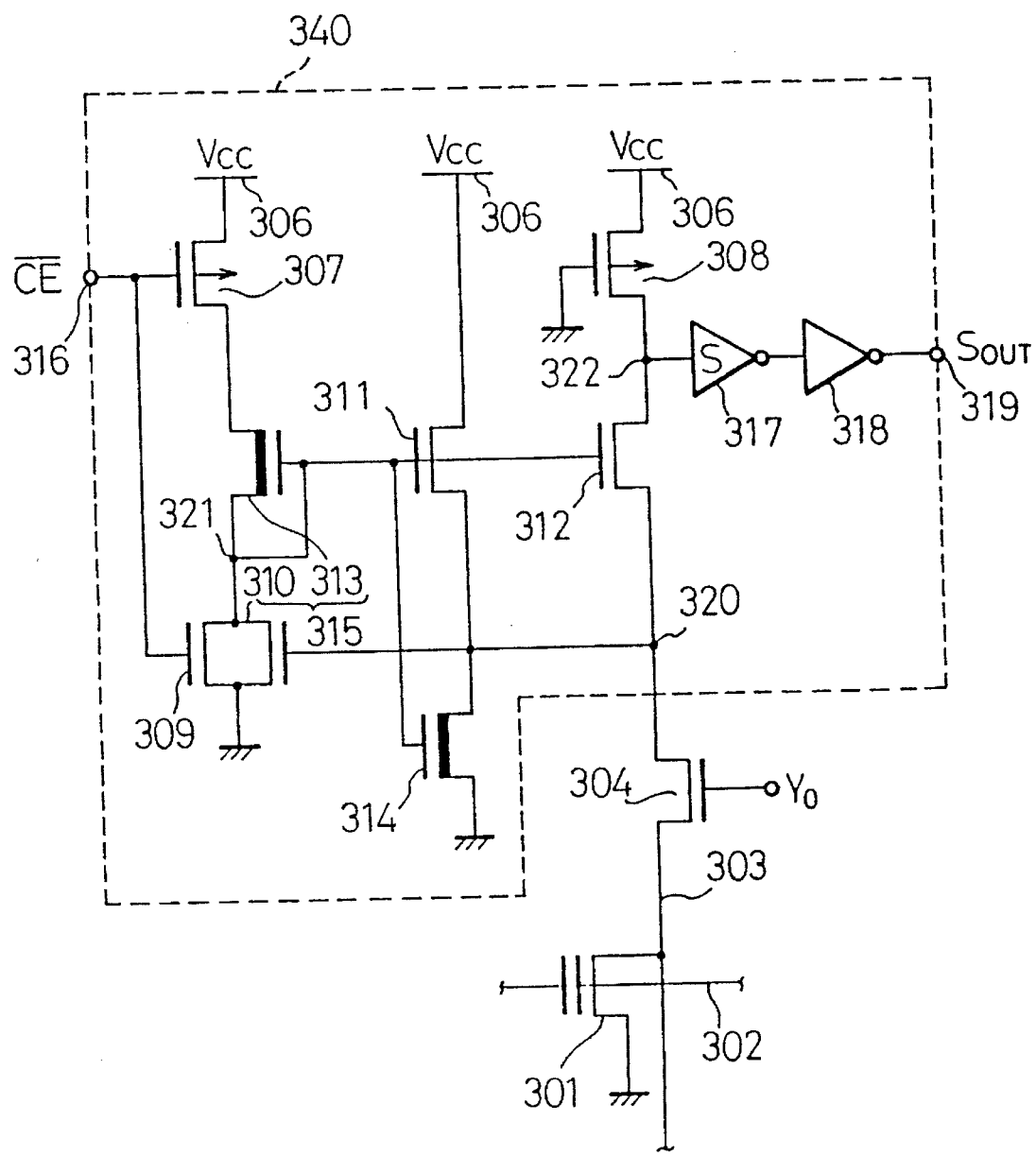
FIG. 33 is a circuit diagram showing an essential portion of a first specific example of the third mode according to the invention.

FIG. 33 is a circuit diagram showing the essential part of a first embodiment in the third mode of the present invention. In Figure, the reference numeral 340 denotes a sense amplifier in which an n-channel MOS transistor 314 is connected at the gate thereof to the output terminal of an inverter 315 and of which the other configuration is similar to that of the conventional EPROM shown in FIG. 30.

Also in this sense amplifier, however, when the n-channel MOS transistor 304 is turned off with the bit line select signal Yo taking the L level, the voltage at the node 320 becomes stable at 1 V. The circuit constant is so set that in this case the voltage at the node 322 takes the H level with respect to the Schmidt-trigger inverter 317.

In this first embodiment when selected, the chip enable signal CE takes the H level so that the p-channel MOS transistor 307 is turned off while the n-channel MOS transistor 309 is turned on.

This results in the supply of the power-supply voltage Vcc to the inverter 315 being interrupted, the n-channel MOS transistor 311 being turned off and the n-channel MOS transistor 312 also being turned off so that no power will be consumed in the sense amplifier 340.

On the contrary, when this embodiment is selected, the chip enable signal CE takes the L level so that the p-channel MOS transistor 307 is turned on while the n-channel MOS transistor 309 is turned off.

Thus the power-supply voltage Vcc is supplied again to the inverter 315 through the p-channel MOS transistor 307, and the n-channel MOS transistors 311 and 312 are turned on so that the sense amplifier is activated.

Assume here that the word line 302 takes the H level and the n-channel MOS transistor 304 is turned on with the bit line select signal Yo taking the H level so that the memory cell transistor 301 is selected. When no current flows through the memory cell transistor 301, the voltage at the node 320 rises due to the current supplied through the p-channel MOS transistor 308 and the n-channel MOS transistor 312 and the current supplied through the n-channel MOS transistor 311.

The voltage at the node 321 then falls, the current flowing through the n-channel MOS transistors 311 and 312 decreases, the voltage at the node 320 becomes stable at 1 V, the node 322 takes the H level, and a sense amplifier output Sout at the H level develops at the sense amplifier output terminal 319.

On the contrary, when a current flows through the memory cell transistor 301, the voltage at the node 320 falls, so that the voltage at the node 322 takes the L level and a sense amplifier output Sour at the L level develops at the sense amplifier output terminal 319.

In this first embodiment, when the voltage at the node 320 falls, the voltage at the node 321 rises, the gate voltage of the n-channel MOS transistor 314 rises and the current flowing through the n-channel MOS transistor 314 increases.

Hence, in this first embodiment, if a current flows through a selected memory cell transistor at the time of data reading, the time required for the node 322 to take the L level can be shortened and the data reading can be effected at a high speed compared to the case that the n-channel MOS transistor 314 is connected at the gate thereof to the ground potential.

Namely, as seen from the waveform in FIG. 38, even if the voltage at the node 322 is raised to some extent by using an ATD circuit in the aforementioned embodiment of the present invention, the control circuit in this embodiment comprising the second transistor and inverter permits the time required for the node 322 to take the L level to be shortened as indicated with the waveform (A) and considerably shortens the time taken for data reading compared to the same waveform (B) in the conventional circuit configuration.

Figure 34:
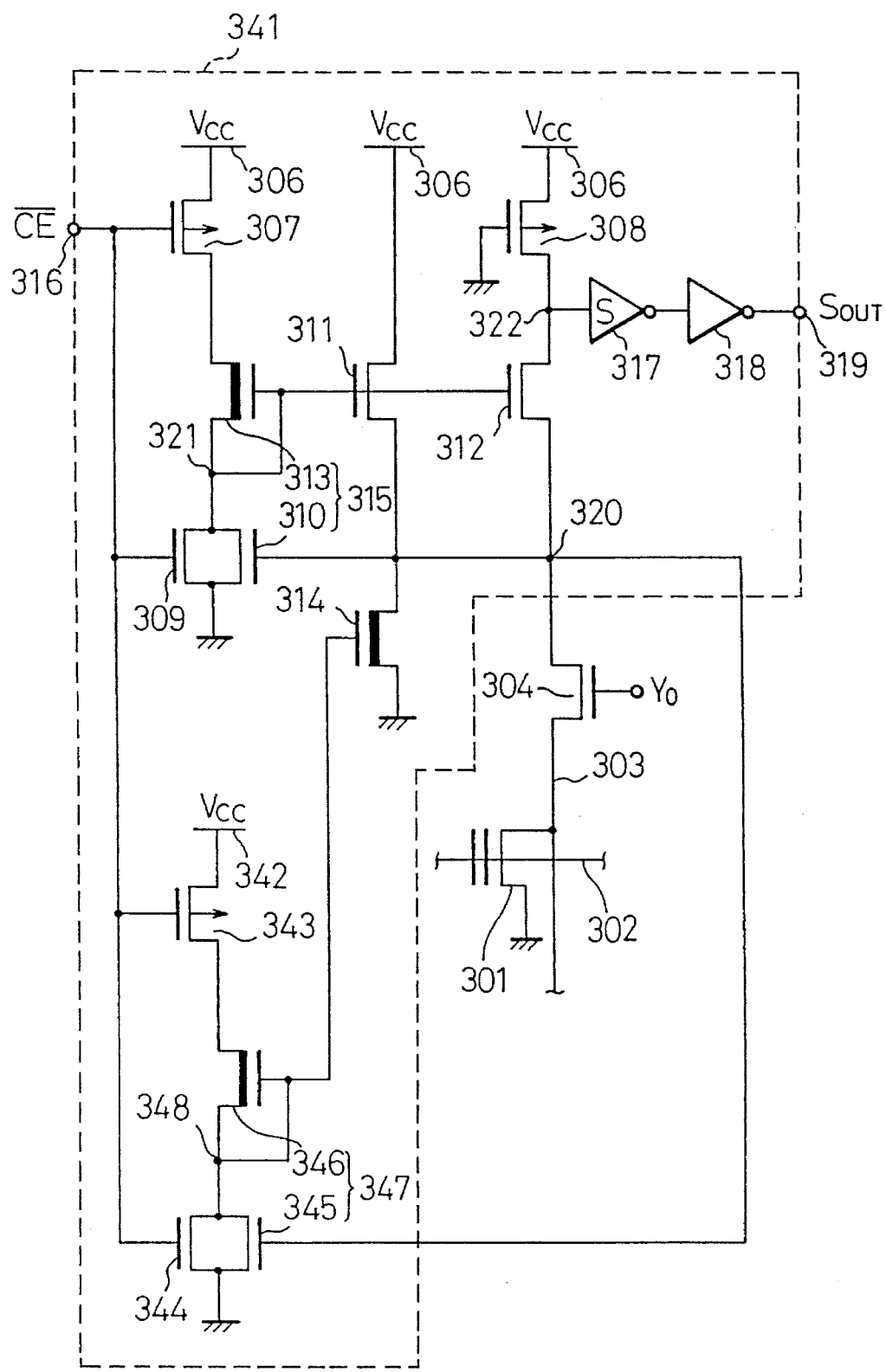
FIG. 34 is a circuit diagram showing an essential portion of a second specific example of the third mode according to the invention.

FIG. 34 is a circuit diagram showing the essential part of a second embodiment in the third mode of the present invention. In Figure, the reference numeral 341 denotes a sense amplifier comprising a power line 342 over which the power-supply voltage Vcc is supplied, an enhancement-type p-channel MOS transistor 343, enhancement-type n-channel MOS transistors 344 and 345, and a depression-type n-channel MOS transistor 346.

In this embodiment, an E/D-type inverter 347 is built with an n-channel MOS transistor 345 as a drive transistor and an n-channel MOS transistor 346 as a load transistor.

More particularly, this second embodiment has a circuit configuration that includes a p-channel MOS transistor 343, n-channel MOS transistor 344 and an inverter 347. The input terminal of the inverter 347 is connected to the node 340 and the n-channel MOS transistor 314 is connected at the gate thereof to the node 348. In other respects, the second embodiment is similar to the first embodiment shown in FIG. 33.

In the second embodiment, when the word line 302, for example, takes the H level and the bit line select signal Yo takes the H level, the n-channel MOS transistor 304 is turned on so that the memory cell transistor 301 is selected. If no current flows through the memory cell transistor 301, the voltage at the node 320 rises due to the current supplied through the p-channel MOS transistor 308 and n-channel MOS transistor 312 and the current supplied through the n-channel MOS transistor 311.

The voltage at the node 321 then falls, the current flowing through the n-channel MOS transistors 311 and 312 decreases, the voltage at the node 320 becomes stable at 1 V, the node 322 takes the H level and a sense amplifier output Sout at the H level develops at the sense amplifier output terminal 319.

On the contrary in this second embodiment, when a current flows through the memory cell transistor 301, the voltage at the node 320 falls with the result that the voltage at the node 322 takes the L level and a sense amplifier output Sout at the L level develops at the sense amplifier output terminal 319.

In this second embodiment, when the voltage at the node 320 falls, the voltage at the node 348, which is the output terminal of the inverter 347, rises and the gate voltage of the n-channel MOS transistor 314 also rises, so that a current flowing through the n-channel MOS transistor 314 increases.

Hence, also in this second embodiment, if a current flows through a selected memory cell transistor at the time of data reading, the time required for the node 322 to take the L level can be shortened and the data reading can be done at a high speed compared to the case that the n-channel MOS transistor 314 is connected at the gate thereof to the ground potential.

Figure 35:
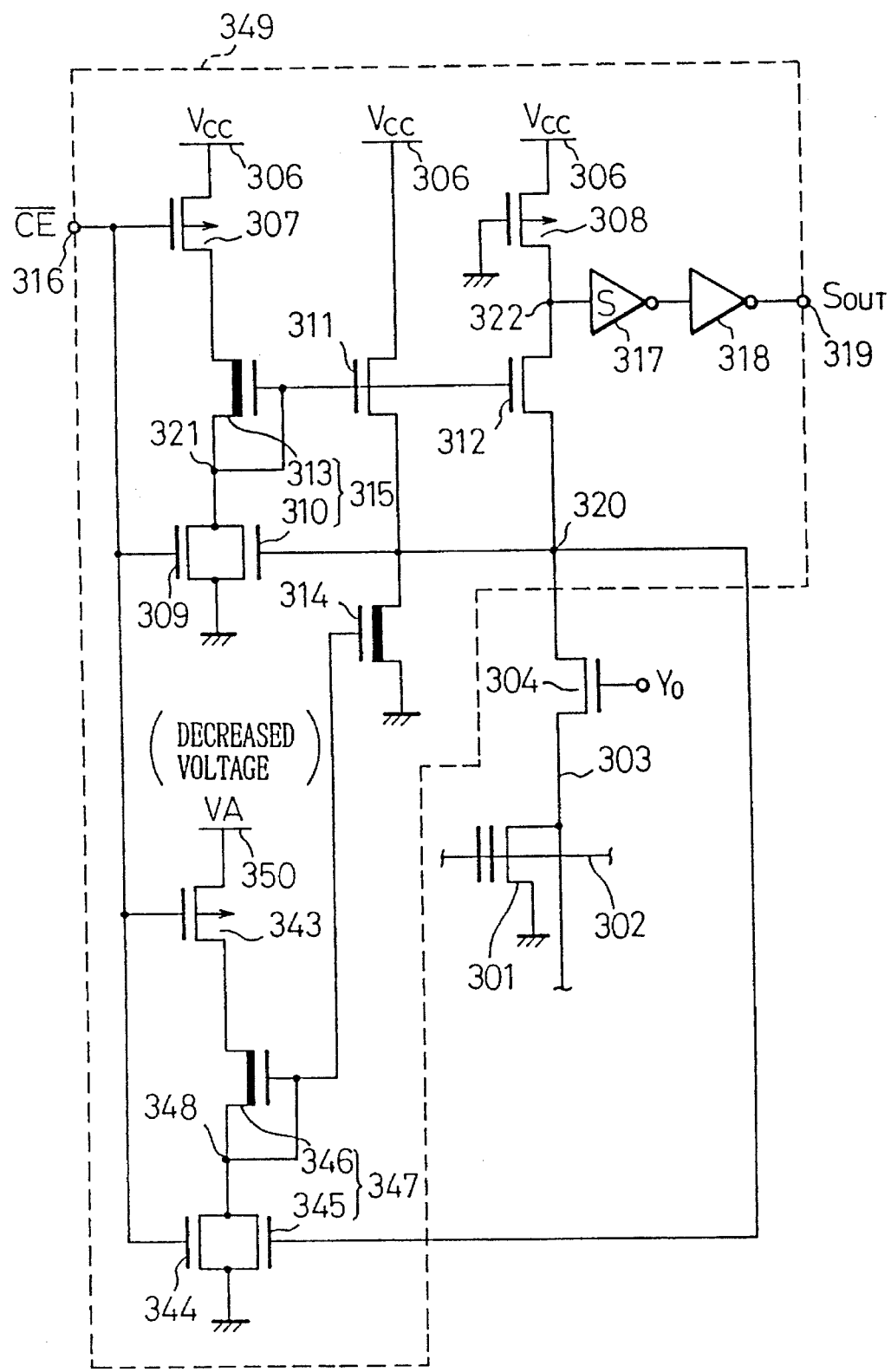
FIG. 35 is a circuit diagram showing an essential portion of a third specific example of the third mode according to the invention.

FIG. 35 is a circuit diagram showing the essential part of a third embodiment in the third mode of the present invention. In Figure, the reference numeral 349 denotes a sense amplifier having a low voltage line 350, which supplies a low voltage VA produced by dropping the power-supply voltage Vcc.

More particularly, the circuit of this third embodiment is so configured that the low voltage VA is supplied through the p-channel MOS transistor 343 to the inverter 347, which will be operated with the low voltage VA. In other respects, the third embodiment is similar to the second embodiment shown in FIG. 34.

The third embodiment has a similar effect to that of the second embodiment. Furthermore, the rise of the voltage at the node 348 when the voltage at the node 320 falls is more limited than in the second embodiment in limiting the rise of the gate voltage of the n-channel MOS transistor 314, thereby preventing a fault from occruing as a result of the current flowing through the n-channel MOS transistor 314 becoming too large.

Figure 36:
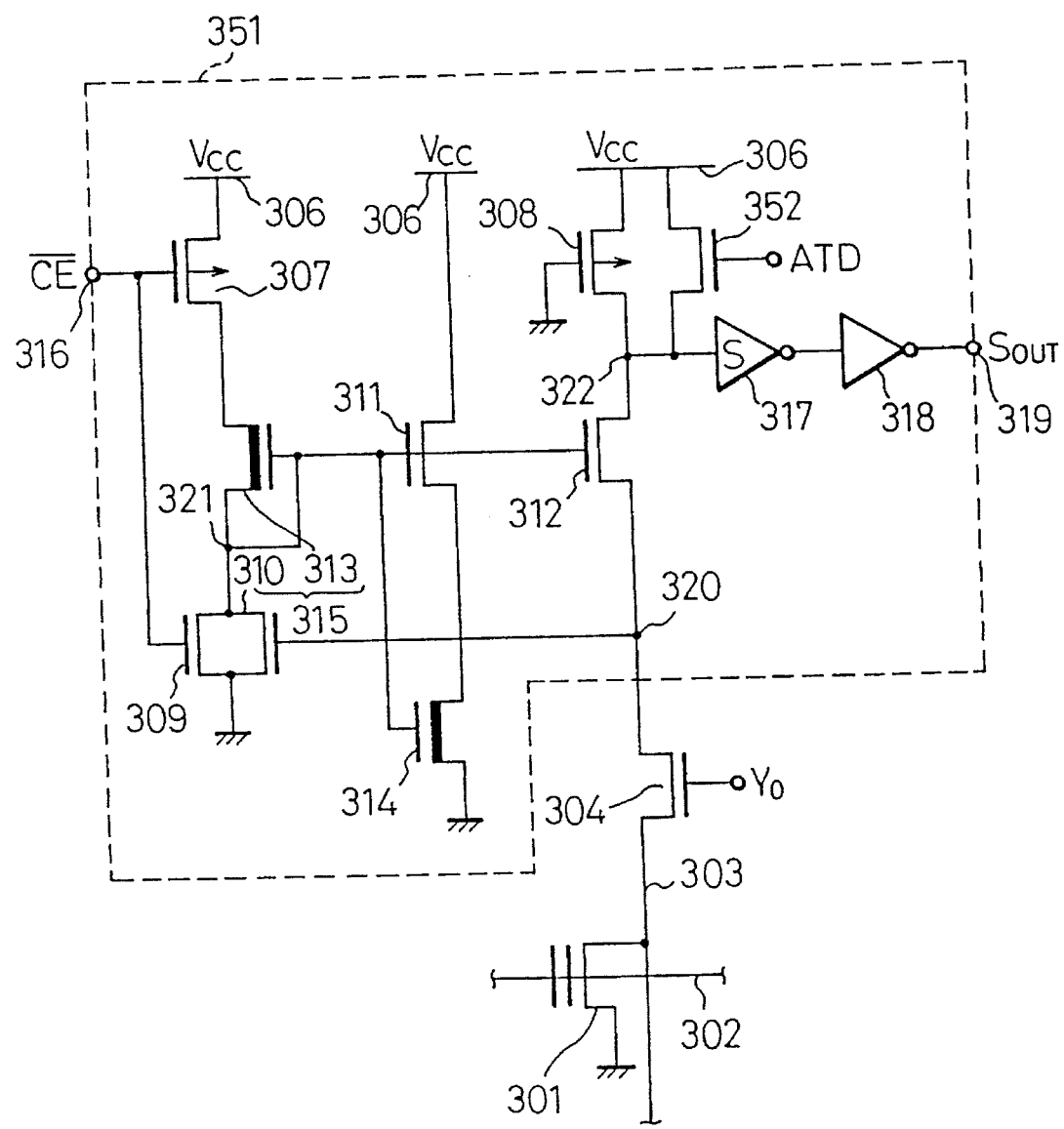
FIG. 36 is a circuit diagram showing an essential portion of a fourth specific example of the third mode according to the invention.

FIG. 36 is a circuit diagram showing the essential part of a fourth embodiment in the third mode of the present invention. In Figure, the reference numeral 351 denotes a sense amplifier comprising an n-channel MOS transistor 352 connected at the drain thereof to the power line 306, at the source thereof to the node 322 and supplied at the gate thereof with an ATD signal. In other respects, this fourth embodiment is similar to the first embodiment shown in FIG. 33.

In this fourth embodiment, if the nodes 320 and 322 are precharged based on the ATD signal so that no current flows through a selected memory cell transistor at the time of data reading, the status with the H level can be read at a higher speed.

Also in this fourth embodiment, the n-channel MOS transistor 314 is connected at the gate thereof to the node 321 as in the first embodiment, so that when the voltage at the node 320 falls at the time of data reading, the gate voltage of the n-channel MOS transistor 314 rises and the current flowing through the n-channel MOS transistor 314 increases.

Hence, in the fourth embodiment, when a current flows through a selected memory cell transistor at the time of data reading in the case that the nodes 320 and 322 are precharged based on the ATD signal, the time required for the node 322 to take the L level can be shortened and the data reading can be done at a high speed compared to the case when the n-channel MOS transistor 314 is connected at the gate thereof to the ground potential.

Figure 37:
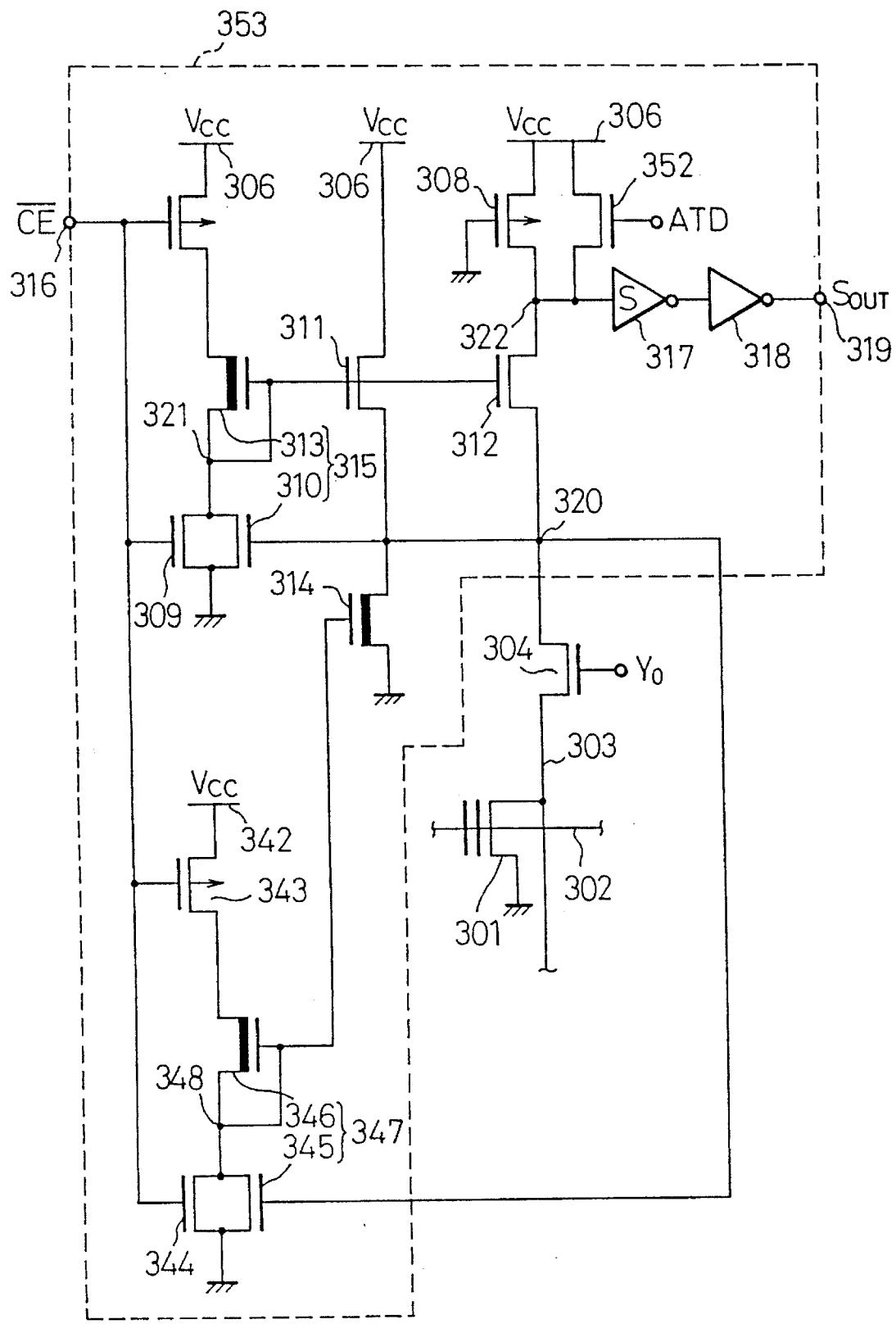
FIG. 37 is a circuit diagram showing an essential portion of a fifth specific example of the third mode according to the invention.

FIG. 37 is a circuit diagram showing the essential part of a fifth embodiment in the third mode of the present invention. In Figure, the reference numeral 353 denotes a sense amplifier comprising an MOS transistor 352 connected at the drain thereof to the power line 306, at the source thereof to the node 322 and supplied at the gate thereof with an ATD signal. In other respects, this fifth embodiment is similar to the second embodiment shown in FIG. 34.

Also in this fifth embodiment, if the nodes 320 and 322 are precharged based on the ATD signal so that no current flows through a selected memory cell transistor at the time of data reading, the status with the H level can be read at a higher speed.

Also in this fifth embodiment, the n-channel MOS transistor 314 is connected at the gate thereof to the node 348 as in the second embodiment, so that when the voltage at the node 320 falls at the time of data reading, the gate voltage of the n-channel MOS transistor 314 rises and the current flowing through the n-channel MOS transistor 314 increases.

Hence, in the fifth embodiment, when a current flows through a selected memory cell transistor at the time of data reading in the case that the nodes 320 and 322 are precharged based on the ATD signal, the time required for the node 322 to take the L level can be shortened and the data reading can be done at a high speed compared to the case when the n-channel MOS transistor 314 is connected at the gate thereof to the ground potential.

FIGS. 38(A)–(B) are waveform diagrams showing the operation of the sense amplifier 353 as shown in FIG. 37 used in the fifth embodiment in comparison with the operation of the conventional sense amplifier 305 shown in FIG. 30. FIG. 38(A) is a waveform diagram showing the operation of the sense amplifier 353 as shown in FIG. 37, incorporated in the fifth embodiment, and FIG. 38(B) is a waveform diagram showing the operation of the sense amplifier 305 shown in FIG. 30.

Figure 39:
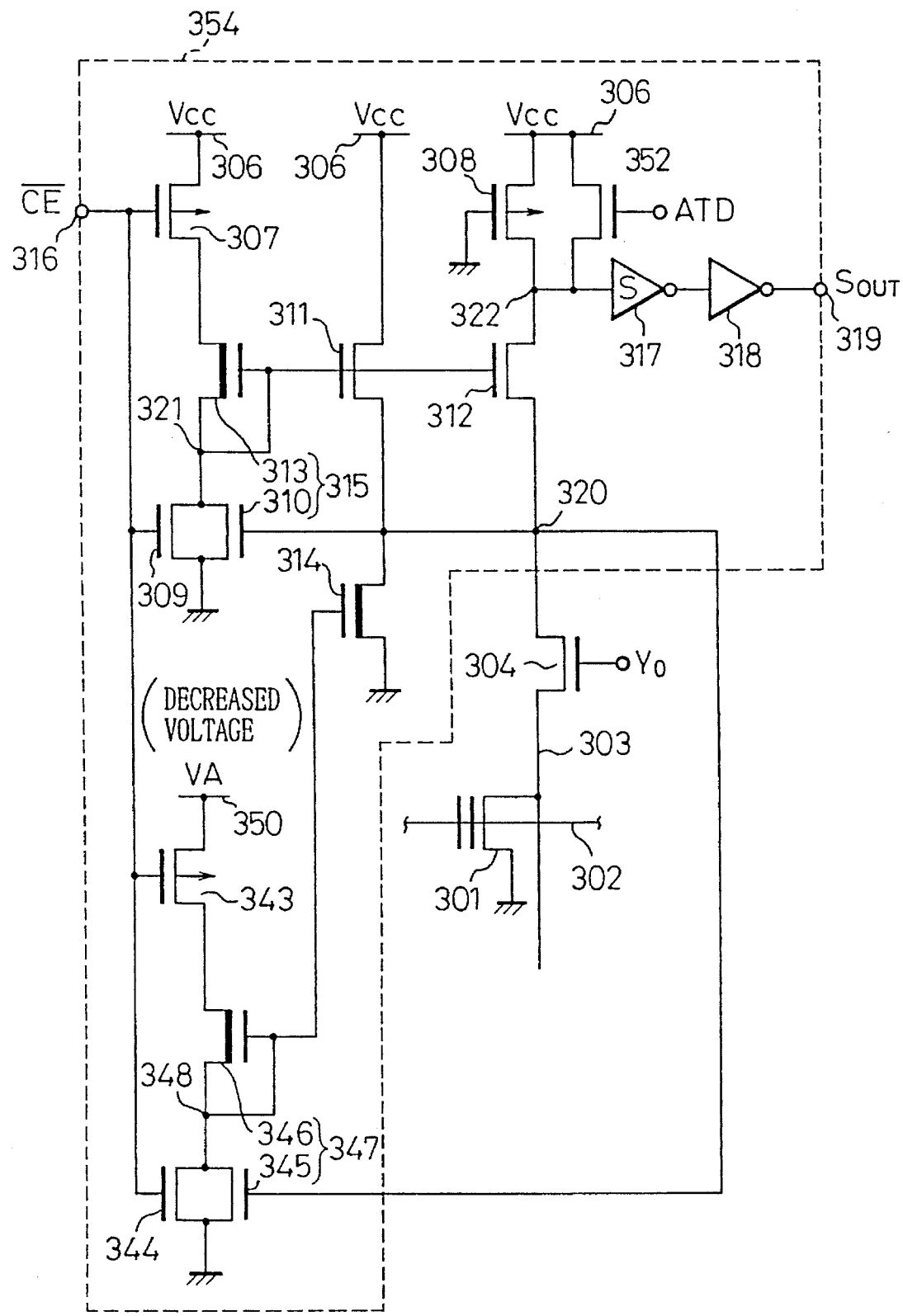
FIG. 39 is a circuit diagram showing an essential portion of a sixth specific example of the third mode according to the invention.

FIG. 39 is a circuit diagram showing the essential part of a sixth embodiment in the third aspect of the present invention. In Figure, the reference numeral 354 denotes a sense amplifier comprising an n-channel MOS transistor 352 connected at the drain thereof to the power line 306, at the source thereof to the node 322 and supplied at the gate thereof with an ATD signal. In other respects, the sixth embodiment is similar to the third embodiment shown in FIG. 35.

In this sixth embodiment as shown in FIG. 39, if the nodes 320 and 322 are precharged based on the ATD signal so that no current flows through a selected memory cell transistor at the time of data reading, the status with the H level can be read at a higher speed.

Also in this sixth embodiment, the n-channel MOS transistor 314 is connected at the gate thereof to the node 348 as in the third embodiment, so that when the voltage at the node 320 falls at the time of data reading, the gate voltage of the n-channel MOS transistor 314 rises and the current flowing through the n-channel MOS transistor 314 increases.

Hence, in the sixth embodiment, when a current flows through a selected memory cell transistor at the time of data reading in the case that the nodes 320 and 322 are precharged based on the ATD signal, the time required for the node 322 to take the L level can be shortened and the data reading can be done at a high speed as compared to the case when the n-channel MOS transistor 314 is connected at the gate thereof to the ground potential.

Also in this sixth embodiment, the inverter 347 is supplied with a low voltage VA. Thus, when the voltage at the node 320 falls, the rise of the gate voltage of the n-channel MOS transistor 314 is limited more than in the fifth embodiment in decreasing the current through the n-channel MOS transistor 314, thereby preventing a fault from occuring as a result of the current flowing through the n-channel MOS transistor 314 becoming too large.

The third aspect of the present invention having been described in the foregoing, when a current flows through a selected memory cell transistor at the time of data reading, the gate voltage of the n-channel MOS transistor makes up the current flowing through the load rises. Thus, when a current flows through a selected memory cell transistor at the time of data reading, the current through the load is increased so that the time required for data reading when the current flows through the selected memory cell transistor can be shortened and the data reading can be effected at a higher speed.

In the flash-type memory according to the present invention, a plurality of different power-supply voltages is used at different positions, and many of them are supplied from external power supplies.

In the modes of the present invention, a single external power supply should preferably be used to produce a plurality of different power-supply voltage within the flash-type memory according to the present invention.

Heretofore, however, there have been many problems with such internal power-supply voltage generation circuits, and it has been difficult to obtain an ideal internal power-supply voltage generation circuit.

Recently, because of the larger-scale integration of semiconductor devices, down-sizing and lower power consumption are required. It is also required that the power-supply voltage be lower (for example, a voltage of 5 V is currently prevailing, but a reduction to 3.0 or 3.3 V is required). On the other hand, use of conventional semiconductor devices and other parts together with such recent semiconductor devices integrated in a larger scale is unavoidable. Therefore, it is required that the operation of an apparatus using both a low voltage and an ordinary power-supply voltage be ensured.

In conventional technology, existing semiconductor devices are used with a low voltage without special consideration afforded them. Therefore, since transistors used to build a semiconductor device are not sufficiently adapted for use with a low voltage (for example, thinning of a gate oxide film, shortening of channel length, etc.), the characteristics of the transistors are degraded significantly when the semiconductor device is operated using a low voltage.

Thus, in the conventional semiconductor device, an external power-supply voltage (normally, 5 V) is dropped to a suitable low voltage within the device (namely, the power-supply voltage is simply dropped). Namely, the transistors are adapted to the reduced voltage so as to maintain characteristics thereof.

However, conventional semiconductor devices in which an external reduced power-supply voltage is used incur the following problems (1) Problems with the voltage dropping circuit itself, (2) Problems with the input-stage circuit and (3) Problems with the output-stage circuit.
(1) Problems with the voltage dropping circuit FIG. 40 shows an example voltage dropping circuit used in the conventional semiconductor device, and FIG. 41 shows its operational characteristic waveform.

In FIG. 40, Vcc indicates an external power-supply voltage (power line), Vss a reference power-supply voltage (power line) of the semiconductor device, and Vci an internally dropped voltage. The circuit illustrated in FIG. 40 comprises a constant-current source IS connected to the power line Vcc, n-channel transistors QT1 to QTn connected in series between the output terminal of the constant-current source IS and the power line Vss and each of which has a gate connected to the drain thereof, and an n-channel transistor Q30 connected between the power line Vcc and the internal-voltage (Vci) delivery node and which responds to a signal at the drain terminal of the transistor QT1.

As shown in the operational characteristic waveform in FIG. 41, the internal voltage Vci is stabilized at the level of V2 when the external voltage Vcc is higher than the level of V1, thus advantageously, an ideal voltage drop is obtainable.

On the other hand, however, since the gate potential (reference voltage) of the transistor Q30 for conversion of the external voltage Vcc to the dropped voltage Vci is determined based on the voltage drop (threshold level) of each of the transistors QT1 to QTn, a problem will occur when the ambient temperature changes, the power-supply voltage varies or the like. Namely, the voltage drop of each of the transistors QT1 to QTn varies and the gate potential of the transistor Q30 also varies correspondingly, so that the operation of the transistor Q30 loses stability, thereby resulting in unstable delivery of the lowered voltage Vci.

Also since the constant-current source IS is used to generate a voltage drop in each of the transistors QT1 to QTn, the current is always consumed, which is a significant disadvantage.
(2) Problems with the input-stage circuit FIG. 42 shows an example address input circuit used in the conventional semiconductor device.

Figure 42:
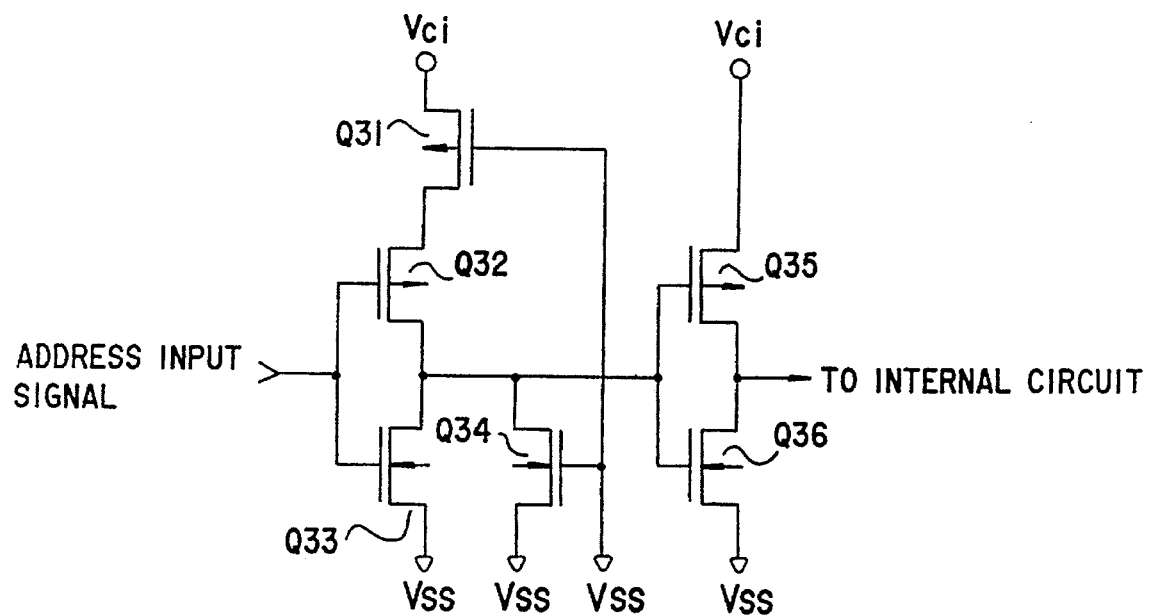
FIG. 42 is a circuit diagram showing an exemplary address input circuit in the semiconductor device of the prior art.

The circuit shown in FIG. 42 comprises a p-channel transistor Q31 driven by a dropped voltage Vci produced in, for example, the voltage dropping circuit shown in FIG. 40, connected at the source thereof to the line of dropped voltage Vci and which responds to the potential Vss, a CMOS inverter (composed of a p-channel transistor Q32 and n-channel transistor Q33) connected between the drain of the transistor Q31 and the power line Vss and which responds to the address input signal, an n-channel transistor Q34 connected parallel to the transistor Q33 and which responds to the potential Vss, and a CMOS inverter (composed of a p-channel transistor Q35 and n-channel transistor Q36) connected between the power lines Vci and Vss and which responds to the output from the inverter (Q32 and Q33).

Since the input threshold level of the input circuit is lower because this circuit is driven by the internally dropped voltage Vci, the circuit is susceptible to noise compared to the case when driven by an ordinary power-supply voltage Vcc higher than the voltage Vci. For example, the transistor will possibly malfunction as a result of an internally developed noise.

Also, when the amplitude of the address input signal changes to the levels of the voltages Vcc to Vss, the noise component (coupling noise) caused by the capacitive coupling with the external signal line and will be larger.

(3) Problems with the output-stage circuit

Figure 43:
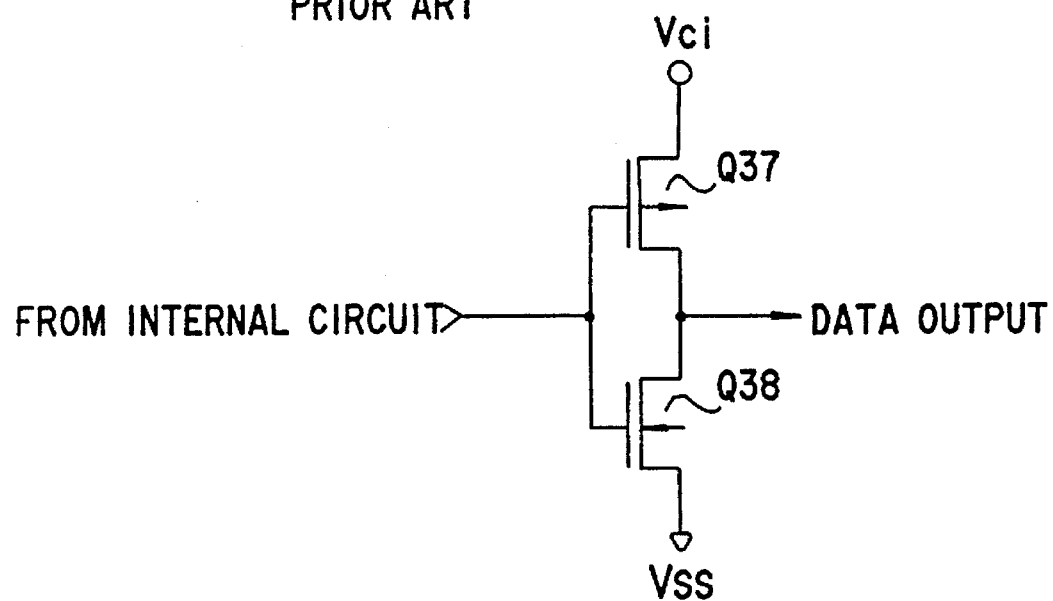
FIG. 43 is a circuit diagram showing an exemplary data output circuit in the semiconductor device of the prior art.

FIG. 43 shows an example data output circuit used in the conventional semiconductor device.

Similar to the circuit shown in FIG. 42, this circuit comprises a CMOS inverter (composed of a p-channel transistor Q37 and an n-channel transistor Q38) driven by the dropped voltage Vci produced in, for example, the voltage dropping circuit shown in FIG. 40, connected between the line of dropped voltage Vci and the power line Vss and which responds to the data signal from the internal circuit.

Since this circuit is driven by the internally dropped voltage Vci, when the data signal from the internal circuit changes in amplitude to the levels of the voltages Vci to Vss, the output signal also changes correspondingly with the amplitude at the levels of the voltages Vci to Vss. Thus, if a circuit connected to the output stage of this data output circuit is driven by an ordinary power-supply voltage (5 V), matching with elements used in that circuit will be poor. A signal at a predetermined logical level may not be transmitted stably, as the case may be.

Figure 44:
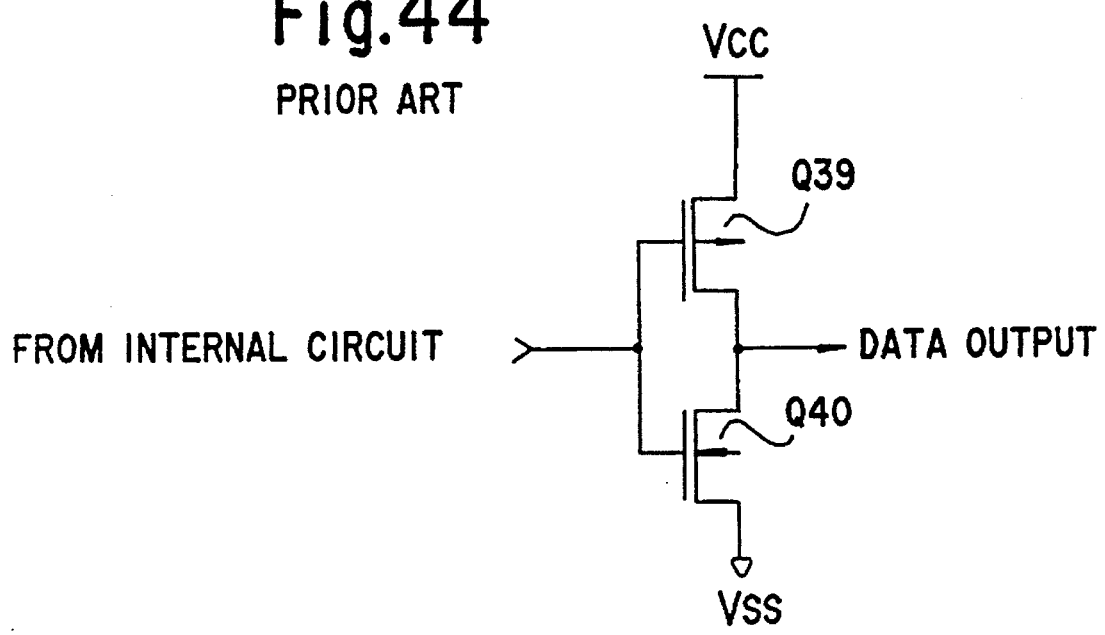
FIG. 44 is a circuit diagram showing another data output circuit in the semiconductor device of the prior art.

FIG. 44 shows another example data output circuit in the conventional semiconductor device.

This circuit comprises a CMOS inverter (composed of a p-channel transistor Q39 and an n-channel transistor Q40) driven by the external power-supply voltage Vcc, connected between the power lines Vcc and Vss and which responds to the data signal from the internal circuit.

Since it is driven with the power-supply voltage Vcc, this circuit has no problem in matching with external elements that are driven with the same voltage (5 V). However, when the input is at the level of Vss in the case that the data signal from the internal circuit changes in amplitude to the levels of the voltages Vci to Vss, only the p-channel transistor Q39 is turned on while the n-channel transistor Q40 is cut off, thus causing no problem. But if the input is at the level of Vci, the p-channel transistor Q39 is turned on as well, depending on the difference in level between the power-supply voltage Vcc and the internally dropped voltage Vci. In this case, there a problem will occur in that a through current flows from the power line Vcc to the power line Vss through the transistors Q39 and Q40.

Accordingly, the fourth aspect of he present invention seeks to solve the aforementioned problems of the internal power-supply voltage generation circuit used primarily in such a flash-type memory by providing an internal power-supply voltage generation circuit that consumes less power and can supply a low voltage by stably dropping an external power-supply voltage.

Furthermore, the fourth aspect of the present invention is intended to provide an internal power-supply voltage generation circuit for use in a flash-type memory that can maintain a good matching with various elements including external elements even in the case that an external voltage and an internally dropped voltage are used together, and which contributes to the improvement of operational reliability by eliminating the influence of noise.

Moreover, the internal power-supply voltage generation circuit in the fourth aspect of the present invention has a simple configuration, has developed therein no such through current as in the conventional voltage dropping circuit and is very suitable for building an internal power-supply voltage generation circuit in which the CMOS configuration is adopted.

Namely, the basic technical concept of this fourth aspect of the present invention is such that the threshold of the main transistors composing the internal power-supply source voltage generation circuit is adjusted while both the external power-supply voltage and reference voltage are kept at a stable fixed level to generate a dropped voltage at a predetermined level.

Therefore, this fourth aspect of the present invention permits the provision of an internal power-supply voltage generation circuit incorporating a circuit that drops an external power-supply voltage and of which the performance can be ensured with a wide range of power-supply voltages.

The internal power-supply voltage generation circuit in the fourth aspect of the present invention comprises, to solve the aforementioned problems, a means of dropping an external power-supply voltage to a predetermined internal voltage. This voltage dropping means is characterized in that a transistor is connected between the power-supply voltage line and the node at which the internal voltage is developed and that a reference voltage at a predetermined level is applied to the gate of the transistor so as to deliver the internally dropped voltage at the internal-voltage delivery node.

Particularly, the flash-type memory according to the present invention comprises a cell matrix circuit (1) having disposed therein reloadable nonvolatile memory cells (Mij) at the intersections of a plurality of word lines WL1 to WLm and a plurality of bit lines BL11 to BL1k, . . . , BLn1 to BLnk, a row decoder circuit 3, a column decoder 5, sense amplifier circuits 71 to 7n connected to the bit lines BL11 to BL1k, . . . , BLn1 to BLnk of the cell matrix circuit (1), and an internal power-source voltage generation circuit connected to at least an external power supply and in which an external power-supply voltage Vcc is used to produce different kinds of internal voltages. The internal power-supply voltage generation circuit comprises a means of dropping an external power-supply voltage Vcc to a predetermined internal voltage Vci. This voltage dropping means has a transistor Q connected between the external power-supply voltage line and the node N at which the internal voltage is delivered. A reference voltage at a predetermined level is applied to the gate of the transistor Q to deliver the internally dropped voltage at the internal-voltage delivery node. The transistor Q should preferably be a depression-type n-channel transistor.

Further, a smoothing capacitor C may be provided in the internal-voltage delivery node in the internal power-source voltage generation circuit, whereby the internal source voltage resulting from noise or the like can be prevented from fluctuating.

Moreover in this embodiment, the voltage dropping level can be adjusted by changing the threshold of the aforementioned transistor Q.

Also in this embodiment, the fixed reference voltage applied to the gate of the transistor Q should preferably be a single voltage supplied from the reference power line Vss of the semiconductor device.

Furthermore, the reference voltage at the predetermined level applied to the gate of the transistor Q may be supplied to the reference power line of the semiconductor device, whereby only the dropped voltage is delivered at the internal-voltage delivery node. Otherwise, nonvolatile memory elements may be used and the reference voltage at the predetermined level applied to the gate of the transistor Q should be set to either the level of the external power-source voltage or that of the reference power-source voltage of the semiconductor device, whereby a dropped voltage or an ordinary power-source voltage is selectively delivered at the internal-voltage delivery node.

In the aforementioned circuit configuration, since a transistor is used as the means of dropping an external power-supply voltage to a predetermined internal voltage and it is driven by applying the transistor at the gate thereof with a stable reference voltage at a predetermined level; the power is not unnecessarily consumed as in the conventional circuit configuration, thereby providing a stable internally-dropped voltage.

Also, a smoothing capacitor may be provided in the internal-voltage delivery node to further stabilize the level of the internally dropped voltage delivered at the node.

Embodiments of the internal power-supply voltage generation circuit in the fourth mode of the present invention will be described with reference to FIGS. 45 to 50.

Figure 45:
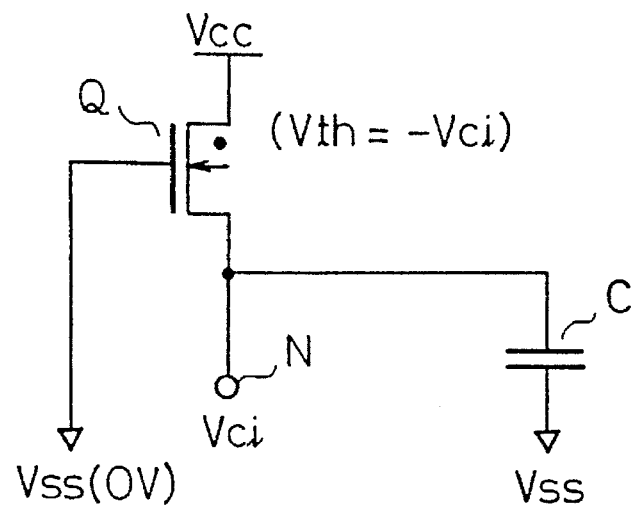
FIG. 45 is a circuit diagram showing an exemplary voltage reducing circuit in a semiconductor device used in a fourth mode according to the invention.

FIG. 45 shows an example configuration of the voltage dropping circuit in the internal power-supply voltage generation circuit in the fourth aspect of the present invention.

In this embodiment, a depression-type n-channel transistor Q is used to convert an external power-supply voltage Vcc to an internal voltage dropped for the internal circuit. The transistor Q is connected at the gate thereof to the reference power line Vss (that is a stable reference voltage of 0 V (=ground potential) of the semiconductor device, at the drain thereof to a higher-potential power line (that is, external voltage Vcc), and at the source thereof to the internal-source voltage (Vci) delivery node N. The threshold level of this depression-type transistor Q is selected to be Vth=−Vci. Also, a smoothing capacitor C is connected between the internal-voltage delivery node N and the lower-potential power line Vss.

In the circuit configuration according to this embodiment, the transistor Q provided for converting a stable external power-source voltage Vcc to a dropped internal voltage Vci is connected at the gate thereof to the reference voltage line Vss; the potential of which is stable and does not fluctuate. Since there is no problem that a current is always supplied as in the circuit configuration shown in FIG. 40, a stable internally-dropped voltage Vci can be obtained.

The threshold of the transistor used in the internal power-source voltage generation circuit according to the present invention can be adjusted by changing, for example, the thickness of silicon oxide film.

Also, since a smoothing capacitor C is provided in the internal-voltage delivery node N, the level of the internally dropped voltage Vci delivered at the node N can be further stabilized.

Figure 46:
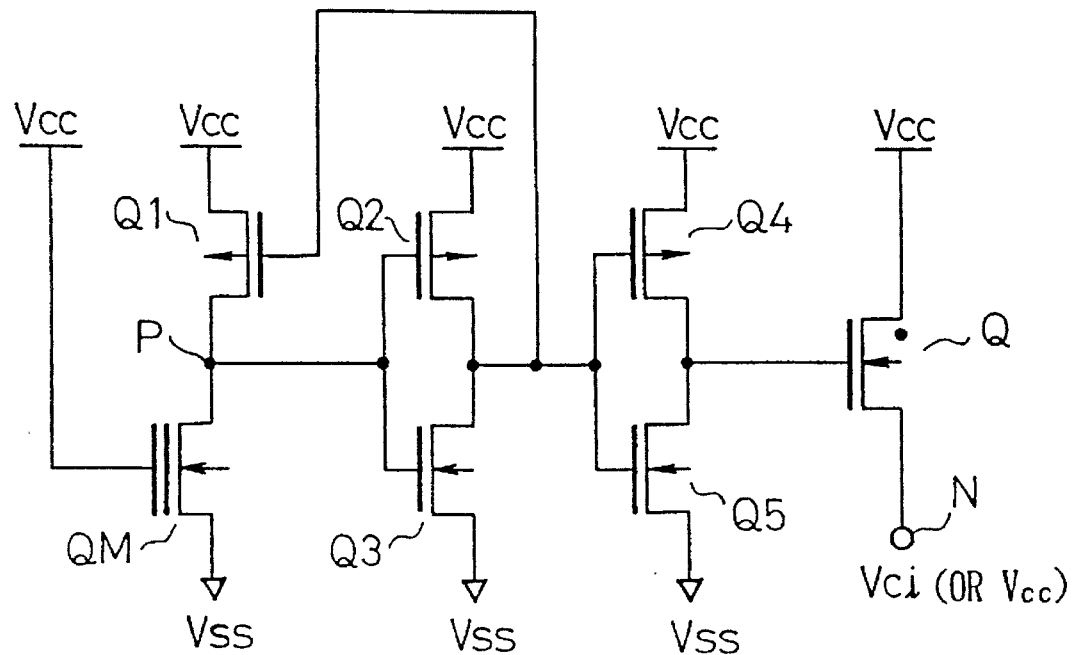
FIG. 46 is a circuit diagram showing another voltage reducing circuit in the semiconductor device shown in FIG. 45.

In this embodiment, only the internally dropped voltage Vci is delivered at the internal-voltage delivery node N. However, the ordinary power-supply source voltage Vcc can be easily delivered in place of the internal source voltage Vci. FIG. 46 shows an example of such a circuit.

The circuit shown in FIG. 46 comprises a nonvolatile memory cell QM such as EPROM to determine whether the internally dropped voltage Vci or the external voltage Vcc is to be delivered. The nonvolatile memory cell QM is connected between the reference power line Vss and the internal-voltage delivery node P and has the control gate connected to the supply line of the external voltage Vcc. The nonvolatile memory cell QM supplies or does not supply a current according to its contents. Therefore, the potential at the internal-voltage delivery node P takes the L level when the memory cell QM supplies a current, and takes the H level when the memory cell does not supply a current.

A p-channel transistor Q1 is connected between the power line Vcc having a high potential and the internal-voltage delivery node P. Also a CMOS inverter (composed of a p-channel transistor Q2 and an n-channel transistor Q3) is connected between the power line Vcc and the low voltage line Vss, and these transistors are connected at the gate thereof to the internal-voltage delivery node P and at the drain thereof to the gate of the p-channel transistor Q1. Similarly, there is connected between the power lines Vcc and Vss, another CMOS inverter (composed of a p-channel transistor Q4 and an n-channel transistor Q5), the gates of which are connected to the output terminals of the inverter (Q2 and Q3) and the drains are connected to the gate of the transistor Q (FIG. 45).

In particular, the gate of the transistor Q provided for conversion of the power-source voltage Vcc to an internal source voltage Vci (or Vcc) is so arranged as to respond to the voltage determined depending upon the contents of the nonvolatile memory cell QM (namely, the H or L level developed at the internal-source voltage delivery node P) but not to the fixed reference potential Vss as in the embodiment shown in FIG. 45.

Therefore, when the nonvolatile memory cell QM supplies a current, the internal-source voltage delivery P takes the L level. Thus, the transistor Q is applied at the gate thereof with an L-level signal through the two-stage inverter, and this transistor is cut off. A dropped internal source voltage Vci is delivered at the internal-source voltage delivery node N. On the other hand, when the nonvolatile memory cell QM supplies no current, the internal-source voltage delivery node P takes the H level, so that the transistor Q is turned on and thus the external power-source voltage Vcc is delivered at the internal-source voltage delivery node N.

Figure 47:
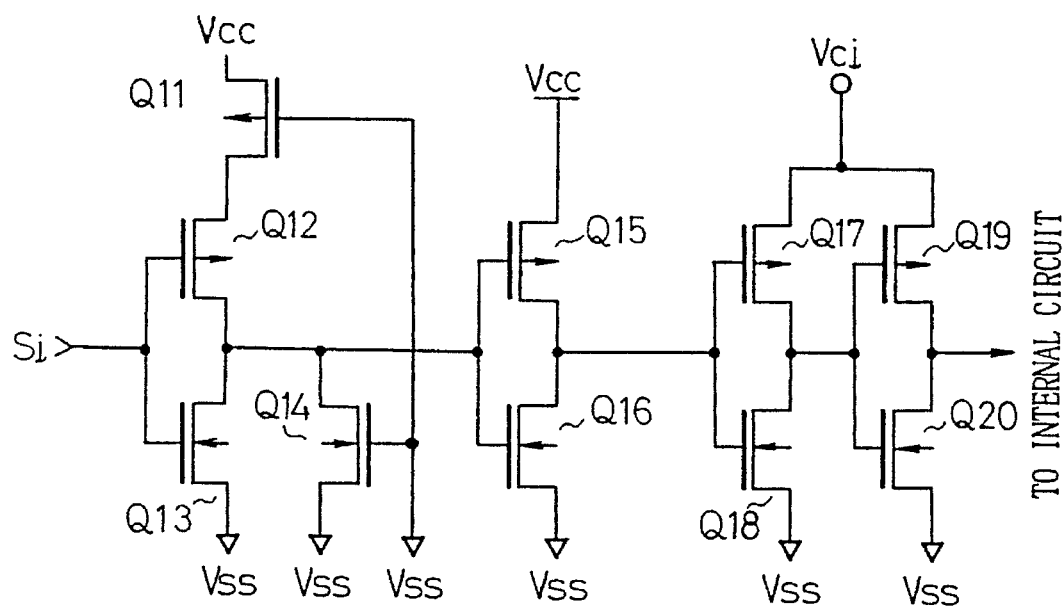
FIG. 47 is a circuit diagram showing an exemplary input circuit of the semiconductor device to which the circuit shown in FIG. 45 or 46 is applied.

FIG. 47 shows an example configuration of the input-stage circuit in a semiconductor device in which the aforementioned voltage dropping circuit is adopted.

The input-state circuit shown in Figure comprises a circuitry driven by an external power-source voltage Vcc and a circuitry driven by the dropped internal source voltage Vci, and it is so configured as to transmit an input signal Si (for example, an address signal in case of a semiconductor memory) to an internal circuit of which at least a part is driven by the internally dropped voltage Vci.

The circuitry driven by the external power-source voltage Vcc comprises a p-channel transistor Q11 connected at the source thereof to the power line Vcc that responds to the potential Vss, a CMOS inverter (composed of a p-channel transistor Q12 and an n-channel transistor Q13) connected between the drain of the transistor Q11 and the power line Vss that responds to the input signal Si, an n-channel transistor Q14 connected parallel to the transistor Q13 that responds to the potential Vss, and a CMOS inverter (composed of a p-channel transistor Q15 and an n-channel transistor Q16) connected between the power lines Vcc and Vcc that responds to the output from the inverter (Q12 and Q13). The transistors Q15 and Q16 function to stabilize the level of signals having amplitudes Vcc to Vss delivered from the circuit provided upstream thereof and transmit them to the circuit provided downstream thereof.

On the other hand, the circuitry driven by the internally dropped voltage Vci comprises a CMOS inverter (composed of a p-channel transistor Q17 and an n-channel transistor Q18) connected between the internally-dropped voltage line Vci and the power line Vss that responds to the output from the inverter (Q15 and Q16), and a CMOS inverter (composed of a p-channel transistor Q19 and an n-channel transistor Q20) connected between the power lines Vci and Vss that responds to the output from the inverter (Q17 and Q18).

In the circuit configuration shown in FIG. 47, since the circuitry which directly receives the input signal Si is driven by the external power-supply voltage Vcc, the input threshold level can be set high compared to that in the conventional circuit configuration (shown in FIG. 42). Namely the circuitry is not susceptible to noise in an external input signal (that is, improvement in the noise margin of the circuit) and the possibility of a transistor malfunction can be eliminated.

Note that since the gate signals in the circuitry, which also receive the input signal Si in the first stage of the circuit driven by internally dropped voltage Vci (consisting of the transistors Q17 and Q18), change with the logical amplitudes of Vcc to Vss, the gate withstand voltage of each transistor used in the circuitry is preferably selected so as to be relatively high.

Also, in this connection, the drain or gate withstand voltage of each transistor used in the circuitry driven by the external power-supply voltage Vc should preferably be set high.

Figure 48:
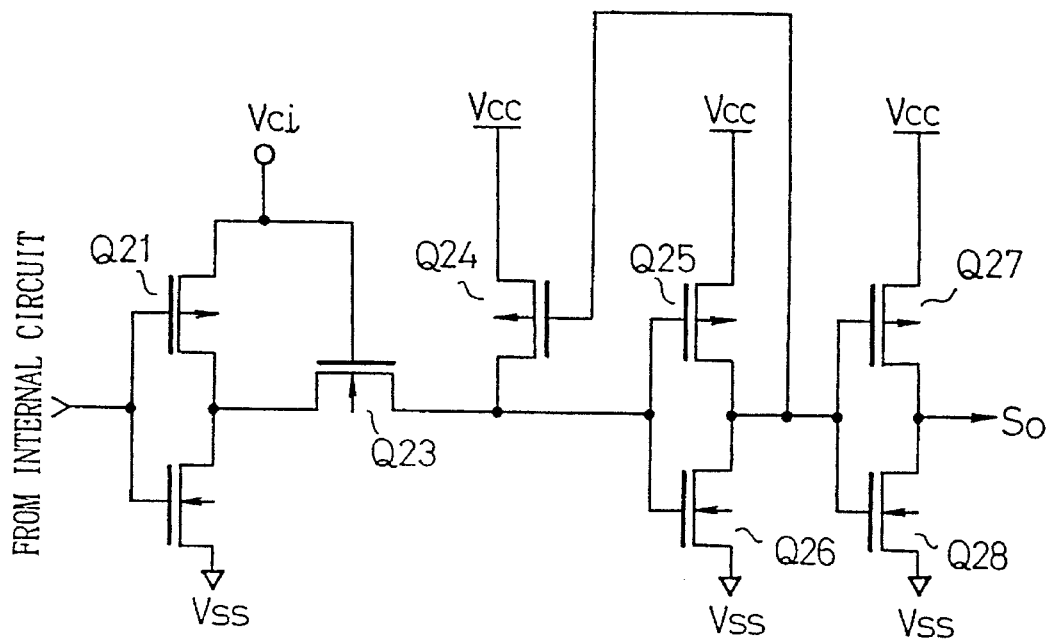
FIG. 48 is a circuit diagram showing an exemplary output circuit of the semiconductor device to which the circuit shown in FIG. 45 or 46 is applied.

FIG. 48 shows an example configuration of the output-stage circuit in a semiconductor device in which the aforementioned voltage dropping circuit is adopted.

The output-stage circuit shown in Figure comprises a circuitry driven by the dropped internal voltage Vci and a circuitry driven by the external power-supply voltage Vcc, and it is so configured as to deliver outside the circuit, as data output So, the data signal from the internal circuit (not shown) of which at least a part is driven by the internally dropped voltage Vci.

The circuitry driven by the internally dropped voltage Vci comprises a CMOS inverter (composed of a p-channel transistor Q21 and an n-channel transistor Q22) connected between the internally dropped voltage line Vci and the power line Vss that responds to the above-mentioned data signal, and an n-channel transistor Q23 connected at the source thereof to the output terminal of the CMOS inverter and at the gate thereof to the internally dropped voltage line Vci.

On the other hand, the circuitry driven by the external power-supply voltage Vcc comprises a p-channel transistor Q24 connected between the drain of the transistor Q23 and the power line Vcc that responds to the output signal from a CMOS transistor (Q25 and Q26), which will be discussed later, a CMOS inverter (composed of a p-channel transistor Q25 and an n-channel transistor Q26) connected between the power lines Vcc and Vss that responds to the signal at the drain terminal of the transistor Q24, and a CMOS inverter (composed of a p-channel transistor Q27 and an n-channel transistor Q28) also connected between the power lines Vcc and Vss that is operative in response to the output from the inverter (Q25 and Q26) to produce a data output So.

In the circuit configuration shown in FIG. 48, the data signal from an internal circuit is converted to the level of the external power-supply voltage Vcc by means of the level converting means (transistors Q23 and Q24) and delivered outside the circuit as a data output So having amplitudes of the voltage Vcc to Vss. Therefore, in the case that the circuit connected to this output-state circuit is driven by an ordinary power-supply voltage (5 V), matching with the elements used in this circuit can be maintained. Namely, a stable predetermined logical-level signal can be transmitted.

Also in the case that the data signal from the internal circuit changes with the amplitudes of the voltages Vci to Vss, the above-mentioned level converting means works in such a manner that the transistors Q25 and Q26 are supplied at the gates thereof with signals having amplitudes of the voltages Vcc to Vss. Thus both transistors are not turned on together, so that a through current will not flow from the power line Vcc to the power line Vss through these transistors.

Similar to the circuit configuration shown in FIG. 47, it should be noted here that the drain or gate withstand voltage of each transistor used in the circuitry driven by the external power-source voltage Vcc should preferably be relatively high.

Figure 49:
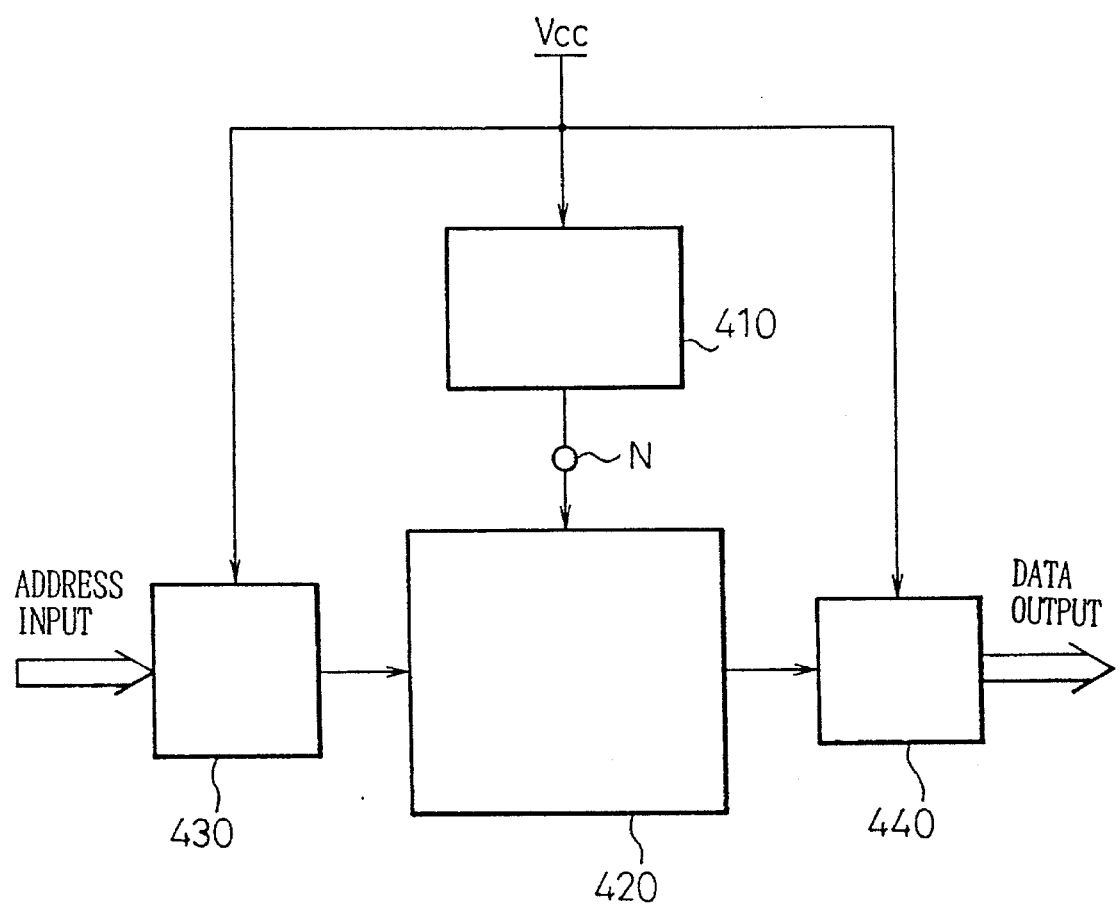
FIG. 49 is a block diagram showing a schematic construction of a semiconductor memory to which the circuit shown in FIG. 46 is applied.

FIG. 49 shows the configuration of a semiconductor device in which the circuit shown in FIG. 46 is adopted.

In Figure, the reference numeral 410 denotes a voltage dropping circuit comprising a data write/erase circuit (see FIG. 50) of the nonvolatile memory cell and the voltage dropping circuit shown in FIG. 46. The voltage dropping circuit 410 works with the normal source voltage Vcc and a high voltage Vpp for data write/erase with respect to the nonvolatile memory cell. The reference numeral 420 denotes a circuitry comprising an address buffer, a decoder, a memory cell and a sense amplifier, and this circuitry works with an internally dropped voltage developed at the output terminal (node N) of the voltage dropping circuit 410. In addition, the reference numeral 430 denotes a first-stage address buffer which, upon receiving the power-source voltage Vcc, buffers and address input, and 440 an output buffer which, also upon receiving the power-source voltage Vcc, delivers a data output.

Figure 50:
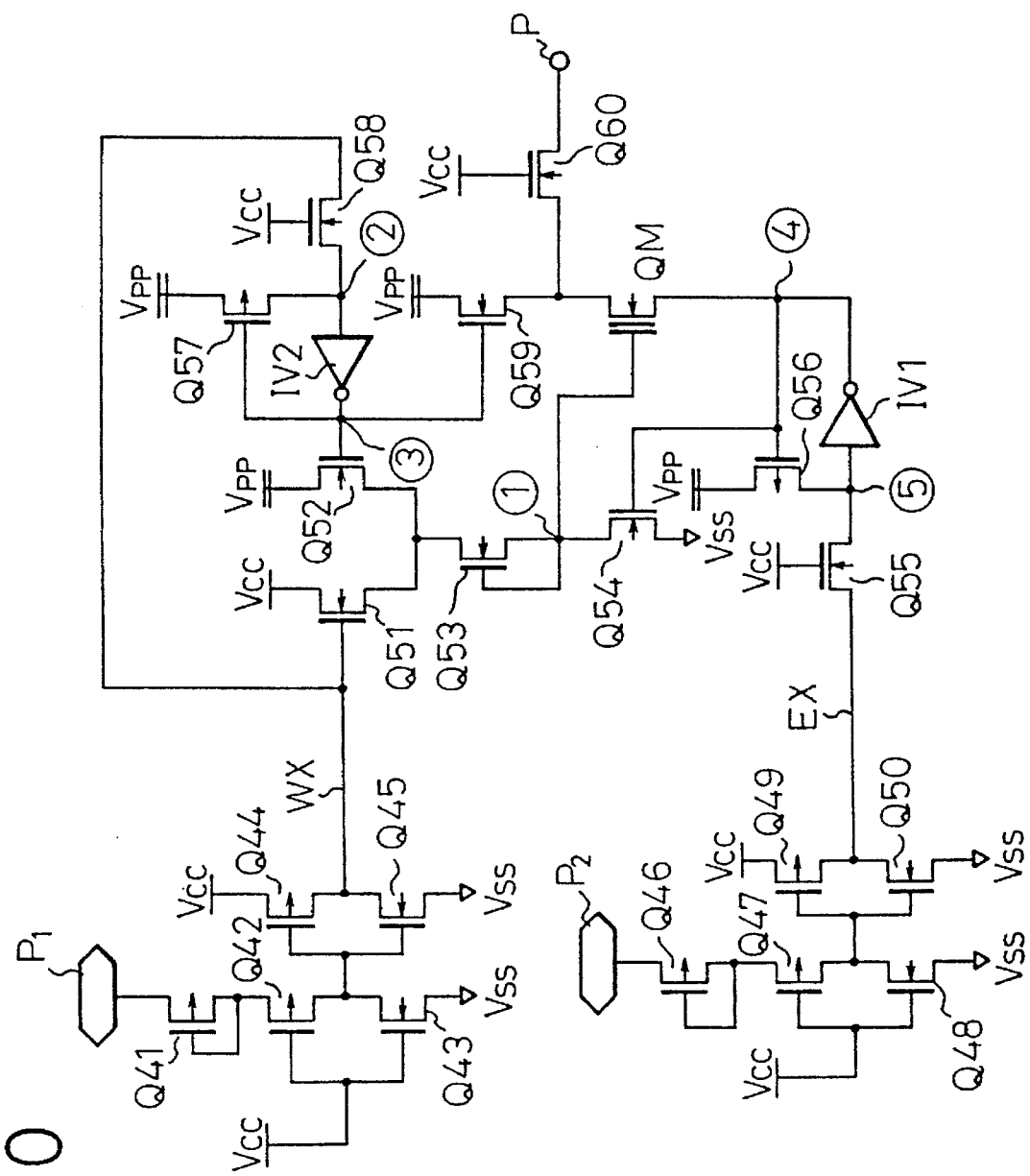
FIG. 50 is a circuit diagram showing an exemplary construction of a nonvolatile memory cell writing/erasing circuit in a voltage reducing circuit in FIG. 49.

FIG. 50 shows an example configuration of the data write/erase circuit of the nonvolatile memory cell in the voltage dropping circuit 410.

In Figure, the circuit for controlling the write operation to the nonvolatile memory cell QM comprises a p-channel transistor Q41 connected at the source thereof to a pad P1 and at the gate to the drain thereof, a CMOS inverter (composed of a p-channel transistor Q42 and an n-channel transistor Q43) connected between the drain of the transistor Q41 and the power line Vss that responds to the power-supply voltage Vcc, and a CMOS inverter (composed of a p-channel transistor Q44 and an n-channel transistor Q45) connected between the power lines Vcc and Vss that is operative in response to the output from the inverter (Q42 and Q43) so as to generate a write signal WX. Similarly, the circuit for controlling the erase operation of the nonvolatile memory cell comprises a p-channel transistor Q46 connected at the source thereof to a pad P2 and at the gate to the drain thereof, a CMOS inverter (composed of a p-channel transistor Q47 and an n-channel transistor Q48) connected to the drain of the transistor Q46 and the power line Vss that responds to the power-supply voltage Vcc, and a CMOS inverter (composed of a p-channel transistor Q49 and an n-channel transistor Q50) connected between the power lines Vcc and Vss that is operative in response to the output from the inverter (Q47 and Q48) so as to produce an erase signal EX.

The data write/erase circuitry of the nonvolatile memory cell QM comprises an n-channel transistor Q51 connected at the drain thereof to the power line Vcc that responds to the write signal WX, an n-channel transistor Q52 connected at the drain thereof to the high voltage power line Vpp that responds to the potential at a node 3, an n-channel transistor Q53 connected at the drain thereof to the source of each of the transistors Q51 and Q52 and at the gate to the source thereof node 1), an n-channel transistor Q54 connected between the node 1 and the power line Vss that responds to the potential at a node 4, an n-channel transistor Q55 connected between the output terminal of erase signal EX and node 5 that responds to the power-supply voltage Vcc, a p-channel transistor Q56 connected between the high voltage power line Vpp and the node 5 that responds to the potential at the node 4, an inverter IV1 connected in the forward direction between the nodes 5 and 4, a p-channel transistor Q57 connected between the high voltage power line Vpp and the node 2 that responds to the potential at the node 3, an inverter IV2 connected in the forward direction between the nodes 2 and 3, an n-channel transistor Q58 connected between the node 2 and the output terminal of write signal WX that responds to the power-source voltage Vcc, an n-channel transistor Q59 connected at the drain thereof to the high voltage power line Vpp that responds to the potential at the node 3, a nonvolatile memory cell QM connected between the source of the transistor Q59 and the node 4 that responds to the potential at the node 1, and an n-channel transistor Q60 connected between the source of the transistor Q59 and the internal-voltage delivery node P that responds to the power-source voltage Vcc.

The data write/erase circuit shown in FIG. 50 functions as explained below:

(1) When the write signal WX is at L level and the erase signal EX is at H level:

Since the transistor Q51 is off while the transistor Q58 is on in this case, the node 2 takes the L level and the node 3 takes the H level through the inverter IV2 so that the transistor Q52 is on. Thus, the nonvolatile memory cell QM is applied at the control gate thereof with the potential (nearly at the level of Vpp) at the node 1. Also because the node 3 takes the H level, the transistor Q59 is turned on and the nonvolatile memory cell QM is applied at the drain thereof with a signal of nearly Vpp level. On the other hand, since the erase signal EX is at the H level, the node 5 takes the H level through the transistor Q55. Thus the node 4 takes the L level through the inverter IV1 so that the source of the nonvolatile memory cell transistor QM takes the L level. Thus, electrons are injected into the floating gate of the transistor QM and data is written into the memory cell transistor QM with the result that the transistor QM is turned off. The potential at the internal-voltage delivery node P takes the H level. In this case, the external power-supply voltage Vcc is delivered at the internal-voltage delivery node N as seen from FIG. 46.

(2) When the write signal WX is at H level and the erase signal EX is at L level:

Since the transistor Q51 is on while the transistor Q58 is off, the node 2 takes the H level, so that the node 3 takes the L level. Thus the transistor Q59 is off. On the other hand, the erase signal EX takes the L level, so the node 5 takes the L level. Therefore, the node 4 takes the H level and the transistor Q54 is turned on. Therefore, the node 1 takes the L level. The nonvolatile memory cell QM is applied at the control gate thereof with a signal at the L level (nearly at the level of Vss). Since the node 3 is at the L Level at this time, electrons are evacuated from the floating gate of the transistor QM, namely, data are erased with the result that the transistor QM is turned on. The potential at the internal-voltage delivery node P takes the L level. As seen from FIG. 46, a dropped internal voltage Vci is delivered at the internal-voltage delivery node N in this case.

In the aforementioned circuit configuration, when the pads P1 and P2 are applied with a power-source voltage Vcc+Vth (where Vth is the threshold level of the p-channel transistors Q41 and Q46), both the write signal WX and the erase signal EX take the L level.

As described in the foregoing, the fourth aspect of the present invention permits a reduction in power consumption and stably supplies an internally dropped voltage in a semiconductor device in which a circuit to drop an external power-source voltage is incorporated.

Even in the case that an external voltage and an internally dropped voltage are used together, matching with elements including external ones can be maintained, and the influence of noise can be eliminated thereby improving the operational reliability of the semiconductor device significantly.

In the foregoing, the configurations of the internal power-supply voltage generation circuit used in the flash-type memory according to the present invention have been described. During the operation of such a flash-type memory, it is necessary in some cases to simply drop an external power-supply voltage as well as raise a predetermined voltage to a predetermined level.

However, since the conventional internal power-source voltage generation circuit has no booster circuit, it was formerly necessary to provide a discrimination circuit.

Figure 56:
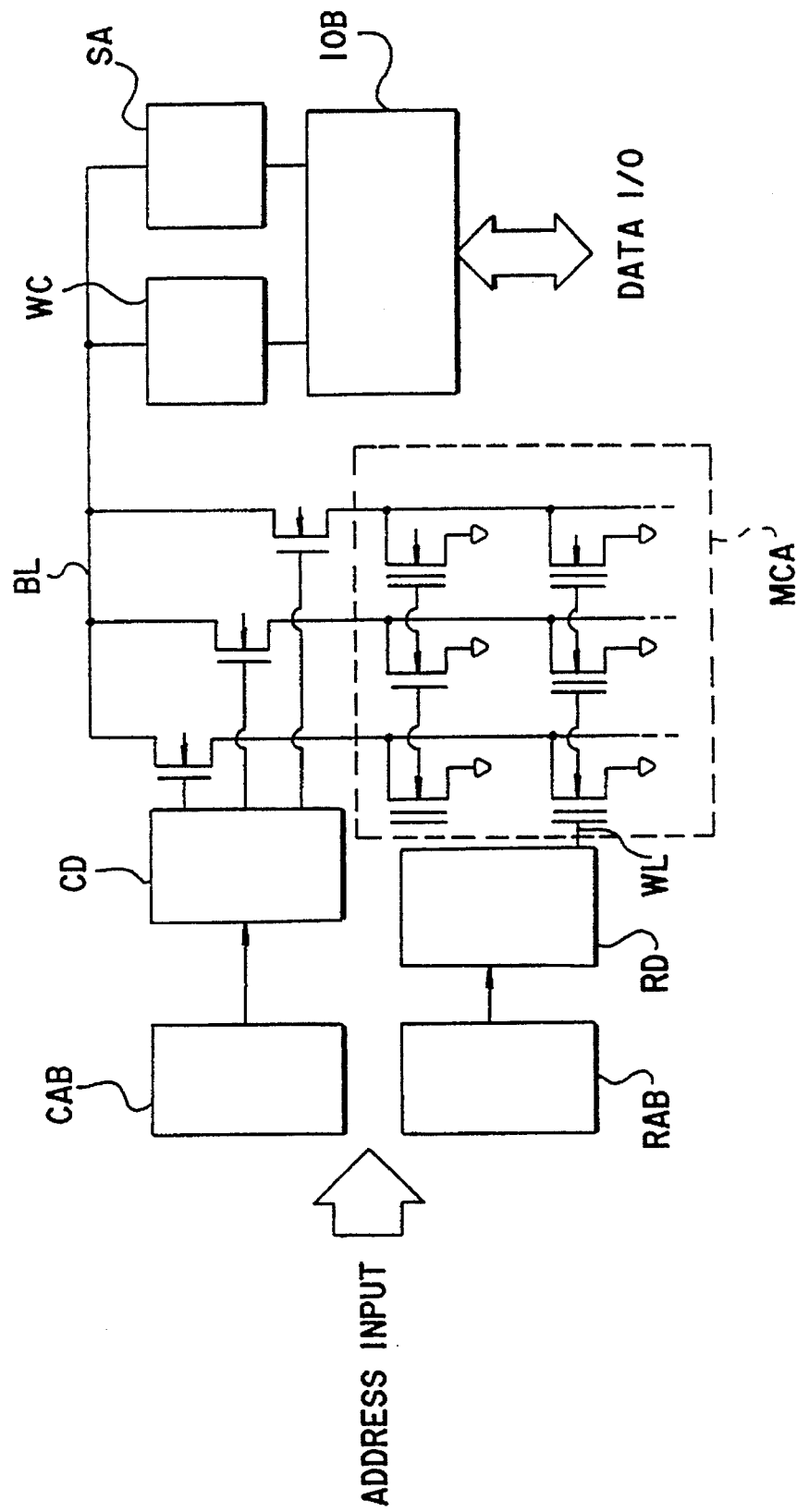
FIG. 56 is a block diagram of an EPROM.

FIG. 56 is a block diagram of an EPROM used in the conventional flash-type memory. As seen, the EPROM comprises a memory cell array MCA disposed in a matrix, a column address buffer CAB, a column decoder CD, a row address buffer RAB, a row decoder RD, a write circuit WC, a sense amplifier SA and an input/output data buffer IOB. Based on an address input, the row decoder RD selects the word line WL, and the column decoder CD selects the bit line BL, thus selecting a single memory cell with respect to which write or read data is put through the input/output buffer IOB.

Figure 57:
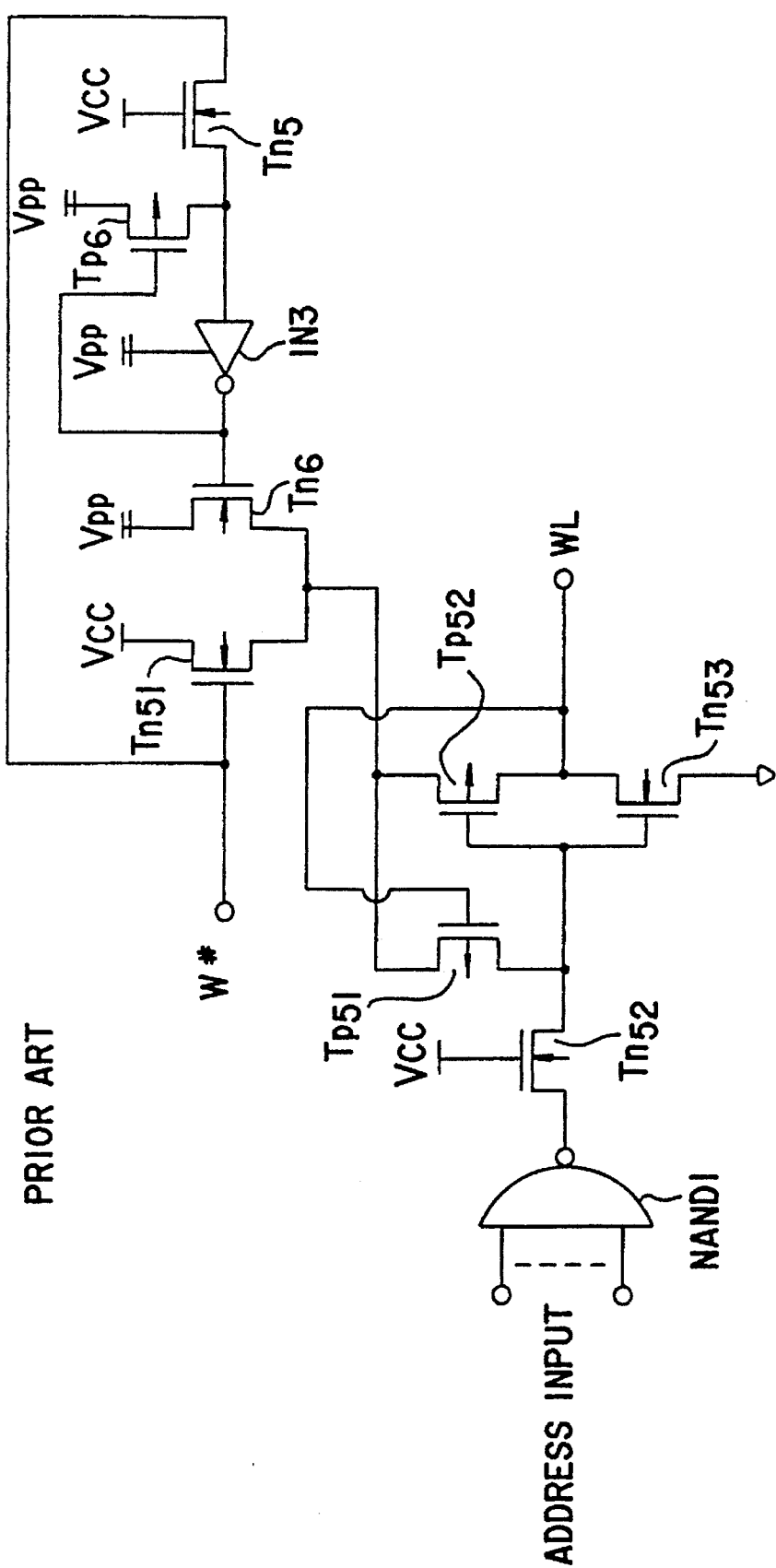
FIG. 57 is a circuit diagram of a decoder of the prior art.

FIG. 57 is a circuit diagram of the decoder. For a data write, the write control signal W# (# means that the signal in consideration is a negative-logic signal) takes the L level, and the word line WL is applied with the power-supply voltage Vpp. For a data read, the write control signal W# takes the H level and the world line WL is applied with the power-supply voltage Vcc. Further, for verification the write control signal W# remains at the H level and verification is completed with the power-supply voltage Vcc raised above the ordinary read voltage.

These days, it is required that the ordinary read voltage be changed from 5 V to 3 V to reduce power consumption, which is also true for the EPROM. In this case, a shift to the lower voltage will necessarily lower the access speed. Therefore, the transistor must be optimally adapted for use with a voltage of 3 V.

A write operation to the EPROM is effected with a specially designed writer, and when a conventional writer is used for such a write, the power source-voltage Vcc will be 5 or 6 V. Therefore, it is necessary to use the voltage dropping circuit shown in FIGS. 40 and 41 in order to inhibit the power-source voltage Vcc (Vci) to the internal circuit from rising above a predetermined value. In this case, verification as in the above is impossible since the power-source voltage Vci to the internal circuit is inhibited by the voltage dropping circuit from rising above the predetermined value.

For the conventional flash-type memory, it is necessary to change the read voltage to a lower voltage in order to minimize power consumption as described in the foregoing. If the conventional write operation is used for a data write to the memory, the power-source voltage to the internal circuit should be prohibited by the voltage dropping circuit from rising above a predetermined value. However, verification in the conventional manner cannot be done in this case.

Accordingly, the present invention proposes a fifth mode to solve the above problems by providing a flash-type memory in which the read voltage is changed to a lower voltage to minimize power consumption and that can effect the verification and provide a stable device operation even when operated with a voltage produced by internally dropping the power-source voltage.

Figure 51:
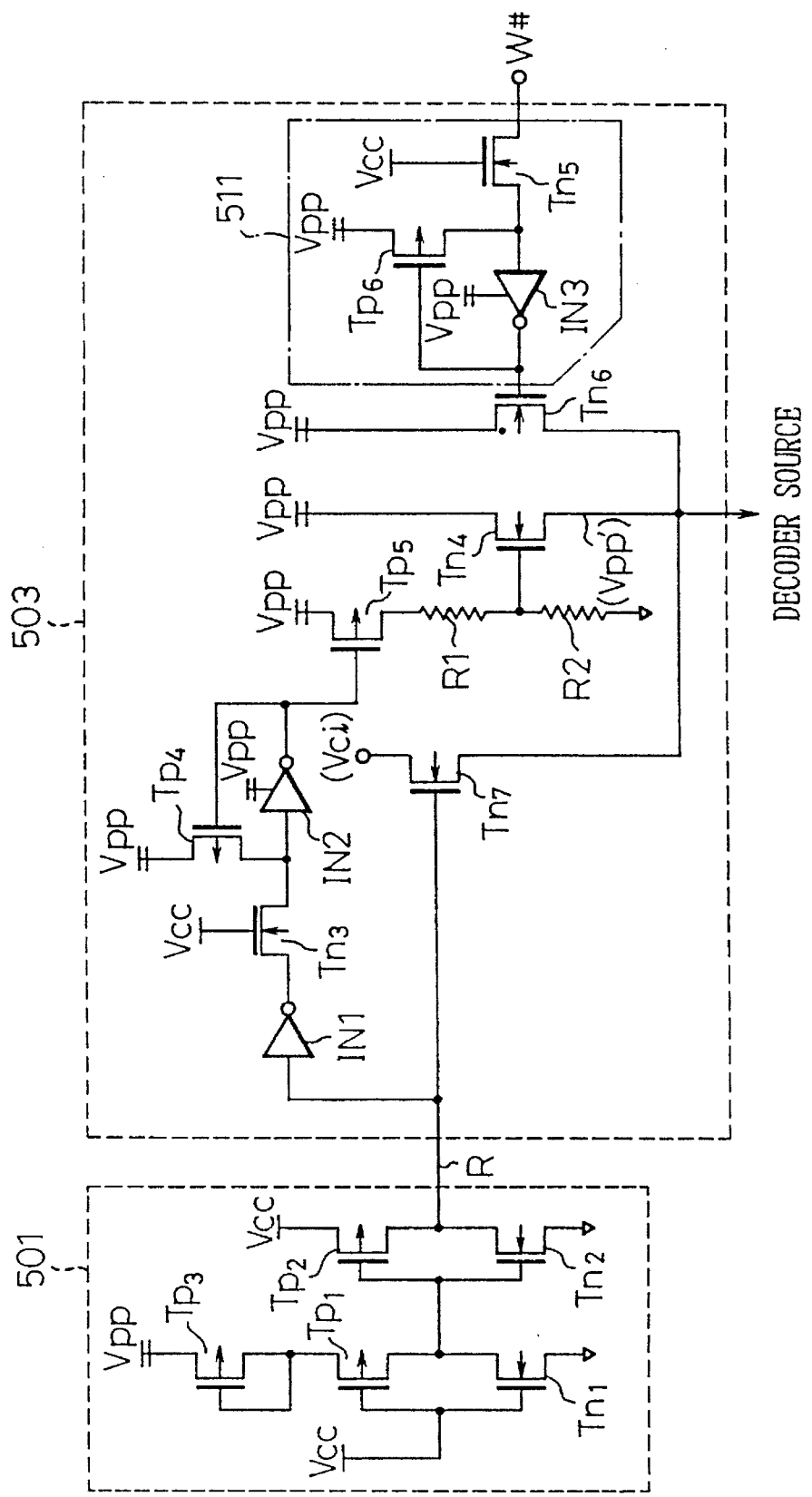
FIG. 51 is a circuit diagram of a supply voltage switching unit of a nonvolatile semiconductor memory used in a first specific example of a fifth mode according to the invention.

For overcoming the drawbacks of the conventional technique, the present invention provides a first embodiment in the fifth aspect as shown in FIG. 51. The first embodiment relates to an internal power-source voltage generation circuit adapted so as to receive an external power-source voltage Vcc for a data read and an external power-source voltage Vpp for a data write, and which comprises a means of operating the read circuit in the flash-type memory by dropping the read external power-source voltage Vcc to a predetermined value and a means of producing a word-line potential for post-write verification by dropping the read external power-source voltage Vpp.

Figure 52A:
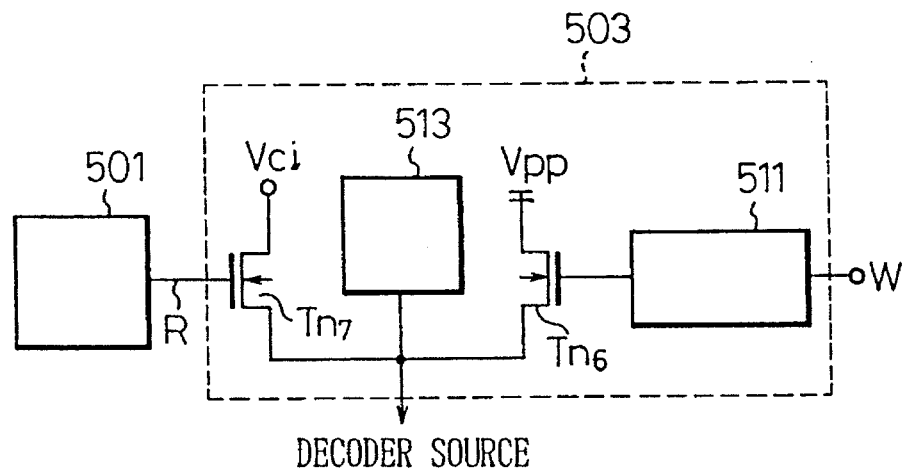
Figure 52B:
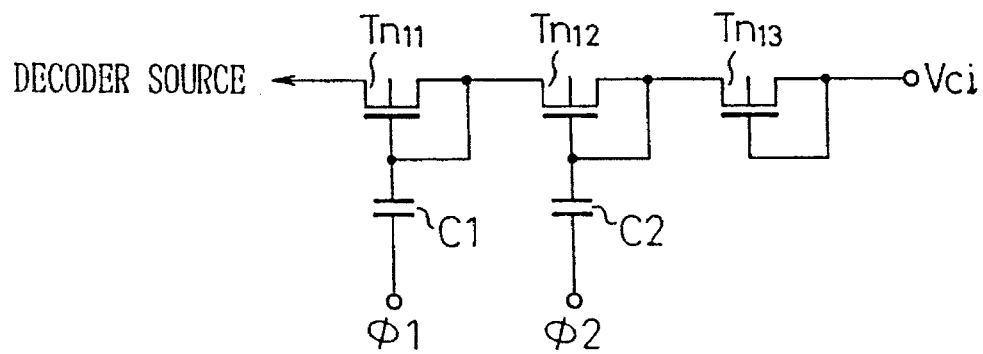
Figure 52C:
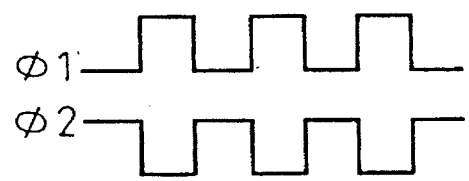

The fifth aspect of the present invention also includes a second embodiment shown in FIGS. 52(A)–(C). It is an internal power-source voltage generation circuit adapted to receive a read external power-source voltage Vcc and a write external power-source voltage Vpp that comprises a means of operating the read circuit inside the flash-type memory by dropping the read external power-source voltage Vcc to a predetermined value and a means of producing a word-line potential for post-write verification by internally generating a voltage higher than a voltage obtained by dropping the read external power-source voltage Vcc.

Figure 53:
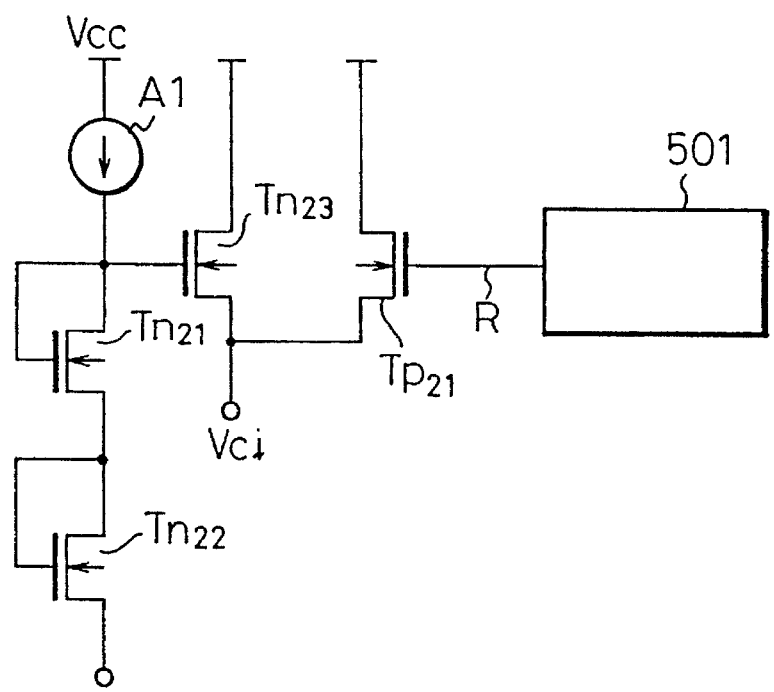
FIG. 53 is a circuit diagram of a supply voltage switching unit of a nonvolatile semiconductor memory used in a third specific example of the fifth mode according to the invention.

FIG. 53 shows a third embodiment of the internal power-supply voltage generation circuit, which is adapted to receive a read external power-source voltage Vcc and a write external power-source voltage Vpp, and comprises a means of operating the read circuit in the flash-type memory by dropping the read external power-source voltage Vcc to a predetermined value and a means of inhibiting the read external power-source voltage Vcc from being dropped at the time of post-write verification.

Figure 54:
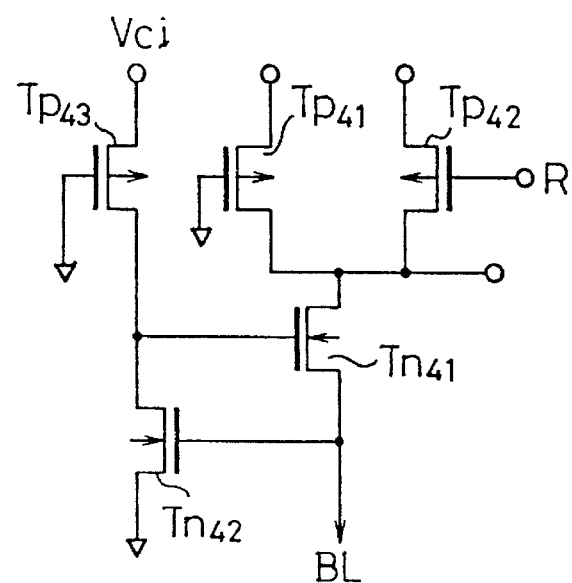
FIG. 54 is a circuit diagram showing a sense amplifier of a nonvolatile semiconductor memory used in a fourth specific example of the fifth mode according to the invention.

Further the fifth mode of the present invention includes a fourth embodiment of the internal power-source voltage generation circuit. As shown in FIG. 54, the internal power-source voltage generation circuit adapted to receive a read external power-source voltage Vcc and a write external power-source voltage Vpp comprises a means of operating the read circuit inside the flash-type memory by dropping the read external power-source voltage Vcc to a predetermined value and a means of normally making the sense current of a sense amplifier smaller than the read sense current.

More particularly, the first embodiment has a power-source voltage selector comprising, as shown in FIG. 51, a Vpp detection circuit 501 that detects whether or not the write external power-source voltage Vpp is supplied, and a selection circuit 503 that supplies a word-line potential. This power-source voltage selector is so arranged that when the write external power-source voltage Vpp is supplied, the voltage Vci (power to the internal circuit) provided by dropping the read external power-source voltage Vcc to a predetermined value is disconnected and for verification, the write external power-source voltage Vpp is supplied as a word-line potential for post-write verification.

Therefore, in the flash-type memory in which the read voltage is changed to a lower voltage for reduced power consumption, verification can be effected and a stable device operation can be ensured even when the semiconductor device is operated with a voltage obtained by internally dropping the power-source voltage.

In the second embodiment, the power-source voltage selector comprises, as shown in FIGS. 52(A)–(C) a Vpp detection circuit 501 that determines whether or not the write external power-source voltage Vpp is supplied, and a selection circuit 503' that supplies a word-line potential. It is so arranged that when the write external power-source voltage Vpp is supplied, the voltage Vci (power to the internal circuit) derived from dropping the read external power-source voltage Vcc to a predetermined value, and for the verification, a voltage obtained by raising the voltage produced by dropping the read external power-source voltage Vcc is supplied as a word-line potential for post-write verification. Thus, good verification can be implemented.

The power-source voltage selector in the third embodiment comprises, as shown in FIG. 53, a voltage dropping circuit provided for the read circuit in the flash-type memory that drops the read external power-source voltage Vcc to a predetermined voltage, and a means of inhibiting the voltage supply produced by dropping the read external power-source voltage Vcc under control of the Vpp detection circuit 501, which detects whether or not the write external power-source voltage Vpp is supplied, whereby the read external power-source voltage Vcc is used as it is for the word-line potential for post-write verification. Thus, a good verification can be effected.

In the fourth embodiment, the sense current of the sense amplifier is made smaller than that for the ordinary read for verification, as shown in FIG. 54, so that a stable operation on the power-source voltage Vci to the internal circuit can be ensured and a good verification can be effected.

Next, each of the aforementioned embodiments will be described with reference to the drawings.

FIG. 51 is a circuit diagram of the power-source voltage selector in the flash-type memory according to the first embodiment.

The general configuration of the flash-type memory according to this embodiment is the same as that shown in the block diagram in FIG. 56 and additionally includes the power-supply voltage selector shown in FIG. 51 and the voltage dropping circuit shown in FIG. 40.

As shown in FIG. 51, the power-supply voltage selector in the flash-type memory according to this embodiment comprises a Vpp detection circuit 501 that determines whether or not the write external power-source voltage Vpp is supplied, and a selection circuit 503 that supplies the column decoder and the row decoder with the power-source voltage (word-line potential) after changing.

The Vpp detection circuit 501 comprises p-channel MOS transistors Tp1, Tp2 and Tp3 and n-channel MOS transistors Tn1 and Tn2, thereby changing the Vpp detection signal R to L level when the write external power-source voltage Vpp is supplied.

For verification, the selection circuit 503 supplies, as a power-source voltage (word-line potential) to the column decoder and the row decoder, a voltage produced by dropping the write external power-source voltage Vpp. Namely, when the write external power-source voltage Vpp is supplied, the Vpp detection signal R takes the L level and the power-source voltage Vci (to the internal circuit) produced by dropping the read external power-source voltage Vcc by the voltage dropping circuit shown in FIG. 40 is disconnected by the n-channel MOS transistor Tn7. Then, when the write control signal W# is at the L level (for write), the n-channel MOS transistor Tn6 is turned on and the write external power-supply voltage Vpp is supplied as a power-source voltage to the column decoder and the row decoder, respectively, or when the Vpp detection signal R is at the L level, the p-channel MOS transistor Tp5 is turned on so that if the write control signal W# is at the H level (for verification), a voltage Vpp' derived from voltage division of the write external power-source voltage Vpp by resistors R1 and R2 is supplied to the column decoder and the row decoder, respectively.

FIG. 52(A) is a circuit diagram of the power-source voltage selector in the flash-type memory according to the second embodiment.

The general configuration of the flash-type memory according to this embodiment is the same as that shown in the block diagram in FIG. 56 and additionally includes the power-source voltage selector shown in FIG. 52(A) and the voltage dropping circuit shown in FIG. 40.

The power-source voltage selector according to this embodiment comprises a Vpp detection circuit 501 that is identical to that shown in FIG. 51 and a selection circuit 503'.

For the verification, the selection circuit 503' supplies a voltage produced by an internal verification source voltage generation circuit 513 as a power-source voltage to the column and row decoders.

The verification source voltage generation circuit 513 comprises a booster circuit composed of n-channel MOS transistors Tn11, Tn12 and Tn13 and capacitors C1 and C2 as shown in FIG. 52(B). Namely, the power-source voltage Vci to the internal circuit, produced by the voltage dropping circuit shown in FIG. 40, is raised and used as a power-source voltage to the column and row decoders. Note that the capacitors C1 and C2 are supplied with voltages φ1 and φ2 having the waveforms shown in FIG. 52(C).

The selection circuit 503' is so arranged that when the write external power-source voltage Vpp is supplied (the Vpp detection signal R is at the L level), the power-source voltage Vci is disconnected by the n-channel MOS transistor Tn7. If the write control signal W# is at the L level (for write), the write external power-source voltage Vpp is supplied as the power-source voltage to the column and row columns, respectively. If the write control signal W# is at the H level (for verification), the internal voltage boosted by the verification source voltage generation circuit 513 is supplied as the power-source voltage to the column and the row decoders, respectively.

FIG. 53 is a circuit diagram of the power-source voltage selector in the flash-type memory according to the third embodiment. Note that the general configuration of this flash-type memory is identical to that shown in the block diagram in FIG. 56 and additionally includes the power-source voltage selector shown in FIG. 53.

The power-source voltage selector in this embodiment includes a p-channel MOS transistor Tp21 added to the voltage dropping circuit shown in FIG. 40 that is controlled with the Vpp detection signal R from the Vpp detection circuit 501; the transistor Tp21 serving to inhibit the word-line drive component from being dropped for the verification.

Namely, when a data write is completed by a writer, the write external power-source voltage Vpp is supplied and the Vpp detection signal R takes the L level and the p-channel MOS transistor Tp21 is turned on so that the read external power-source voltage Vcc is supplied as it is as the power-source voltage (word-line potential) to the column and row decoders, respectively. Thus, a good verification can be effected.

Also, it is one of the effective methods to form the power-source voltage selector from a conventional decoder circuit (shown in FIG. 57) and always supply the read external power-source voltage Vcc as a word-line potential for other than the data write.

FIG. 54 is a circuit diagram of the sense amplifier in the flash-type memory according to the fourth embodiment. It should be noted that the general configuration of the flash-type memory according to this fourth embodiment is identical to that shown in FIG. 56, and additionally includes the Vpp detection circuit shown in FIG. 51 and the voltage dropping circuit shown in FIG. 40.

In the flash-type memory according to this embodiment, the sense current of the sense amplifier SA is made smaller than that for the ordinary read, thereby attaining a good verification.

As seen from the circuit diagram in FIG. 54, the sense amplifier SA has two p-channel transistors Tp41 and Tp42 which form together a load circuit. The Vpp detection signal R# from the Vpp detection circuit is supplied to the gate of one (Tp42) of these transistors to supply a sense current to the bit line BL of the memory cell.

Figure 55:
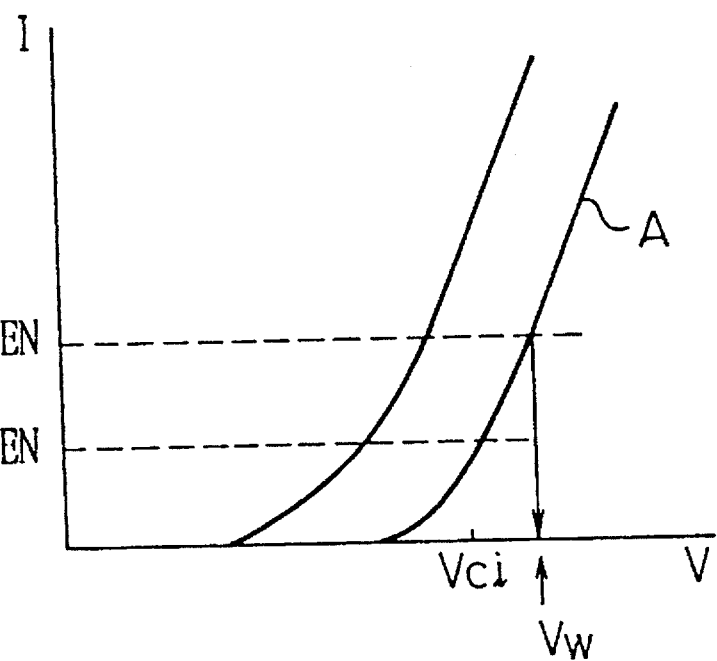
FIG. 55 is a chart showing a characteristic of a memory cell.

The Vpp detection signal R# takes the L level for data read, the p-channel MOS transistor Tp42 is turned on and the sense current has a larger value as shown in FIG. 5. As seen from FIG. 55, the characteristic of the memory cell changes as indicated with the curve A for the verification, but by changing it to the sense current value for the data read, it is possible to provide an operational voltage margin for Vw-Vci.

Namely, for the verification, the sense current of the sense amplifier SA is made smaller than that for the ordinary read, whereby a stable operation with the power-supply voltage Vci to the internal circuit can be ensured.

As having been described in the foregoing, the first embodiment in the fifth mode of the present invention is so configured that when the write external power-source voltage-is supplied, the voltage produced by dropping the read external power-source voltage to a predetermined value for the verification, the voltage obtained by dropping the write external power-source voltage is supplied as the word-line potential for the post-write verification. Thus, for a flash-type memory in which the read voltage is changed to a low voltage to minimize power consumption, an internal power-source voltage generation circuit can be provided in which verification can be effected even when the memory is operated with a voltage produced by internally dropping the power-source voltage and a stable device operation can be ensured.

The second embodiment is so arranged that, when the write external power-source voltage is supplied, the voltage produced by dropping the read external power-source voltage V to a predetermined value is disconnected and a voltage produced by boosting a voltage derived from dropping of the read external power-source voltage is supplied as the word-line potential for the post-write verification. Thus, the second embodiment provides an internal power-source voltage generation circuit for a flash-type memory, which can provide a good verification.

The third embodiment provides an internal power-source voltage generation circuit for a flash-type memory, comprising a voltage dropping circuit provided for the read circuit in the flash-type memory that drops the read external power-source voltage Vcc to a predetermined value, and a means of inhibiting the supply of a voltage derived by dropping the read external power-source voltage under the control of the Vpp detection circuit, which detects whether or not the write external power-source voltage is supplied, whereby the read external power-source voltage Vcc is supplied as it is as the word-line potential for the post-write verification so that a good verification can be ensured.

Furthermore, in the fourth embodiment, a read external power-source voltage Vcc and a write external power-source voltage Vpp are used and the read circuit in the flash-type memory is operated with a voltage produced by raising or boosting the read external power-source voltage Vcc to a predetermined voltage, and for the verification, the sense current of the sense amplifier SA is made smaller than that for the ordinary read, whereby a stable operation with the power-source voltage Vci to the internal circuit can be ensured and a good verification can be done.

Each of the aforementioned modes of the present invention has been described in the foregoing regarding the variety of problems in the flash-type memory according to the present invention, including the solutions to the problems.

To solve other problems yet not resolved concerning such a flash-type memory, it is necessary to erase predetermined information once written into the memory cell transistor; however, a method thereby providing easy and positive erasure of such information has not been proposed.

More particularly, for erasing the memory cell transistor in the flash-type memory, etc., erase/verify operations are to be done to verify whether the information has been positively erased. However, it is difficult to determine when the erasing operation has stopped and no appropriate method has been proposed heretofore.

The memory cell transistors forming together a cell array in a flash-type vary in characteristics from one to another even in the case of similar manufacturing process. Thus, when memory cell transistors are erased under the same conditions, certain transistors can be sufficiently erased while others cannot be sufficiently erased.

If memory cell transistors are erased based on the erased extent of one of them erased at a low speed, the memory cell transistors for which the erase rate is higher will be over-erased and cannot be used again.

Also if the memory cell transistors are erased according to the erase speed of one of the transistors erased at a high speed, many of them will not be sufficiently erased and further write operations can not be made to these transistors. Therefore, the memory cell transistors are erased most elaborately in these situations.

More particularly, in the flash-type memory, erasure and verification (verification of whether the erasure has been completed) are repeatedly effected during an erasure so that no memory cell transistors, so-called cell transistors, will remain under-erased. No cell transistors must be over-erased. On the other hand, the conventional erasing operation is effected using an address for an individual cell transistor, which causes the erasure time to be extremely long, and it is necessary that this erasure time be shortened.

Accordingly, the sixth aspect of the present invention seeks to overcome such drawbacks of the conventional technique by providing a flash-type memory in which the erase/verify can be done in a short time thereby shortening the erase time without over-erasure of any cell transistors.

Generally, the flash-type memory has the configuration as shown in FIG. 1, and the configuration of a sense amplifier is generally as shown in FIG. 32.

For erase/verify in a flash-type memory having such a configuration, the word lines WLo to WL2, for example, are applied with the same voltage as the post-erase threshold required for the cell transistors that are erased at the lowest speed, that is, the upper limit threshold permitted for the cell transistors M11oo to M11jj, taking into consideration the variance in characteristics of the cell transistors. This voltage is a voltage based on the fact that it is possible to judge whether or not a current flows to the cell transistors M11oo to M11jj, when each one of the cell transistors is read respectively, and in this case, the power-supply voltage Vcc in this example.

More particularly in this flash-type memory, where the erase verify operation is carried out, and if no current flows to the cell transistors M11oo to M11jj when they are read individually for erasure/verification, namely, if the voltage at the node 332 in FIG. 32 is a reference voltage Vref, the erasure is determined to be insufficient (under-erase). If the voltage is smaller than Vref, it is determined that the erasure is completed.

Figure 58:
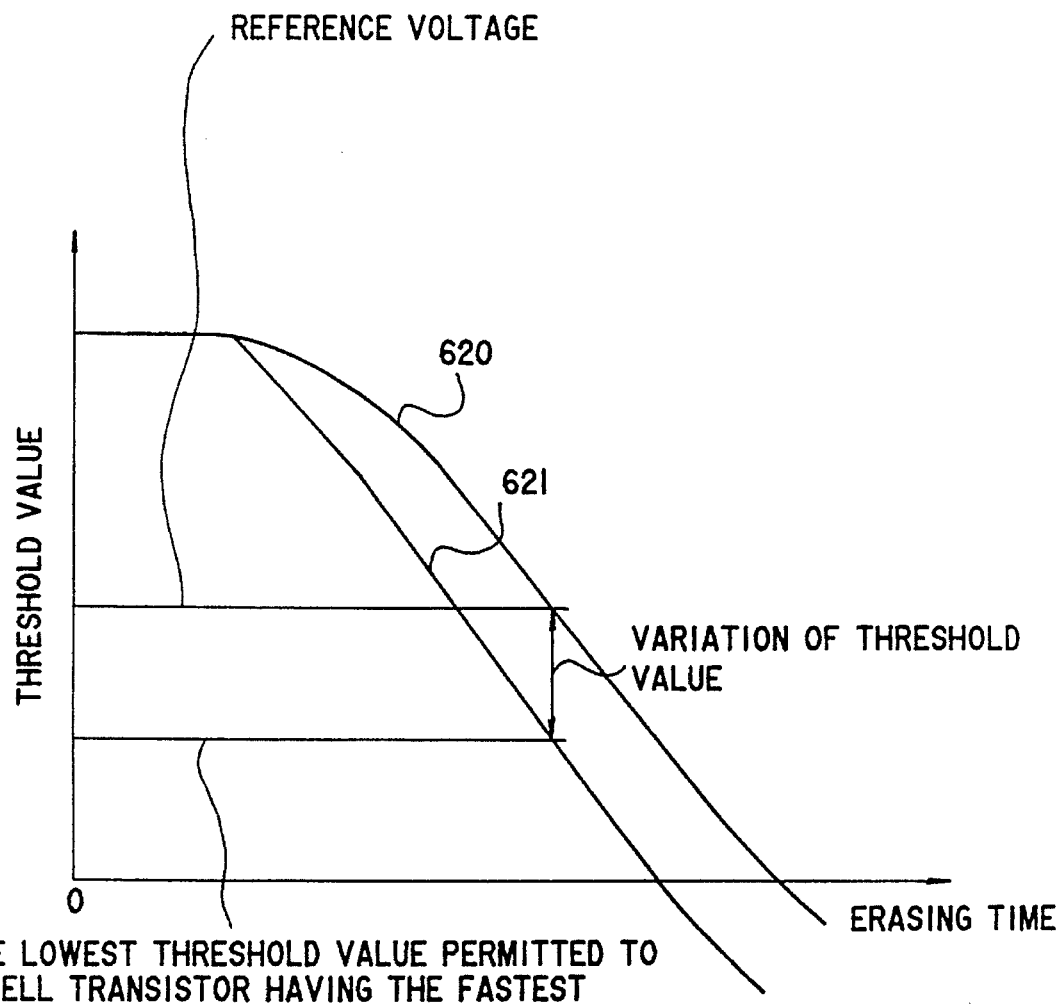
FIG. 58 is a chart showing a relationship between an erasing time and a threshold value of the memory cell transistor.

FIG. 58 shows the relation between the erase time and the threshold of the cell transistors M11oo to M11jj. The solid line 620 is for the cell transistor for which the erase rate is lowest, and the solid line 621 is for the cell that can be erased at the highest speed.

Figure 59:
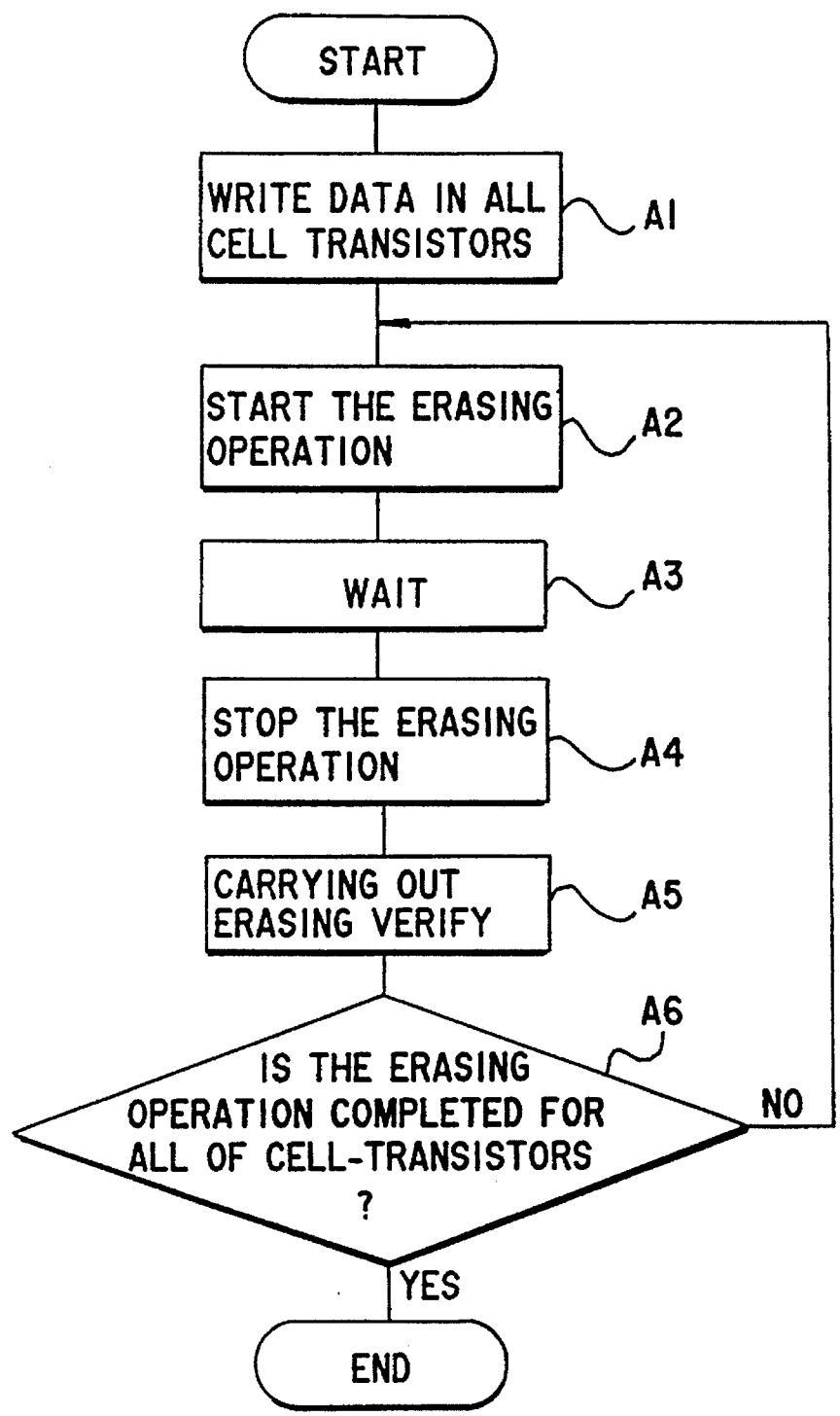
FIG. 59 is a flow chart showing a procedure of erasure carried out in the flash type memory of the prior art.

In this flash-type memory, the erasure is done taking as a reference potential the post-erase threshold required for the cell transistor that erases the memory at the lowest speed, that is, the permitted upper limit threshold, so that the erasure is completed when the threshold of the cell transistor for which the erase rate is lowest reaches the reference voltage. The erasure is done following the procedure shown in FIG. 59.

More particularly, a write for all the cell transistors M11oo to M11jj is done first (step A1), and then an erasing operation is started (step A2). After waiting a predetermined time (erasing operation is kept on), (step A3) the erasing operation is stopped (step A4).

Thereafter, the cell transistors M11oo to M11jj are read individually, and the voltage at the node 332 of the sense amplifier 7 is compared with the reference voltage Vref for the erase verify operation (step A5).

Then it is determined whether or not the voltage at the node 332 is smaller than Vref for all the cell transistors M11oo to M11jj, namely, whether or not all the cell transistors M11oo to M11jj have successfully been erased (step A6).

If all the cell transistors M11oo to M11jj have not yet been erased (judgement of NO at step A6), the operation returns to the step A2. When all of them have been erased (YES at the step A6), the erasing operation is terminated.

In such conventional flash-type memory, the cell transistors M11oo to M11jj are read one by one and only one of them is subject to the erasure/verification at a time.

In other words, only one cell transistor is subject to erase verify operation per sense amplifier, which causes the erase verify operation time to be longer and further leads to a long erasure time.

Also because of the configuration of the conventional flash-type memory, completion of the erasure of all the cell transistors M11oo to M11jj is judged by checking that the threshold of the cell transistor for which the erase rate is lowest reaches the permitted upper limit threshold.

Thus, it is impossible to avoid the situation that the cell transistor for which the erase rate is high is over-erased. It means that over-erased cell transistors possibly remain mixed in the correctly-erased cell transistors.

In the flash-type memory in the sixth aspect of the present invention having a cell matrix circuit 1 in which reloadable nonvolatile memory cells Mij are disposed at the intersections of a plurality of word lines WL1 to WLm and a plurality of bit lines BL11 t BL1k, . . . , BLn1 to BLnk, a row decoder circuit 3, a column decoder circuit 5 and a sense amplifier circuit 1 connected to the bit lines BL11 to BL1k, . . . , BLn1 to BLnk, respectively, of the cell matrix circuit 1, all the cell transistors forming together the cell matrix circuit are connected parallel to each other with the transistors remaining conductive, and the cell matrix circuit has provided as connected thereto a voltage judgement means composed of a means of detecting a voltage developed in response to a current flowing through all of the cell transistors, a reference voltage generating means, and a means of comprising the voltage output from the voltage detecting means with a reference voltage delivered from the reference voltage generating means.

In detail, the circuit configuration in this mode is such that a predetermined voltage is applied to a source line to which the cell transistors are commonly connected at the sources thereof, the same or different positive voltages are applied to all or a part of the plurality of word lines forming the control gates of the plurality of cell transistors; the plurality of cell transistors are connected at the drains thereof commonly to the data bus to which the voltage judgement circuit is also connected; each of the cell transistors is connected at the source thereof to a common source line; the same or different positive voltages are applied to all or a part of the plurality of word lines that form the control gates of the plurality of cell transistors; the plurality of cell transistors are connected at the drains thereof to the data bus to which a predetermined voltage is applied, and the voltage judgement circuit is connected to the source line.

The flash-type memory in the sixth mode of the present invention further comprises a voltage judgement circuit. For erase verify operation, the voltage judgement circuit applies the same or different positive voltages higher than the predetermined voltages to all or a part of the plurality of word lines that form the control gates of the plurality of cell transistors connected at the sources thereof to a common source line and this source line, and when a data bus provided correspondingly to the plurality of bit lines to which the plurality of cell transistors are connected at the drains thereof is connected to all or a part of the plurality of bit lines, the judgement circuit compares the voltage on the data bus with a predetermined reference voltage to judge whether or not the voltage at all or a part of the drains of the plurality of cell transistors has reached a value derived from subtraction of the lower limit threshold permitted for the plurality of cell transistors from the positive voltage applied to the word lines.

Another embodiment of the flash-type memory comprises a voltage judgement circuit. For erasure/verification, this circuit applies the same or different positive voltages higher than the predetermined voltages to all or a part of the plurality of word lines that form the control gates of the plurality of cell transistors connected at the sources thereof to a common source line and to a data bus provided correspondingly to the plurality of bit lines to which the plurality of cell transistors are connected at the drains thereof, and when the data bus is connected to all or a part of the plurality of bit lines, the judgement circuit compares the voltage on the source line with a predetermined reference voltage to judge whether or not the voltage at all or a part of the sources of the plurality of cell transistors has reached a value derived from subtraction of the lower limit threshold permitted for the plurality of cell transistors from the positive voltage applied to the word lines.

More particularly in the first embodiment, the same or different positive voltages higher than predetermined voltages are applied to, for example, the plurality of world lines and the source line, for erasure/verification, and when the data bus is connected to the plurality of bit lines, the drain voltage of the plurality of cell transistors will be a value derived from "subtraction of threshold of the cell transistor for which the erase rate is highest (threshold of the cell transistor that is smallest) from the positive voltage applied to the word lines".

In the first embodiment, the voltage judgement circuit judges whether or not the drain voltage of the plurality of cell transistors has reached a value derived from "subtraction of a permitted lower limit threshold from the positive voltage applied to the word lines". When "the threshold of the cell transistor for which the erase rate is highest equals the permitted lower threshold", the drain voltage of the plurality of cell transistors will be a value derived from "subtraction of the permitted lower limit threshold from the positive voltage applied to the word lines".

In other words, when the drain voltage of the plurality of cell transistors has reached a value derived from "subtraction of the permitted lower limit threshold from the positive voltage applied to the word lines", the threshold of the cell transistor for which the erase rate is highest can be decided to have reached the permitted lower limit threshold. Also in this case, the threshold of the cell transistor for which the erase rate is lowest can be decided to have reached the permitted lower limit threshold.

Namely, in this first embodiment, the same or different positive voltages are applied to the plurality of word lines and the source line, respectively, and the data bus is connected to all of the bit lines. The voltage judgement circuit judges whether or not the drain voltage of the plurality of cell transistors has reached the value derived from subtraction of the permitted lower limit threshold from the positive voltage applied to the word lines, thereby permitting erasure/verification for the plurality of cell transistors at one time.

According to the first embodiment described above, erase verify can be made simultaneously for a plurality of memory cell transistors, and all the memory cell transistors need not be read out one by one. Therefore, the erase verify time can be shortened.

According to the first embodiment, erase verify can be made by detecting the case where the threshold value of the memory cell transistor having the highest erase time reaches the allowed lower limit threshold value. Therefore, the erasing operation can be carried out without causing any memory cell transistors to be over-erased.

Incidentally, if erase verify is made by the prior art method after the threshold value of the memory cell transistor having the highest erase time reaches the allowed lower limit threshold value, it is possible to confirm the existence of any memory cell transistors exhibiting a greater threshold value than the threshold value after erasure permitted for the memory cell transistor having the lowest erase time, and thus to defect defects in the devices.

In such a case, too, erase verify by the prior art method needs be carried out only once for each memory cell transistor. Therefore, the erase verify time can be made shorter than in the prior art method.

Furthermore, this first embodiment includes the voltage judgement circuit for judging whether or not the drain voltage of all, or a part, of a plurality of memory cell transistors reaches the difference obtained by subtracting the allowed lower limit threshold value from the positive voltage applied to the word lines, by comparing the voltage of the data bus with a predetermined reference voltage. Therefore, erase verify can be executed for those memory cell transistors which share a common bit line, or for each memory cell transistor.

In this case, the same or different voltages above predetermined voltage values are applied to a part of a plurality of word lines and to the source lines, and the data bus is connected to a part of a plurality of bit lines at the time of erase verify.

In the second embodiment, when the same or different positive voltages above predetermined voltage values are applied to all of a plurality of word lines and to the data bus and the data bus, and a plurality of bit lines are all connected at the time of erase verify, for example, the source voltage of a plurality of memory cell transistors becomes [positive voltage applied to the word lines]—[the threshold value of the memory cell transistor having the highest erase time].

In this second embodiment, the voltage judgement circuit judges whether or not the source voltage of a plurality of memory cell transistors reaches the difference, that is, [the positive voltage applied to the word lines]—[the allowed lower limit threshold value]. When [the threshold value of the memory cell transistor having the lowest erase time] is equal to [the allowed lower limit threshold value], the drain voltage of a plurality of memory cell transistors reaches the difference, that is, [the positive voltage applied to the word lines]—[the allowed lower limit threshold value].

In other words, when the source voltage of a plurality of memory cell transistors reaches the difference, i.e., [the positive voltage applied to the word lines]—[the allowed lower limit threshold value], the threshold value of the memory cell transistor having the highest erase time can be judged as reaching the allowed lower limit threshold value. In this case, the threshold value of the memory cell transistor having the lowest erase time can be judged as reaching the allowed upper limit threshold value.

In other words, the second embodiment can simultaneously execute erase verify for a plurality of memory cell transistors by applying the same or different positive voltages above predetermined voltages to all of a plurality of word lines and to the data bus at the time of erase verify, connecting the data bus to all of a plurality of bit lines, and judging by the voltage judgement circuit whether or not the drain voltage of a plurality of memory cell transistors reaches the difference obtained by subtracting the allowed lower limit threshold value from the positive voltage applied to the word lines.

As described above, the second embodiment can simultaneously execute erase verify for a plurality of memory cell transistors in the same way as the first embodiment. Since all the memory cell transistors need not be read out one by one, the erase verify time can be shortened.

The second embodiment can execute erase verify by detecting the point of time when the threshold value of the memory cell transistor having the highest erase time reaches the allowed lower limit threshold value. Therefore, the second embodiment can carry out the erasing operation without causing any memory cell transistors to be overerased.

When erase verify is carried out by the prior art method after the threshold value of the memory cell transistor having the highest erase time reaches the allowed lower limit threshold value, the existence of any memory cell transistors which exhibit a greater threshold value than the threshold value after erasure allowed for the memory cell transistor having the lowest erase time can be confirmed, and any defects in the devices can be discovered.

In such a case, too, erase verify according to the prior art method may be carried out only once. Therefore, the erase verify time can be made shorter than in the prior art method.

The second embodiment includes the voltage judgement circuit for judging whether or not the source voltage of all, or a part, of a plurality of memory cell transistors reaches the voltage value obtained by subtracting the allowed lower limit threshold value from the positive voltage applied to the word lines. For this reason, erase verify can be carried out for those memory cell transistors which share a common bit line, or for each memory cell transistor.

In this case, the same or different positive voltages exceeding the predetermined voltage values are applied to a part of a plurality of word lines and to the data bus at the time of erase verify, and the data bus is connected to a part of a plurality of bit lines.

Hereinafter, the sixth aspect according to the present invention will be explained with reference to FIGS. 60 to 64.

Figure 60:
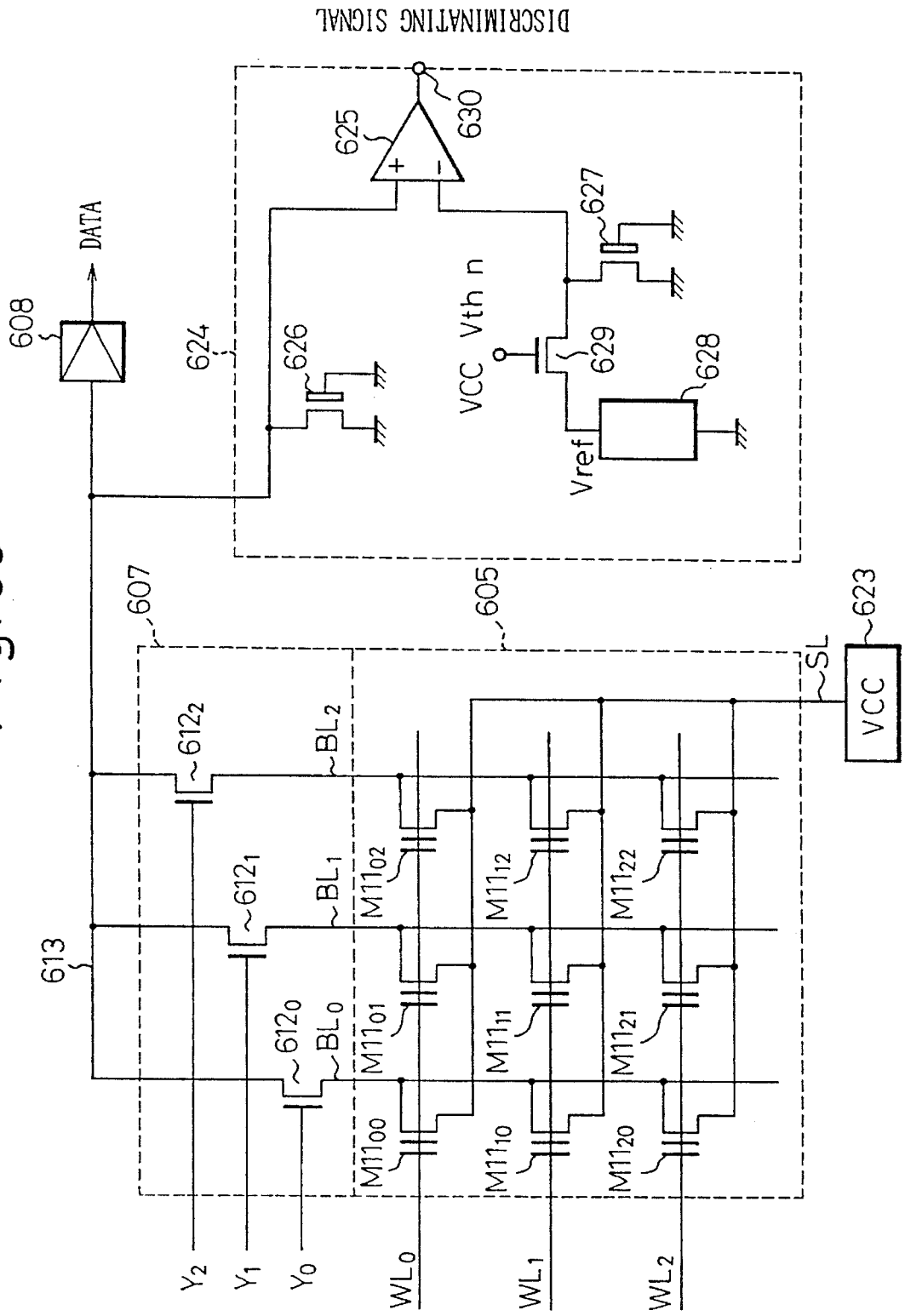
FIG. 60 is a circuit diagram showing an essential portion of a first specific example of a sixth mode according to the invention.
Figure 61:
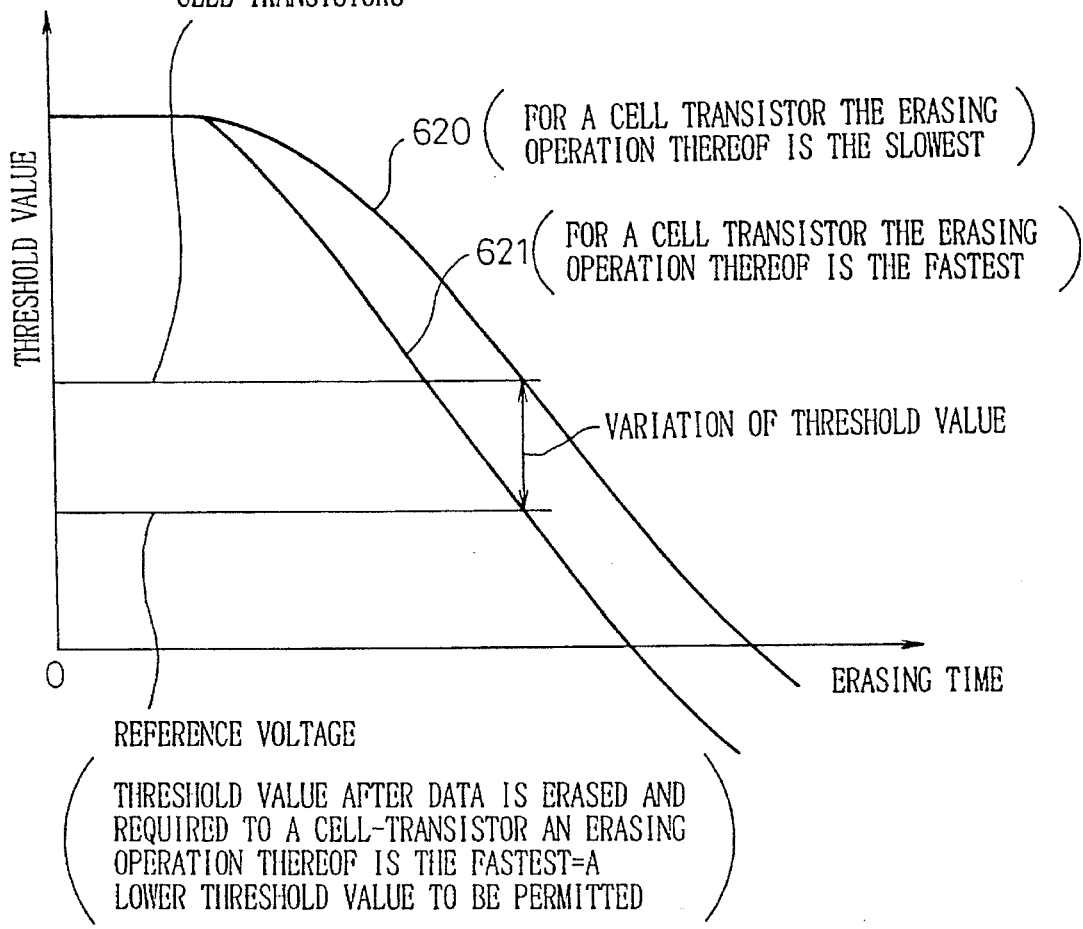
FIG. 61 is a chart showing a relationship between the erasing time and the threshold value of the memory cell transistor in the sixth mode according to the invention.
Figure 62:
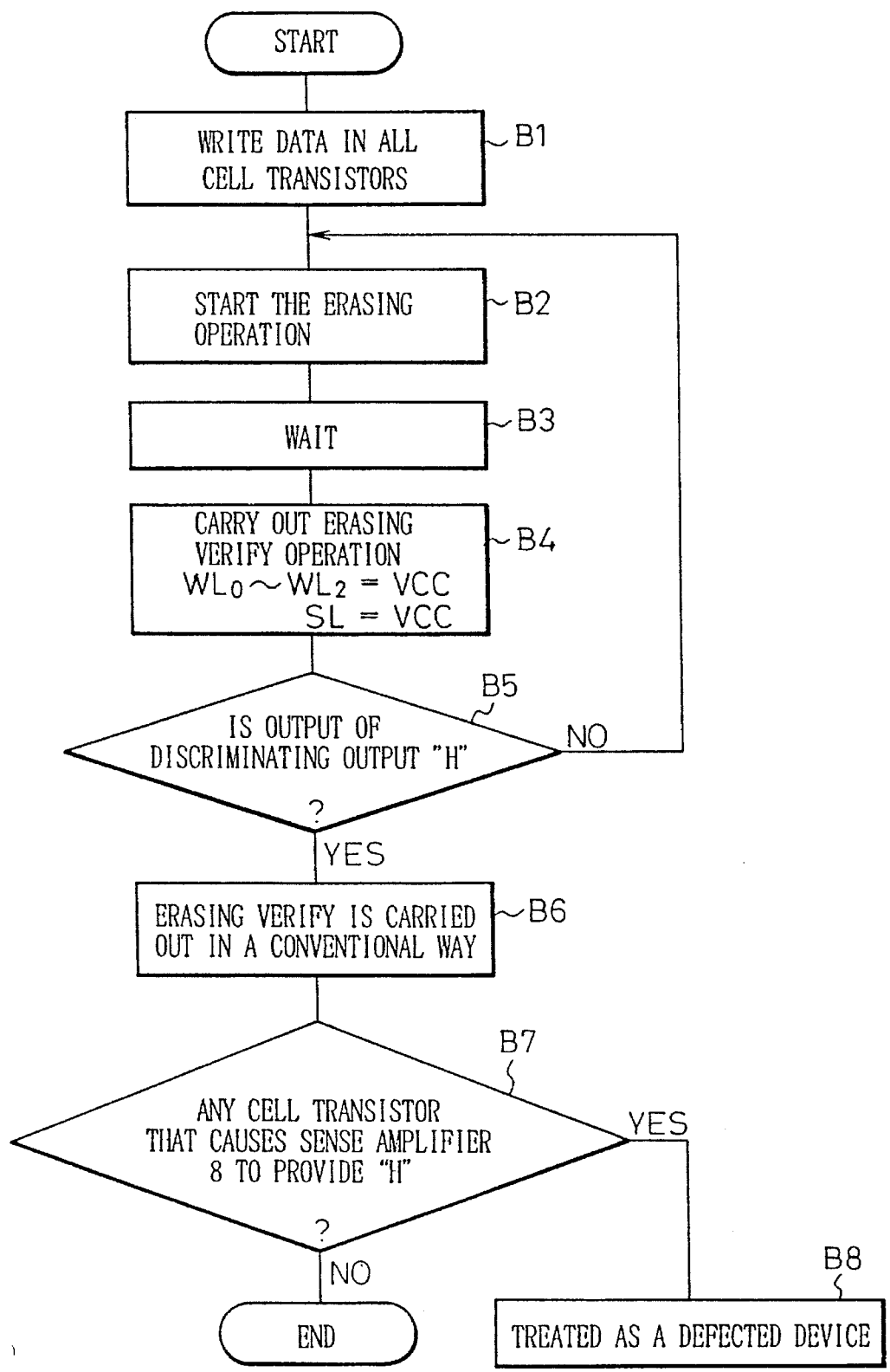
FIG. 62 is a flow chart showing a procedure of erasure carried out in the first specific example of the sixth mode according to the invention.

FIG. 60 is a circuit diagram showing the principal portions of a first definite example of the sixth aspect of the present invention. In the drawing, symbol SL represents a source line to which the sources of the memory cell transistors $M11_{oo}$ to $M11_{22}$ are connected. In this first definite example, there is disposed a voltage impression circuit 623 for impressing a power supply voltage VCC on the source line SL at the time of erase verify.

There is disposed a voltage judgement circuit 624 which judges whether or not the voltage of the data bus is greater than the difference obtained by subtracting the allowed lower limit threshold value of the memory cell transistors $M11_{oo}$ to $M11_{22}$ from VCC. The rest of the circuit construction is the same as that of the prior art flash memory shown in FIG. 32.

In the voltage judgement circuit 624, reference numeral 625 denotes an operational amplifier which constitutes a comparator, reference numerals 626 and 627 denote depletion type n-MOS transistors constituting a load, and reference numeral 628 denotes a reference voltage generation circuit for generating a reference voltage Vref. The reference voltage Vref is set to be the difference obtained by subtracting the allowed lower limit threshold value of the memory cell transistors $M11_{oo}$ to $M11_{22}$ from VCC.

Reference numeral 629 denotes an enhancement type n-MOS transistor having the same size as that of n-MOS transistors $612_o$ to $612_2$ of a column gate 601. A voltage, that is, $VCC+V_{th-n}$ (a threshold voltage of n-MOS transistor), is applied to the gate of the n-MOS transistor 629 at the time of erase verify. Reference numeral 630 denotes a judgement output terminal from which the judgement output is output.

In this first definite example, erase is carried out with the threshold value, after erasure, required for the memory cell transistor having the highest erase time, that is, the allowed lower limit threshold value, as the reference voltage. Whether or not the threshold value of the memory cell transistor having the highest erase time has reached the reference voltage is first confirmed, and then erase verify is carried out by the prior art method. More definitely, the erasing operation is carried out in the sequence shown in FIG. 62.

In other words, in the sixth aspect of the present invention, the memory cell transistor having the highest erase time among the memory cell transistors is focused on, and the threshold value Vth at which this memory cell transistor having the highest erase time is erased is set as the reference potential.

Accordingly, the threshold voltage $V_{th}$ is ideally 0 V.

The range of variance from this reference potential is set to a range in which all the memory cell transistors in the memory cell array can be judged as being erased.

To begin with, write to all the memory cell transistors $M11_{oo}$ to $M11_{22}$ is carried out (step B1). Next, after the erasing operation is started, a wait state (the erasing operation holding state) is secured for a predetermined time (steps B2 and B3).

Here, the erasing operation is carried out by setting the source line SL to VCC, the word lines $WL_o$–$WL_2$ to a negative potential, the bit lines $BL_o$–$BL_2$ to OPEN and turning OFF the n-MOS transistors $612_o$–$612_2$, or setting the source line SL to a high voltage, e.g. 12 V, the word lines $WL_o$–$WL_2$ to 0 V, and the bit lines $BL_o$–$BL_2$ to OPEN.

Next, erase verify is carried out (step B4). This operation is carried out by setting the word lines $WL_o$–$WL_2$ to VCC, the source line SL to VCC, turning ON the n-MOS transistors $612_o$–$612$, $629$ (gate voltage=VCC+$V_{th-n}$), and comparing the voltage value of the data bus 613 with the voltage value of the reference voltage $V_{ref}$.

In this case, the voltage of the data bus 613 coincides with the drain voltage of the memory cell transistors $M11_{oo}$–$M11_{22}$, and the voltage of the data bus 613 is the difference obtained by subtracting the threshold value of the memory cell transistor having the highest erase time among n-MOS transistors $M11_{oo}$–$M11_{22}$ (the threshold value of the memory cell transistor which minimizes the threshold value).

Here, whether or not the judgement output obtained at the judgement output terminal 630 is "H" is judged (step B5). When the judgement output is not "H" (NO at step B5), that is, when the voltage of the data bus 613<the reference voltage Vref, the threshold value of the memory cell transistor having the highest erase time among the memory cell transistors $M11_{oo}$–$M11_{22}$ is higher than the allowed lower limit threshold value.

In this case, there is the possibility that a memory cell transistor, which exhibits a greater threshold value than the threshold value, after erasure, required for the memory cell transistor having the highest erase time from the aspect of variance of characteristics, exists. Therefore, the flow returns to the step B2, and erase is carried out once again.

In contrast, when the judgement output obtained at the judgement output terminal 630 is "H" (YES at step B5), that is, when the voltage of the data bus 613≧the reference voltage Vref, the threshold value of the memory cell transistor having the highest erase time among the memory cell transistors $M11_{oo}$–$M11_{22}$ reaches the allowed lower limit threshold value.

In this case, the threshold value of the memory cell transistor having the lowest erase time can be regarded as reaching the allowed upper limit threshold value, but it is not possible to deny the possibility that any memory cell transistor(s) exhibiting a greater threshold value than the allowed upper limit threshold value due to defects exists.

In this first definite example, therefore, even in the case of YES at the step B5, the output of the sense amplifier 608 is judged (step B6) by carrying out erase verify according to the prior art method or in other words, by bringing one by one the memory cell transistors $M11_{oo}$ to $M11_{22}$ to the read state, and whether or not the memory cell transistor which renders the output of the sense amplifier 608 "H", that is, the memory cell transister exhibiting a greater threshold value than the allowed upper limit threshold value, exists, is judged (step B7).

In this case, when the memory cell transistor which renders the output of the sense amplifier 608 "H" exists (in the case of NO at the step B7), the erasing operation is completed by not regarding the device as the defective device and by regarding that erasure has been completed for all the memory cell transistors $M11_{oo}$ to $M11_{22}$.

In contrast, when the memory cell transistor which renders the output of the sense amplifier 608 "H" exists (in the case of YES at the step B7), the device is processed as a defective device (step B8).

As described above, the first definite example structurally sets the threshold value, after erasure, required for the memory cell transistor having the highest erase time, that is, the allowed lower limit threshold value, to the reference potential, confirms whether or not the threshold value of the memory cell transistor having the highest erase time reaches the reference potential, confirms also the absence of the memory cell transistor rendering the output of the sense amplifier 608 "H", and can thus complete the erasing operation.

Here, whether or not the threshold value of the memory cell transistor having the highest erase time reaches the reference potential can be confirmed by setting the word lines $WL_o$–$WL_2$ to VCC, the source line SL to VCC and the gates of the n-MOS transistors $612_o$–$612_2$ and 629 to VCC+$V_{th-n}$. In this case, it is not necessary to bring the memory cell transistors $M11_{oo}$–$M11_{22}$ to the read state one by one.

Incidentally, when a voltage above VCC+$V_{th-n}$ is applied to the gates of the n-MOS transistors $612_o$–$612_2$ and 629, the voltage drop of these n-MOS transistors $612_o$–$612_2$ and 629 can be neglected.

The judgement of the existence or absence of the memory cell transistor rendering the output of the output of the sense amplifier 608 "H" can be accomplished by carrying out erase verify only once by the prior art method.

This first definite example can execute erase verify by detecting the case where the memory cell transistor having the highest erase time reaches the allowed lower limit threshold value. Accordingly, over-erased memory cell transistors are not caused.

Accordingly, the first definite example can shorten the erase verify time as well as the time necessary for erase, and can execute erase without generating over-erased memory cell transistors.

In this first definite example, erase verify can be executed for those memory cell transistors which share a common bit line, or for each memory cell transistor.

When erase verify is carried out for those memory cell transistors which share a bit line in common, and when erase verify is simultaneously executed for the memory cell transistors $M11_{oo}$, $M11_{10}$ and $M11_{20}$ connected to the bit line $BL_o$, for example, this operation can be carried out by setting the world lines $WL_o$–$WL_2$ to VCC, the source line SL to VCC, turning ON the n-MOS transistors 612 and 629 (gate voltage=VCC+$V_{th-n}$), and turning OFF the n-MOS transistors $612_1$ and $612_2$ (gate voltage=ground potential VSS).

Erase verify can be executed for each memory cell transistor such as the memory cell transistor $M11_{oo}$ by setting the word line $WL_o$ to VCC, the word lines $WL_1$ and $WL_2$ to VSS, and the source line SL to VCC, turning ON the n-MOS transistors $612_o$ and 629 (gate voltage=VCC+$V_{th-n}$) and turning OFF the n-MOS transistors $612_1$ and $612_2$ (gate voltage=VSS).

In this first definite example, VCC+$V_{th-n}$ is applied to the gates of the n-MOS transistors $612_o$–$612_2$ and 629 when these transistors are turned ON, but VCC may also be applied.

Figure 63:
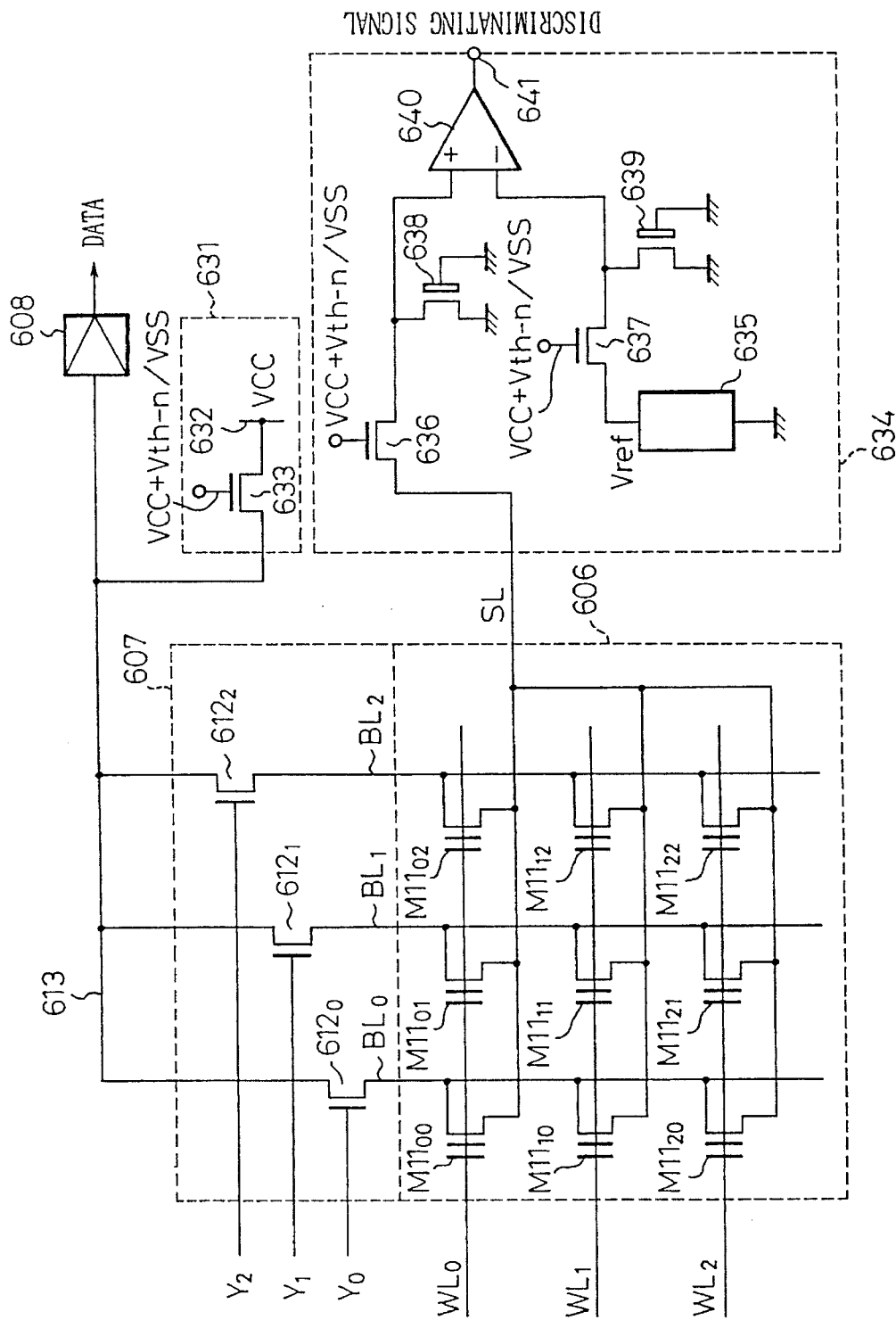
FIG. 63 is a circuit diagram showing an essential portion of a second specific example of the sixth mode according to the invention.
Figure 64:
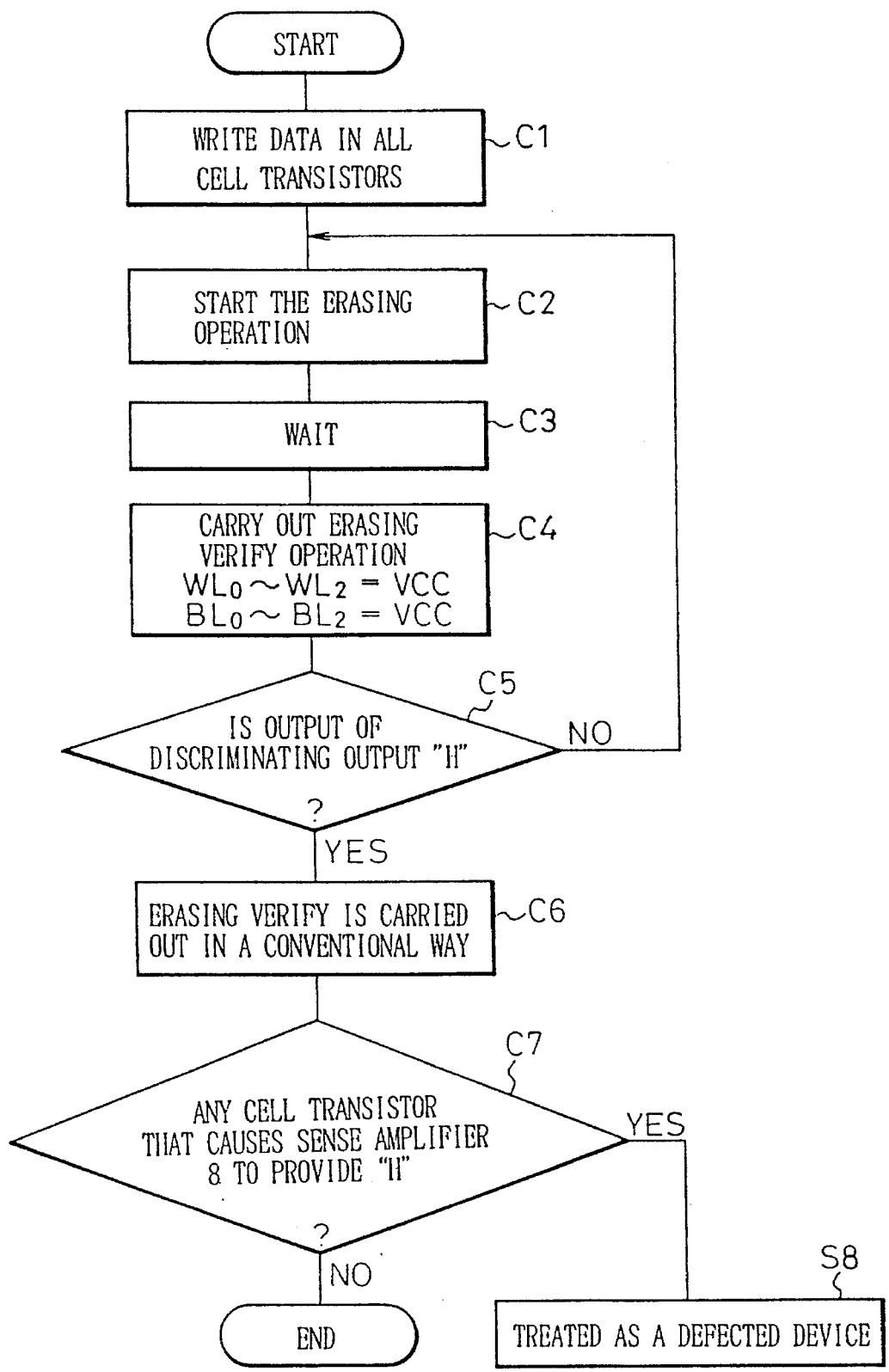
FIG. 64 is a flow chart showing a procedure of erasure carried out in the second specific example of the sixth mode according to the invention.

FIG. 63 is a circuit diagram showing the principal portions of a second definite example of the sixth aspect of the present invention. In this second definite example, there is disposed a voltage impression circuit 631 for applying the power supply voltage VCC to the data bus 613 at the time of erase verify.

Reference numeral 632 denotes the VCC power supply line, and reference numeral 633 denotes the n-MOS transistor. At the time of erase verify, VCC+$V_{th-n}$ is applied to the gate of this n-MOS transistor 633 to turn ON this transistor, and VSS is applied to the gate at other times and the transistor is turned OFF.

There is also disposed a voltage judgement circuit 634 which judges whether or not the voltage of the source line SL is greater than the difference obtained by subtracting the allowed lower limit value of the memory cell transistors $M11_{oo}$–$M11_{22}$ from VCC at the time of erase verify. The rest of the construction is the same as that of the prior art flash memory shown in FIG. 32.

In this voltage judgement circuit 634, reference numeral 635 denotes a reference voltage generation circuit for generating the reference voltage Vref, and this reference voltage Vref is set to the difference obtained by subtracting the allowed lower limit threshold value of the memory cell transistors $M11_{oo}$–$M11_{22}$ from VCC.

Reference numerals 636 and 637 denote enhancement type n-MOS transistors having the same size and constituting the gate, reference numerals 638 and 639 denote depletion type n-MOS transistors having the same size and constituting the load, reference numeral 640 denotes the operational amplifier, and reference numeral 641 denotes the judgement output terminal which outputs the judgement.

The n-MOS transistors 636 and 637 are turned ON at the time of erase verify as VCC+$V_{th-n}$ is applied to their gates, and are turned OFF at other times as VSS is applied to their gates.

In this second definite example, too, the erasing operation is carried out in the same way as in the first definite example. In other words, the threshold value, after erasure, required for the memory cell transistor having the highest erase time, that is, the allowed lower limit threshold value, is used as the reference potential, and whether or not the threshold value of the memory cell transistor having the highest erase time reaches the reference potential is confirmed. Then, erase verify is executed by the prior art method. More definitely, this operation is carried out in the sequence shown in FIG. 64.

First of all, write to all the memory cell transistors $M11_{oo}$–$M11_{22}$ is carried out (step C1). Next, after the erasing operation is started, the wait time (the erasing operation holding state) is secured for a predetermined time (steps C2 and C3).

Here, the erasing operation is carried out by setting the source line SL to VCC, the word lines $WL_o$–$WL_2$ to a negative potential and the bit lines $BL_o$–$BL_2$ to OPEN (turning OFF the n-MOS transistors $612_o$–$612_2$), or by setting the source line SL to a high voltage, e.g. 12 V, the word lines $WL_o$–$WL_2$ to 0 V, and the bit lines $BL_o$–$BL2_2$ to OPEN.

Next, erase verify is executed (step C4). This operation is carried out by turning ON the n-MOS transistors $612_o$–$612_2$, 633, 636 and 637 (the gate voltage=VCC+$V_{th-n}$), setting the bit lines $BL_o$–$BL_2$ to VCC and the word lines $WL_o$–$WL_2$ to VCC, and comparing the voltage value of the source line SL with the reference voltage Vref.

In this case, the source voltage of the memory cell transistors $M11_{oo}$–$M11_{22}$, that is, the voltage of the source line SL, is set to the threshold voltage of the memory cell transistor having the highest erase time (the threshold value of the memory cell transistor which minimizes the threshold value).

Here, whether or not the judgement output obtained at the judgement output terminal 641 is "H" is judged (step C5). When the judgement output is not "H" (NO at step C5), that is, when the voltage of the source line SL<the reference voltage Vref, the threshold voltage of the memory cell transistor having the highest erase time is higher than the allowed lower limit threshold value.

In this case, there is a possibility that a memory cell transistor exhibiting a greater threshold value than the threshold value, after erasure, required for the memory cell transistor having the highest erase time (the allowed upper limit threshold value) exists from the aspect of variance of characteristics. Therefore, the flow returns to the step C2, and the erasing operation is carried out once again.

In contrast, when the judgement output obtained at the judgement output terminal 641 is "H" (YES at the step C5), that is, when the voltage of the source line SL≧the reference voltage Vref, the threshold value of the memory cell transistor having the highest erase time among the memory cell transistors $M11_{oo}$–$M11_{22}$ reaches the allowed lower limit threshold value.

In this case, the threshold value of the memory cell transistor having the lowest erase time can be regarded as reaching the allowed upper limit threshold value, but it is not possible to deny the possibility that any memory cell, which exhibits a greater threshold value than the allowed upper limit threshold value due to defect, exists.

In this second definite example, therefore, whether or not the memory cell transistor, which renders the output of the sense amplifier 608 "H", that is, which exhibits a greater threshold value than the allowed upper limit threshold value, exists is judged, even in the case of YES at the step C5, by effecting the erase verify by the prior art method or, in other words, by bringing the memory cell transistors $M11_{oo}$–$M11_{22}$ into the read state one by one and by judging the output of the sense amplifier 608 (steps C6 and C7).

If the memory cell transistor which renders the output of the sense amplifier 608 "H" does not exist (NO at the step C7), the device is not a defective device, and the erasing operation is completed by regarding that all of the memory cell transistors $M11_{oo}$–$M11_{22}$ have been erased.

In contrast, when the memory cell transistor which renders the output of the sense amplifier 608 "H" exists (YES at the step C7), the device is processed as a defective device (step C8).

As described above, the second definite example uses the threshold value, after erasure, required for the memory cell transistor having the highest erase time, that is, the allowed lower limit threshold value, as the reference potential, confirms whether or not the threshold value of the memory cell transistor having the highest erase time reaches this reference potential, confirms also whether or not the memory cell transistor rendering the output of the sense amplifier 608 "H" exists, and can thus complete the erasing operation.

In this case, whether or not the threshold value of the memory cell transistor having the highest erase time reaches the reference potential can be confirmed by setting the word lines $WL_o-WL_2$ to VCC and the bit lines $BL_o-BL_2$ to VCC and turning ON the transistors $612_o-612_2$, 633, 636 and 637 (gate voltage=$VCC+V_{th-n}$). The memory cell transistors $M11_{oo}-M11_{22}$ need not be brought into the read state one by one.

Judgement of whether or not the memory cell transistor rendering the output of the sense amplifier 608 "H" exists is carried out by executing erase verify only once by the prior art method for all the memory cell transistors $M11_{oo}-M11_{22}$.

Since this second definite example can execute erase verify by detecting the case where the memory cell transistor having the highest erase time reaches the allowed lower limit threshold value, over-erased memory cell transistors are not caused.

Accordingly, this second definite example can shorten the erase verify time and the time necessary for the erasing operation. Moreover, it can execute the erasing operation without causing any over-erased memory cell transistors.

In this second definite example, erase verify can be executed for a set of those memory cell transistors which share a common bit line, or for each memory cell transistor.

When erase verify is executed for a set of memory cell transistors which share a bit line in common, the memory cell transistors $M11_{oo}$, $M11_{10}$, $M11_{20}$ connected to the bit line $BL_o$, for example, can be subjected simultaneously to erase verify by setting the word lines $WL_o-WL_2$ to VCC, turning ON the n-MOS transistors $612_o$, 633, 636 and 637 (gate voltage=$VCC+V_{th-n}$) and turning off the n-MOS transistors $612_1$ and $612_2$ (gate voltage=VSS).

When erase verify is executed individually for each memory cell transistor such as the memory cell transistor $M11_{oo}$, for example, it can be carried out by setting the word lines $WL_o$ to VCC and the word lines $WL_1$ and $WL_2$ to VSS, turning ON the n-MOS transistors $612_o$, 633, 636 and 637 (gate voltage=$VCC+V_{th-n}$) and turning OFF the n-MOS transistors $612_1$ and $612_2$ (gate voltage=VSS).

Incidentally, in this second definite example, $VCC+V_{th-n}$ is applied to the gates of the n-MOS transistors $612_o-612_2$, 636 and 637 when these transistors are turned ON, but VCC may also be applied.

As described above, the sixth embodiment of the present invention can simultaneously execute erase verify for a plurality of memory cell transistors, and since all the memory cell transistors need not be read out one by one, this embodiment can shorten the erase verify time and the time necessary for the erasing operation. Since this embodiment can execute erase verify by detecting the point of time when the threshold value of the memory cell transistor having the highest erase time reaches the allowed lower limit threshold value. Accordingly, the erasing operation can be carried out without causing any over-erased memory cell transistors.

Incidentally, when the internal power supply of the non-volatile semiconductor memory device including the flash memory described above is examined, the data readout operation alone, for example, includes the readout modes of at least three different kinds of systems, that is, the normal readout mode, the erase verify mode at the time of erase and the write verify mode after writing.

In other words, three different kinds of power supply voltages are necessary in at least the readout mode in the non-volatile semiconductor memory device such as the flash memory, as can be understood from the example given above.

However, these voltages have in most cases a predetermined correlationship between them, and when this correlationship collapses, a predetermined logical operation is likely to fail. Therefore, the correlationship between a plurality of kinds of power supply voltages must be kept constant by all means.

Figure 74:
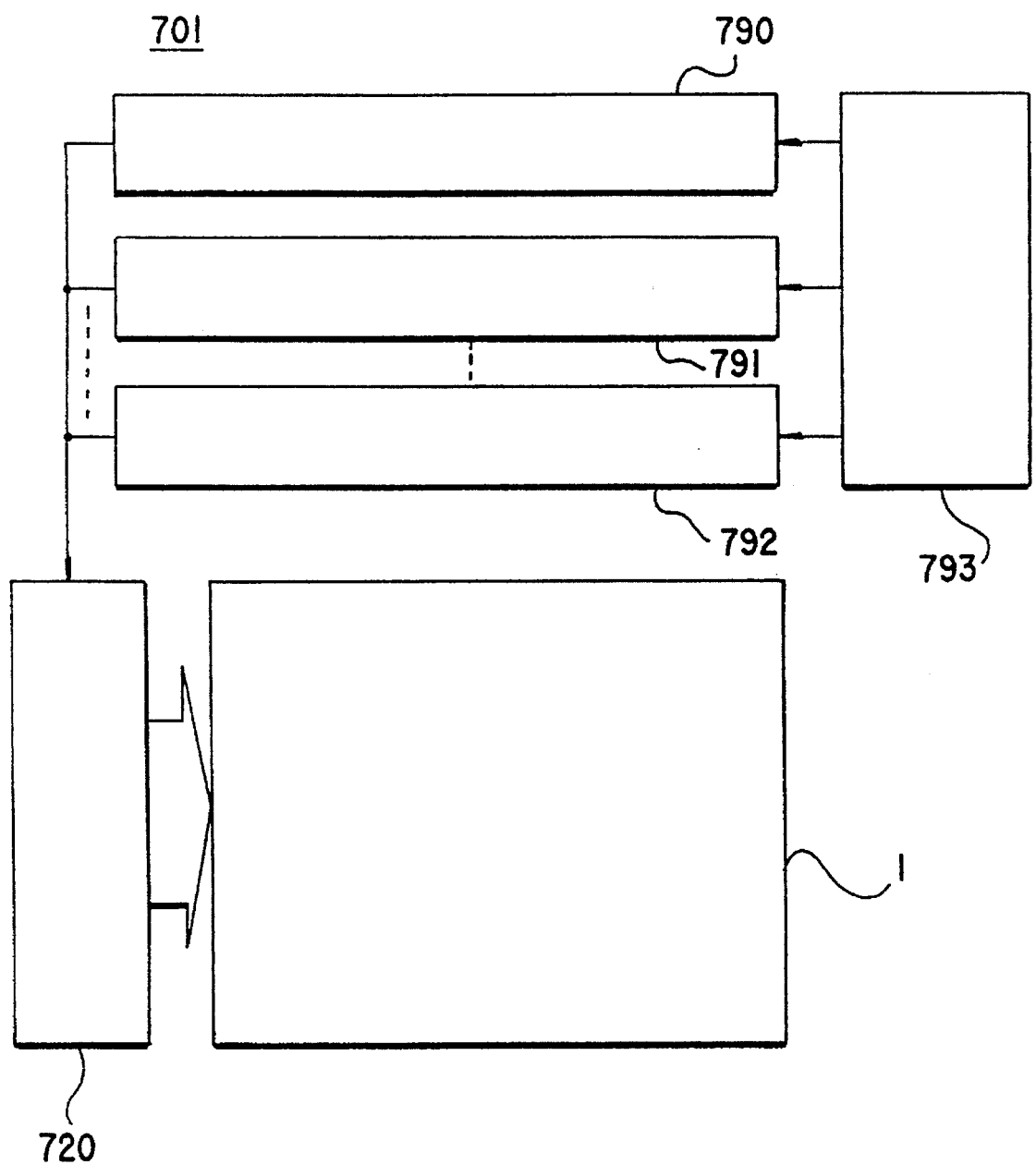
FIG. 74 is a block diagram showing an example of construction of a semiconductor memory of the prior art.

As shown in FIG. 74, however, it has been customary according to the prior art to suitably select separate power supply voltages such as a power supply voltage generation circuit 790 for the first readout mode, a power supply voltage generation circuit 791 for the second readout model; . . . , a power supply voltage generation circuit 792 for the nth readout mode by the use of a mode selection circuit 793, and to supply the selected voltages to a decoder through a suitable booster circuit. In this case, a variance necessarily occurs between these power supply voltages, and the correlationship described above is likely to collapse.

Such a problem results from the fact that a predetermined power supply voltage is formed from different power supply voltages by individual booster circuits.

In other words, among the three kinds of internal power supply voltages described above, the power supply voltage that cannot be supplied directly from an external power supply must be generated inside the semiconductor memory device to match each mode.

Recently, in order to reduce the power supply voltage, to use a single power supply and to improve an operation speed, it has become necessary to generate the power supply voltages for all the readout modes inside the semiconductor memory device to match each of the readout modes.

However, when a low voltage operation is taken into account, variance will occur if the predetermined different power supply voltages are generated by suitable individual booster circuits, and there remains the problem described above that the correlationship between the power supply voltages collapses.

In other words, there is the possibility that the voltage value will deviate from a target voltage value in each of the booster circuits due to variance in the production process, and the synergistic effect of this variance of the respective booster circuits causes the correlationship of the power supply voltages necessary for the readout modes to grately deviate from the initial design values.

As a result, there occurs the problem that an error occurs in the judgement of the write data to the read mode and the judgement of the erase data, and write defects as well as erase defects are more likely to occur.

Therefore, the seventh aspect of the present invention is directed to providing a power supply circuit for use in a semiconductor memory device such as a flash memory having a power supply voltage generation function, which can improve the problems with the prior art described above, and which can easily generate a plurality of kinds of different power supply voltages.

To accomplish the object described above, the power supply circuit for the non-volatile semiconductor memory device according to the seventh aspect of the present invention employs the following technical construction.

In other words, the seventh aspect of the present invention provides a semiconductor memory device having a plurality of kinds of readout modes and requiring a different power supply voltage for each of these modes, which comprises power source voltage input unit, reference voltage generation means, boost means including a capacitance device, and charge means for charging the capacitance device, the charge means of the capacitance device including charge quantity change means for changing the charge quantity of the capacitance device into a plurality of kinds in response to mutually different voltages.

Namely, the power supply voltage circuit of the semiconductor memory device according to the seventh aspect of the present invention uses the same external reference power supply source and one booster circuit, and generates a plurality of kinds of power supply voltages. More definitely, the reference source voltage is used as the first power source voltage by the use of one capacitance device and at the same time, a voltage necessary for generating mutually different voltages necessary for the readout modes is charged in advance in the capacitance device constituting the boost means, and at a predetermined timing control signals each having a voltage amplitude necessary to generate respective voltage the level of which is different from each other from the capacitance device, are applied to the capacitance device so that a plurality of kinds of mutually different, necessary power supply voltages can be generated by adding and combining the output charged voltage with the reference voltage.

In other words, in the semiconductor memory device according to the seventh aspect of the present invention, the correlationship between the power supply voltages of the readout modes is determined only by the amplitude of the signal input to the capacitance device, or only by the voltage charged in advance in the capacitance device, or by both of them.

Accordingly, the power supply voltage can be controlled by controlling only the input signal or the charge voltage, so that setting of the power supply voltages becomes easier and the correlationship between the power supply voltages of the readout modes can be set more correctly.

Hereinafter, a definite embodiment of the power supply circuit used in the semiconductor memory device in the seventh aspect of the present invention will be explained in detail with reference to the drawings.

Figure 65:
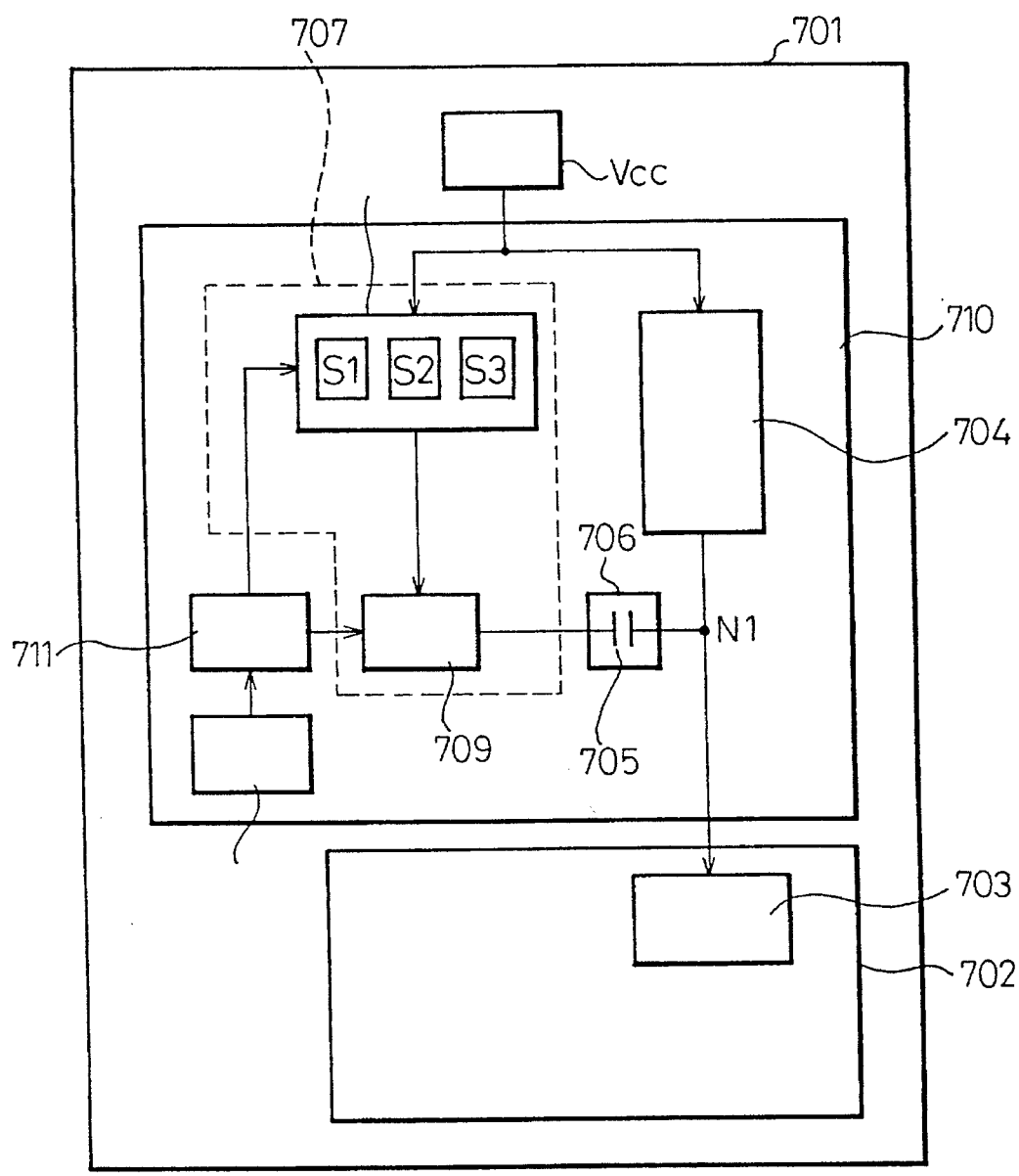
FIG. 65 is a block diagram showing a construction of a specific example of a supply voltage generating circuit used in a semiconductor memory in a seventh mode according to the invention.

FIG. 65 is a block diagram showing an example of the construction of the power supply voltage generation circuit 710 used in the semiconductor memory device according to this definite example.

FIG. 65 illustrates a semiconductor memory device 701 which includes a logical circuit unit 702 having a plurality of kinds of readout modes, and which requires different power supply voltages for these readout modes. In other words, the semiconductor memory device 701 includes a power supply voltage input unit 703 and a power supply voltage generation circuit 710, which, in turn, includes reference voltage generation means 704, boost means 706 including a capacitance device 705, and charge means 707 for charging the capacitance device 705, the charge means 707 being equipped with charge quantity change means 707 for changing a charge quantity of the capacitance device 705 into a plurality of kinds in response to mutually different voltages required by the readout modes, respectively.

In other words, the power supply voltage generation circuit 710 in the semiconductor memory device 701 according to this definite example generates a plurality of kinds of power supply voltages required by the logical circuit unit 702 by boosting the reference voltage by the capacitance device 705 and at the same time, changes the amplitude of a clock pulse signal input to the capacitance device 705 for generating the power supply voltage required by each readout mode in response to each of a plurality of kinds of power supply voltages required by the logical circuit unit 702, or changes the charge voltage to be charged in the capacitance device 705. The clock pulse signal having a different amplitude or the charge voltage having a different voltage is charged in the capacitance device 705 in accordance with a predetermined clock signal, and is added to, or subtracted from, the reference voltage so as to obtain a predetermined power supply voltage, which is output to the power supply voltage input unit 703 of the logical circuit unit 702 as the predetermined power supply voltage.

Figure 66:
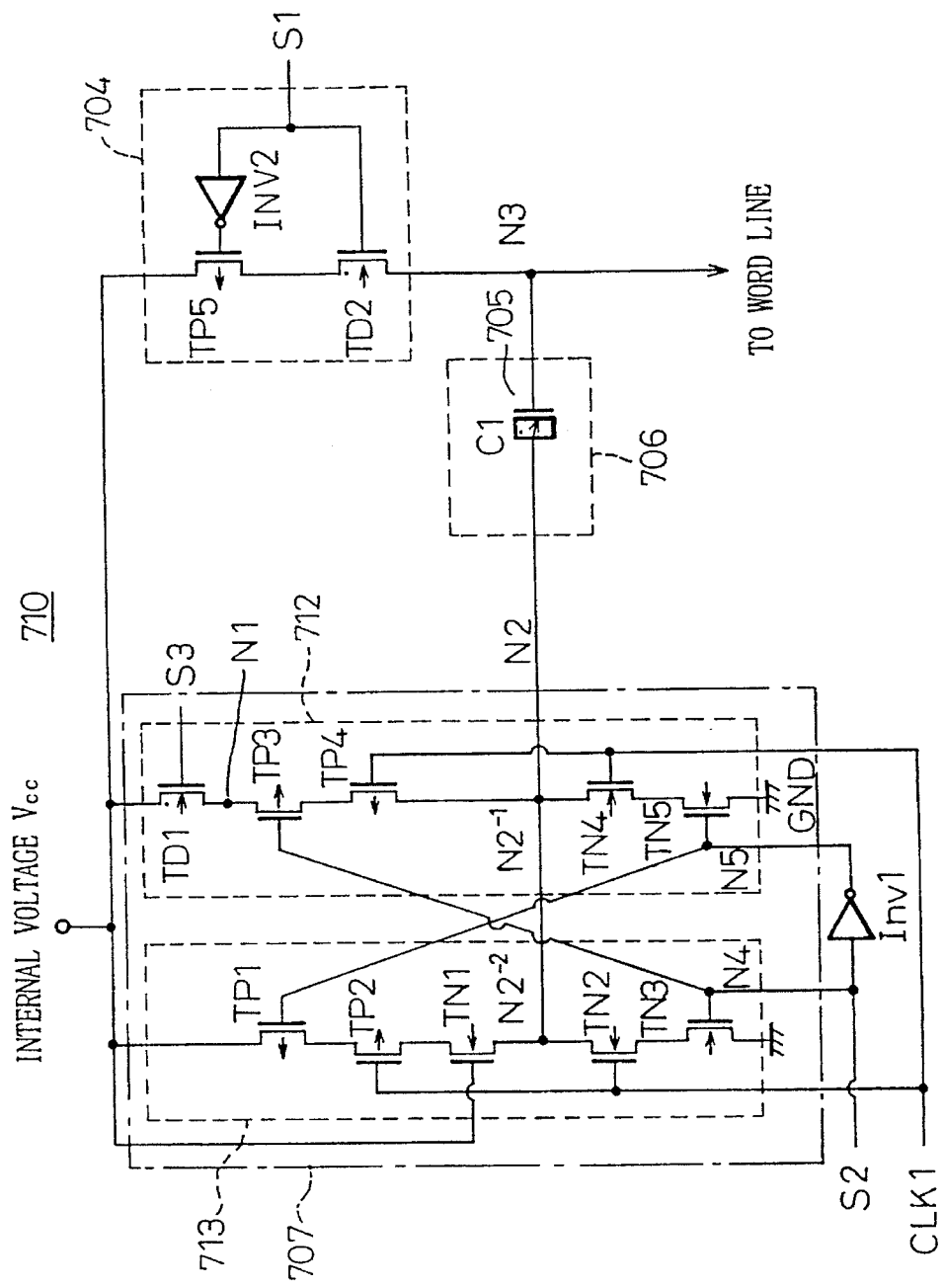
FIG. 66 is a block diagram showing a detailed construction of the specific example of the supply voltage generating circuit used in the semiconductor memory according to the seventh mode of the invention.

The reference voltage generation means 704 in this definite example functions also as charge means for charging the capacitance device 705 constituting the boost means 706. Though its construction is not limited in particular, it may be constituted by connecting a P-channel enhancement type field effect transistor TP5 and an N-channel depletion type field effect transistor TD2 in series, connecting the gate of the P-channel enhancement type field effect transistor to the gate of the N-channel type depletion type field effect transistor TD2 through an inverter INV2, and connecting their common terminal to a suitable control terminal S1, as shown in FIG. 66.

In this case, the free end portion of the P-channel type enhancement type field effect transistor TP5 in the reference voltage generation means 704 may be connected to a predetermined external power supply, or may be connected to an internal power supply voltage Vcc.

On the other hand, the free end portion of the N-channel type depletion field effect transistor TD2 is connected to one of the ends of the capacitance device 705 disposed in the boost means 706.

The power supply voltage generation circuit 710 in the semiconductor memory device 701 according to this definite example includes a suitable charge circuit 709 and charge quantity selection means 708 for changing the charge voltage to be charged in the capacitance device 705 constituting the boost means 706 into a plurality of kinds in accordance with the mutually different voltages required by the readout modes, respectively.

In other words, the charge quantity selection means 708 is provided in advance with a plurality of kinds of voltage generation circuits capable of outputting a plurality of predetermined voltage levels, selects these voltage generation circuits by suitable selection means, supplies the selected voltage to the capacitance device 705, and boosts the voltage charged to the capacitance device 705 from the reference voltage generation means 704. The boost voltage is input to the power supply voltage input unit 703 of the logical circuit unit from a node portion N1 shown in FIG. 65.

In this definite example, a predetermined clock pulse can be used as the charge quantity selection means.

In other words, the charge quantity selection means 708 in this definite example may even be controlled by the signal from the clock circuit 711.

In the power supply voltage generation circuit 710 in this definite example, the charge quantity change means 707 includes a suitable charge circuit 709 and at the same time, may be equipped with amplitude change means 712 for changing the amplitude of the clock pulse into the capacitance device 705 into a plurality of kinds in response to the mutually different voltages required by the readout modes, respectively.

In the definite example, the amplitude change means 712 generates a predetermined pulse width control signal for the clock circuit 711 and changes the amplitude of this clock pulse into a plurality of kinds, so that the charge voltage charged in the capacitance device 705 disposed in the boost means 706 is changed.

This means that the mutually different voltages required by the readout modes in the semiconductor memory device 701 according to this definite example are obtained by the selective addition of the output voltage from the reference voltage generation means 704 and the amplitude of the input signal to the boost means 706, respectively.

Furthermore, all of a plurality of kinds of readout modes in the semiconductor memory device according to this definite example may be connected to the power supply voltage circuit such as the one described above, or at least a part of the readout modes may be connected to such a power supply voltage circuit.

In any case, the mutually different voltages required for a plurality of kinds of readout modes in this definite example are preferably generated from the same internal power supply voltage.

Hereinafter, the definite construction of the power supply voltage generation circuit 710 of the semiconductor memory device 701 according to this definite example will be explained in further detail.

FIG. 66 is a block diagram useful for explaining a definite example of the power supply voltage generation circuit 710 of the semiconductor memory device 701 of this definite example.

As described already, the reference voltage generation means 704 in this definite example is constituted by connecting the P-channel enhancement field effect transistor TP5 in series with the N-channel depletion field effect transistor TD2, connecting the gate of the P-channel enhancement field effect transistor to the gate of the N-channel depletion field effect transistor TD2 through the inverter INV2, and further connecting their common terminal to a suitable first control terminal S1.

In this case, the free end portion of the P-channel enhancement field effect transistor TP5 in the reference voltage generation means 704 may be connected to a predetermined external power supply or to the internal power supply voltage Vcc.

On the other hand, the free end portion of the N-channel depletion field effect transistor TD2 is connected to one of the end portions of the capacitance device 705 disposed in the boost means 706 and to the power supply voltage input unit 703 in the logical circuit unit 702 of the semiconductor memory device.

The charge quantity change means 707 in the power supply voltage generation circuit 710 includes a first transistor train 712 formed by connecting in series an N-channel depletion field effect transistor TD1, P-channel enhancement field effect transistors TP3 and TP4, and N-channel enhancement field effect transistor TN4 and TN5 in the order named, between the internal power supply voltage Vcc and the ground potential GND. The charge quantity change means 7 in the power supply voltage generation circuit 710 includes a second transistor train 713 formed by connecting in series P-channel enhancement field effect transistors TP1 and TP2, N-channel enhancement field effect transistors TN1 and TN2, and an N-channel enhancement field effect transistor TN3 between the internal power supply voltage Vcc and the ground potential GND in the order named. A clock terminal portion CLK1 which is disposed separately is connected to the gate of each of the P-channel enhancement field effect transistor TP4 and the N-channel enhancement field effect transistor TN4 and also to the gate of each of the P-channel enhancement field effect transistor TP2 and the N-channel enhancement field effect transistor TN2. On the other hand, a second control terminal S2 is connected to the gate of each of the N-channel enhancement field effect transistor TN3 and the P-channel enhancement field effect transistor TP3, and at the same time, to the gate of each of the N-channel enhancement field effect transistor TN5 and the P-channel enhancement field effect transistor PT1 through the inverter INV1.

A third control terminal S3 is connected to the gate of the N-channel depletion field effect transistor TD1, and the internal power supply voltage Vcc is connected to the gate of the N-channel enhancement field effect transistor TN1.

The output terminals N2-1 and N2-2 of the first and second transistor trains 712 and 713 are commonly connected to one of the end portions of the capacitance device 705.

In such a power supply voltage generation circuit, the charge voltage charged in the capacitance device 705 can be set to a predetermined voltage level by appropriately switching the control voltage applied to the control terminals S1, S2 and S3 and simultaneously applying the clock in a suitable cycle. Therefore, this voltage is added to the voltage which is in advance generated in the reference voltage generation means 704 and charged in the capacitance device 705, and the reference voltage is output as the boosted voltage from the output node portion N3.

Next, the operation of the power supply generation circuit 710 shown in FIG. 66 will be explained.

First of all, assuming that the second control signal S2 is at the "L" level and the third control signal S3 is at the "H" level, the control signal S1 is set to the "H" level so as to drive the reference voltage generation circuit 704. Accordingly, the voltage of the power supply voltage output unit N3 is charged to the power supply voltage Vcc (this will be referred to as the "first power supply voltage").

At this time, if the clock CLK1 is set to "H" as shown in FIG. 67(A), the first control signal S1 is set to the "L" level at the point t1 at which the power supply voltage output unit N3 is sufficiently charged, and the clock CLK1 is set to the "L" level at the point t2 which is somewhat retarded from the point t1 at which the control signal S1 changes from the "H" level to the "L" level. Since the control signal S2 is at the "L" level at this time, the second inverter 712 constituted by the first transistor train 712 becomes effective, and since the third control signal S3 is at the "H" level, the potential at the connection node N1 between the N-channel depletion field effect transistor TD1 and the P-channel enhancement field effect transistor TP3 in the second inverter 712 becomes Vcc, so that the potential of the output node N2-1 changes from 0 V to Vcc.

As described above, since the power supply voltage output unit N3 and the output node N2 are capacitance-coupled by the capacitance device 705 as shown in FIG. 67(B), the potential at the power supply voltage output unit N3 is raised from Vcc to 2 Vcc, and here, the second power supply voltage is generated.

Next, the case where the second control signal S2 is set to the "L" level and the third control signal S3, too, is set to the "L" level, will be taken into consideration. In the same way as in the definite example described above, the control signal S1 is set to the "H" level and the voltage of the power supply voltage output unit N3 is charged to the internal power supply voltage Vcc.

As shown in FIG. 67(C), at the time t1 at which the power supply voltage output unit N3 is sufficiently charged, the first control signal S1 is kept at the level and at the time t2 slightly delayed from the time t1, at which the signal level of the first control signal S1 is changed from "H" level to "L" level, the clock CLK1 is set to the "L" level.

In this case, since the second control signal S2 remains at the "L" level, the second inverter 712 consisting of the first transistor train 712 becomes effective, but since the third control signal S3 is at the "L" level, the potential of the connection node N1 between the N-channel depletion field effect transistor TD1 and the P-channel enhancement field effect transistor TD3 reaches the threshold value Vtd of this transistor TD1. Accordingly, the potential of the output node N2-1 changes from 0 V to Vtd as shown in FIG. 67(D).

Since the power supply voltage output unit N3 and the output node N2 are capacitance-coupled by the capacitance device 705, the potential of the power supply voltage output unit N3 is boosted from Vcc to Vcc+Vtd, and here, the third power supply voltage is generated (refer to FIG. 67(D)).

Furthermore, the case where the second control signal S2 is set to the "H" level will be taken into consideration. In the same way as in the definite example described above, the control signal S1 is set to the "H" level, and the voltage of the power supply voltage output unit N3 is charged to the internal power supply voltage Vcc.

At this time, at the time t1 at which the power supply voltage output unit N3 is sufficiently charged as shown in FIG. 67(C), the first control signal S1 is kept at "L" level and at the time t2 slightly delayed from the time t1, at which signal level of the first control signal S1 is changed from "H" level to "L" level, the clock CLK1 is set to the "L" level.

Since the second control signal S2 remains at the "H" level, the P-channel enhancement field effect transistor TP2 and the N-channel enhancement field effect transistors TN1 and TN2 are turned ON, so that the third inverter 713 consisting of the second transistor train 713 becomes effective, and the potential of the output node N2-2 as the connection node between the N-channel enhancement field effect transistors TN1 and TN2 in the third inverter 713 changes from 0 V to Vcc–Vth which is the difference obtained by subtracting the threshold voltage Vth of the N-channel enhancement field effect transistor TN1 from Vcc.

Since the power supply voltage output unit N3 and the output node N2 are capacitance-coupled by the capacitance device 705, the potential of the power supply voltage output unit N3 is boosted from Vcc to 2 Vcc+Vtn, and here, the fourth power supply voltage is generated (refer to FIG. 67(E)).

In other words, the control signals S1 to S3 in this definite example constitute the charge quantity selection means 708 for changing the charge voltage to be charged in the capacitance device 705 in this definite example into a plurality of kinds of voltages.

In other words, this definite example makes it possible to extract four different kinds of power supply voltages from the same internal power supply voltage Vcc, and this operation can be executed by adjusting the application timings of the control signals S1 to S3 and the clock CLK.

Figure 68:
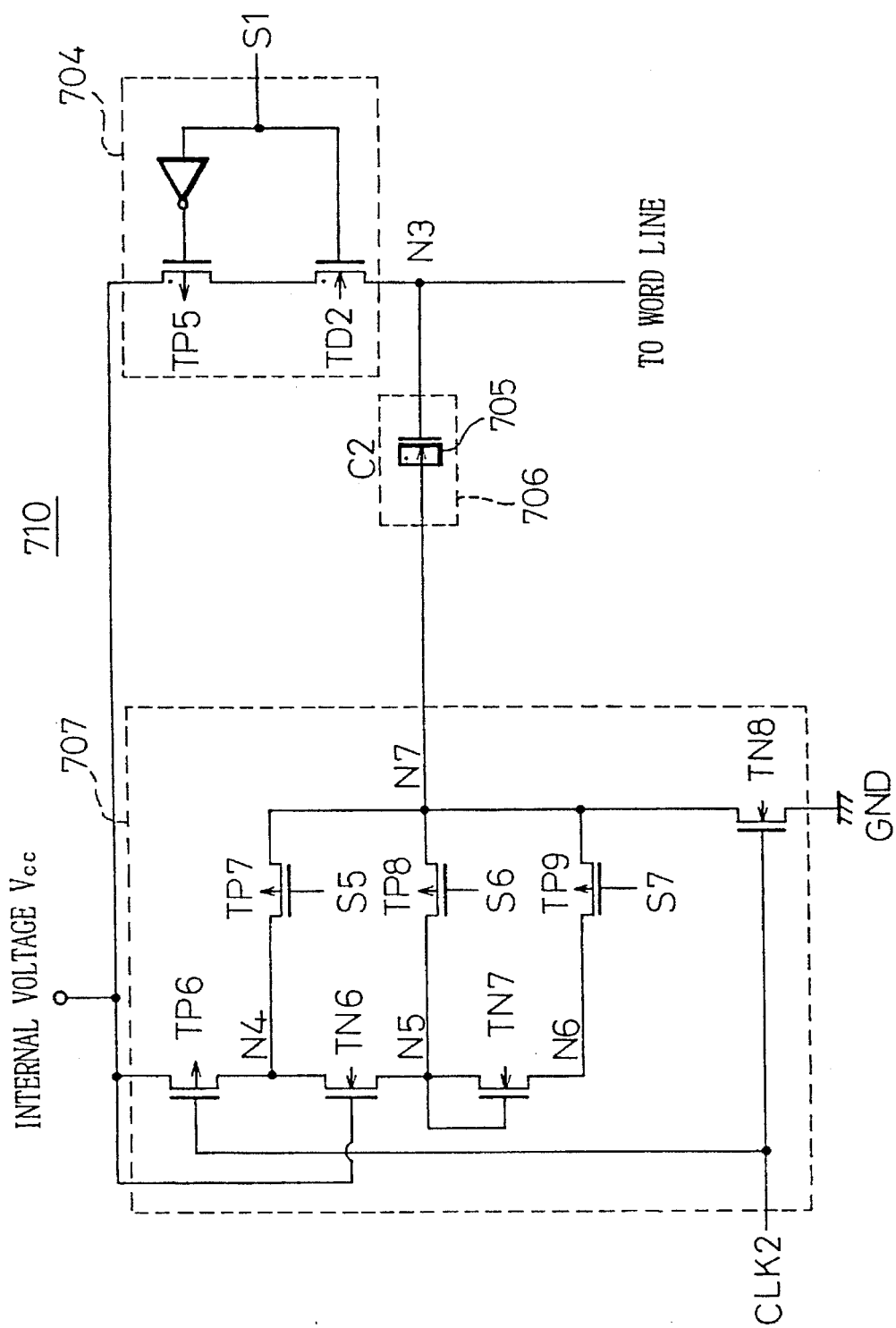
FIG. 68 is a block diagram showing a detailed construction of another specific example of the supply voltage generating circuit used in the semiconductor memory according to the seventh mode of the invention.

Next, the construction and operation of another definite example of the power supply voltage generation circuit 710 according to the present invention will be explained with reference to FIG. 68.

The construction of the reference voltage generation means 704 shown in FIG. 68 and its connection relation with the boost means 706 including the capacitance device 705 are the same as the construction of the definite example explained with reference to FIG. 66, but the construction of the charge quantity change means 707 is different.

In other words, a P-channel enhancement field effect transistor TP6, N-channel enhancement field effect transistors TN6, TN7, a P-channel enhancement field effect transistor TP9 and an N-channel enhancement field effect transistor TN8 are connected in series in the order named between the internal power supply voltage Vcc and the ground potential GND, the internal power supply voltage Vcc is connected to the gate of the N-channel enhancement field effect transistor TN6, and the clock CLK2 is connected to the gate each of the P-channel enhancement field effect transistor TP6 and the N-channel enhancement field effect transistor TN8.

A P-channel enhancement field effect transistor TP7, to the gate of which a fifth control signal S5 is input, is connected to a connection node N4 between the P-channel enhancement field effect transistor TP6 and the N-channel enhancement field effect transistor TN6, and a P-channel enhancement field effect transistor TP8, to the gate of which a sixth control signal S6 is input, is connected to a connection node N5 between the N-channel enhancement field effect transistors TN6 and TN7. The other end of each of the P-channel enhancement field effect transistors TP7, TP8 is connected to the connection node N6 between the P-channel enhancement field effect transistor TP9 and an N-channel enhancement field effect transistor TN8 to the gates of which a seventh control signal S7 is input. The other end of each of the transistors TP7 and TP8 is further connected in common to one of the ends of the capacitance device 705.

The gate of the N-channel enhancement field effect transistor TN7 is connected to the connection node N5 between the N-channel enhancement field effect transistors TN6 and TN7.

Figure 69A:
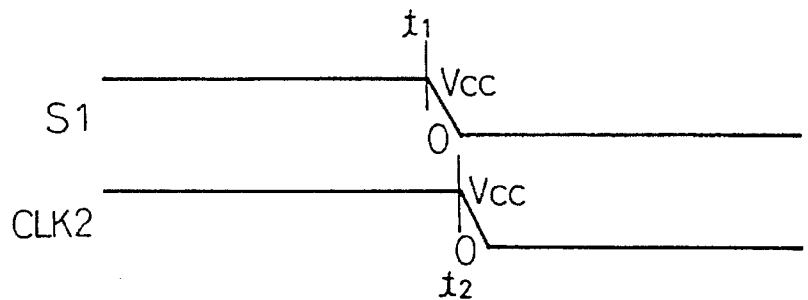
FIGS. 69(A), 69(B), 69(C) and 69(D) are timing charts in the supply voltage generating circuit shown in FIG. 68.

In the same way as in the timing chart of the definite example described above, in FIGS. 69(A)–(D), too, the control signal S1 is set to the "H" level and the reference voltage generation means 704 is driven so that the voltage of the power supply voltage output unit N3 is charged to the internal power supply voltage Vcc. At this time, when the clock CLK1 is set to the "H" level as shown in FIG. 69(A), the first control signal S1 is set to the "L" level at the point t1 at which the power supply voltage output unit N3 is sufficiently charged, and the clock CLK1 is set to the "L" level at the point t2 which is somewhat behind the point t1 at which the control signal S1 changes from the "H" level to the "L" level.

Figure 69B:
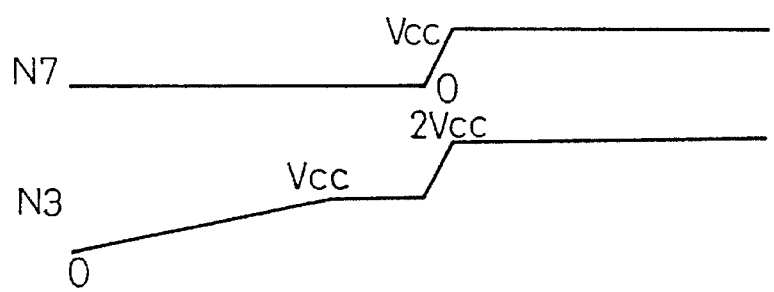

Under the situation described above, the control signal S5 is fixed to the "L" level and the control signals S6 and S7 are fixed to the "H" level among the control signals S5 to S7 applied to the gate of each of the P-channel enhancement field effect transistors TP7 to TP9. Then, at the point t2 at which the clock LCK 2 changes from the "H" level to the "L" level, only the P-channel enhancement field effect transistors TP6 and TP7 are turned ON as shown in FIG. 69(B), and the current is supplied from the internal power supply voltage Vcc to the connection node N7 through the P-channel enhancement field effect transistors TP6 and TP7. Therefore, the potential of this connection node N7 changes from 0 V to Vcc.

Accordingly, in the same way as in the definite example described above, the potential of the power supply voltage output unit N3 is boosted from Vcc to 2 Vcc and here, the second power supply voltage is generated (refer to FIG. 69(B)).

Figure 69C:
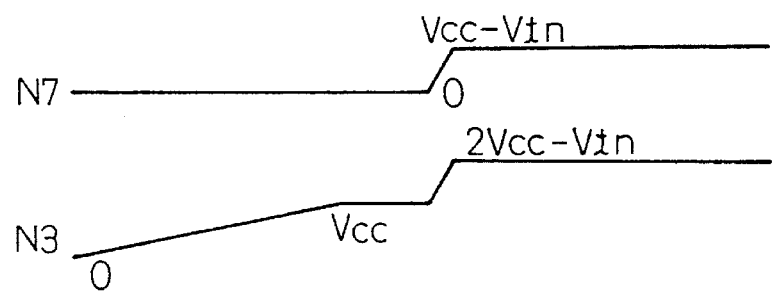

Next, when the control signal S6 among the control signals applied to the gate of each of the P-channel field effect transistors TP7 to TP9 is fixed to the "L" level and the control signals S5 and S7 are fixed to the "H" level, then, only the P-channel enhancement field effect transistor TP8 becomes effective at the time t2 at which the clock CLK2 changes from the "H" level to the "L" level as shown in FIG. 69(C), and the current is supplied from the N-channel enhancement field effect transistor TN6, which is turned ON by the internal power supply voltage Vcc, to the connection node N7 through the P-channel enhancement field effect transistor TP8.

In this case, the potential at the connection node N5 between the N-channel enhancement field effect transistors TN6 and TN7 is fixed to a potential which is reduced by the threshold value Vth of the transistor TN6 from the internal power supply voltage Vcc. Accordingly, the potential of this connection node N7 changes from Vcc to Vcc–Vth.

Accordingly, the potential of the power supply voltage output unit N3 is boosted to 2 Vcc–Vth, and here, the third power supply voltage is generated (refer to FIG. 69(C)).

Next, the control signal S7 among the control signals applied to the gate of each of the P-channel enhancement field effect transistor TP7 to TP9 is fixed to the "L" level and the control signals S5 and S6 are fixed to the "H" level. Then, at the timing t2 at which the clock CLK2 changes from the "H" level to the "L" level, only the P-channel enhancement field effect transistor TP9 becomes effective as shown in FIG. 69(D), and the current is supplied from the N-channel enhancement field effect transistors TN6 and TN7, which are turned ON by the internal power supply voltage Vcc, to the connection node N7 through the P-channel enhancement field effect transistor TP9.

In this case, the potential at the connection node N6 between the N-channel enhancement field effect transistor TN7 and the P-channel enhancement field effect transistor TP9 is fixed to a potential which is lower by 2 Vth of the threshold values of these transistors TN6 and TN7. Accordingly, the potential of the connection node N7 changes from 0 V to Vcc–2 Vth.

Figure 69D:
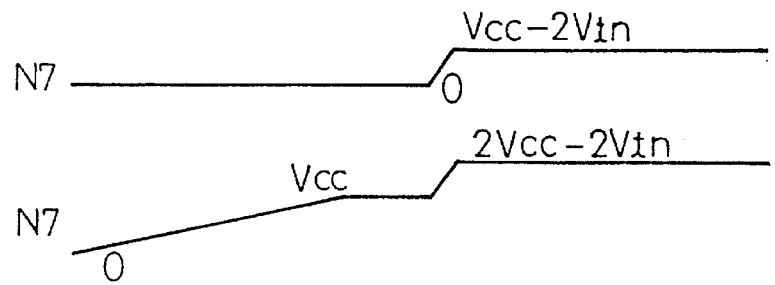

Therefore, the potential of the power supply voltage output unit N3 is boosted to 2 Vcc–2 Vth, and here, the fourth power supply voltage is generated (refer to FIG. 69(D)).

Next, another definite example of the power supply voltage generation circuit 710 used for the semiconductor memory device of this embodiment will be explained with reference to FIGS. 70 and 71.

Figure 70:
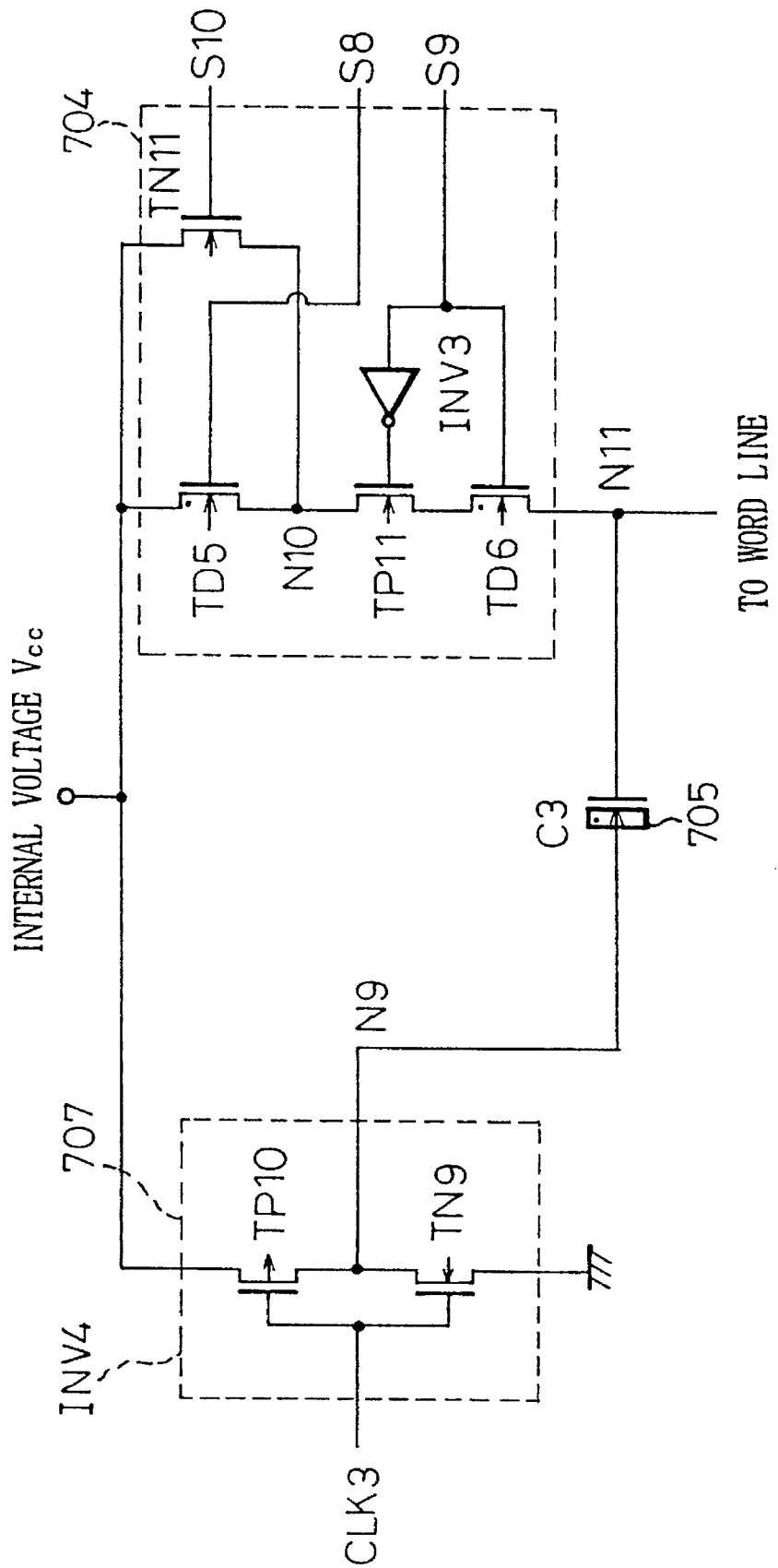
FIG. 70 is a block diagram showing a detailed construction of still another specific example of the supply voltage generating circuit used in the semiconductor memory according to the seventh mode of the invention.
Figure 71:
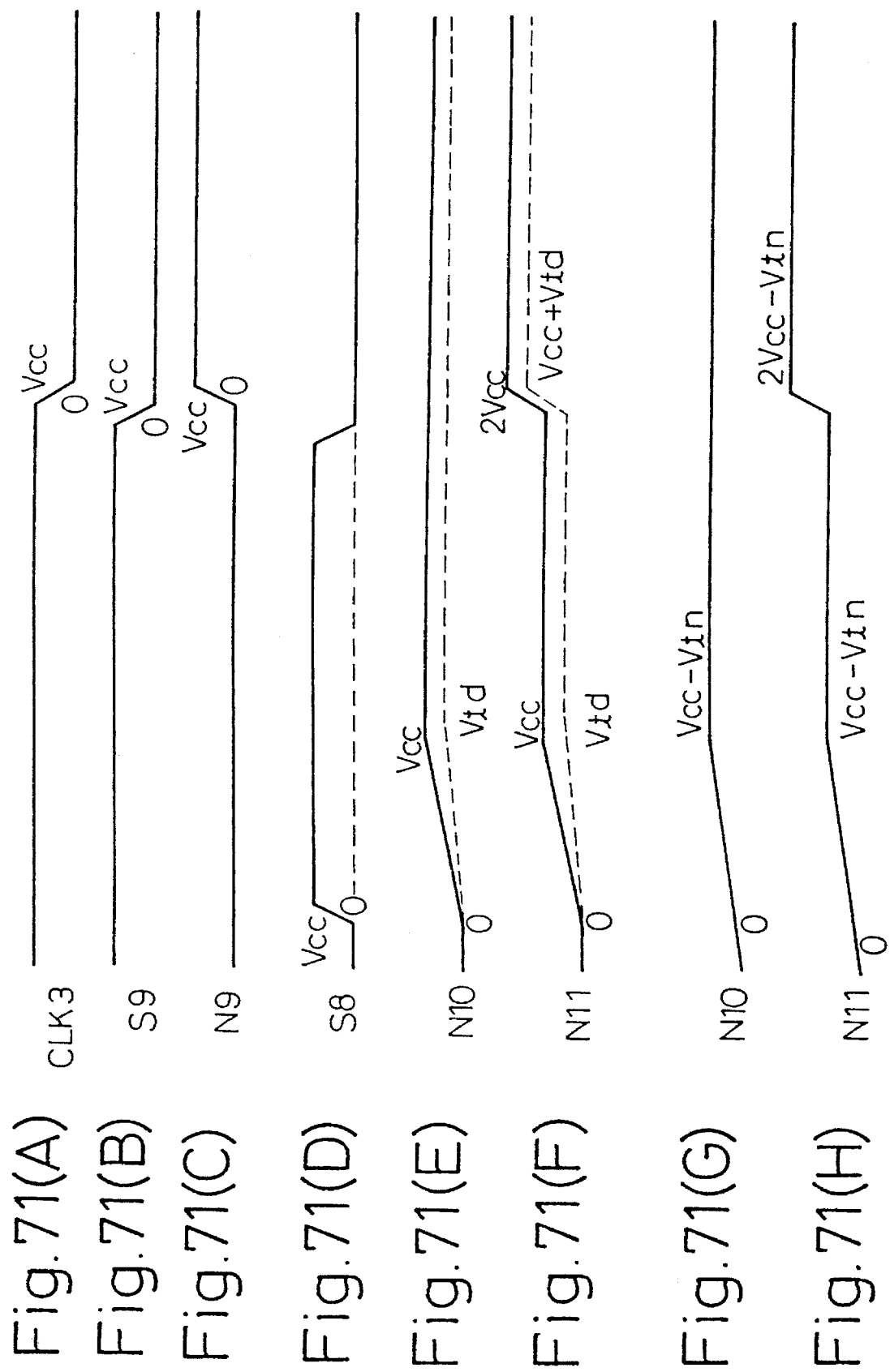
FIGS. 71(A), 71(B), 71(C), 71(D), 71(E), 71(F), 71(G) and 71(H) are timing charts in the supply voltage generating circuit shown in FIG. 70.

FIG. 70 shows the circuit construction of the power supply voltage generation circuit 710 according to this definite example. In the reference voltage generation means 704, an N-channel depletion field effect transistor TD5, a P-channel enhancement field effect transistor TP11 and an N-channel depletion field effect transistor TD6 are connected in series in the order named between the internal power supply voltage Vcc and the power supply voltage input unit 3, the control signal S8 is connected to the gate of this transistor TD5, the control signal S10 is connected to the connection node N10 between the transistors TD5 and TN10, and an N-channel enhancement field effect transistor TN11 connected to the internal power supply voltage Vcc is connected to this connection node N10. The gate of this transistor TN10 is connected to the gate of the transistor TD6 through an inverter INV3, and the control signal S9 is connected to their common node.

On the other hand, boost means 706 including the capacitance device 705 connected thereto at one of the ends thereof is disposed at the connection node 11 between the transistor TD6 and the power supply voltage input unit 3, and the other end of the capacitance device 705 is connected to an inverter INV4 to which the clock CLK is input.

The inverter INV4 has the construction in which a P-channel enhancement field effect transistor TP10 and an N-channel enhancement field effect transistor TN9 are connected in series in order named between the internal power supply voltage Vcc and the ground potential GND, and the clock CLK3 is input to the gates of both transistors.

The operation of the power supply voltage generation circuit 710 will be explained with reference to the timing chart shown in FIGS. 71*a* to 71*e*. To begin with, consider the case where the control signal S10 is set to the "L" level. First, the control signal S8 is set to the "H" level and the control signal S9, too, is set to the "H" level. The potential at the connection node N11 is then charged to Vcc at the timing t3 as represented by a solid line in FIG. 71*e* (first power supply voltage).

At this time, the clock CLK3 is kept under the "H" level state.

As shown in FIGS. 71*a* to 71*d*, the control signals S8 and S9 are changed to the "L" level at suitable timings t4 and t5 after the timing t3 at which the connection node N11 is charged to Vcc, and at the same time, the clock CLK3 is changed to the "L" level at a timing t6. Then, the potential of the output portion of the inverter INV4 changes from 0 V to Vcc.

Since the power supply voltage output unit N11 and the output node N9 are capacitance-coupled by the capacitance device 705 in the same way as in the definite example described above, the potential at the power supply voltage output unit N11 is boosted from Vcc to 2 Vcc as represented by a solid line in FIG. 71*f*, and here, the second power supply voltage is generated.

Next, the case where the control signal S10 is set to the "L" level and the control signal S8 is set to the "L" level will be considered. Since the control signal S8 is at the "L" level, the potential at the connection node 10 is Vtd which is the threshold voltage of the transistor TD5. Accordingly, if the control signal S9 is set to the "H" level, the power supply voltage output unit N11 is charged to Vtd.

At this time, if the clock CLK3 is kept at the "H" level and is then changed to the "L" level at the timings t5 and t6 at which the potential of the power supply voltage output unit N11 is sufficiently charged, the potential of the output portion N9 of the inverter INV4 changes from 0 V to Vcc, so that the potential of the power supply voltage output unit N11 is boosted from Vcc to Vcc+Vtd as represented by a dotted line in FIG. 71*f* in the same way as in the definite example described above, and here, the third power supply voltage is generated.

Furthermore, the case where the control signal S10 is set to the "H" level and the control signal S8 is set to the "L" level, will be considered. Since the control signal S10 is at the "H" level, the potential of the connection node N10 is Vcc–Vth which is lower by the threshold voltage Vth of the transistor TN11, and the transistor TD5 is cut OFF.

In this case, however, it is assumed that Vtd<Vcc–Vtn.

Then, the power supply voltage output unit N11 is charged to Vcc–Vtn as shown in FIG. 71*g* by setting the control signal S9 to the "H" level.

At this time, while the clock CLK3 is kept at the "H" level, the control signal S9 and the clock CLK3 are changed to the "L" level at the timings t5 and t6, respectively, at the point at which the potential of the power supply voltage output unit N11 is sufficiently charged. Then, the potential of the output portion N9 of the inverter INV4 changes from 0 V to Vcc. Accordingly, the potential of the power supply voltage output unit N11 is boosted from Vcc to 2 Vcc–Vtn as represented by a solid line shown in FIG. 71*h*, and here, the fourth power supply voltage is generated.

Figure 72:
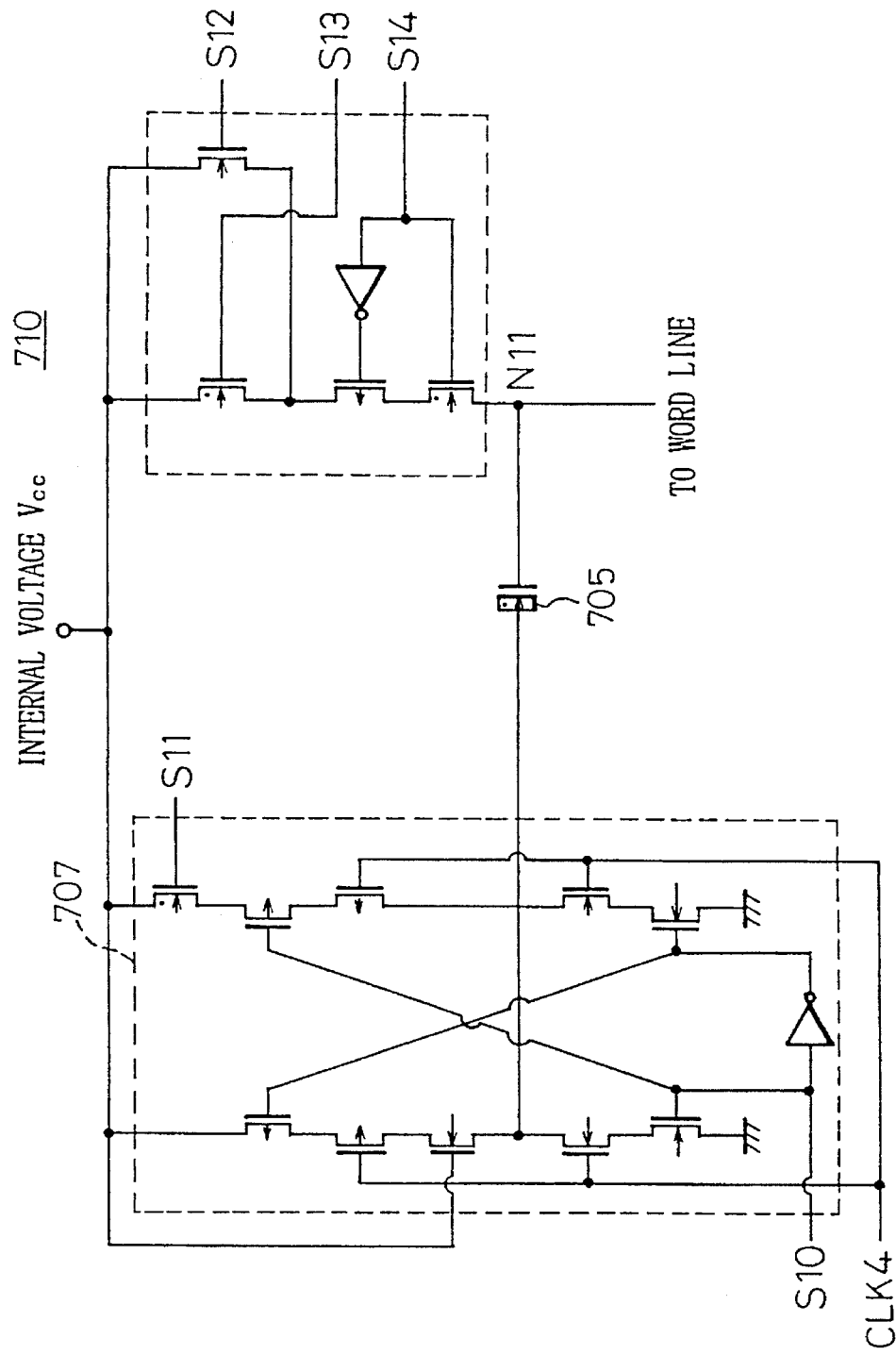
FIG. 72 is a block diagram showing a detailed construction of further another specific example of the supply voltage generating circuit used in the semiconductor memory according to the seventh mode of the invention.

FIG. 72 shows the construction of still another definite example of the power supply voltage generation circuit 710 in this embodiment. The construction uses the reference voltage generation means 704 shown in FIG. 70 as the reference voltage generation means 704, and uses the charge quantity change means shown in FIG. 66 as the charge quantity change means 707. Since the principle of operation is the same as those of the foregoing definite examples, the explanation of the operation will be omitted.

In this definite example, five kinds of control signals ranging from a control signal S10 to a control signal S14 are used. Therefore, nine different kinds of power supply voltages can be generated from one internal power supply voltage by combining the control signals with the clock CLK4.

In other words, each definite example of this embodiment provides the advantage that since the correlationship between the power supply voltages is determined by the amplitude of the clock signal and the charge voltage, the correlationship can be controlled easily.

Incidentally, in the power supply voltage generation circuit 710 in each definite embodiment, external power supply voltages of several systems can be used separately, and the internal power supply voltage and the external power supply voltages can be combined and used suitably.

The power supply voltage generation circuit 710 in this definite example is used as the power supply voltage of the decoder, but is particularly preferably used as a power supply voltage circuit of a decoder in a flash memory.

Figure 73:
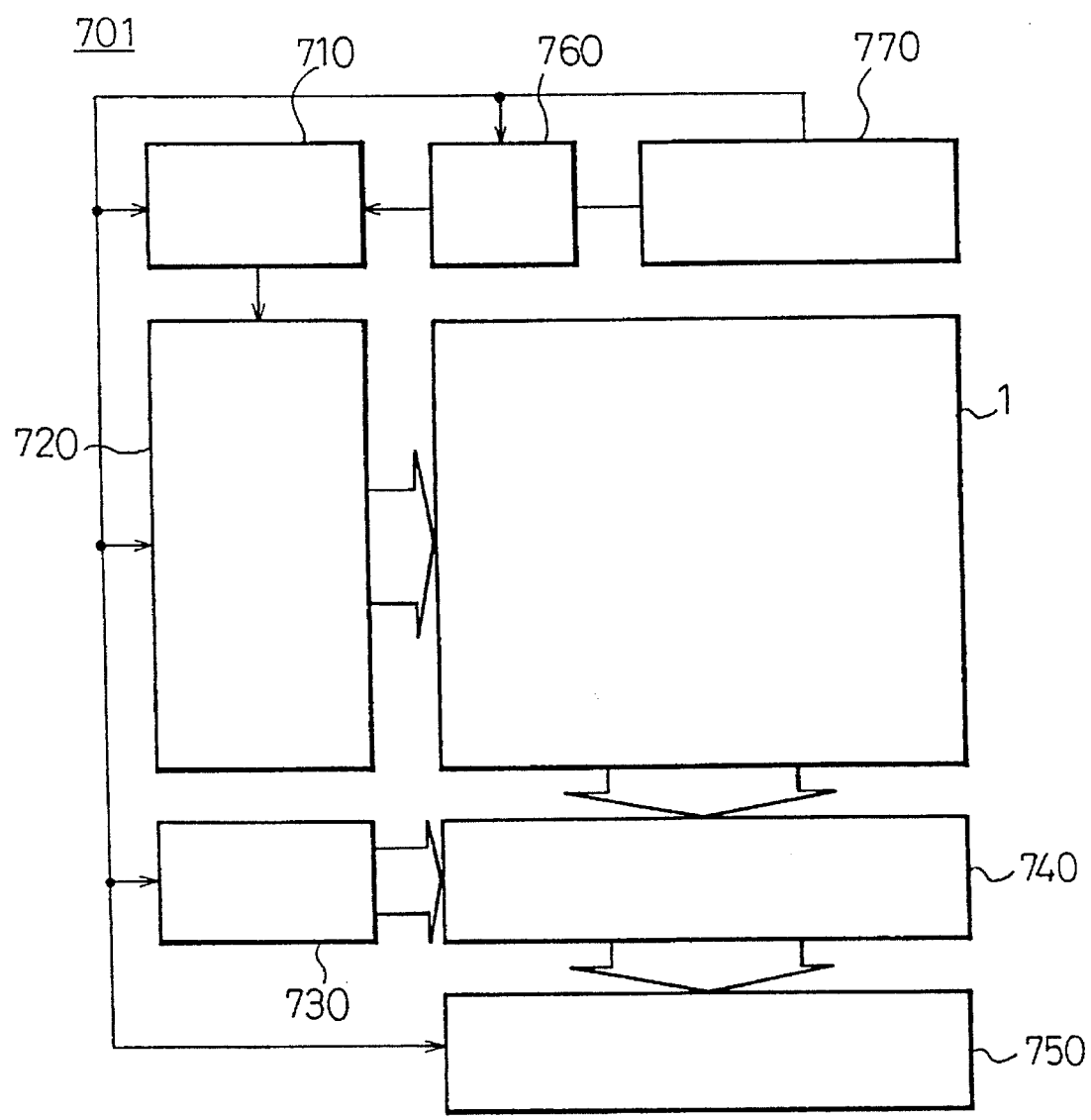
FIG. 73 is a block diagram showing a schematic construction of the semiconductor memory using the supply voltage generating circuit in the seventh mode according to the invention.

FIG. 73 shows an example wherein the power supply voltage generation circuit 710 according to this definite example is supplied to a row decoder of a flash memory. In the drawing, reference numeral 1 denotes a cell matrix, reference numeral 730 denotes a column decoder, reference numeral 740 denotes a Y gate, reference numeral 750 denotes a sense amplifier data-out buffer, reference numeral 760 denotes a control circuit and reference numeral 770 denotes an internal power supply circuit.

Figure 75:
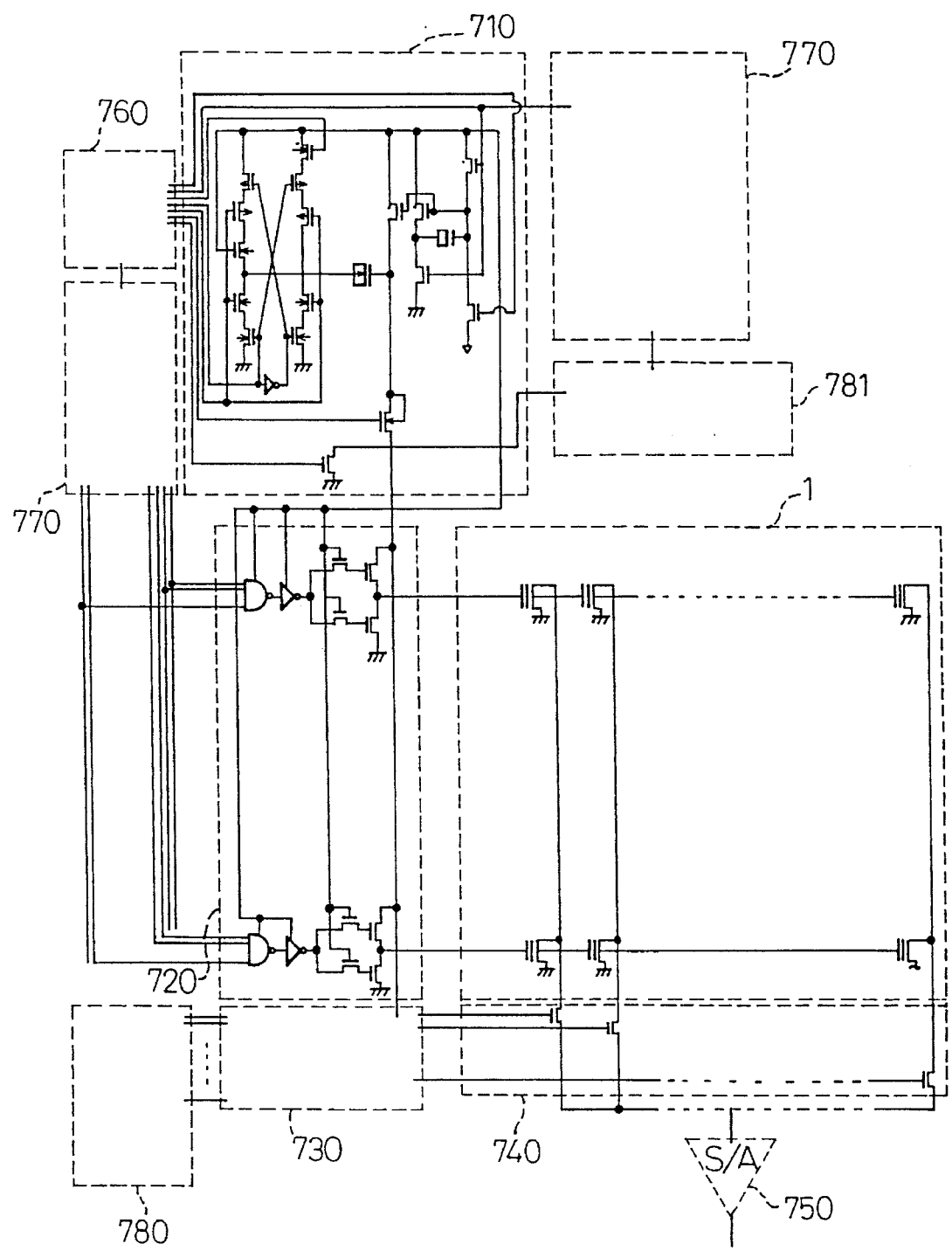
FIG. 75 is a block diagram showing a detailed construction of the semiconductor memory using the supply voltage generating circuit of the above specific example of the seventh mode according to the invention.

Furthermore, FIG. 75 shows in more detail the circuit construction of a semiconductor memory device using the power supply voltage generation circuit 710 according to this definite example, and basically, the circuit construction is the same as that shown in FIG. 73.

Reference numerals 770 and 780 denote an address buffer and a pre-decoder, respectively, and reference numeral 781 denotes a negative charge pump.

Judging from the function, the reference voltage generation means 704 according to this definite example charges the internal power supply voltage Vcc or the external power source voltage Vcc to the power supply voltage output units N3 and N11, as already described. Therefore, any construction can be employed so long as it has such a circuit function. For example, a P-channel enhancement field effect transistor, an N-channel enhancement field effect transistor and an N-channel depletion field effect transistor shown in FIGS. 76 to 78 can be used individually.

Figure 76:
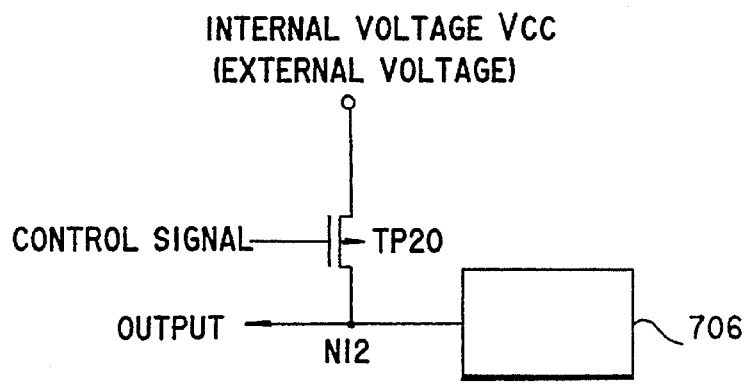
FIG. 76 is a diagram showing an example of construction of a charging circuit in the prior art.

In FIG. 76, however, when the control signal S is set to the "L" level at the time of charging and the output terminal N12 of the boost means (boosting circuit) 706 is charged to the internal power source voltage or to the external power source voltage Vcc, the P-channel enhancement field effect transistor TP20 is turned ON and the current flow from the output terminal N12 to the power supply if the boosting voltage is higher than the control signal S by the threshold voltage value of the transistor, even though the control signal S is set to the "H" level at the time of boosting.

When the boosting voltage is not higher than the control signal S by at least the threshold voltage value, too, the current flows from the output terminal to the N-well if the boosting voltage is higher than Vcc by the ON voltage of the P-N junction. Therefore, the power is consumed.

To prevent such problems, boosting must be done by each N-well but if such a construction is employed, the capacity of the boosting circuit must be improved to a considerable extent, so that another problem occurs in that the boosting circuit becomes greater in size and the cost of production becomes higher.

Figure 77:
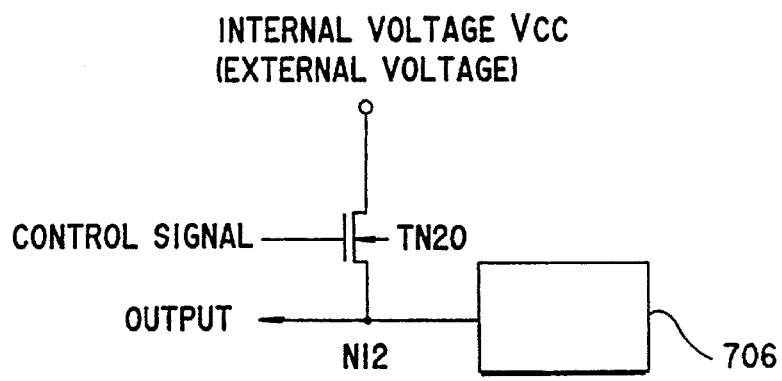
FIG. 77 is a diagram showing another example of construction of a charging circuit in the prior art.

In FIG. 77, the output terminal N12 of the boosting circuit (boost means) 706 is charged by setting the control signal S to the "H" level at the time of charging, and no current flows from the output terminal to the power supply or to the substrate at the time of boosting. However, since the N-channel enhancement field effect transistor TN20 is used, there remains the problem in that the output terminal N12 can be charged only up to Vcc–Vtn when the threshold voltage of the N-channel enhancement field effect transistor is Vtn.

Figure 78:
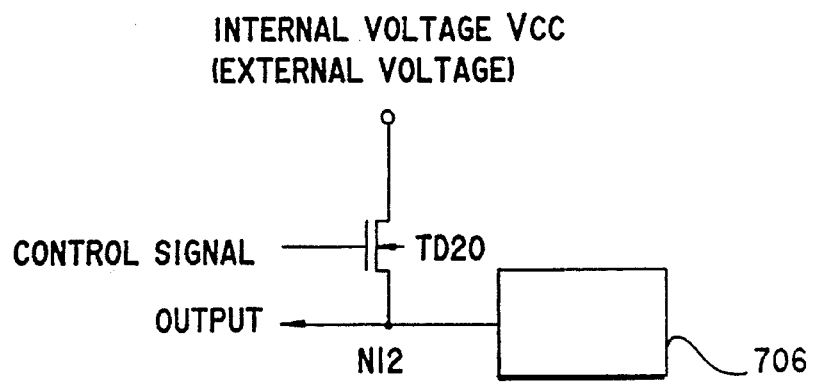
FIG. 78 is a diagram showing still another example of construction of a charging circuit in the prior art.

Furthermore, in FIG. 78, the output terminal N12 of the boosting circuit 706 can be charged to Vcc by setting the control signal S to the "H" level at the time of charging.

If the potential Vcc of the output terminal is higher than the threshold voltage value Vtd of the N-channel enhancement field effect transistor TD20 when the control signal S is set to the "L" level at the time of boosting, no current flows from this output terminal N12 to the power supply, but if a circuit for passing a penetration current such as a decoder is connected to the power supply line as shown in FIG. 78, there is the problem that the power supply voltage Vcc becomes lower than the threshold voltage Vtd and a current flows from the output terminal N12 to the power supply.

Accordingly, the reference voltage generation means 704 of the power supply voltage generation circuit 710 in this embodiment preferably has the circuit construction which does not generate the problems described above. As described in the definite example, a preferred circuit construction of the reference voltage generation means 704 connected to the boost means 706 comprises a P-channel enhancement field effect transistor TP21 which is connected to an internal power supply voltage supplied through an N-channel depletion field effect transistor TD22, for example, and to the gate of which the first control signal is inputted, and an N-channel depletion field effect transistor TD21 the drain of which is connected to the drain of the P-channel enhancement field effect transistor TP21, to the gate of which the control signal is input and at the source of which the boosting voltage appears.

Figure 79:
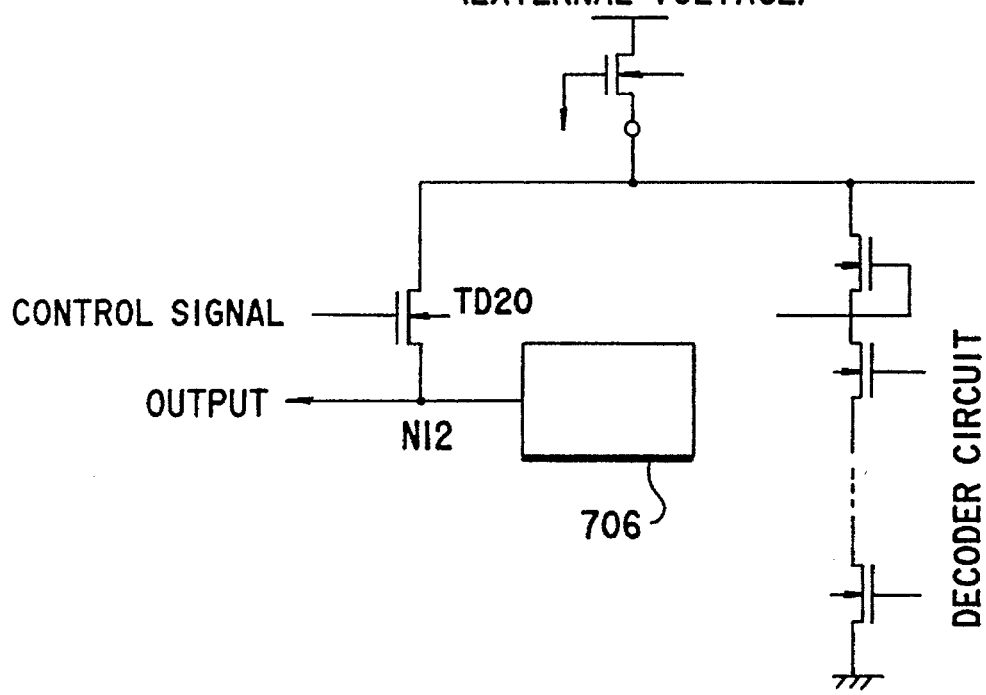
FIG. 79 is a diagram showing further another example of construction of a charging circuit in the prior art.
Figure 80:
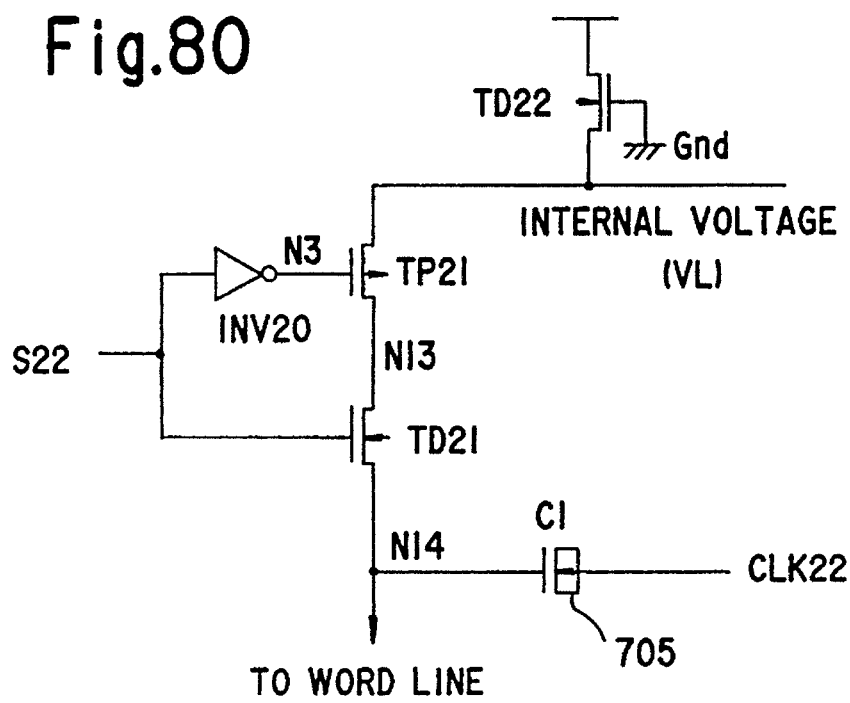
FIG. 80 is a block diagram showing an example of construction of a reference voltage generating circuit which operates as a charging circuit according to the invention.
Figure 81:
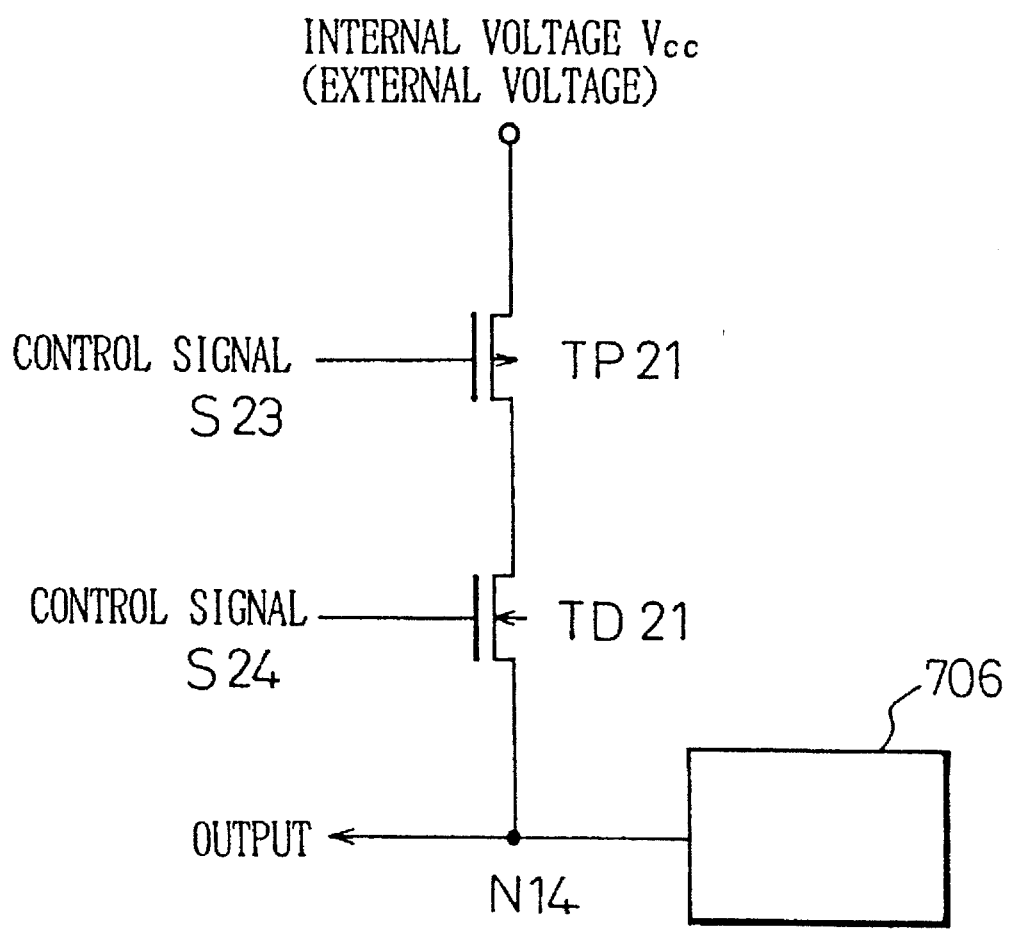
FIG. 81 is a block diagram showing another example of construction of the reference voltage generating circuit which operates as a charging circuit according to the invention.

The first and second control signals 23, 24 in this definite example may be input independently and individually as shown in FIG. 80, or their complementary signals may be input through an inverter INV20, etc., using one control signal S22, as shown in FIG. 79.

In the definite example of this embodiment shown in FIG. 80, the leakage current from the output terminal N12 is cut off by the P-channel enhancement field effect transistor TP21 at the time of boosting, and the leakage current from the P-type region of this P-channel enhancement field effect transistor TP21 to the N-well does not occur because the threshold voltage Vtd of the N-channel depletion field effect transistor TD21 limits the potential difference between the P-type region and the N-well below the ON voltage of the O-N junction.

The reference voltage generation means 704 in this definite example consists of the P-channel enhancement field effect transistor TP21 and the N-channel depletion field effect transistor TD21. Accordingly, the charge voltage of the output terminal N21 can be secured at a sufficiently high level.

The definite example shown in FIG. 79 will be explained. It will be hereby assumed that the internal power supply voltage is clamped at the threshold voltage Vtd of the N-channel depletion field effect transistor TD22 by this transistor TD22.

Here, when the clock signal CLK22 is set to the "L" level and the control signal S22 is set to the "H" level. Then, the P-channel enhancement field effect transistor TP21 is turned OFF and the transistor TD21 is strongly turned ON at the time of charging, so that the potential of the connection node N14 between the transistor TD21 and the capacitance device 705 is charged to Vtd.

The control signal S22 is set to the "L" level when the potential of the connection node N14 is sufficiently charged.

At this time, the transistor TP21 is turned OFF and the transistor TD21 is weakly turned ON.

Thereafter, when the clock signal CLK22 is set to the "H" level, the potential of the connection node N14 is boosted from Vtd to 2 Vtd.

On the other hand, since the gate of the transistor TD21 is at 0 V, the potential at the connection node N14 does not rise beyond Vtd.

Since the potentials at both the source and drain of the transistor TP21 are at Vtd, no leakage current flows from this connection node N14 to the internal power supply.

Furthermore, if the potential difference between Vtd and N-well is set to be below the ON voltage of the P-N junction; the leakage current from the connection node N14 to the N-well is eliminated, as well.

It is preferred in this definite example to dispose control means for setting the first control signal S23 to the "L" level after the second control signal S24 reaches the "H" level and for setting the first control signal S23 to the "H" level after the second control signal S24 reaches the "L" level at the time of boosting.

According to this definite example, the connection node N14 can be charged to a sufficient high voltage, and no leakage current is allowed to flow at the time of boosting. Furthermore, boosting efficiency of the booster circuit can also be improved.

Since this definite example employs the technical construction described above, the power supply voltage can be controlled by controlling only the input signal and the charge voltage. Therefore, setting of the power supply voltage becomes easy and moreover, the correlationship between the power supply voltages of each mode can be set very accurately. In this way, since the correlationship of the power supply voltages of each mode can be set very accurately, this definite example makes a great contribution to the reduction of erase defects and write defects in the flash memory.

Incidentally, when predetermined data is read out from the non-volatile memory device described above; the embodiment employs a method which includes a plurality of sense amplifiers per bit and selects the output of the sense amplifiers by the address so that the data of a plurality of addresses can be read out in parallel with one another.

Figure 82:
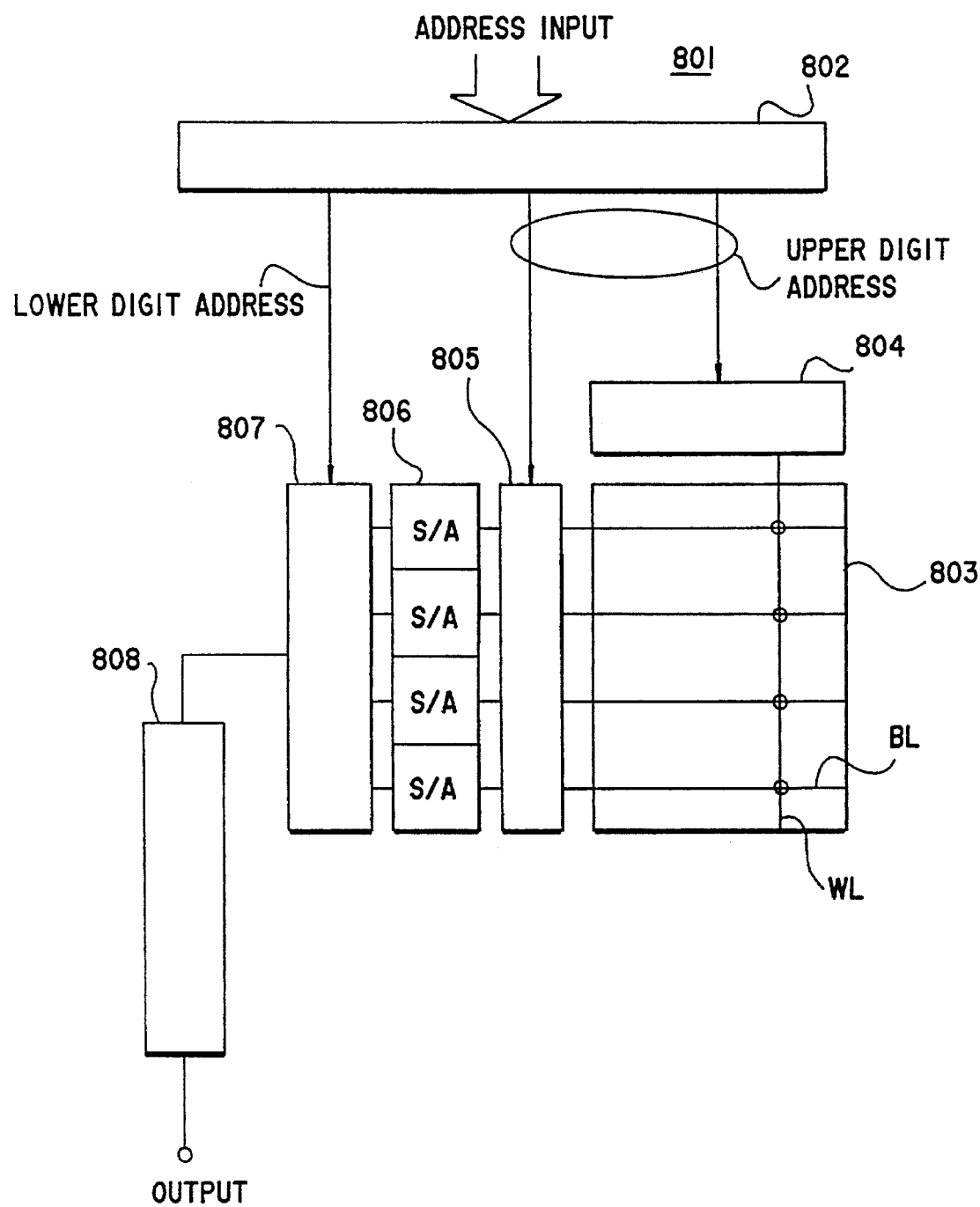
FIG. 82 is a block diagram showing an exemplary construction of the semiconductor memory of the prior art.

FIG. 82 shows the construction of one definite example of the semiconductor memory device 801 according to the prior art.

In other words, FIG. 82 shows an address buffer 802 for receiving an address input ADD inputted from at least a suitable external memory circuit, bit selection means 805, a sense amplifier 806, sense amplifier selection means 807 and an output buffer 808. The address buffer means 802 is provided with first address generation means for simultaneously making access to a predetermined number of data groups and reading them, and with second address generation means for individually selecting a plurality of data selected by the first address generation means. The first address generation means selects, for example, a predetermined word line from a plurality of word lines WL, and makes it possible to read out all of a plurality of data stored along the selected word line. It is generally referred to a "high order address".

On the other hand, the second address generation means generates addresses for suitably and individually selecting the bit lines BL in order to select a plurality of data selected by the host address, and is generally referred to as a "lower order address".

In the conventional semiconductor memory device 801 having such a construction, the read-out operation of the data by the first address generation means, that is, by the higher order address, is time-consuming, while the read-out operation of the selected data for each bit line BL by the second address generation means, that is, by the lower order address, can be executed within an extremely short time.

In other words, in the conventional semiconductor memory device, selection of data by the higher order address is time-consuming, while selection of data by the lower order address under the state where the higher order address is fixed, that is, under the state where the higher order address does not change, can be carried out at random and at high speed. However, when the higher order address is again selected, the access time becomes longer.

Therefore, according to the prior art, when the higher order address reads out the data (0, 1, 2, 3) of the address m in the course of a predetermined time and then writes the data into the sense amplifier 806 or the like, a period in which no operation is carried art, is deliberately set as a sense wait time such as the period represented by symbol X. After this wait time passes by, the data (0, 1, 2, 3) is then written into each sense amplifier 806 and is thereafter output sequentially from the output buffer 808 by the sense amplifier selection means 807.

In other words, since a sense wait time exists in the conventional semiconductor memory device 801, the data read-out time is time-consuming. Therefore, the conventional semiconductor memory device is not suitable for high speed operation.

Particularly when a greater number of continuous addresses than the number of sense amplifiers provided per bit are accessed in the semiconductor memory device 801, the wait time for the operation of the sense amplifiers exists in the interim. Thus, there is another problem that the data output cannot be read out in a uniform time interval and at a high speed.

Therefore, the definite example of the eight embodiment of the present invention provides a non-volatile semiconductor memory device which can improve the drawbacks with the prior art described above, and which can read out a plurality of data stored in memory cell means at a high speed.

To accomplish the object described above, the definite example of the eighth embodiment of the present invention employs the following technical construction.

In other words, in a semiconductor memory device including at least address buffer means, memory cell means, word line selection means, bit line selection means, output buffer, first address generation means for imparting one address to each group using a plurality of data as one group, and second address generation means for imparting one address to each of the individual data, the semiconductor memory device according to this embodiment further includes first readout means for selecting and reading out one of a plurality of data groups through the word line selection means or the bit line selection means by the use of one address value in the first address generation means, second readout means for selectively reading out the individual data constituting the data group selected and read out from a plurality of data groups by one address of the first address generation means, by the use of the address value in the second address generation means, and precedence readout means for reading out a plurality of other data groups corresponding to other addresses of the first address generation means by the values of other addresses in the first address generation means, after a predetermined number of data are read out by one address of the first address generation means but before each of a plurality of data read out by one address of the first address generation means is selectively read out to the output buffer by the respective address in the second address generation means.

The non-volatile semiconductor memory device according to the eighth embodiment of the present invention employs the basic technical construction described above. In contrast, the prior art employs the construction wherein, when the access is made to the memory cell means by the use of the higher order address to once output predetermined data to the output buffer and then makes once again the access to the memory cell means by the use of the next or other higher order address, the prior art makes the access to the memory cell means by the use of the higher order address to read out the predetermined data, and while the data is once written and stored in the sense amplifier, the prior art sets the sense wait time described above so that no operation is carried out in that period. However, the present invention utilizes this sense wait time for making access to the memory cell means in advance by the use of the next or other higher order address so as to read out the data corresponding to the address and to prepare for the next operation.

In other words, in the semiconductor memory device according to this definite example, the readout operation by the higher order address, which will otherwise need a long time, is executed in advance, so as to improve the read-out speed of the data.

A semiconductor memory according to this embodiment of the present invention will be explained in detail with reference to the drawings.

Figure 84:
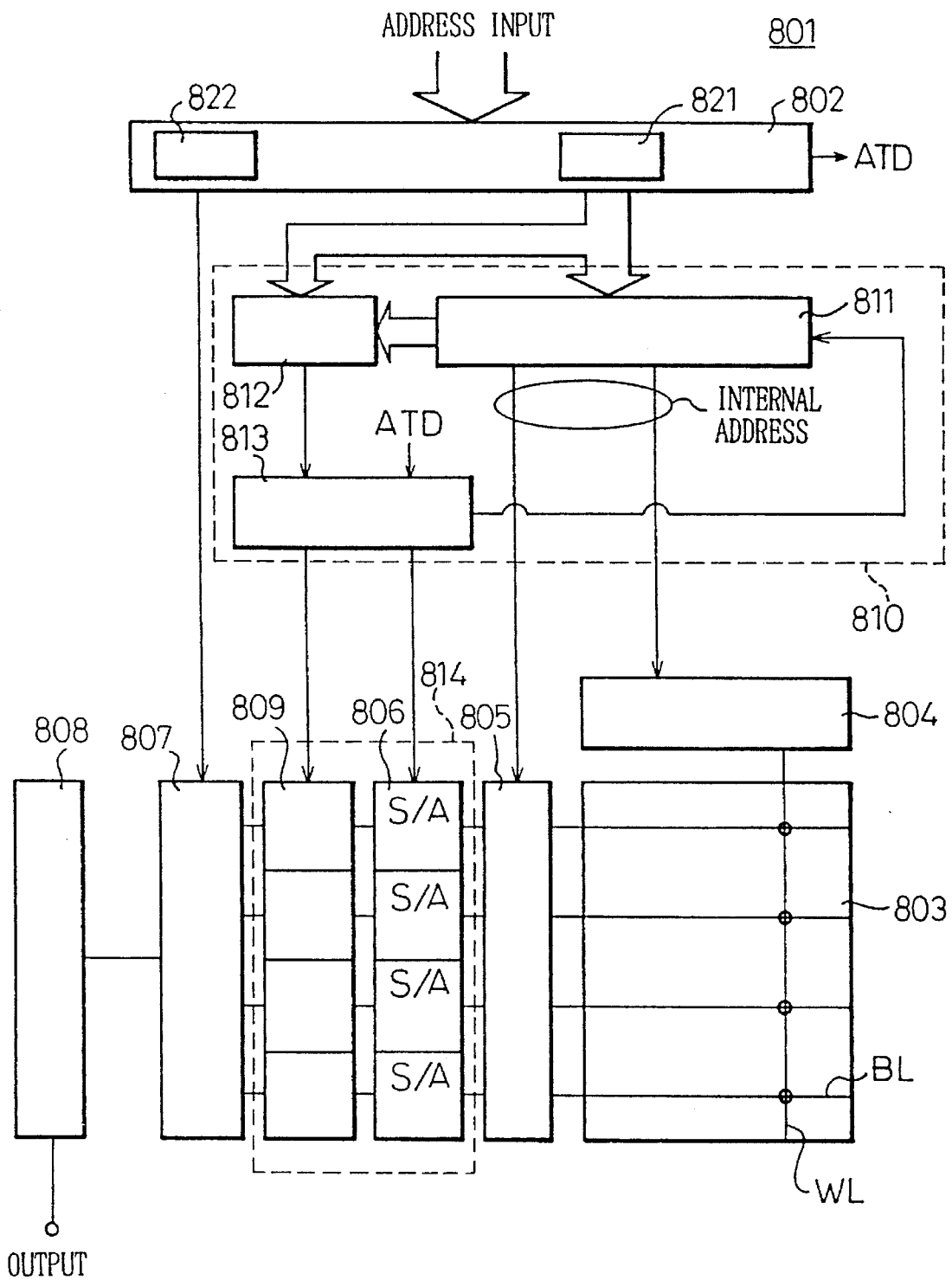
FIG. 84 is a block diagram showing a construction of a specific example of semiconductor memory according to an eighth mode of the invention.

FIG. 84 is a block diagram showing the semiconductor memory 801 according to the embodiment. The semiconductor memory 801 comprises address buffer means 802, memory cell means 803, word line selection means 804, bit line selection means 805, and an output buffer 808. The address buffer means 802 involves a first address generator 821 for generating an address to specify a group of data pieces, and a second address generator 822 for generating addresses to specify the data pieces, respectively.

The semiconductor memory 801 further comprises first read means 814 for selecting and reading a group of data pieces through the word line selection means 804 or the bit line selection means 805 according to an address provided by the first address generator 821; second read means 807 for selecting the data pieces, which have been selected and read according to the address provided by the first address generator 821, through the word line selection means 804 or the bit line selection means 805 according to addresses provided by the second address generator 822 and providing the output buffer 808 with the data pieces as selected; and pre-read means 810 for reading another group of data pieces according to another address provided by the first address generator 821 while the preceding data pieces, which have been read according to the address provided by the first address generator 821, are being selected and provided to the output buffer 808 according to the addresses provided by the second address generator 822.

The semiconductor memory 801 of this embodiment basically resembles to the conventional semiconductor memory 801 of FIG. 82. The semiconductor memory 801 of this embodiment is characterized by the pre-read means 810, which reads, during a sense wait time, a group of data pieces from the memory cell means 803 according to the next or another upper address and has the read data pieces on standby.

The first address generator 821 generates an address for specifying, for example, a word line WL and a bit line BL involving a group of different data pieces. Namely, the address provided by the first address generator 821 corresponds to a conventional upper address.

The second address generator 822 generates addresses for selecting an output data output from the sense amplifier by the sense amplifier selecting means to access the group of data pieces selected by the first address generator 821. Namely, the addresses provided by the second address generator 822 correspond to conventional lower addresses.

The first read means 814 may comprise sense amplifiers 806, or the sense amplifiers 806 and latch circuits 809.

The second read means 807 may be sense amplifier selection means 807.

The pre-read means 810, which is characteristic to this embodiment, includes an internal address generator 811 and a comparator 812. The internal address generator 811 has an input portion 816 for receiving an address from the first address generator 821 of the address buffer means 802, and means 817 such as a counter for changing an address held in the internal address generator 811 according to a given control signal. The comparator 812 compares an address provided by the internal address generator 811 with an address provided by the first address generator 821.

When the two addresses agree with each other, the comparator 812 provides a signal according to which the first read means 814 pre-reads a group of data pieces corresponding to the agreed address out of the memory cell means 803. At the same time, the comparator 812 provides the internal address generator 811 with a control signal. In response to the control signal, the internal address generator 811 changes a count of the counter (the address changing means), to provide a different address.

This different address may be an increment or decrement of the preceding address, or a random address.

The pre-read means 810 may have a timing controller 813 for relationally controlling the internal address generator 811 and comparator 812.

The timing controller 813 also controls the timing of the sense amplifiers 806 and latch circuits 809 of the first read means 814 as well as the timing of the sense amplifier selection means (the second read means) 807.

The timing controller 813 is controlled by an address transition detector (not shown) that determines whether or not an address from the first address generator 821 has been changed, and when it has been changed, provides a signal ATD.

Reading a group of data pieces according to an address provided by the internal address generator 811 from the memory cell means 803 into the sense amplifiers 806 of the first read means 814 involves a predetermined delay time. The pre-read means 810 uses this delay time, to access, in advance, an address that is different from the address now provided by the internal address generator 811.

After the delay time, the timing controller 813 provides a latch signal. In response to the latch signal, the latch circuits 809 latch the data pieces from the sense amplifiers 806. At the same time, the timing controller 813 provides a signal for changing a count in the internal address generator 811.

In this way, this embodiment accesses the next upper address while the present data are being read and provided outside, to thereby solve the problems of the prior art. To achieve this, the embodiment employs the detector for detecting a change in an address provided by the first address generator 821, the counter (or an adder) 817 for incrementing an address according to an addition signal generated when the address change is detected, the comparator 812 for comparing the incremented address with an externally provided address, the latch circuits 809 for latching data pieces from the sense amplifiers 806, and the timing controller 813 for generating control signals for controlling the above-mentioned circuits according to predetermined timing. When the first address generator 821 provides a different address, the comparator 812 compares this address with an incremented address provided by the internal address generator 811. If the addresses agree with each other, the latches 809 latch data from the sense amplifiers 806, and the latched data are provided outside.

Thereafter, the address in the internal address generator 811 is incremented to start the next access operation. This process is repeated to access continuous or random addresses at high speed.

Irrespective of the number of addresses that are simultaneously accessed in the semiconductor memory, the embodiment can read data from consecutive addresses at high speed. The embodiment requires a small number of sense amplifiers in a chip, to thereby reduce a chip area and cost per bit.

Operations of the semiconductor memory 801 will be explained with reference to a timing chart of FIG. 85 and operational views of FIGS. 86 to 92.

Figure 86:
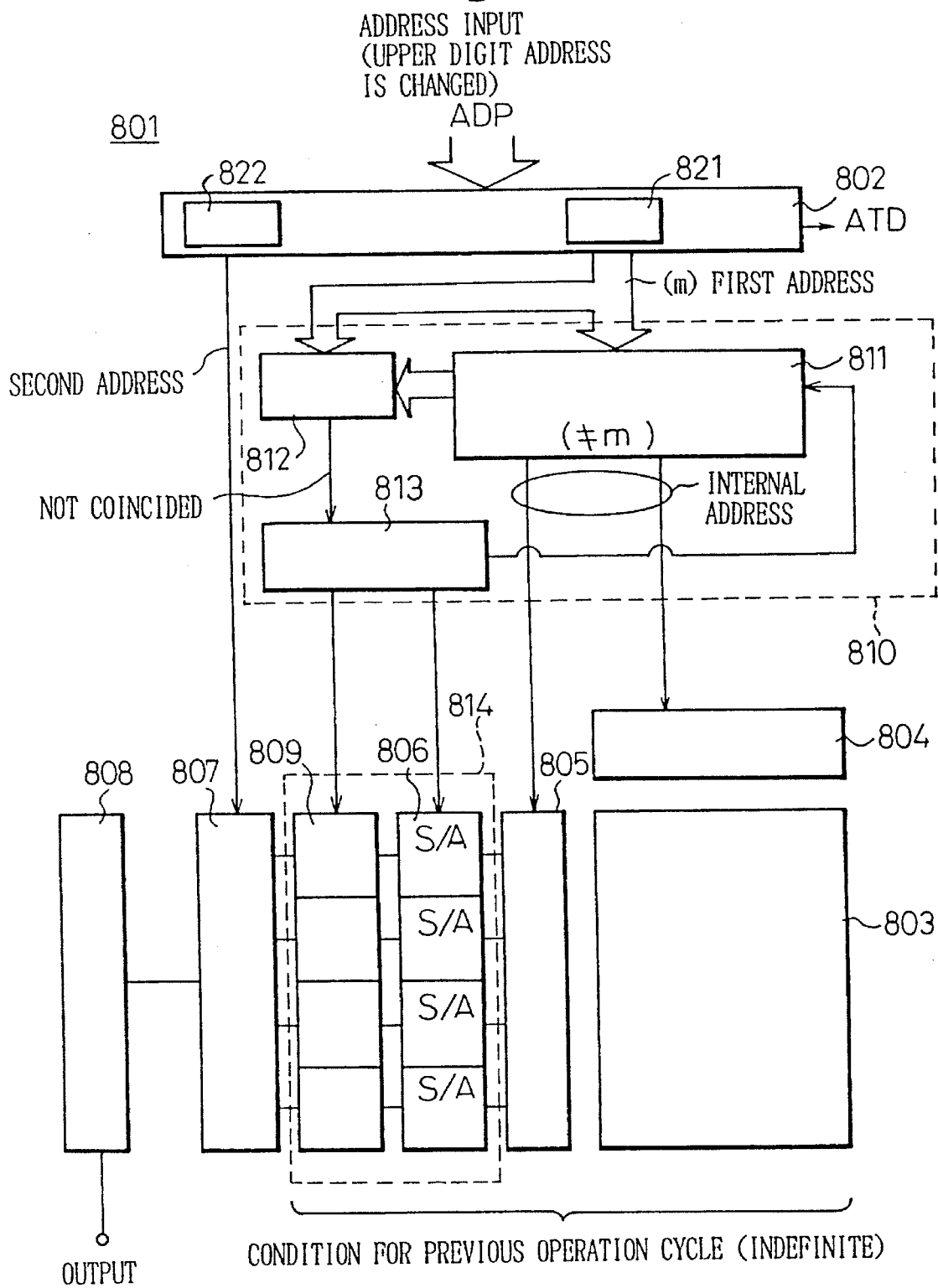
FIG. 86 is a block diagram showing an operation procedure of the semiconductor memory according to the eighth mode of the invention.

FIG. 86 shows an initial state of the semiconductor memory 801. The first address generator 821 provides the comparator 812 and internal address generator 811 with an address m.

The comparator 812 receives no internal address from the internal address generator 811, and therefore, provides a disagreement signal.

In FIG. 86, the comparator 812 has just provided the disagreement signal.

Figure 85:
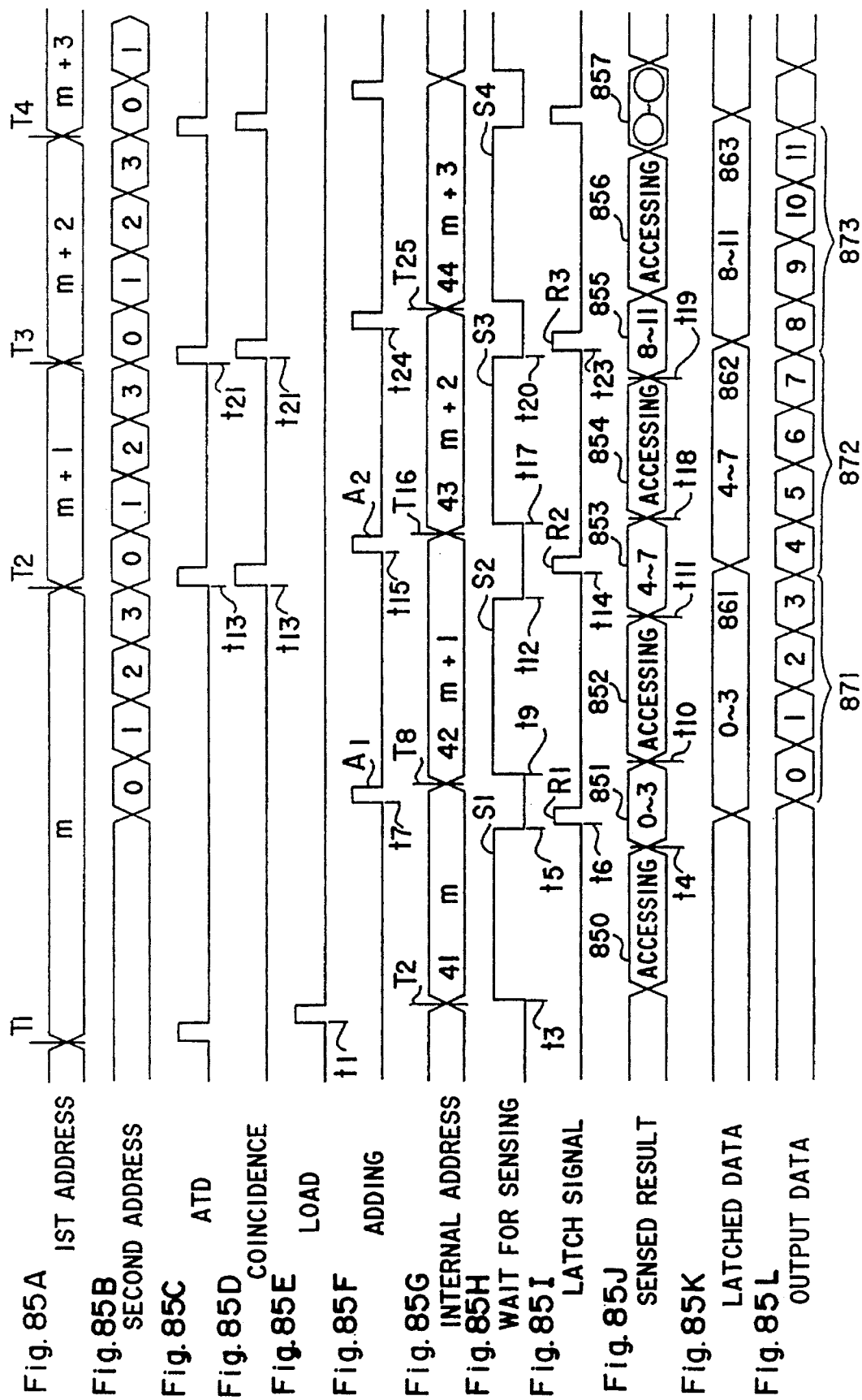
FIG. 85 is a timing chart in the case where the semiconductor memory according to the eighth mode of the invention is used.

On the timing chart in FIG. 85, the first address generator 821 provides the address m at time T1. At the same time, an address change detected signal ATD is provided to drive the comparator 812. A signal LOAD is provided at time t1. At time t2, the external address m from the first address generator 821 is provided to and held by the internal address generator 811, as indicated with numeral 41.

Figure 87:
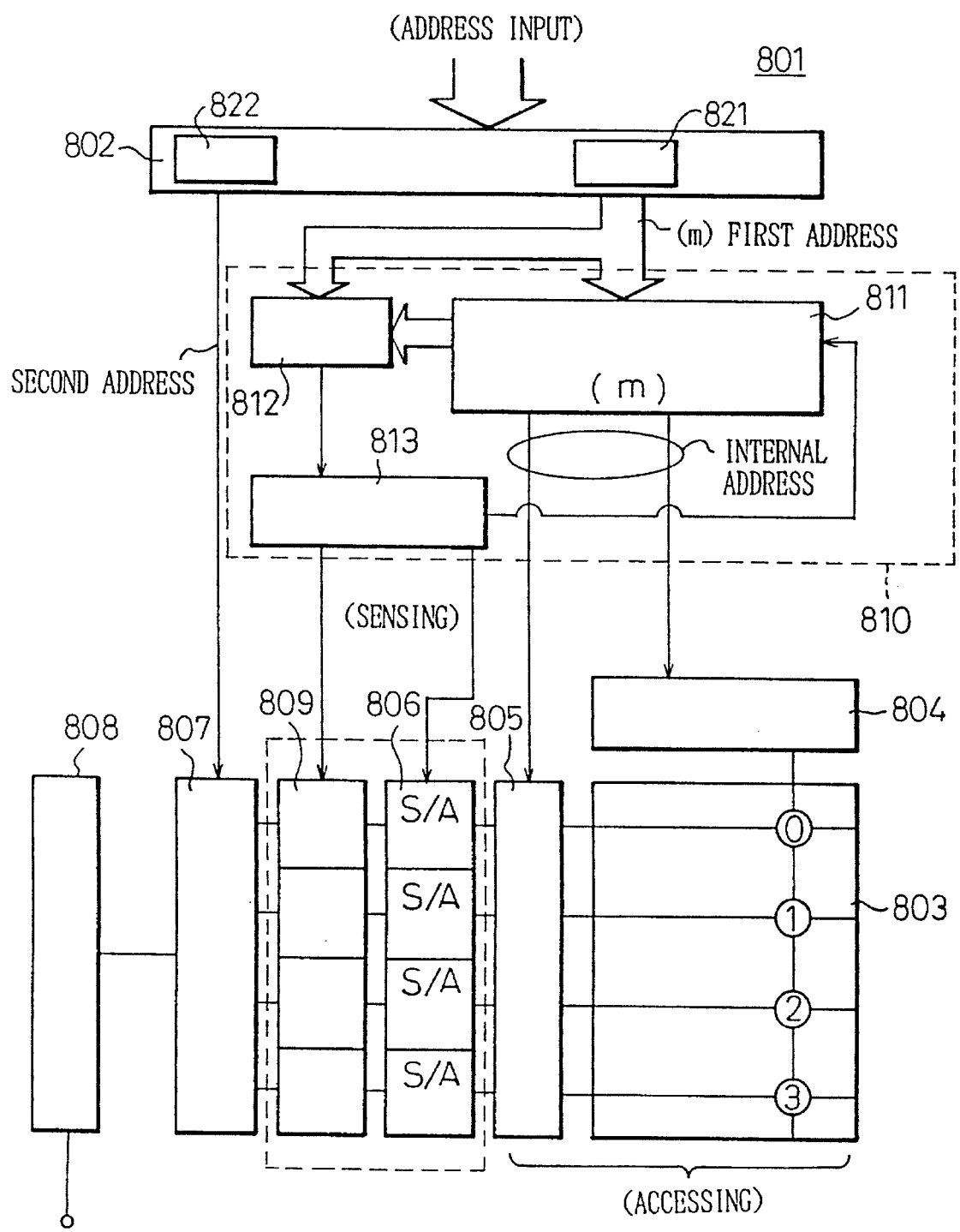

In FIG. 87, a word line m is selected according to the address m, and data pieces 0 to 3 corresponding to the word line m are read.

A sense wait time S1 starts at time t3. During the sense wait time S1, the processing of the data pieces 0 to 3 of the address m is suspended.

An access period 850 is of the preceding step. In this example, nothing is done during the access period 850 because the process has just started.

Just before the end of the sense wait time S1, a period 851 starts at time t4. During the period 851, the sense amplifiers 806 read the data pieces 0 to 3 from the address m. When the sense wait time S1 ends at time t5, a latch signal R1 is provided at time t6, so that the latches 809 latch the data pieces 0 to 3 from the sense amplifiers 806 during a period 861.

The signals LOAD and ATD, signals for the sense wait time S, and latch signal are provided through the timing controller 813.

Figure 88:
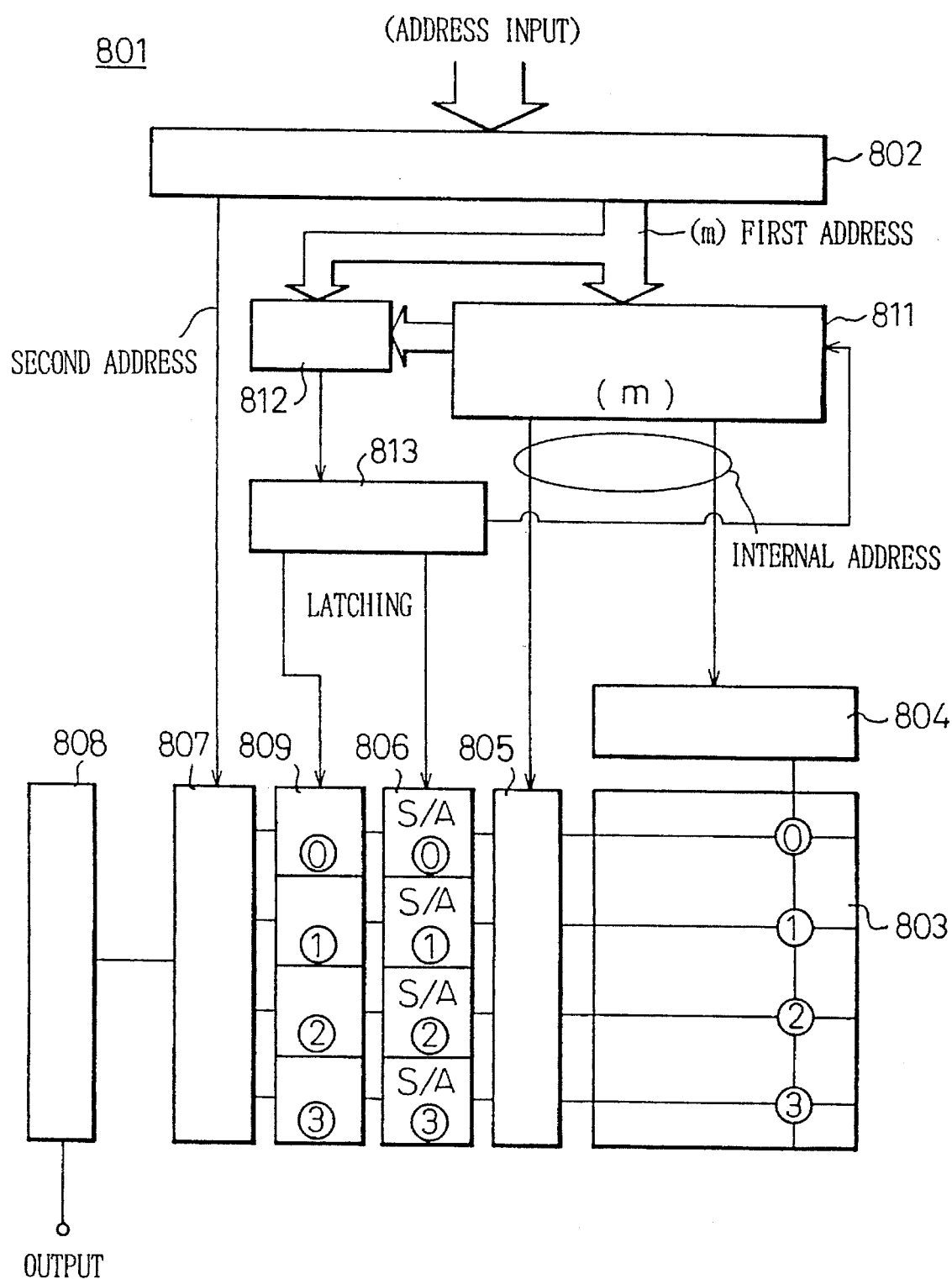

Results of these processes are shown in FIG. 88.

In response to the latch signal R1, an addition signal A1 is provided at time t7. As a result, the address m in the internal address generator 811 is incremented, for example, by one to m+1, which is held therein during a period 42 starting at time t8.

Figure 89:
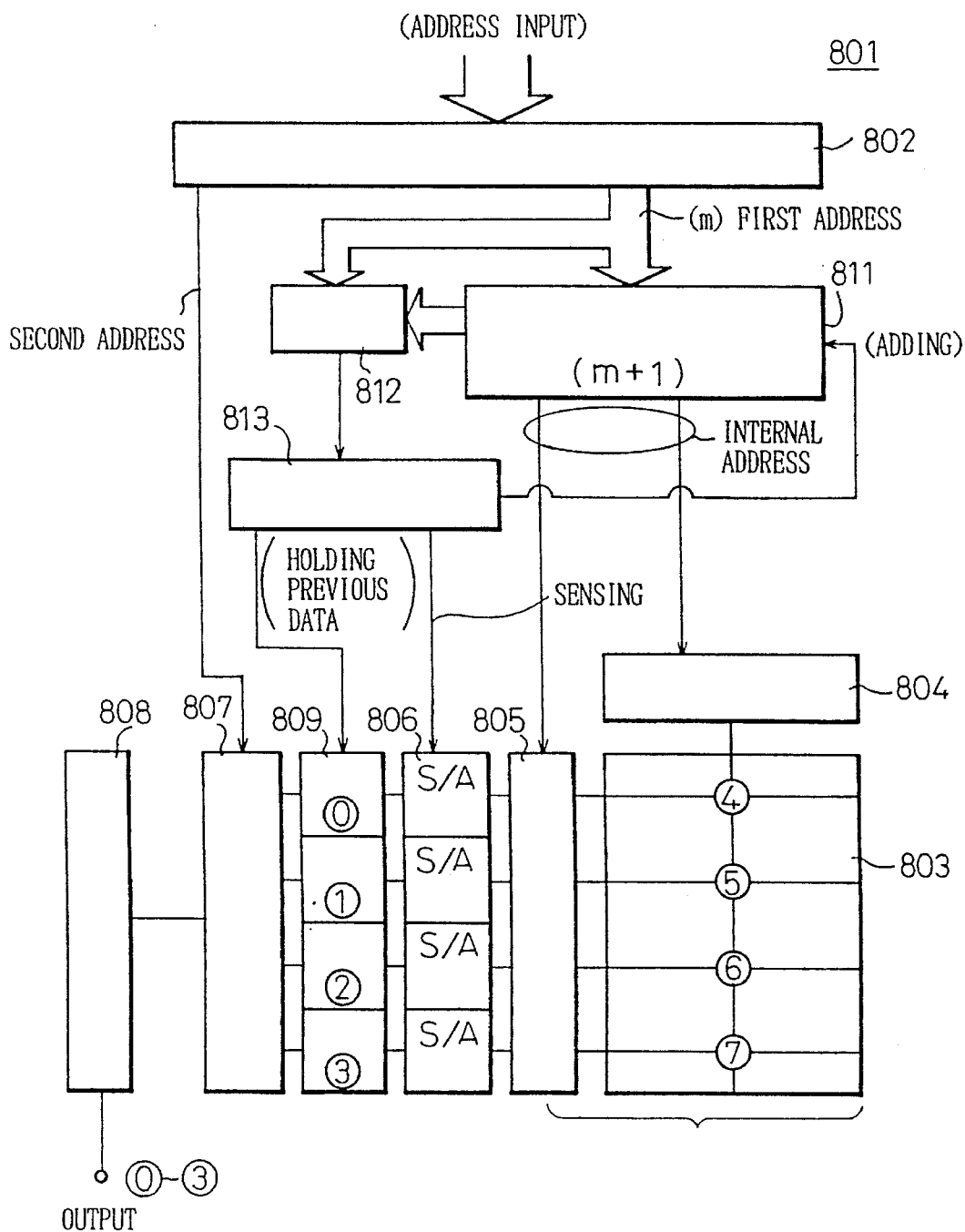

In FIG. 89, a word line m+1 is selected according to the address m+1, and data pieces 4 to 7 corresponding to the word line m+1 are read.

Meanwhile, during a period 871, the data pieces 0 to 3 latched by the latch circuits 809 are provided to the output buffer 808 through the sense amplifier selection means 807 sequentially or at random according to addresses provided by the second address generator 822.

Results of these operations are shown in FIG. 89.

At time t9, another sense wait time S2 starts. During a period 852 between t10 and t11 within the wait time S2, the memory cell means 803 is accessed according to the address m+1 provided by the internal address generator 811, to read the data pieces 4 to 7.

During a period 853 starting at t11, the sense amplifiers 806 read the data pieces 4 to 7 from the address m+1.

The sense wait time S2 ends at time t12. If an external address provided by the first address generator at time T2 is m+1, the address change detector provides the address change signal ATD at time t13. In response to the signal ATD, the comparator 812 carries out comparison.

The comparator 812 determines that the address m+1 provided by the internal address generator 811 agrees with the external address m+1 provided by the first address generator 821, and provides an agreement signal IC.

In response to the signal IC, a latch signal R2 is provided at time t14, so that the latch circuits 809 latch the data pieces 4 to 7 from the sense amplifiers during a period 862.

Figure 90:
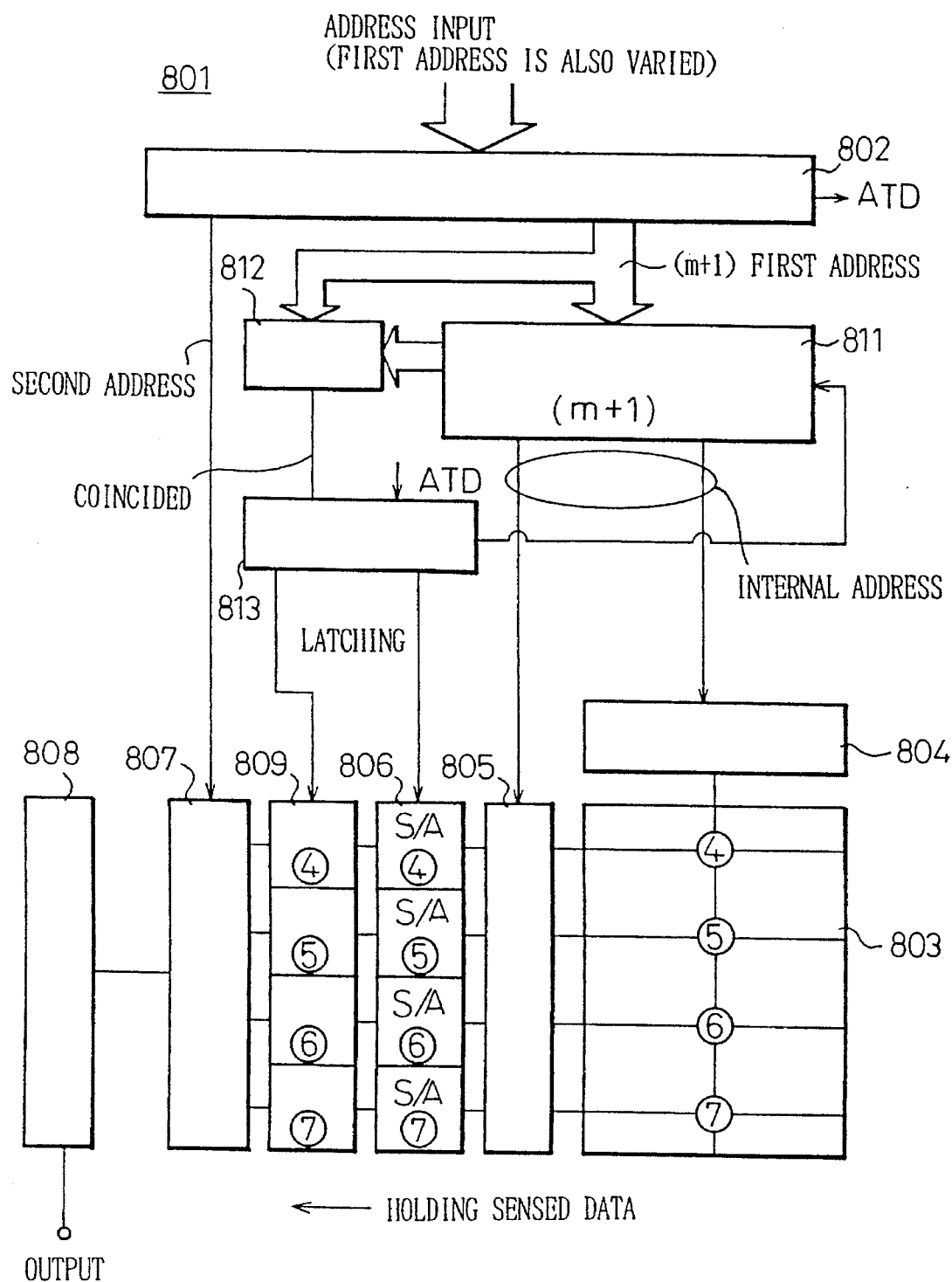

Results of these operations are shown in FIG. 90.

In response to the latch signal R2, an addition signal A2 is provided at time t15. Accordingly, the internal address generator 811 increments the now holding address m+1 by one to m+2 and holds it during a period 43 starting from time t16.

In FIG. 91, a word line m+2 is selected according to the address m+2, and data pieces 8 to 11 corresponding to the word line m+2 are read.

Namely, the internal address generator 811 starts a pre-read access to the word line m+2.

Meanwhile, during a period 872, the data pieces 3 to 7 latched by the latch circuits 809 are provided to the output buffer 808 through the sense amplifier selection means 807 sequentially or at random according to addresses provided by the second address generator 822.

At time t17, another sense wait time S3 starts. During a period 854 between t18 and t19 within the wait time S3, the memory cell means 803 is accessed according to the address m+2 provided by the internal address generator 811, to read the data pieces 8 to 11.

During a period 855 starting at t19, the sense amplifiers 806 read the data pieces 8 to 11 from the address m+2.

The sense wait time S3 ends at time t20. If an external address provided by the first address generator 821 at time T3 is m+2, the address change detector provides an address change signal ATD at time t21. In response to the signal ATD, the comparator carries out comparison.

The comparator 812 determines that the address m+2 provided by the internal address generator 811 agrees with the external address m+2 provided by the first address generator 821, and provides an agreement signal IC.

In response to the signal IC, a latch signal R3 is provided at time t23, so that the latch circuits 809 latch the data pieces 8 to 11 from the sense amplifiers 806 during a period 863.

Results of these operations are shown in FIG. 92.

In response to the latch signal R3, an addition signal A3 is provided at time t24. Accordingly, the internal address generator 811 increments the presently holding address m+2 by one to m+3 and holds it during a period 44 starting at time t25. Similar to the previous case, the internal address generator 811 starts a pre-read access with the address m+3, to read data pieces 12 to 15 from a word line m+3.

Meanwhile, during a period 873, the data pieces 8 to 11 latched by the latch circuits 809 are provided to the output buffer 808 through the sense amplifier selection means 807 sequentially or at random according to addresses provided by the second address generator 822.

The above processes are repeated.

As explained above, this embodiment uses a sense wait time to pre-read memory cell means according to the next or another upper address and has data pieces corresponding to the address on standby.

Since an access to the memory cell means according to an upper address takes a relatively long time, the pre-reading operation of the embodiment is effective to improve a data read speed.

Irrespective of the number of addresses to be simultaneously read in a semiconductor memory, the embodiment can read consecutive addresses at high speed. The embodiment requires a small number of sense amplifiers in a chip, to thereby reduce a chip area and cost per bit.

We claim:

1. A nonvolatile writable and erasable semiconductor memory having a matrix (1) of nonvolatile writable and erasable memory cell transistors (Mij) formed at intersections of word lines (WL1 to WLm) and bit lines (BL11 to BL1k, . . . , BLn1 to BLnk), a row decoder (3), a column decoder (5), and sense amplifiers (71 to 7n) connected to the bit lines (BL11 to BL1k, . . . , BLn1 to BLnk), respectively, the nonvolatile writable and erasable semiconductor memory comprising:

write means connected to said matrix;

verify means having at least one function selected from a) a write verify function which determines whether or not data are written in a memory as to accurately read out said data even when variation in a power source voltage occurs during a reading operation, and b) an erase verify function which determines whether or not data are erased in said memory as to accurately read out said data even when variation in the power source voltage occurs in the reading operation;

the verify means including means for detecting an output voltage of the sense amplifiers, comparison means for comparing the output voltage with a reference voltage, and storage means for storing a result of the comparison; and means for repeating a write operation and/or erase operation to memory cell transistors, if a result of comparison provided by the storage means after a verify operation for the write operation and/or erase operation indicates that the write operation and/or erase operation is not successful.

2. The nonvolatile writable and erasable semiconductor memory according to claim 1, further comprising:

timing signal generation means, connected to said write means, for setting a period between the end of a write operation and the start of a verify operation, so that the comparison means may compare an output voltage of the sense amplifiers with the reference voltage during the period.

3. The nonvolatile writable and erasable semiconductor memory according to claim 1, wherein the verify means has a storage circuit for storing an output of the sense amplifiers if the output indicates that said write operation and/or erase operation, which has been carried out to the memory cell transistors and checked by putting the memory cell transistors in a read-out state, is not successful including a condition in which said sense amplifier oscillates, and wherein the verify means determines according to contents of the storage circuit whether or not the write operation and/or erase operation is sufficient not to oscillate the sense amplifiers under the readout state, and provides a result of the determination to the outside.

4. The nonvolatile writable and erasable semiconductor memory according to claim 1, further comprising:

timing signal generation means for generating a timing signal of predetermined frequency after said write operation and/or erase operation to the memory cell transistors;

a storage circuit for storing an output level of the sense amplifiers in response to the timing signal of the predetermined frequency provided by the timing signal generation means after said write operation and/or erase operation is carried out to the cell transistors and after the cell transistors are put in a read-out state; and a write verify circuit for providing an insufficient write signal to the outside when the output level of the sense amplifiers stored in the storage circuit indicates that the write operation and/or erase operation is not successful, and a sufficient write signal to the outside when the output level of the sense amplifiers stored in the storage circuit does indicate that the write operation and/or erase operation is successful.

5. A nonvolatile writable and erasable semiconductor memory having a matrix (1) of nonvolatile writable and erasable memory cell transistors (Mij) formed at intersections of word lines (WL1 to WLm) and bit lines (BL11 to BL1k, . . . , BLn1 to BLnk), a row decoder (3), a column decoder (5), sense amplifiers (7) connected to the bit lines (BL11 to BL1k, . . . , BLn1 to BLnk) respectively, and voltage determination means connected to the matrix, said voltage determination means for determining whether or not drain voltage of said memory cell transistors has reached a value derived from substraction of a permitted limit threshold from the voltage applied to said word lines, the voltage determination means comprising:

voltage detection means for making all memory cell transistors of the matrix conductive and connecting all the memory cell transistors in parallel with one another to detect a voltage produced by a current flowing through all the memory cell transistors;

reference voltage generation means; and comparison means for comparing an output voltage of the voltage detection means with a reference voltage provided by the reference voltage generation means.

6. The nonvolatile writable and erasable semiconductor memory according to claim 5, wherein:

a predetermined voltage is applied to a source line connecting all sources of the memory cell transistors together, a same or different positive voltages are applied to all or part of word lines that form control gates of the memory cell transistors, drains of the memory cell transistors are connected to a data bus, and the voltage determination means is connected to the data bus.

7. The nonvolatile writable and erasable semiconductor memory according to claim 5, wherein:

sources of the memory cell transistors are connected to a single source line, same or different positive voltages are applied to all or some of word lines that form control gates of the memory cell transistors, drains of the cell transistors are commonly connected to a data bus, a predetermined voltage is applied to the data bus, and the voltage determination means is connected to the source line.

* * * * *